US012232410B2

(12) United States Patent
Shin et al.

(10) Patent No.: US 12,232,410 B2
(45) Date of Patent: Feb. 18, 2025

(54) ORGANOMETALLIC COMPOUND AND ORGANIC LIGHT-EMITTING DEVICE INCLUDING THE SAME

(71) Applicant: Samsung Display Co., Ltd., Yongin-si (KR)

(72) Inventors: Sujin Shin, Yongin-si (KR); Soobyung Ko, Yongin-si (KR); Sungbum Kim, Yongin-si (KR); Eunyoung Lee, Yongin-si (KR); Hyunjung Lee, Yongin-si (KR); Junghoon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 836 days.

(21) Appl. No.: 17/211,614

(22) Filed: Mar. 24, 2021

(65) Prior Publication Data

US 2022/0102653 A1 Mar. 31, 2022

(30) Foreign Application Priority Data

Apr. 6, 2020 (KR) ........................ 10-2020-0041719

(51) Int. Cl.
*H10K 85/30* (2023.01)
*H10K 50/11* (2023.01)
(Continued)

(52) U.S. Cl.
CPC ........... *H10K 85/346* (2023.02); *H10K 85/40* (2023.02); *H10K 85/615* (2023.02); (Continued)

(58) Field of Classification Search
None
See application file for complete search history.

(56) References Cited

U.S. PATENT DOCUMENTS 9,108,998 B2 8/2015 Molt et al.
10,211,414 B2 2/2019 Li et al.
(Continued)

FOREIGN PATENT DOCUMENTS

KR 10-2014-0144152 A 12/2014
KR 10-2015-0043225 A 4/2015
KR 10-2016-0012941 A 2/2016

OTHER PUBLICATIONS

Bimodal coordination of fused arenes to a Pd3 cluster site (Year: 2018).*

*Primary Examiner* — Jeffrey D Washville
(74) *Attorney, Agent, or Firm* — Womble Bond Dickinson

(57) ABSTRACT

An organometallic compound having a novel structure represented by Formula 1 and an organic light-emitting device including the same. In Formula 1, the substituents are the same as described in the Detailed Description.

Formula 1

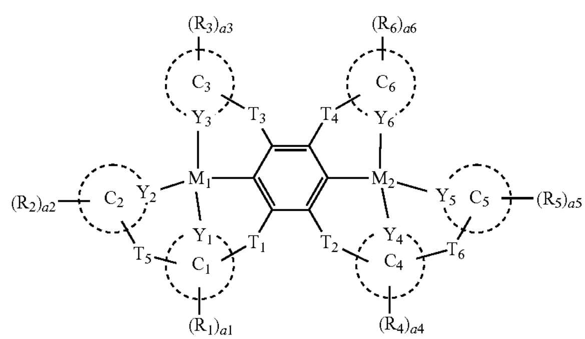

20 Claims, 4 Drawing Sheets

(51) Int. Cl.

| | |
|---|---|
| ***H10K 85/40*** | (2023.01) |
| ***H10K 85/60*** | (2023.01) |
| ***H10K 101/40*** | (2023.01) |

(52) U.S. Cl.

CPC ....... *H10K 85/654* (2023.02); *H10K 85/6572* (2023.02); *H10K 85/6574* (2023.02); *H10K 50/11* (2023.02); *H10K 2101/40* (2023.02)

(56) References Cited

U.S. PATENT DOCUMENTS

| | | | |
|---|---|---|---|
| 2014/0364605 | A1 | 12/2014 | Li et al. |
| 2016/0133862 | A1 | 5/2016 | Li et al. |
| 2018/0219161 | A1 | 8/2018 | Li et al. |
| 2019/0028028 | A1 | 1/2019 | Wang |
| 2019/0067598 | A1 | 2/2019 | Li et al. |
| 2019/0153007 | A1 | 5/2019 | Li et al. |
| 2019/0214584 | A1 | 7/2019 | Chen et al. |
| 2020/0152891 | A1 | 5/2020 | Li et al. |

* cited by examiner

10

20

30

40

ORGANOMETALLIC COMPOUND AND ORGANIC LIGHT-EMITTING DEVICE INCLUDING THE SAME

CROSS-REFERENCE TO RELATED APPLICATION

This application claims priority to and the benefit of Korean Patent Application No. 10-2020-0041719, filed on Apr. 6, 2020, in the Korean Intellectual Property Office, the disclosure of which is incorporated herein in its entirety by reference.

BACKGROUND

1. Field

One or more embodiments relate to an organometallic compound and an organic light-emitting device including the same.

2. Description of Related Art

Organic light-emitting devices (OLEDs) are self-emission devices that have wide viewing angles, high contrast ratios, short response times, and/or excellent characteristics in terms of brightness, driving voltage, and/or response speed, compared to devices in the related art.

OLEDs may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state to thereby generate light.

SUMMARY

Aspects according to one or more embodiments are directed toward an organometallic compound having a novel structure, and an organic light-emitting device including the same and having high luminescence efficiency and a long lifespan.

Additional aspects will be set forth in part in the description which follows and, in part, will be apparent from the description, or may be learned by practice of the presented embodiments of the disclosure.

According to an embodiment of the present disclosure, an organometallic compound is represented by Formula 1:

Formula 1

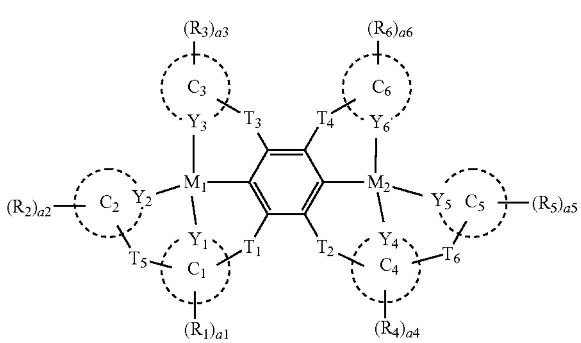

wherein, in Formula 1,

M1 and $M_2$ are each independently selected from platinum (Pt), palladium (Pd), iridium (Ir), copper (Cu), cadmium (Cd), nickel (Ni), zinc (Zn), manganese (Mn), and gold (Au), ring C1 to ring $C_6$ are each independently selected from a $C_5$-$C_{30}$ carbocyclic group and a $C_1$-$C_{30}$ heterocyclic group, $Y_1$ is a constituent atom of ring $C_1$, and is C or N, $Y_2$ is a constituent atom of ring $C_2$, and is C or N, $Y_3$ is a constituent atom of ring $C_3$, and is C or N, $Y_4$ is a constituent atom of ring $C_4$, and is C or N, $Y_5$ is a constituent atom of ring $C_5$, and is C or N, $Y_6$ is a constituent atom of ring $C_6$, and is C or N, one selected from a bond between $Y_1$ and $M_1$, a bond between $Y_2$ and $M_1$, and a bond between $Y_3$ and $M_1$ is a covalent bond, and the others are each a coordinate bond, one selected from a bond between $Y_4$ and $M_2$, a bond between $Y_5$ and $M_2$, and a bond between $Y_6$ and $M_2$ is a covalent bond, and the others are each a coordinate bond, $T_1$ to $T_6$ are each independently selected from a single bond, *—O—*', *—S—*', *—Se—*', *—N($R_7$)—*', *—B($R_7$)—*', *—P($R_7$)—', *—P(═O)($R_7$)—', *—S(═O)—', *—S(═O)$_2$-', *—S(═O)($R_7$)($R_8$)—', *—C(═O)—', *—C($R_7$)($R_8$)—', *—Si($R_7$)($R_8$)—*', and *—Ge($R_7$)($R_8$)—*', $R_1$ to $R_8$ are each independently selected from hydrogen, deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, an am idino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(═O)($Q_1$)($Q_2$), adjacent groups from among $R_1$ to $R_8$ are optionally linked to each other to form a substituted or unsubstituted $C_5$-$C_{30}$ carbocyclic group or a substituted or unsubstituted $C_1$-$C_{30}$ heterocyclic group, a1 to a6 are each independently an integer from 0 to 10,

* and *' each indicate a binding site to a neighboring atom, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_2$-$C_{60}$ heteroaryl group, the substituted monovalent non-aromatic condensed polycyclic group, and the substituted monovalent non-aromatic condensed heteropolycyclic group is selected from deuterium, —F, —Cl, —Br, —I, $—CH_2D$, $—CHD_2$, $—CD_3$, $—CH_2F$, $—CHF_2$, $—CF_3$, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a alkoxy group, each substituted with at least one selected from deuterium, —F, —Cl, —Br, —I, $—CH_2D$, $—CHD_2$, $—CD_3$, $—CH_2F$, $—CHF_2$, $—CF_3$, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, and $—P(=O)(Q_{11})(Q_{12})$, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, $—CH_2D$, $—CHD_2$, $—CD_3$, $—CH_2F$, $—CHF_2$, $—CF_3$, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, and $—P(=O)(Q_{21})(Q_{22})$, and $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, $—CH_2D$, $—CHD_2$, $—CD_3$, $—CH_2F$, $—CHF_2$, $—CF_3$, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_1$-$C_{60}$ heteroaryl group, a monovalent non-aromatic condensed polycyclic group, a monovalent non-aromatic condensed heteropolycyclic group, a biphenyl group, and a terphenyl group.

According to another embodiment of the present disclosure, an organic light-emitting device includes a first electrode, a second electrode, an organic layer between the first electrode and the second electrode and including an emission layer, and the organometallic compound represented by Formula 1.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
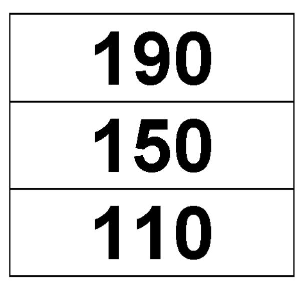
FIG. 1 is a schematic view of an organic light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

According to an embodiment of the present disclosure, an organometallic compound is represented by Formula 1:

Formula 1

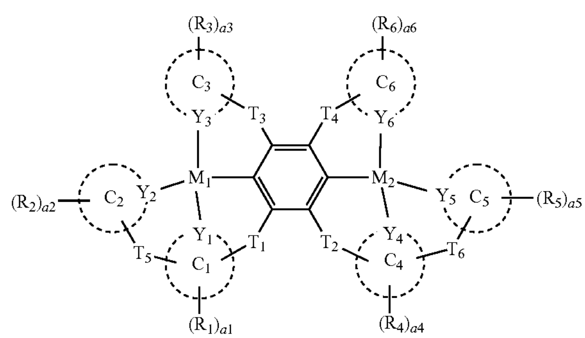

In Formula 1, $M_1$ and $M_2$ may each independently be selected from platinum (Pt), palladium (Pd), iridium (Ir), copper (Cu), cadmium (Cd), nickel (Ni), zinc (Zn), manganese (Mn), and gold (Au).

In one embodiment, $M_1$ and $M_2$ may be the same metals. For example, $M_1$ and $M_2$ may each be Pt.

In Formula 1, ring $C_1$ to ring $C_6$ may each independently be selected from a $C_5$-$C_{30}$ carbocyclic group and a $C_1$-$C_{30}$ heterocyclic group.

In one embodiment, ring $C_1$ to ring $C_6$ and ring $A_1$ and ring $A_2$ may each independently be selected from i) a first ring, ii) a second ring, iii) a condensed ring in which two or more first rings are condensed with each other, iv) a condensed ring in which two or more second rings are condensed with each other, and v) a condensed ring in which one or more first rings and one or more second rings are condensed with each other.

In one embodiment, the first ring may be selected from a cyclopentane group, a cyclopentene group, a cyclopentadiene group, a furan group, a thiophene group, a pyrrole group, a borole group, a phosphol group, a silole group, a germole group, a selenophene group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the second ring may be selected from a cyclohexane group, a cyclohexene group, a cyclohexadiene group, an adamantane group, a norbornane group, a norbornene group, a benzene group, a pyridine group, a dihydropyridine group, a tetrahydropyridine group, a pyrimidine group, a dihydropyrimidine group, a tetrahydropyrimidine group, a pyrazine group, a dihydropyrazine group, a tetrahydropyrazine group, a pyridazine group, a dihydropyridazine group, a tetrahydropyridazine group, a triazine group, an oxasiline group, a thiasiline group, a dihydroazasiline group, a dihydrodisiline group, a dihydrosiline group, a dioxine group, an oxathiine group, an oxazine group, a pyran group, a dithiine group, a thiazine group, and a thiopyran group.

In one embodiment, at least one selected from ring $C_1$ to ring $C_6$ may be a heterocyclic group including a carbene moiety. For example, at least one selected from ring $C_1$ to ring $C_6$ may be a carbene group.

In one embodiment, ring $C_1$ and ring $C_4$ may be identical to each other. In one embodiment, ring $C_2$ and ring $C_5$ may be identical to each other. In one embodiment, ring $C_3$ and ring $C_6$ may be identical to each other. In one embodiment, ring $C_2$, ring $C_3$, ring $C_5$, and ring $C_6$ may be identical to each other.

For example, a moiety represented by

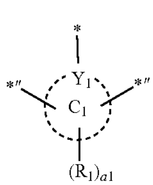

may be a group represented by one selected from Formulae 1a to 1d, a moiety represented by

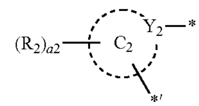

may be a group represented by one selected from Formulae 2a to 2h, a moiety represented by

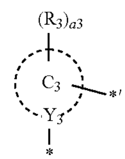

may be a group represented by one selected from Formulae 3a to 3d, a moiety represented by

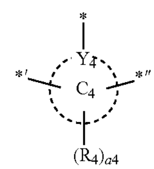

may be a group represented by one selected from Formulae 4a to 4d, a moiety represented by

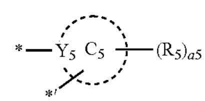

may be a group represented by one selected from Formulae 5a to 5h, and a moiety represented by

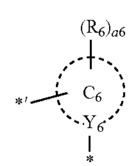

may be a group represented by one selected from Formulae 6a to 6d:

1a

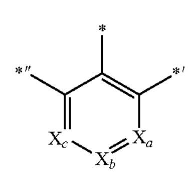

-continued
1b
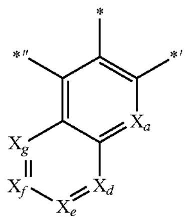
1c
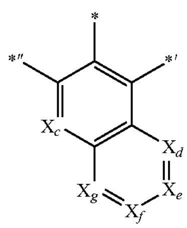
1d
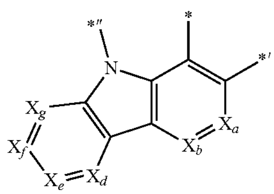
2a
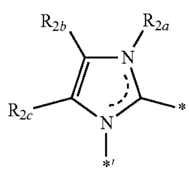
2b
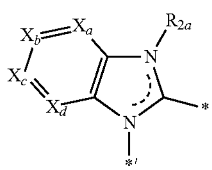
2c
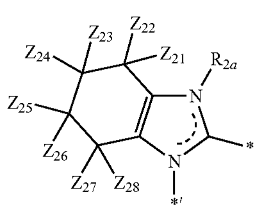
2d
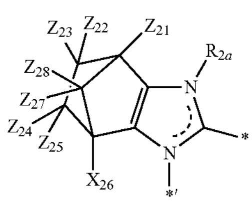
2d
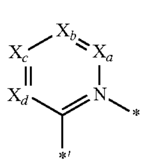
-continued
2e
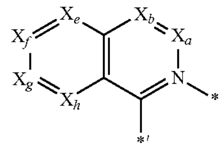
2g
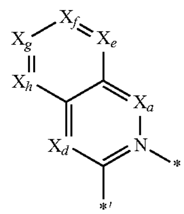
2h
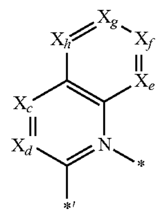
3a
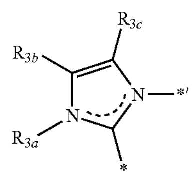
3b
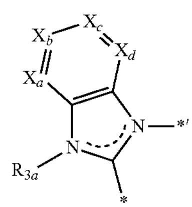
3c
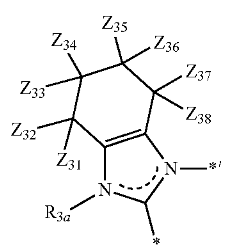
3d
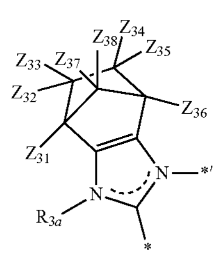
4a
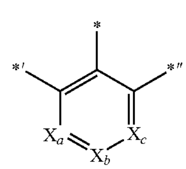

-continued
4b
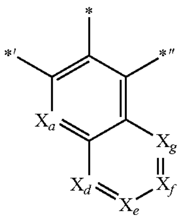
4c
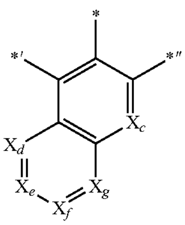
4d
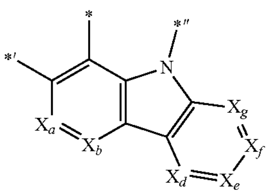
5a
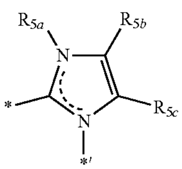
5b
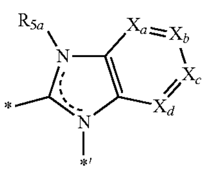
5c
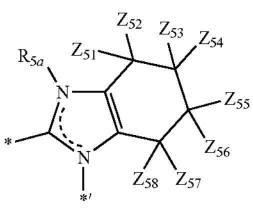
5d
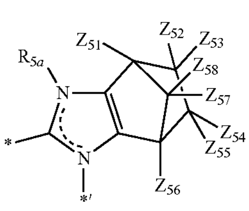
5e
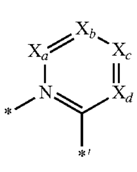
-continued
5f
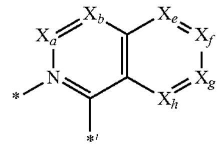
5g
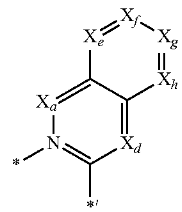
5h
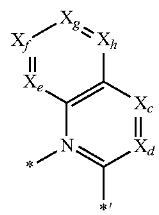
6a
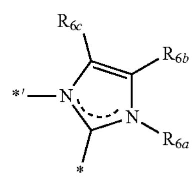
6b
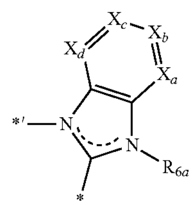
6c
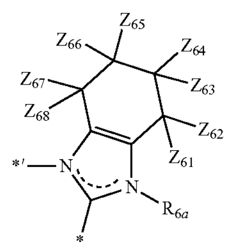
6d
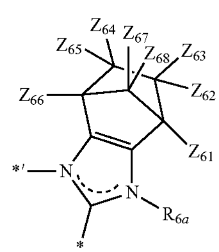
In Formulae 1a to 1d,
$X_a$ may be N or $C(Z_{1a})$, $X_b$ may be N or $C(Z_{1b})$, $X_c$ may be N or $C(Z_{1c})$, $X_d$ may be N or $C(Z_{1d})$, $X_e$ may be N or $C(Z_{1e})$, $X_f$ may be N or $C(Z_{1f})$, and $X_g$ may be N or $C(Z_{1g})$,
$Z_{1a}$ to $Z_{1g}$ may each independently be the same as described in connection with $R_1$ in the present specification, in Formulae 2a to 2h, $X_a$ may be N or $C(Z_{2a})$, $X_b$ may be N or $C(Z_{2b})$, $X_c$ may be N or $C(Z_{2c})$, $X_d$ may be N or $C(Z_{2d})$, $X_e$ may be N or $C(Z_{2e})$, $X_f$ may be N or $C(Z_{2f})$, $X_g$ may be N or $C(Z_{2g})$, and $X_h$ may be N or $C(Z_{2h})$, $R_{2a}$ to $R_{2c}$, $Z_{21}$ to $Z_{28}$, and $Z_{2a}$ to $Z_{2h}$ may each independently be the same as described in connection with $R_2$ in the present specification, in Formulae 3a to 3d, $X_a$ may be N or $C(Z_{3a})$, $X_b$ may be N or $C(Z_{3b})$, $X_c$ may be N or $C(Z_{3c})$, and $X_d$ may be N or $C(Z_{3d})$, $R_{3a}$ to $R_{3c}$, $Z_{31}$ to $Z_{38}$, and $Z_{3a}$ to $Z_{3d}$ may each independently be the same as described in connection with $R_3$ in the present specification, in Formulae 4a to 4d, $X_a$ may be N or $C(Z_{4a})$, $X_b$ may be N or $C(Z_{4b})$, $X_c$ may be N or $C(Z_{4c})$, $X_d$ may be N or $C(Z_{4d})$, $X_e$ may be N or $C(Z_{4e})$, $X_f$ may be N or $C(Z_{4f})$, and $X_g$ may be N or $C(Z_{4g})$, $Z_{4a}$ to $Z_{4g}$ may each independently be the same as described in connection with $R_4$ in the present specification, in Formulae 5a to 5h, $X_a$ may be N or $C(Z_{5a})$, $X_b$ may be N or $C(Z_{5b})$, $X_c$ may be N or $C(Z_{5c})$, $X_d$ may be N or $C(Z_{5d})$, $X_e$ may be N or $C(Z_{5e})$, $X_f$ may be N or $C(Z_{5f})$, $X_g$ may be N or $C(Z_{5g})$, and $X_h$ may be N or $C(Z_{5h})$, $R_{5a}$ to $R_{5c}$, $Z_{51}$ to $Z_{58}$, and $Z_{5a}$ to $Z_{5h}$ may each independently be the same as described in connection with $R_5$ in the present specification, in Formulae 6a to 6d, $X_a$ may be N or $C(Z_{6a})$, $X_b$ may be N or $C(Z_{6b})$, $X_c$ may be N or $C(Z_{6c})$, and $X_d$ may be N or $C(Z_{6d})$, and $R_{6a}$ to $R_{6c}$, $Z_{61}$ to $Z_{68}$, and $Z_{6a}$ to $Z_{6d}$ may each independently be the same as described in connection with $R_6$ in the present specification.

In Formula 1, $Y_1$ may be a constituent atom of ring $C_1$, and may be C or N; $Y_2$ may be a constituent atom of ring $C_2$, and may be C or N; $Y_3$ may be a constituent atom of ring $C_3$, and may be C or N; $Y_4$ may be a constituent atom of ring $C_4$, and may be C or N; $Y_5$ may be a constituent atom of ring $C_5$, and may be C or N; and $Y_6$ may be a constituent atom of ring $C_6$, and may be C or N, wherein one selected from a bond between $Y_1$ and $M_1$, a bond between $Y_2$ and $M_1$, and a bond between $Y_3$ and $M_1$ may be a covalent bond, and the others (i.e., the remaining two bonds excluding the one that is a covalent bond) may each be a coordinate bond, and one selected from a bond between $Y_4$ and $M_2$, a bond between $Y_5$ and $M_2$, and a bond between $Y_6$ and $M_2$ may be a covalent bond, and the others (i.e., the remaining two bonds excluding the one that is a covalent bond) may each be a coordinate bond.

In one embodiment, $Y_1$ and $Y_4$ may each be C, and a bond between $Y_1$ and $M_1$ and a bond between $Y_4$ and $M_2$ may each be a covalent bond.

In one or more embodiments, $Y_3$ and $Y_6$ may each be C, and a bond between $Y_3$ and $M_1$ and a bond between $Y_6$ and $M_2$ may each be a covalent bond.

In one embodiment, $T_1$ to $T_6$ may each independently be selected from a single bond, *—O—*', *—S—*', *—Se—*', *—N($R_7$)—*', *—B($R_7$)—*', *—P($R_7$)—*', *—P(=O)($R_7$)—*', *—S(=O)—*', *—S(=O)$_2$—*', *—S(=O)($R_7$)($R_8$)—*', *—C(=O)—*', *—C($R_7$)($R_8$)—*', *—Si($R_7$)($R_8$)—*', and *—Ge($R_7$)($R_8$)—*'.

In one embodiment, $T_1$ and $T_2$ may each independently be selected from O, S, and Se, $T_3$ and $T_4$ may each be a single bond, and $T_5$ and $T_6$ may each independently be selected from a single bond and *—N($R_7$)—*'.

For example, $T_1$ and $T_2$ may each be O, $T_3$ and $T_4$ may each be a single bond, and $T_5$ and $T_6$ may each independently be selected from a single bond and *—N($R_7$)—*', wherein, when $T_5$ and $T_6$ are each *—N($R_7$)—*', $R_7$ may be linked to each of $R_1$ and $R_4$ to form a hetero condensed ring.

In Formula 1, $R_1$ to $R_8$ may each independently be selected from hydrogen, deuterium (D), —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)(Qi), —S(=O)$_2$($Q_1$), and —P(=O)($Q_1$)($Q_2$), wherein adjacent groups from among $R_1$ to $R_8$ may optionally be linked to each other to form a substituted or unsubstituted $C_5$-$C_{30}$ carbocyclic group or a substituted or unsubstituted $C_1$-$C_{30}$ heterocyclic group.

In one embodiment, $R_1$ to $R_8$ may each independently be selected from:

hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, and an indolocarbazolyl group;

a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, and an indolocarbazolyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a $C_1$-$C_{60}$ alkyl group, a $C_1$-$C_{60}$ alkoxy group, a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, an indolocarbazolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$; and —$Si(Q_1)(Q_2)(Q_3)$, —$N(Q_1)(Q_2)$, —$B(Q_1)(Q_2)$, —$C(=O)(Qi)$, —$S(=O)_2(Q_1)$, and —$P(=O)(C_{21})(Q_2)$, but embodiments of the present disclosure are not limited thereto, and $Q_1$ to $Q_3$ and $Q_{31}$ to $Q_{33}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group that is substituted with at least one selected from deuterium, —F, a cyano group, a $C_1$-$C_{60}$ alkyl group, a phenyl group, and a biphenyl group, a $C_6$-$C_{60}$ aryl group that is substituted with at least one selected from deuterium, —F, a cyano group, a $C_1$-$C_{10}$ alkyl group, a phenyl group, and a biphenyl group and a $C_1$-$C_{60}$ heteroaryl group that is substituted with at least one selected from deuterium, —F, a cyano group, a $C_1$-$C_{10}$ alkyl group, a phenyl group, and a biphenyl group.

For example, $R_1$ to $R_8$ may each independently be selected from:

hydrogen, deuterium, —F, —Cl, —Br, —I, a hydroxyl group, a cyano group, a nitro group, an amidino group, a hydrazine group, a hydrazone group, a methyl group, an ethyl group, an n-propyl group, an isopropyl group, an n-butyl group, an isobutyl group, a sec-butyl group, a tert-butyl group, an n-pentyl group, a tert-pentyl group, a neo-pentyl group, an isopentyl group, a sec-pentyl group, a 3-methylpentyl group, a sec-isopentyl group, an n-hexyl group, an isohexyl group, a sec-hexyl group, and a tert-hexyl group;

a methyl group, an ethyl group, an n-propyl group, an isopropyl group, an n-butyl group, an isobutyl group, a sec-butyl group, a tert-butyl group, an n-pentyl group, a tert-pentyl group, a neo-pentyl group, an isopentyl group, a sec-pentyl group, a 3-methylpentyl group, a sec-isopentyl group, an n-hexyl group, an isohexyl group, a sec-hexyl group, and a tert-hexyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a cyclopentyl group, a cyclohexyl group, a cycloheptyl group, an adamantanyl group a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyridinyl group, and a pyrimidinyl group; and a cyclopentyl group a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyridinyl group, and a pyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group a nitro group, an amidino group, a hydrazine group, a hydrazone group, a methyl group, an ethyl group, an n-propyl group, an isopropyl group, an n-butyl group, an isobutyl group, a sec-butyl group, a tert-butyl group, an n-pentyl group, a tert-pentyl group, a neo-pentyl group, an isopentyl group, a sec-pentyl group, a 3-methylCY-pentyl group, a sec-isopentyl group, an n-hexyl group, an isohexyl group, a sec-hexyl group, a tert-hexyl group, a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyridinyl group, and a pyrimidinyl group, but embodiments of the present disclosure are not limited thereto.

In Formula 1, a1 indicates the number of $R_1$(s), and may be an integer from 0 to 10; a2 indicates the number of $R_2$(s), and may be an integer from 0 to 10; a3 indicates the number of $R_3$(s), and may be a integer from 0 to 10; a4 indicates the number of $R_4$(s), and may be an integer from 0 to 10; a5 indicates the number of $R_5$(s), and may be an integer from 0 to 10; and a6 indicates the number of $R_6$(s), and may be an integer from 0 to 10.

In one embodiment, the organometallic compound may be represented by Formula 1-1:

Formula 1-1

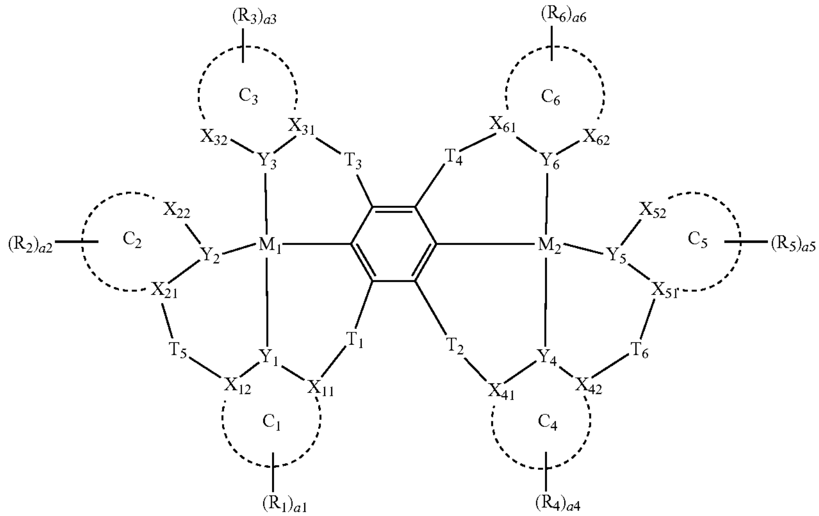

In Formula 1-1, $M_1$, $M_2$, $C_1$ to $C_6$, $R_1$ to $R_6$, a1 to a6, $T_1$ to $T_6$, and $Y_1$ to $Y_6$ may each be the same as respectively described above in the present specification, $X_{11}$, $X_{12}$, $X_{21}$, $X_{22}$, $X_{31}$, $X_{32}$, $X_{41}$, $X_{42}$, $X_{51}$, $X_{52}$, $X_{61}$, and $X_{62}$ may each independently be C or N, when $X_{21}$ is N, $X_{22}$ may be N, and $Y_2$ may be C, when $X_{31}$ is N, $X_{32}$ may be N, and $Y_3$ may be C, when $X_{51}$ is N, $X_{52}$ may be N, and $Y_5$ may be C, and when $X_{61}$ is N, $X_{62}$ may be N, and $Y_6$ may be C.

In one embodiment, $X_{31}$, $X_{32}$, $X_{61}$, and $X_{62}$ may each be N, and $Y_3$ and $Y_6$ may each be C.

In one or more embodiments, when $X_{21}$ and $X_{22}$ are each C, $Y_2$ may be N, and when $X_{51}$ and $X_{52}$ are each C, $Y_5$ may be N; or when $X_{21}$ and $X_{22}$ are each N, $Y_2$ may be C, and $X_{22}$ and $Y_2$ or $X_{21}$ and $Y_2$ may each include a *—N═C—*' bond, and when $X_{51}$ and $X_{52}$ are each N, $Y_5$ may be C, and $X_{52}$ and $Y_5$ or $X_{51}$ and $Y_5$ may each include a *—N═C—*' bond.

In one embodiment, the organometallic compound may be represented by Formula 1-2:

Formula 1-2

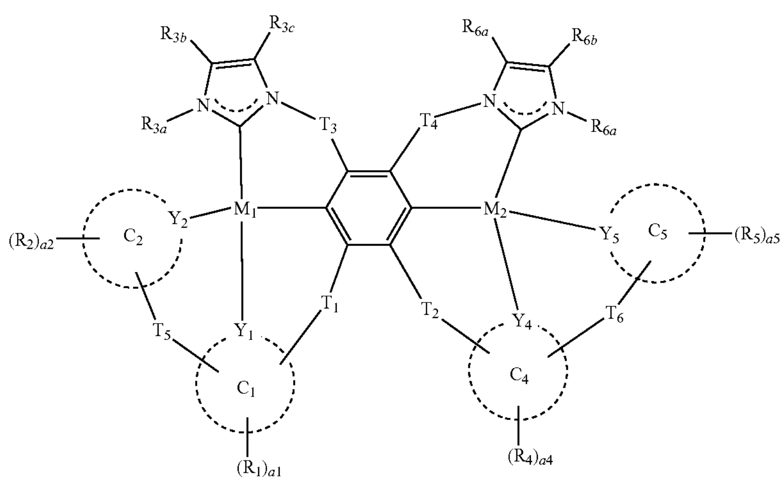

In Formula 1-2, $M_1$, $M_2$, $C_1$, $C_2$, $C_4$, $C_5$, $R_1$, $R_2$, $R_4$, $R_5$, a1, a2, a4, a5, $T_1$ to $T_6$, $Y_1$, $Y_2$, $Y_4$, and $Y_5$ may each be the same as respectively described above in the present specification, $R_{3a}$ to $R_{3c}$ may each independently be the same as described in connection with $R_3$ in the present specification, and $R_{6a}$ to $R_{6c}$ may each independently be the same as described in connection with $R_6$ in the present specification.

In one embodiment, the organometallic compound may be represented by Formula 1-3 or 1-4:

Formula 1-3

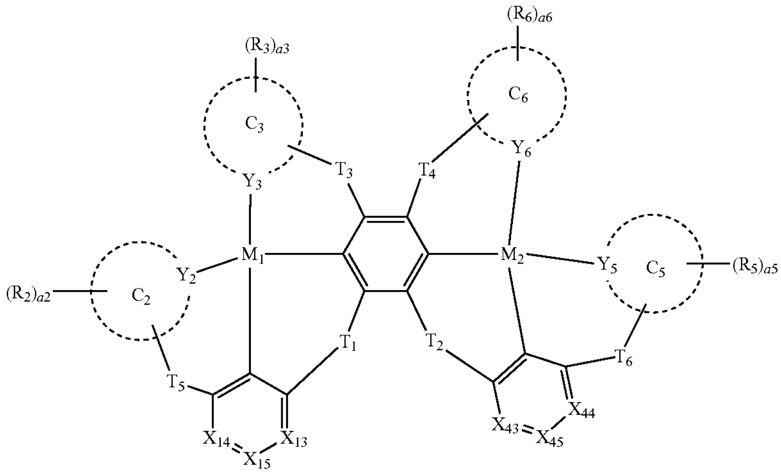

Formula 1-4

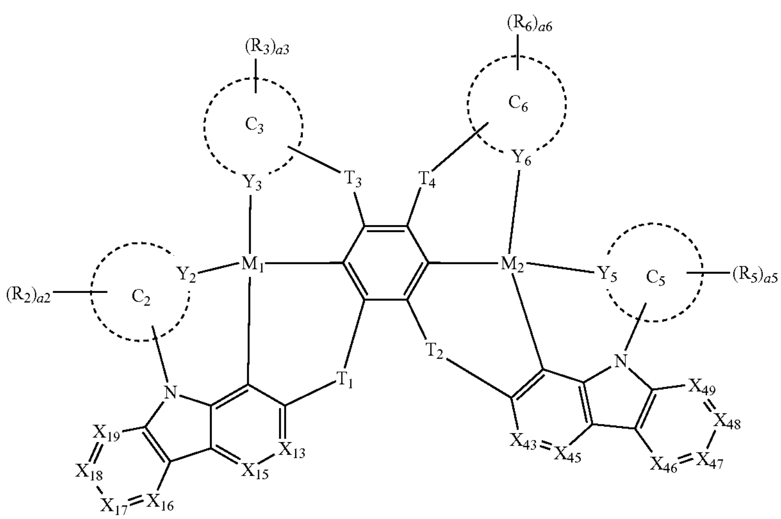

In Formulae 1-3 and 1-4, $M_1$, $M_2$, $C_2$, $C_3$, $C_5$, $C_6$, $Y_2$, $Y_3$, $Y_5$, $Y_6$, $R_2$, $R_3$, $R_5$, $R_6$, a2, a3, a5, a6, and $T_1$ to $T_6$ may each be the same as respectively described above in the present specification, $X_{13}$ may be N or $C(R_{13})$, $X_{14}$ may be N or $C(R_{14})$, $X_{15}$ may be N or $C(R_{15})$, $X_{16}$ may be N or $C(R_{16})$, $X_{17}$ may be N or $C(R_{17})$, $X_{18}$ may be N or $C(R_{18})$, and $X_{19}$ may be N or $C(R_{19})$, $X_{43}$ may be N or $C(R_{43})$, $X_{44}$ may be N or $C(R_{44})$, $X_{45}$ may be N or $C(R_{45})$, $X_{46}$ may be N or $C(R_{46})$, $X_{47}$ may be N or $C(R_{47})$, $X_{48}$ may be N or $C(R_{48})$, and $X_{49}$ may be N or $C(R_{49})$, $R_{13}$ to $R_{19}$ may each independently be the same as described in connection with $R_1$ in the present specification, and $R_{43}$ to $R_{49}$ may each independently be the same as described in connection with $R_4$ in the present specification.

In one embodiment, the organometallic compound may be represented by one of Formulae 1-5 to 1-7:

Formula 1-5

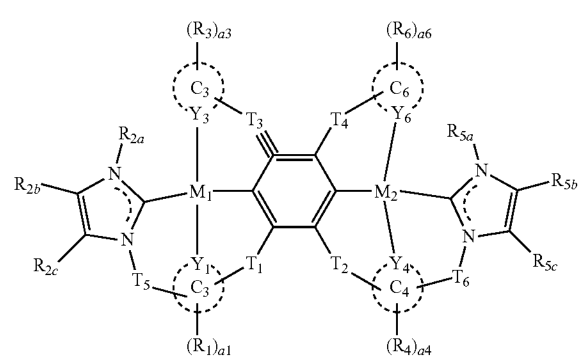

-continued

Formula 1-6

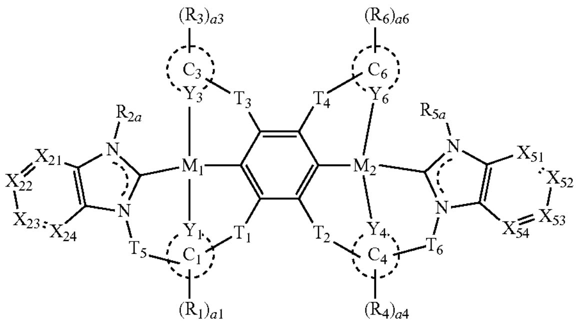

Formula 1-7

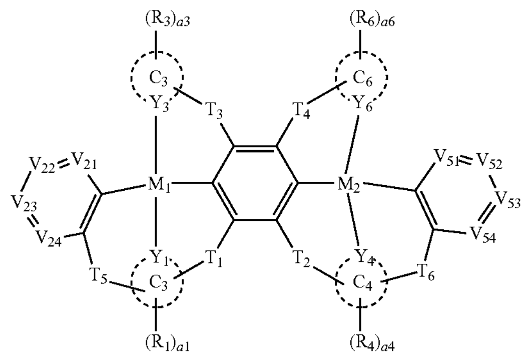

In Formulae 1-5 to 1-7, $M_1$, $M_2$, $C_1$, $C_3$, $C_4$, $C_6$, $R_1$, $R_3$, $R_4$, $R_6$, a1, a3, a4, a6, $T_1$ to $T_6$, $Y_1$, $Y_3$, $Y_4$, and $Y_6$ may each be the same as respectively described above in the present specification, $X_{21}$ may be N or $C(R_{21})$, $X_{22}$ may be N or $C(R_{22})$, $X_{23}$ may be N or $C(R_{23})$, and $X_{24}$ may be N or $C(R_{24})$, $X_{51}$ may be N or $C(R_{51})$, $X_{52}$ may be N or $C(R_{52})$, $X_{53}$ may be N or $C(R_{53})$, and $X_{54}$ may be N or $C(R_{54})$, $V_{21}$ may be N or $C(RV_{21})$, $V_{22}$ may be N or $C(RV_{22})$, $V_{23}$ may be N or $C(RV_{23})$, and $V_{24}$ may be N or $C(RV_{24})$, $V_{51}$ may be N or $C(RV_{51})$, $V_{52}$ may be N or $C(RV_{52})$, $V_{53}$ may be N or $C(RV_{53})$, and $V_{54}$ may be N or $C(RV_{54})$, $R_{2a}$ to $R_{2c}$, $R_{21}$ to $R_{24}$, and $RV_{21}$ to $RV_{24}$ may each independently be the same as described in connection with $R_2$ in the present specification, and $R_{5a}$ to $R_{5c}$, $R_{51}$ to $R_{54}$, and $RV_{51}$ to $RV_{54}$ may each independently be the same as described in connection with $R_5$ in the present specification.

In one embodiment, the organometallic compound may be selected from Compounds BD 1 to BD 93:

BD 1

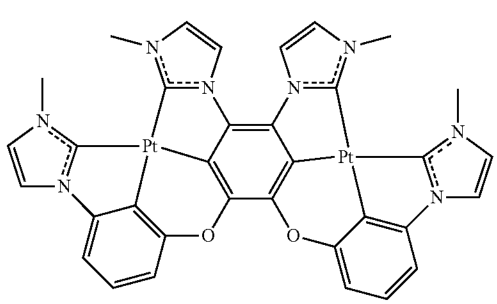

-continued

BD 2

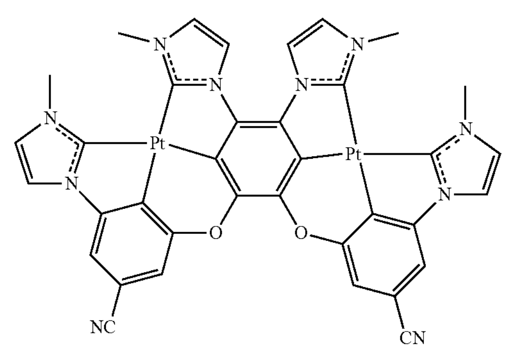

BD 3

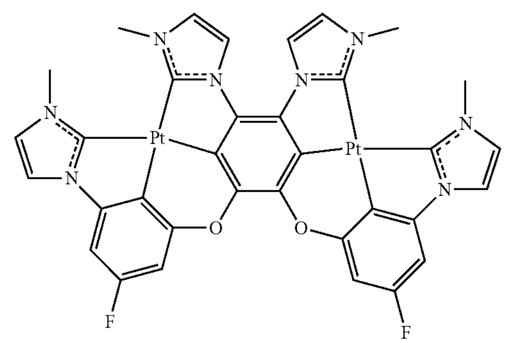

BD 4

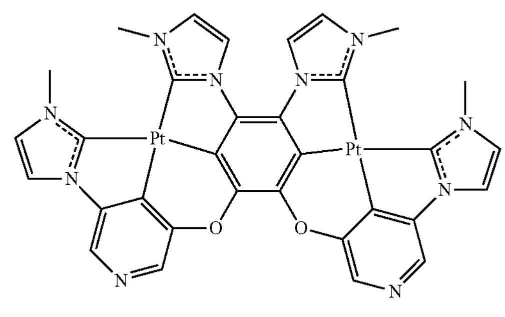

BD 5

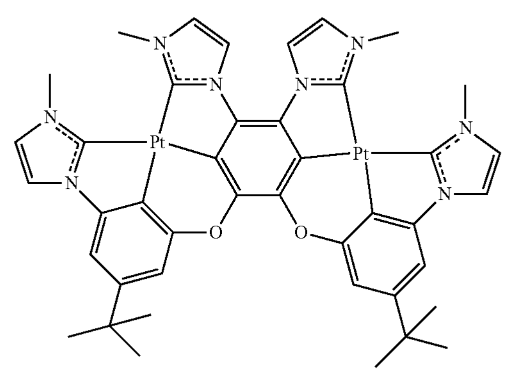

-continued
BD 6
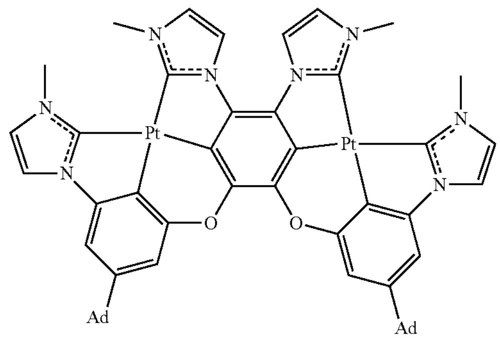
BD 7
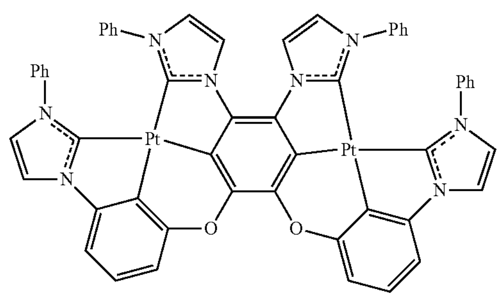
BD 8
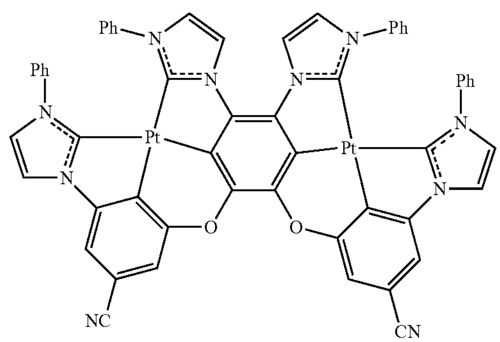
BD 9
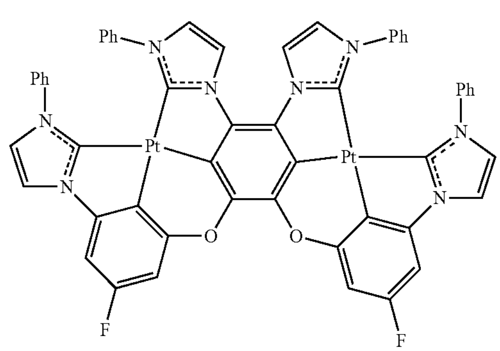
-continued
BD 10
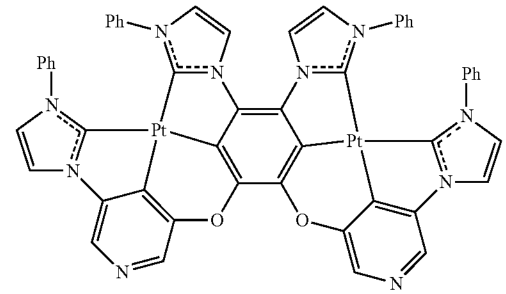
BD 11
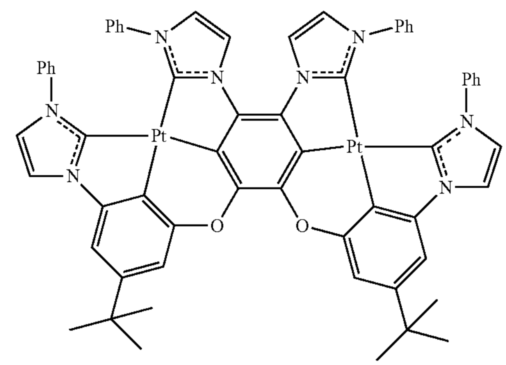
BD 12
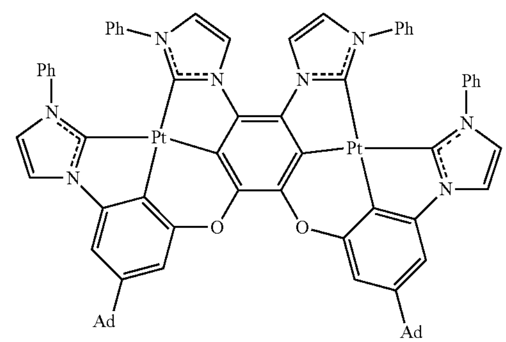
BD 13
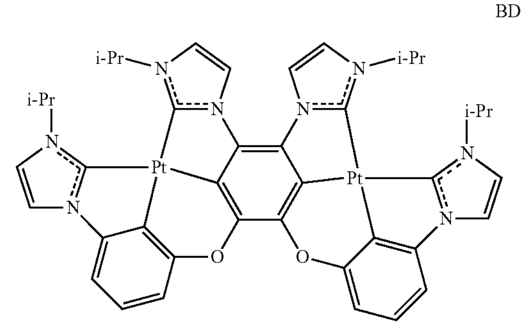

-continued
BD 14
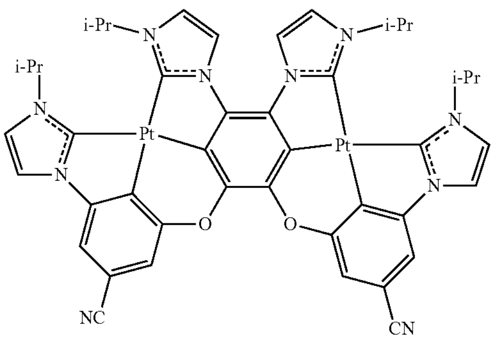
BD 15
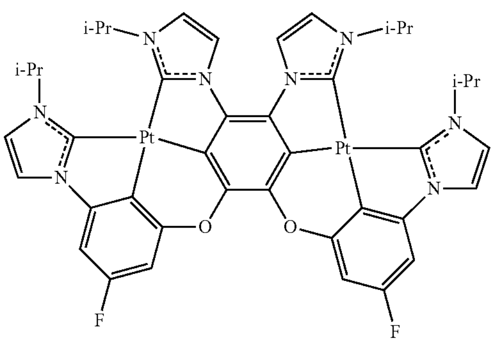
BD 16
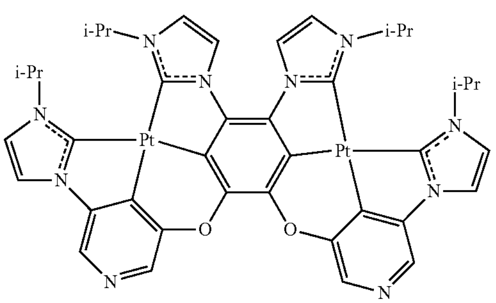
BD 17
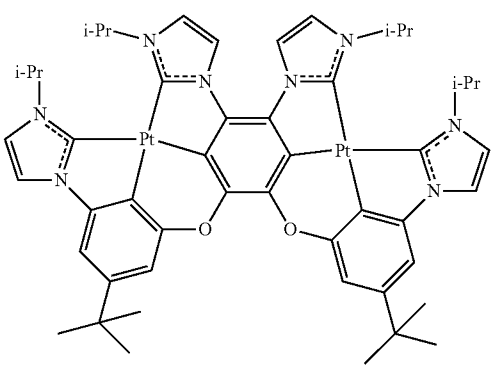
-continued
BD 18
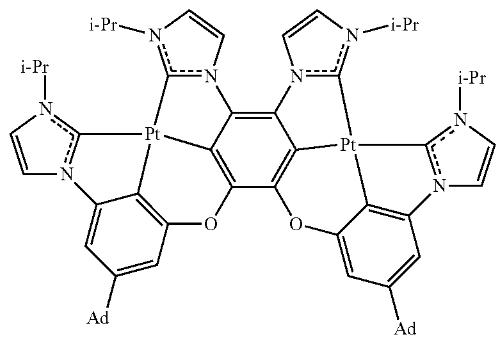
BD 19
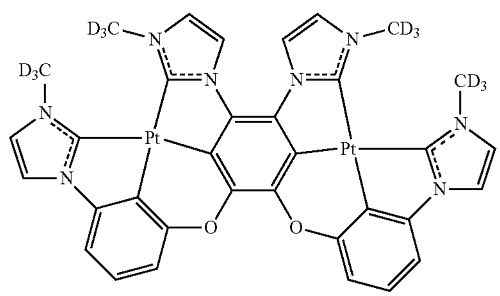
BD 20
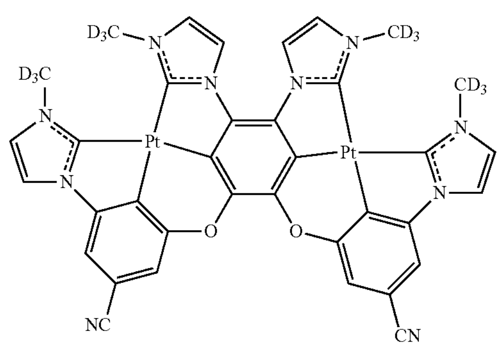
BD 21
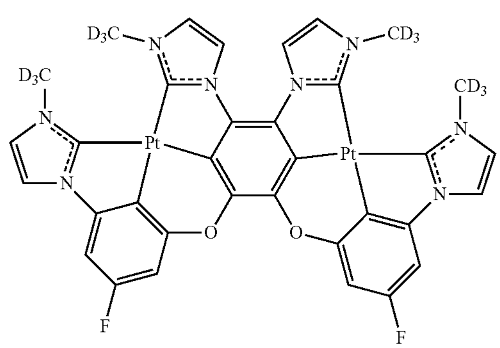

-continued
BD 22
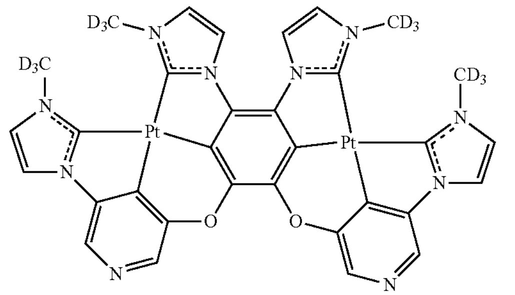
BD 23
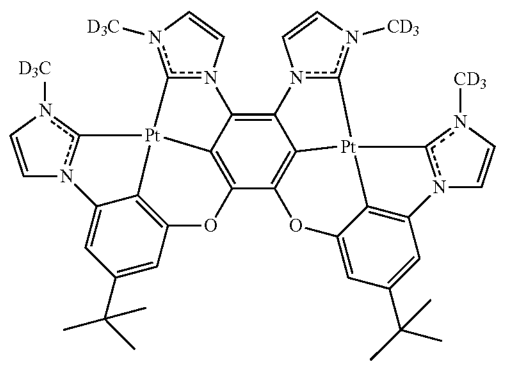
BD 24
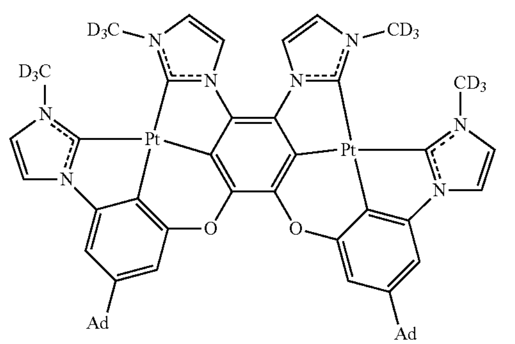
BD 25
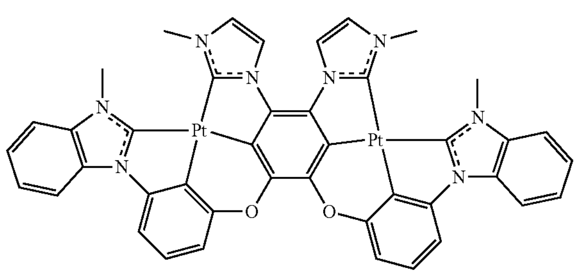
-continued
BD 26
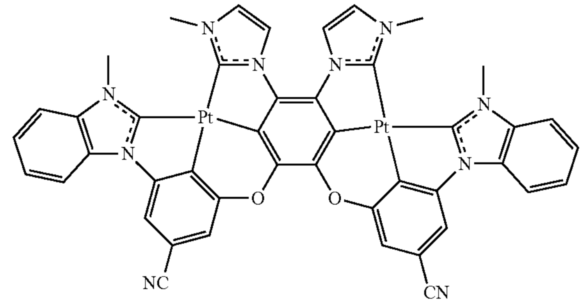
BD 27
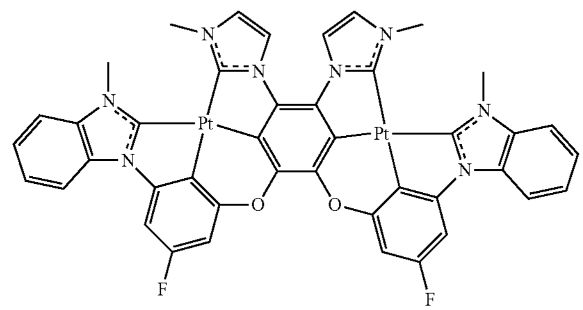
BD 28
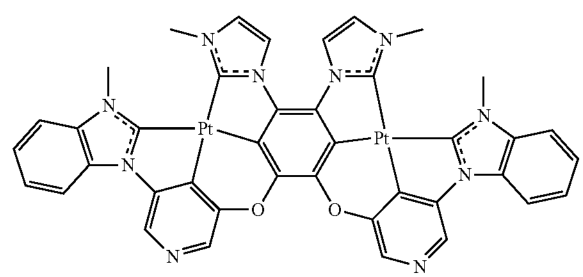
BD 29
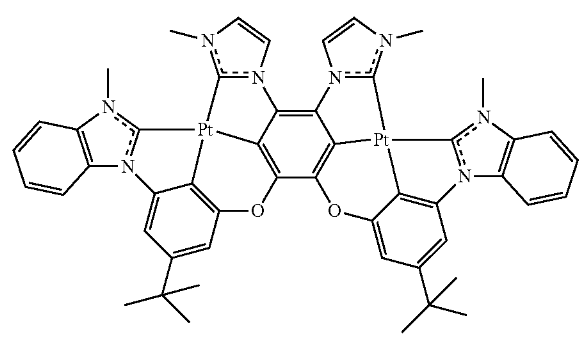
BD 30
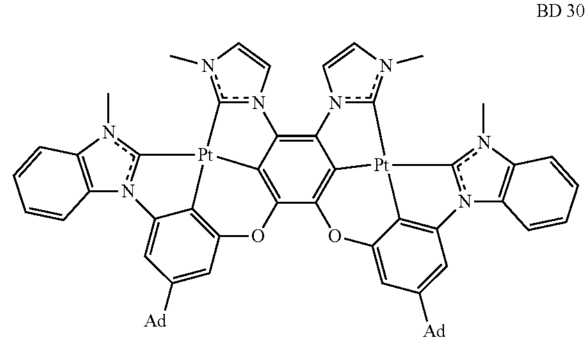

-continued
BD 31
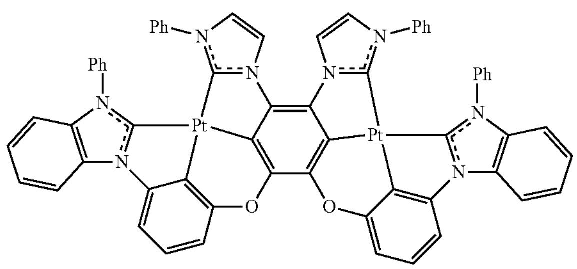
BD 32
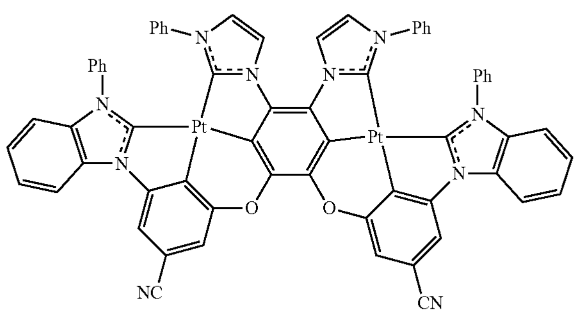
BD 33
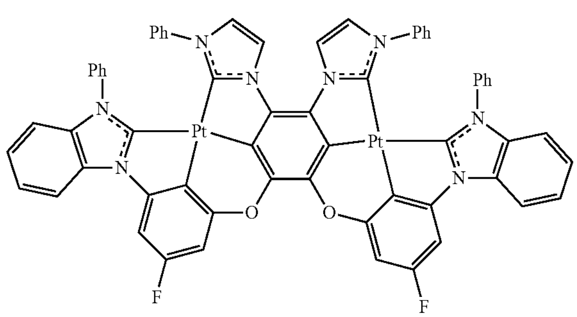
BD 34
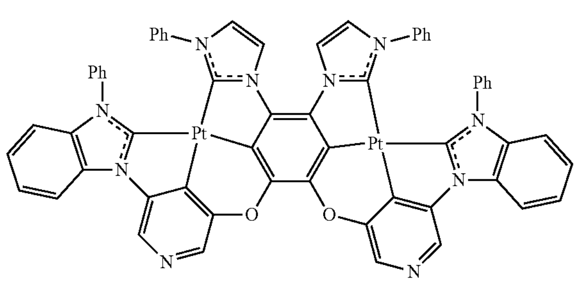
BD 35
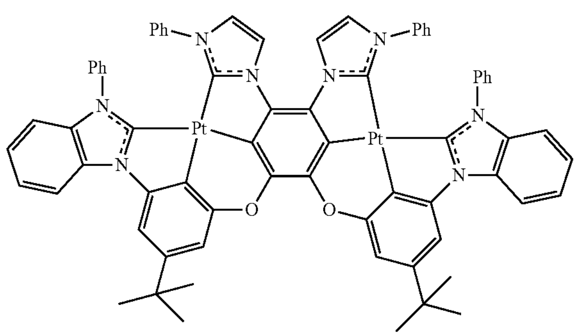
-continued
BD 36
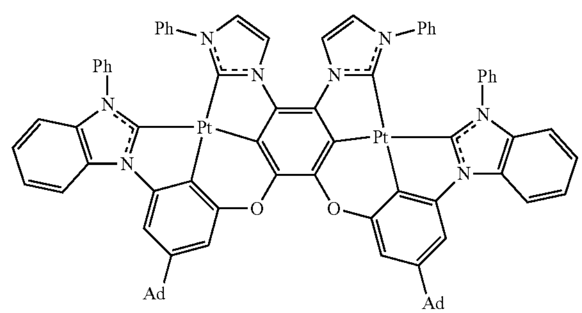
BD 37
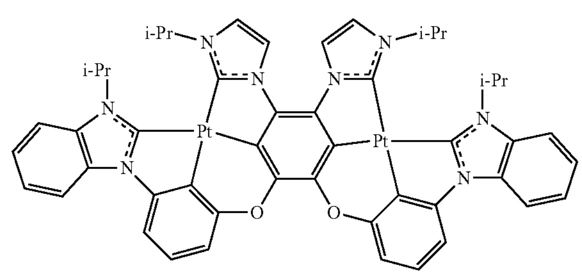
BD 38
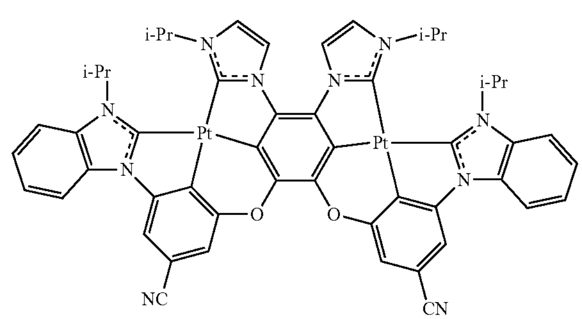
BD 39
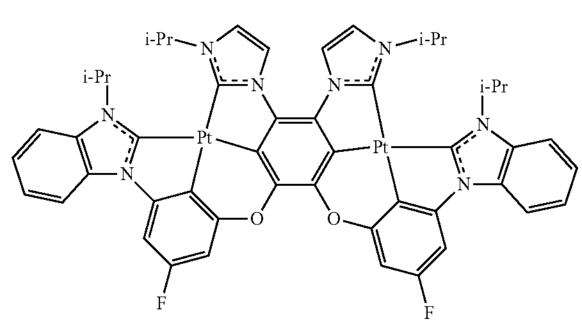
BD 40
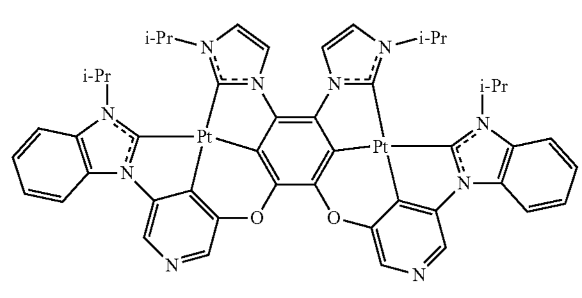

BD 41
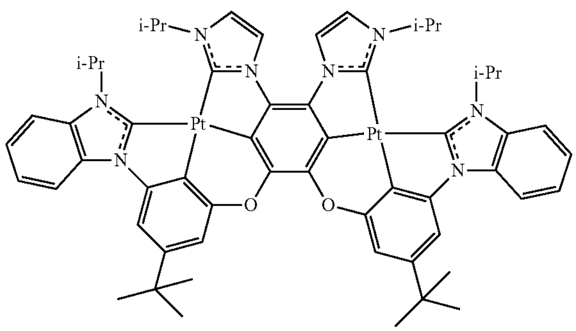
BD 42
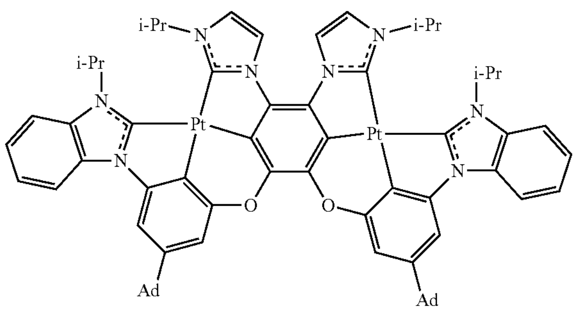
BD 43
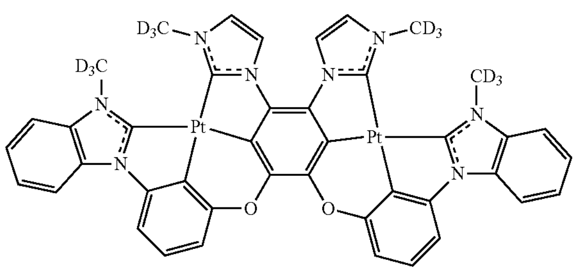
BD 44
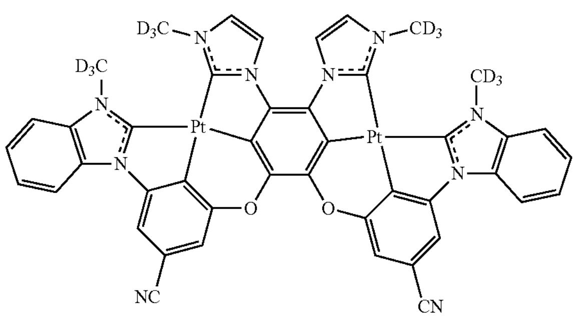
BD 45
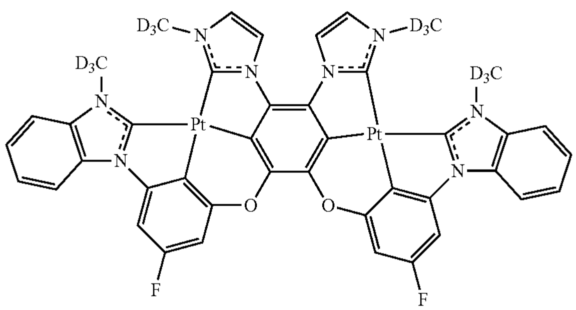
BD 46
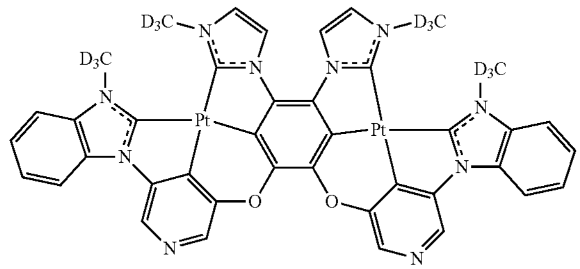
BD 47
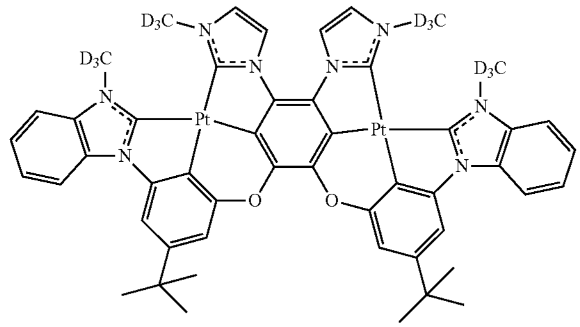
BD 48
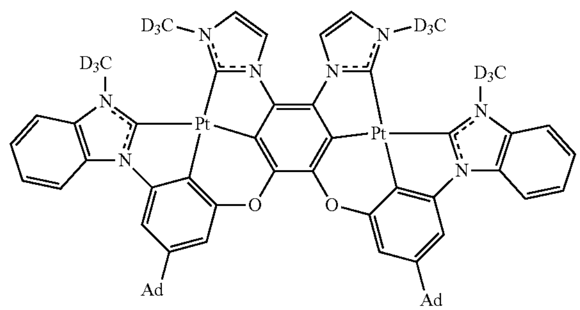
BD 49
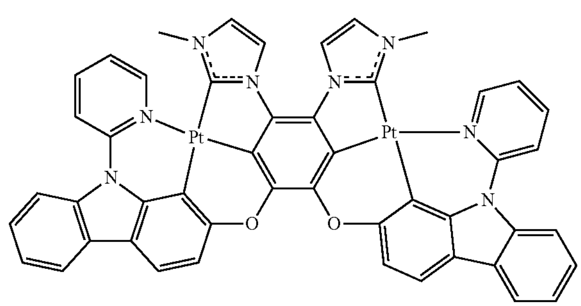
BD 50
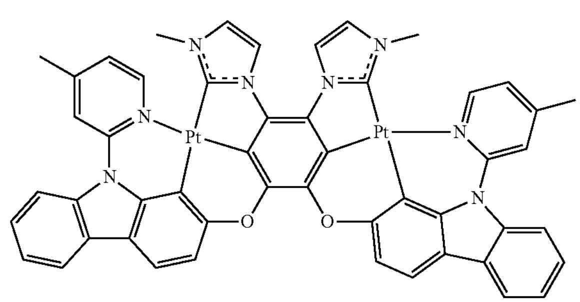

BD 51
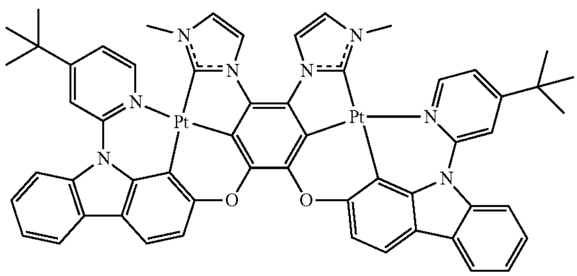
BD 52
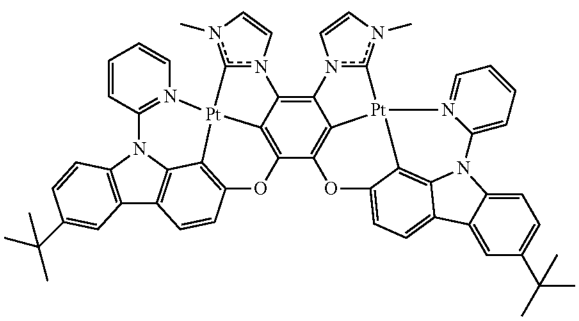
BD 53
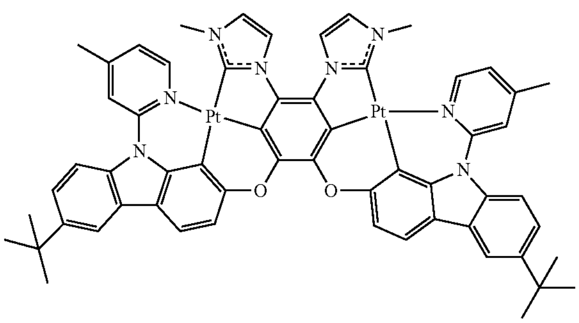
BD 54
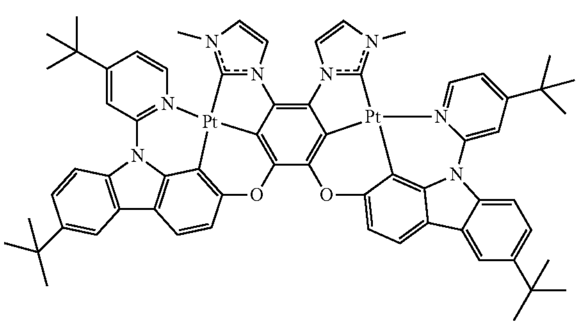
BD 55
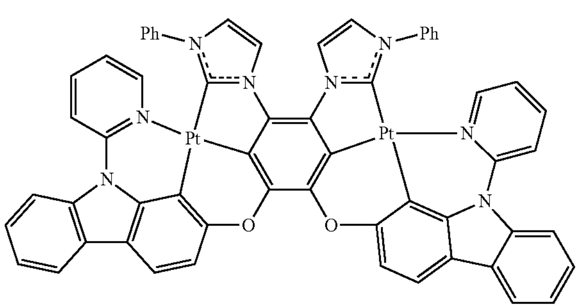
BD 56
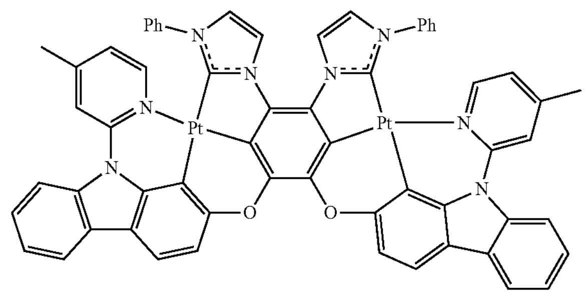
BD 57
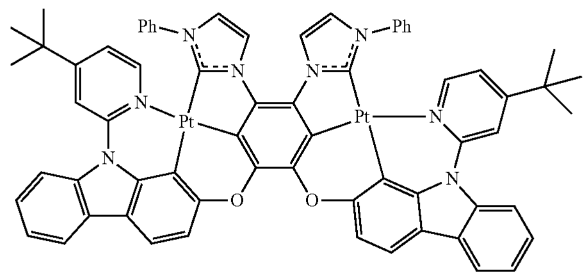
BD 58
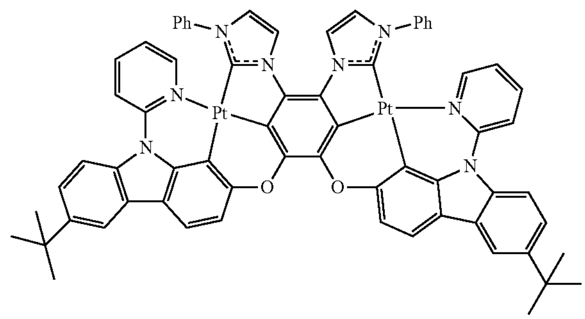
BD 59
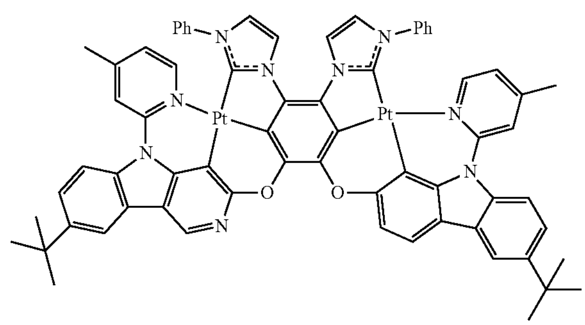
BD 60
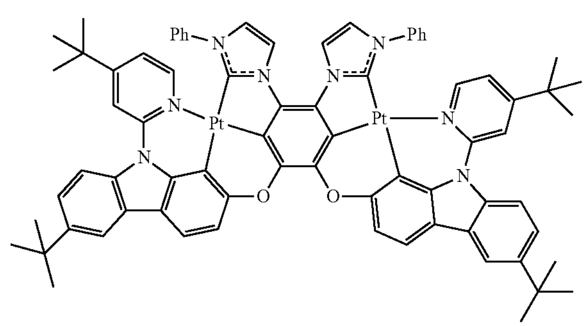

-continued
BD 61
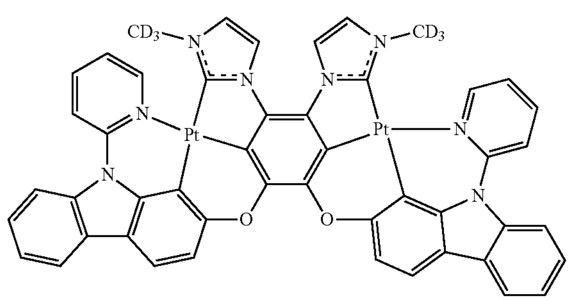
BD 62
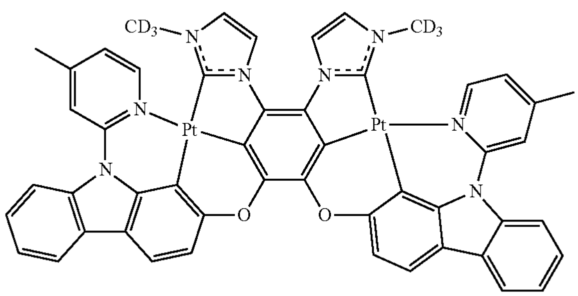
BD 63
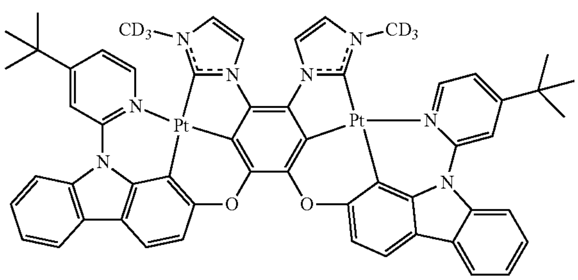
BD 64
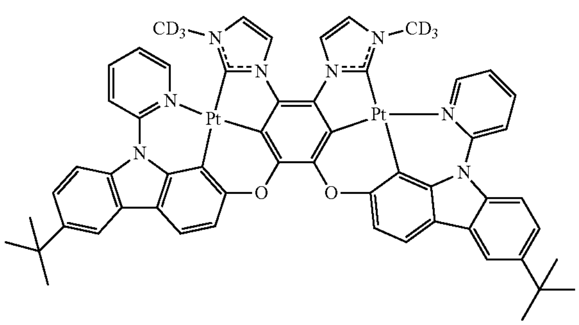
BD 65
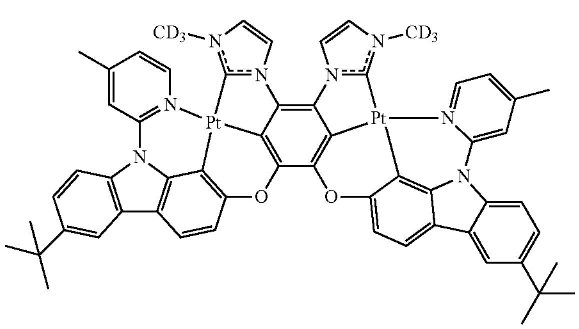
-continued
BD 66
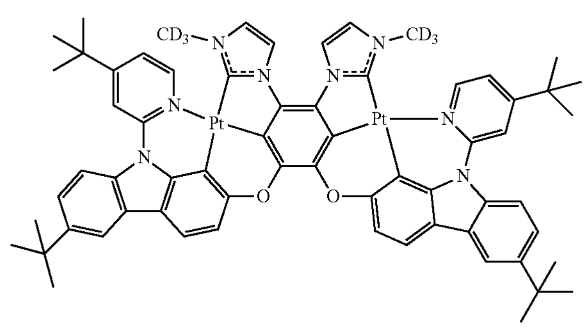
BD 67
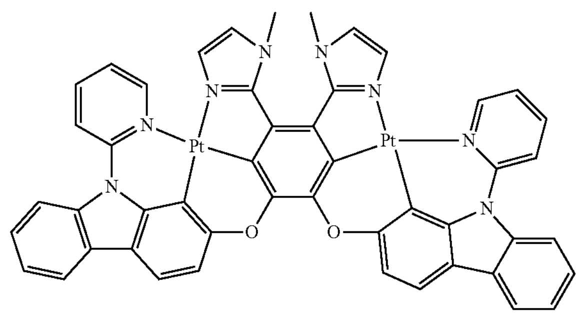
BD 68
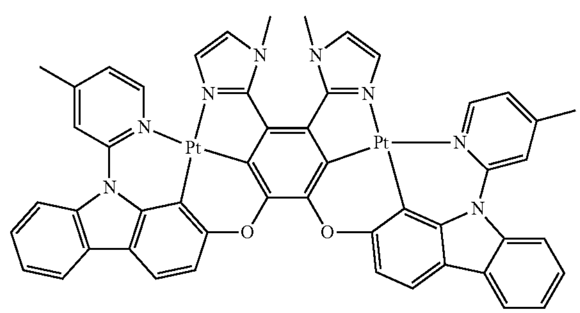
BD 69
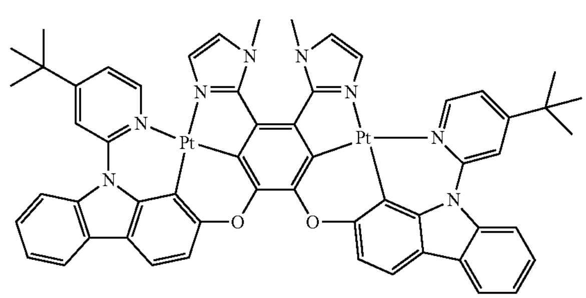
BD 70
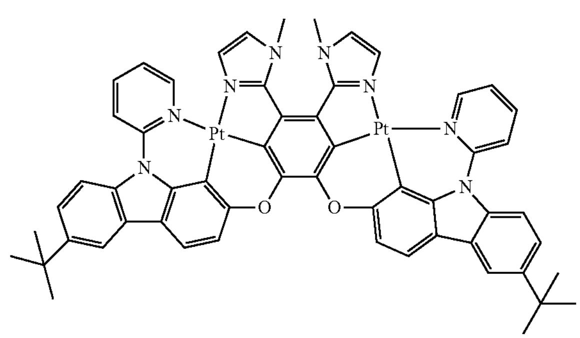

-continued
BD 71
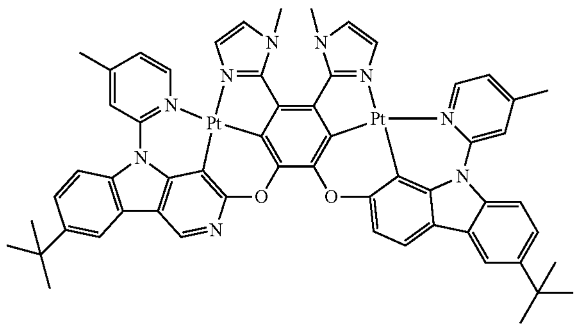
BD 72
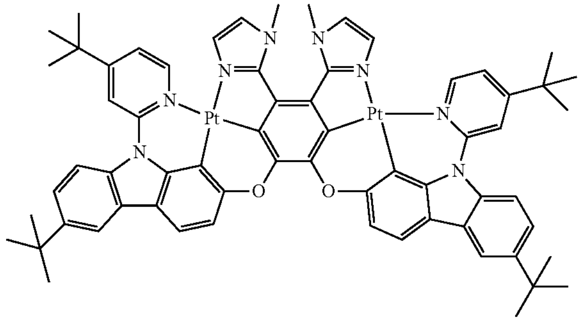
BD 73
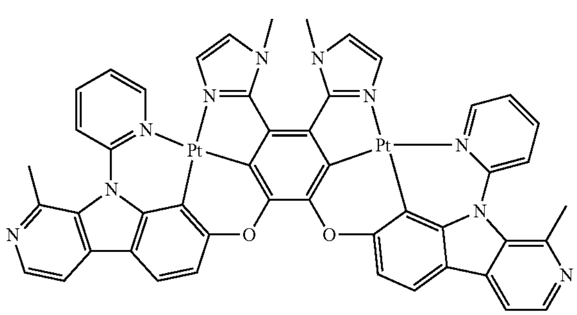
BD 74
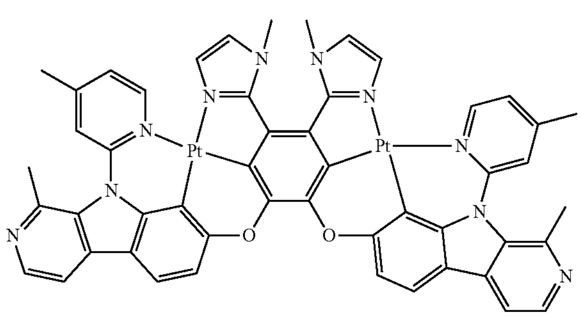
-continued
BD 75
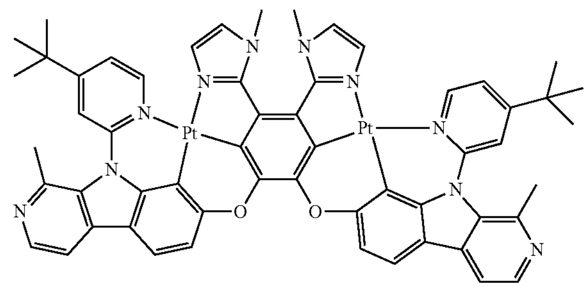
BD 76
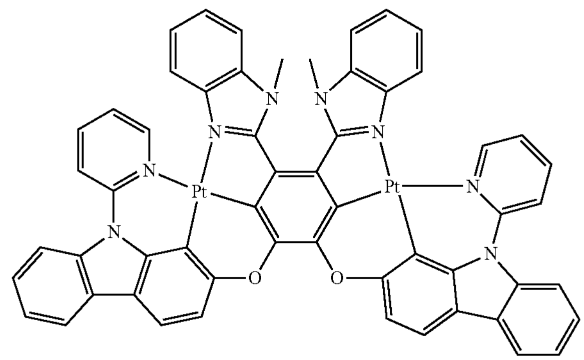
BD 77
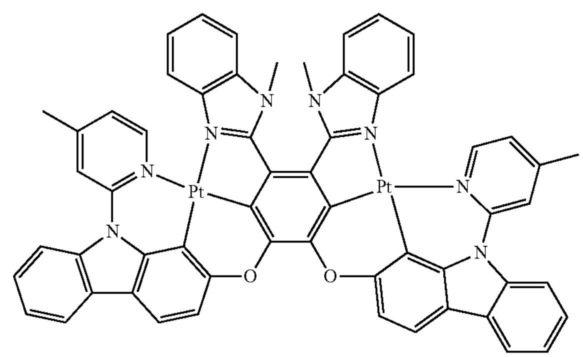
BD 78
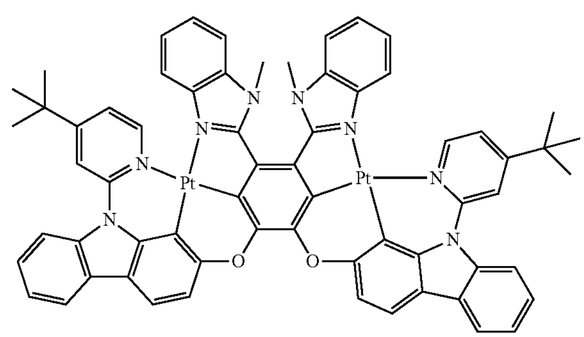

BD 79
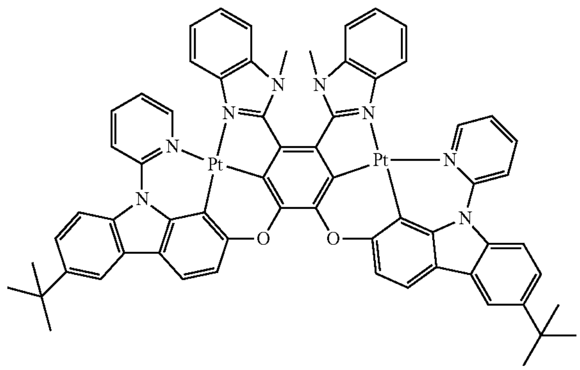
BD 80
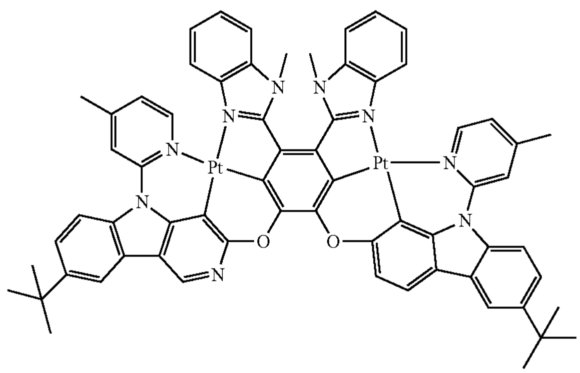
BD 81
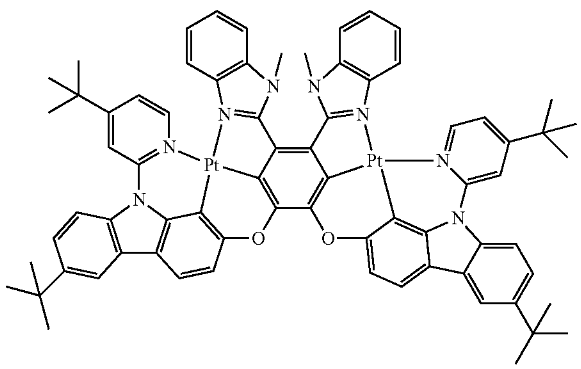
BD 82
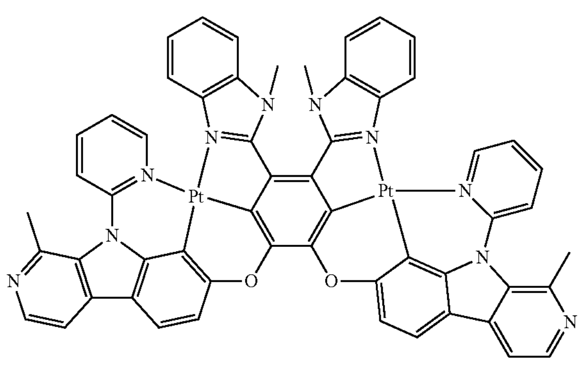
BD 83
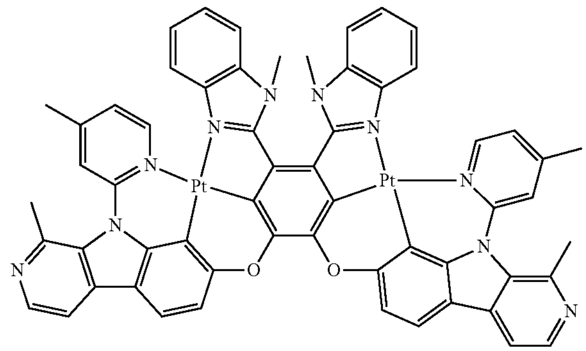
BD 84
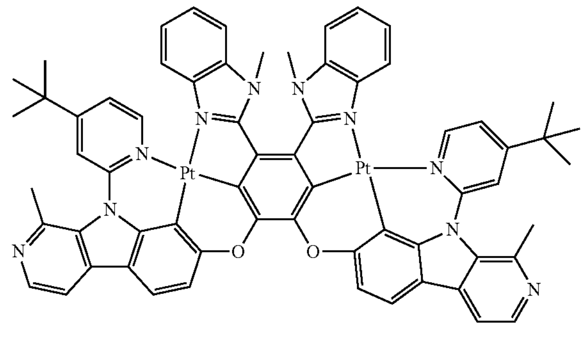
BD 85
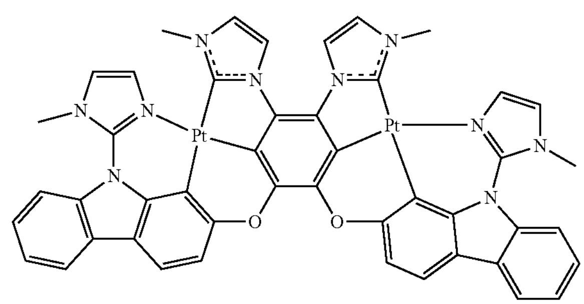
BD 86
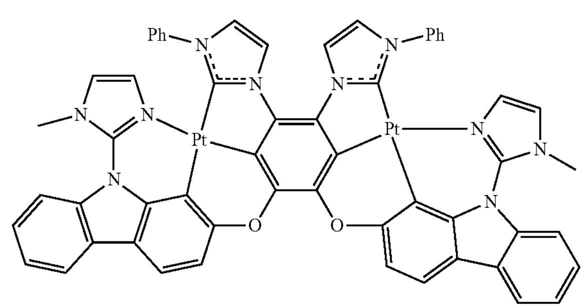

-continued

BD 87

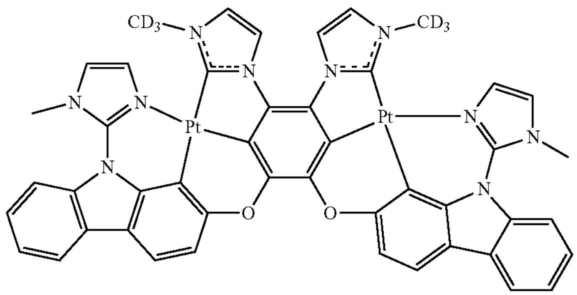

BD 88

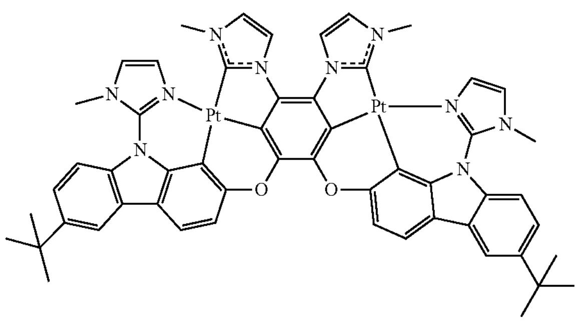

BD 89

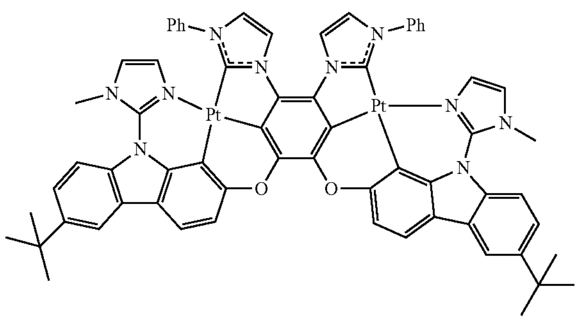

BD 90

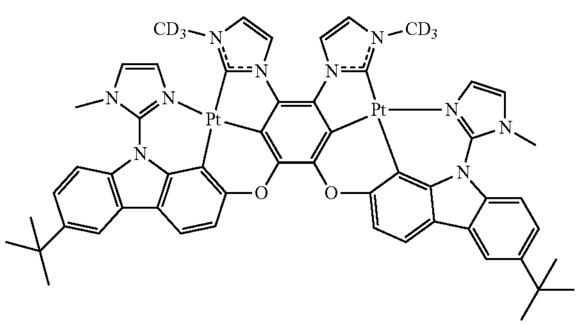

BD 91

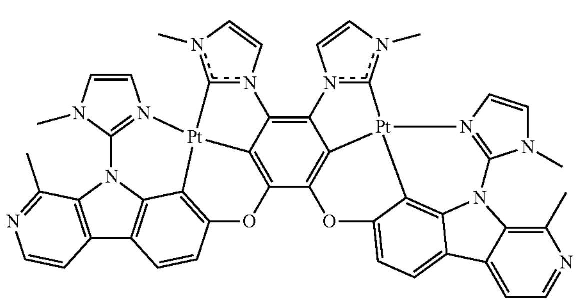

-continued

BD 92

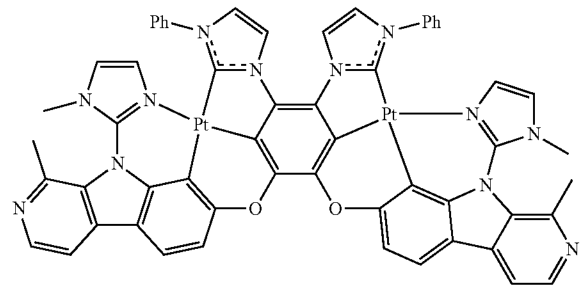

BD93

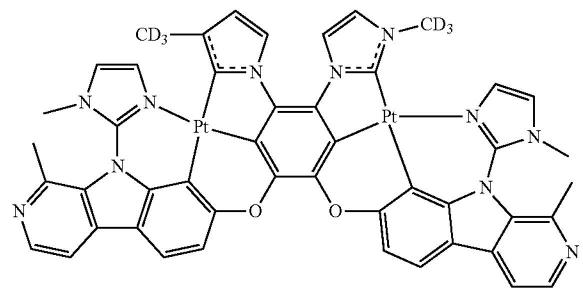

The organometallic compound represented by Formula 1 is a heteronuclear complex including two central metals, and more bulky substituents may be introduced thereto by sharing a benzene ring as a ligand. Accordingly, the tilt angle between ligands becomes larger, and as a result, excimer and exciplex formation between compounds may be suppressed, thereby providing (e.g., improving) long lifespan characteristics.

In addition, because the organometallic compound represented by Formula 1 is a heteronuclear complex including two central metals, an area of a light-emitting moiety increases, thereby increasing the luminescence efficiency.

According to another embodiment of the present disclosure, an organic light-emitting device includes: a first electrode; a second electrode; and an organic layer located between the first electrode and the second electrode and including an emission layer, wherein the organic layer includes the organometallic compound.

In one embodiment, the emission layer may include the organometallic compound.

In one embodiment, the emission layer may further include a second compound and a third compound; the organometallic compound, the second compound, and the third compound may be different from each other; the second compound and the third compound may form an exciplex; and the organometallic compound and the second compound and/or the organometallic compound and the third compound may not form an exciplex.

When the organometallic compound has a heteronuclear complex structure, the exciplex formation with an organic compound may be suppressed, thereby improving color purity and luminescence efficiency of the organometallic compound.

In one embodiment, the second compound may be represented by Formula 2, and the third compound may include a group represented by Formula 3:

Formula 2

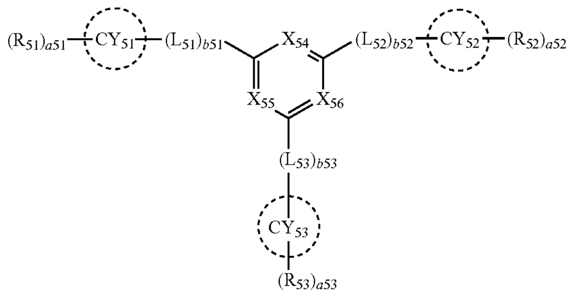

Formula 3

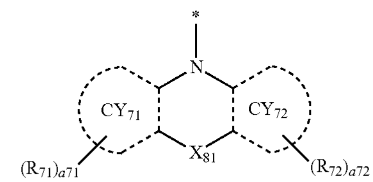

In Formulae 2 and 3, ring $CY_{51}$ to ring $CY_{53}$, ring $CY_{71}$, and ring $CY_{72}$ may each independently be selected from a $C_5$-$C_{30}$ carbocyclic group and a $C_1$-$C_{30}$ heterocyclic group.

In one embodiment, in Formulae 2 and 3, ring $CY_{51}$ to ring $CY_{53}$, ring $CY_{71}$, and ring $CY_{72}$ may each independently be selected from i) a first ring, ii) a second ring, iii) a condensed ring in which two or more first rings are condensed with each other, iv) a condensed ring in which two or more second rings are condensed with each other, and v) a condensed ring in which one or more first rings and one or more second rings are condensed with each other, the first ring may be selected from a cyclopentane group, a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the second ring may be selected from an adamantane group, a norbornane group, a norbornene group, a cyclohexane group, a cyclohexene group, a benzene group, a pyridine group, a pyrimidine group, a pyrazine group, a pyridazine group, a triazine group, an oxasiline group, a thiasiline group, a dihydroazasiline group, a dihydrodisiline group, a dihydrosiline group, a dioxine group, an oxathiine group, an oxazine group, a pyran group, a dithiine group, a thiazine group, a thiopyran group, a cyclohexadiene group, a dihydropyridine group, and a dihydropyrazine group.

For example, in Formulae 2 and 3, ring $CY_{51}$ to ring $CY_{53}$, ring $CY_{71}$, and ring $CY_{72}$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, but embodiments of the present disclosure are not limited thereto.

In Formula 2, $L_{51}$ to $L_{53}$ may each independently be selected from a substituted or unsubstituted $C_5$-$C_{30}$ carbocyclic group and a substituted or unsubstituted $C_1$-$C_{30}$ heterocyclic group. In Formula 2, $L_{51}$ to $L_{53}$ may each independently be selected from a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted heterocycloalkylene group, a substituted or unsubstituted $C_3$-$C_{10}$ cycloalkenylene group, a substituted or unsubstituted heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In one embodiment, in Formula 2, $L_{51}$ to $L_{53}$ may each independently be selected from: a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group;

a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$; and —$C(Q_{31})(Q_{32})$-*', *—$Si(Q_{31})(Q_{32})$-*', *—$N(Q_{31})$-*', *—$B(Q_{31})$-*', *—C(=O)—*', *—$S(=O)_2$—*', and *—$P(=O)(Q_{31})$-*', $Q_{31}$ to $Q_{33}$ may each independently be selected from hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, and a triazinyl group, but embodiments of the present disclosure are not limited thereto, and

* and *' each indicate a binding site to an adjacent atom.

In Formulae 2 and 3, a bond between $L_{51}$ and ring $CY_{51}$, a bond between $L_{52}$ and ring $CY_{52}$, a bond between $L_{53}$ and ring $CY_{53}$, a bond between two or more $L_{51}$(s), a bond between two or more $L_{52}$(s), a bond between two or more $L_{53}$(s), a bond between $L_{51}$ and the carbon atom between $X_{54}$ and $X_{55}$ in Formula 2, a bond between $L_{52}$ and the carbon atom between $X_{54}$ and $X_{56}$ in Formula 2, and a bond between $L_{53}$ and the carbon atom between $X_{55}$ and $X_{56}$ in Formula 2 may each be a carbon-carbon single bond.

In Formula 2, b51 to b53 may each independently be an integer from 0 to 5, wherein, when b51 is 0, *-$(L_{51})_{b51}$-*' may be a single bond, when b52 is 0, *-$(L_{52})_{b52}$-*' may be a single bond, and when b53 is 0, *-$(L_{53})_{b53}$-*' may be a single bond.

For example, b51 to b53 may each independently be 0, 1, or 2.

In Formula 2, $X_{54}$ may be N or $C(R_{54})$, $X_{55}$ may be N or $C(R_{55})$, $X_{56}$ may be N or $C(R_{56})$, and at least one selected from $X_{54}$ to $X_{56}$ may be N. $R_{54}$ to $R_{56}$ may be the same as described above in the present specification.

In Formula 3, $X_{81}$ may be a single bond, O, S, $N(R_{81})$, $B(R_{81})$, $C(R_{81a})(R_{81b})$, or $Si(R_{81a})(R_{81b})$. $R_{81}$, $R_{81a}$, and $R_{81b}$ may be the same as described above in the present specification.

In Formulae 2 and 3, $R_{51}$ to $R_{56}$, $R_{71}$, $R_{72}$, $R_{81}$, $R_{81a}$, and $R_{81b}$ may each independently be selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, and $Q_1$ to $Q_3$ may each independently be the same as described above in the present specification.

In one embodiment, in Formulae 2 and 3, $R_{51}$ to $R_{56}$, $R_{71}$, $R_{72}$, $R_{81}$, $R_{81a}$, and $R_{81b}$ may each independently be selected from:

hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, and an indolocarbazolyl group;

a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, an indolocarbazolyl group, and a group represented by Formula 91, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a $C_1$-$C_{60}$ alkyl group, a $C_1$-$C_{60}$ alkoxy group, a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, an indolocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$; and $—Si(Q_1)(Q_2)(Q_3)$, $—N(Q_1)(Q_2)$, $—B(Q_1)(Q_2)$, —C(═O)(Qi), $—S(=O)_2(Q_1)$, and —P(═O)(Qi)$(Q_2)$, and wherein $Q_1$ to $Q_3$ and $Q_{31}$ to $Q_{33}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group that is substituted with at least one selected from deuterium, —F, a cyano group, a $C_1$-$C_{60}$ alkyl group, a phenyl group, and a biphenyl group, a $C_6$-$C_{60}$ aryl group that is substituted with at least one selected from deuterium, —F, a cyano group, a $C_1$-$C_{10}$ alkyl group, a phenyl group, and a biphenyl group, and a $C_1$-$C_{60}$ heteroaryl group that is substituted with at least one selected from deuterium, —F, a cyano group, a $C_1$-$C_{10}$ alkyl group, a phenyl group, and a biphenyl group, but embodiments of the present disclosure are not limited thereto:

Formula 91

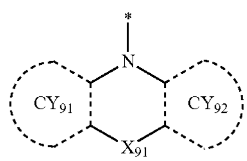

In Formula 91, ring $CY_{91}$ and ring $CY_{92}$ may each independently be selected from a $C_5$-$C_{30}$ carbocyclic group and a $C_1$-$C_{30}$ heterocyclic group, $X_{91}$ may be a single bond, O, S, $N(R_{91})$, $B(R_{91})$, $C(R_{91a})(R_{91b})$, or $Si(R_{91a})(R_{91b})$, $R_{91}$, $R_{91a}$, and $R_{91b}$ are each the same as described in connection with $R_{81}$, $R_{81a}$, and $R_{81b}$, respectively, in the present specification, and

* indicates a binding site to a neighboring atom.

For example, in Formula 91, ring $CY_{91}$ and ring $CY_{92}$ may each independently be selected from a benzene group, a pyridine group, a pyrimidine group, a pyrazine group, a pyridazine group, and a triazine group, $R_{91}$, $R_{91a}$, and $R_{91b}$ may each independently be selected from:

hydrogen and a $C_1$-$C_{10}$ alkyl group;

a phenyl group, a biphenyl group, a pyridinyl group, a pyrimidinyl group, a pyridazinyl group, a pyrazinyl group, and a triazinyl group; and a phenyl group, a pyridinyl group, a pyrimidinyl group, a pyridazinyl group, a pyrazinyl group, and a triazinyl group, each substituted with at least one selected from deuterium, a $C_1$-$C_{10}$ alkyl group, a phenyl group, a biphenyl group, a pyridinyl group, a pyrimidinyl group, a pyridazinyl group, a pyrazinyl group, and a triazinyl group, but embodiments of the present disclosure are not limited thereto.

In Formulae 2 and 3, a51 to a53, a71, and a72 each indicate the number of $R_{51}$(s) to $R_{53}$(s), the number of $R_{71}$ (s), and the number of $R_{72}$(s), respectively, and may each independently be an integer from 0 to 10. When a51 is 2 or more, two or more $R_{51}$(s) may be identical to or different from each other, and a52, a53, a71, and a72 are each understood in the same manner as in a51.

In one embodiment, a group represented by

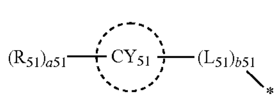

in Formula 2 and a group represented by

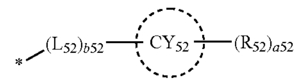

in Formula 2 may not be each a phenyl group.

In one or more embodiments, a group represented by

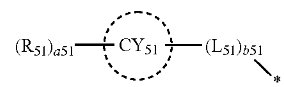

in Formula 2 and a group represented by

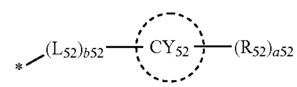

in Formula 2 may be identical to each other.

In one or more embodiments, in Formula 2, ring $CY_{51}$ and ring $CY_{52}$ may each independently be selected from a benzene group, a pyridine group, a pyrimidine group, a pyridazine group, a pyrazine group, and a triazine group, $R_{51}$ and $R_{52}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, and —$Si(Q_1)(Q_2)(Q_3)$, $Q_1$ to $Q_3$ may each independently be selected from a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group and a $C_6$-$C_{60}$ aryl group that is substituted with at least one selected from deuterium, —F, a cyano group, a $C_1$-$C_{10}$ alkyl group, a phenyl group, and a biphenyl group, and a51 and a52 may each independently be 1, 2, or 3.

In one or more embodiments, in Formula 2, a moiety represented by

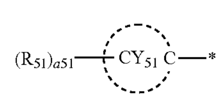

may be selected from groups represented by Formulae CY51-1 to CY51-18, and/or, a moiety represented by
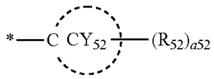
may be selected from groups represented by Formulae CY52-1 to CY52-18, and/or,
a moiety represented by
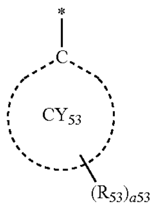
may be selected from groups represented by Formulae CY53-1 to CY53-19:
CY51-1
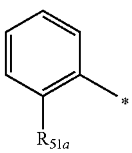
CY51-2
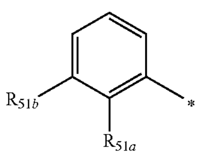
CY51-3
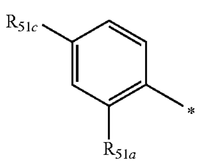
CY51-4
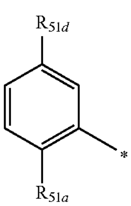
CY51-5
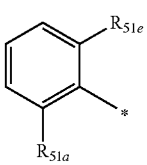
CY51-6
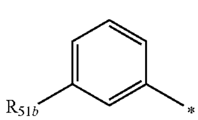
-continued
CY51-7
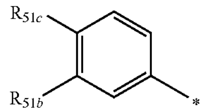
CY51-8
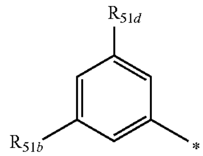
CY51-9
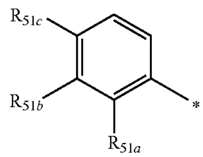
CY51-10
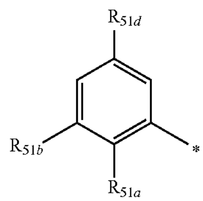
CY51-11
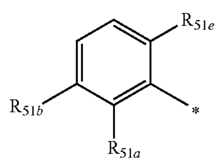
CY51-12
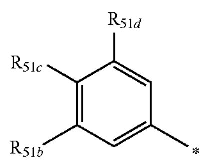
CY51-13
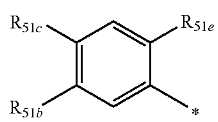
CY51-14
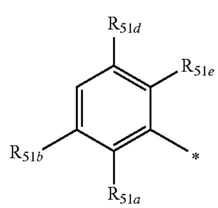
CY51-15
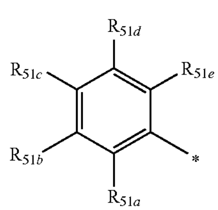

-continued
CY51-16
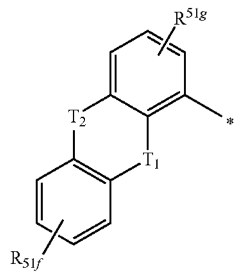
CY51-17
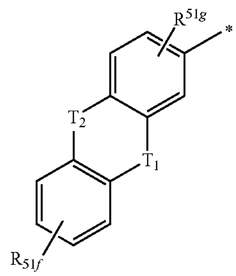
CY51-18
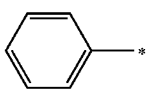
CY52-1
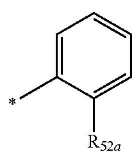
CY52-2
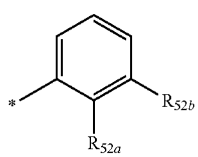
CY52-3
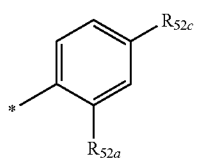
CY52-4
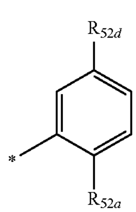
CY52-5
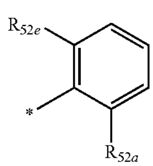
-continued
CY52-6
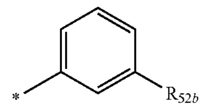
CY52-7
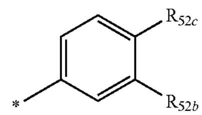
CY52-8
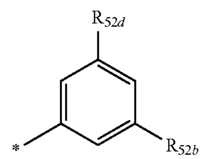
CY52-9
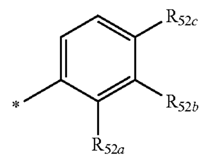
CY52-10
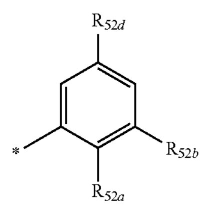
CY52-11
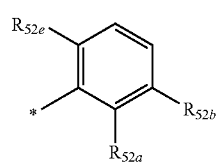
CY52-12
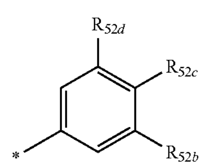
CY52-13
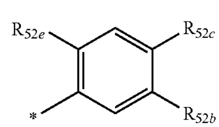
CY52-14
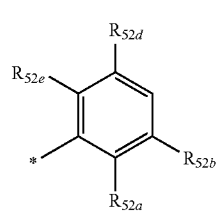

-continued
CY52-15
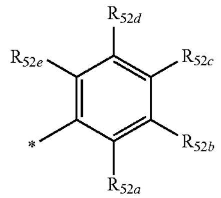
CY52-16
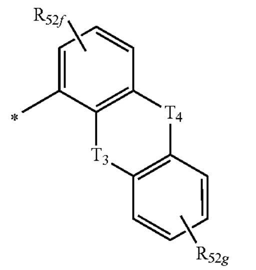
CY52-17
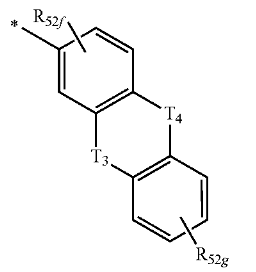
CY52-18
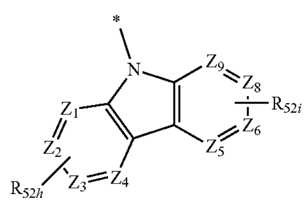
CY53-1
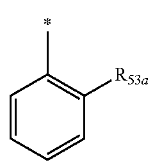
CY53-2
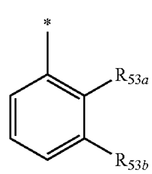
CY53-3
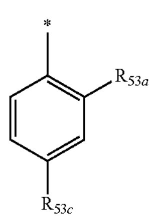
-continued
CY53-4
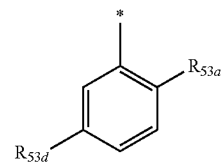
CY53-5
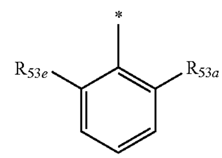
CY53-6
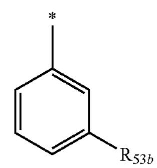
CY53-7
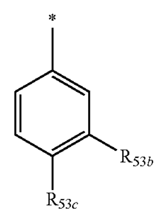
CY53-8
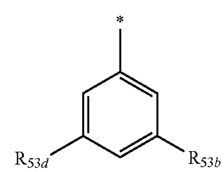
CY53-9
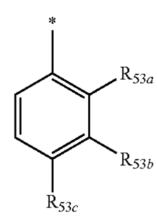
CY53-10
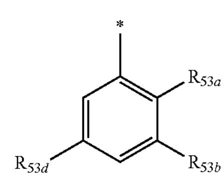
CY53-11
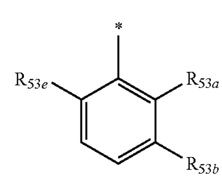

-continued

CY53-12

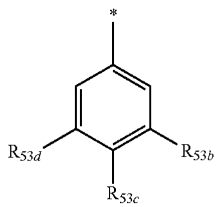

CY53-13

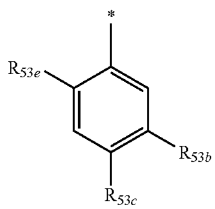

CY53-14

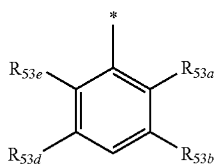

CY53-15

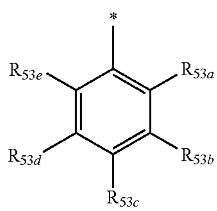

CY53-16

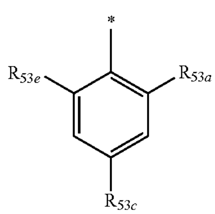

CY53-17

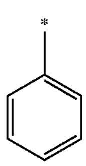

CCY53-18

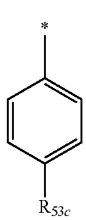

-continued

CY53-19

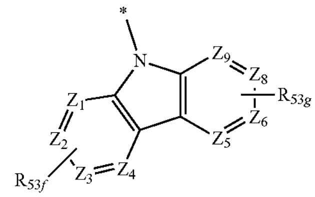

In Formulae CY51-1 to CY51-18, CY52-1 to CY52-18, and CY53-1 to CY53-19, $T_1$ may be a single bond, O, S, $C(T_{11})(T_{12})$, or $Si(T_{11})(T_{12})$, $T_2$ may be a single bond, O, S, $N(T_{21})$, $B(T_{21})$, $C(T_{21})(T_{22})$, or $Si(T_{21})(T_{22})$, $T_3$ may be a single bond, O, S, $N(T_{31})$, $B(T_{31})$, $C(T_{31})(T_{32})$, or $Si(T_{31})(T_{32})$, $T_4$ may be a single bond, O, S, $N(T_{41})$, $B(T_{41})$, $C(T_{41})(T_{42})$, or $Si(T_{41})(T_{42})$, $T_1$ and $T_2$ in Formulae CY51-16 and CY51-17 may not be a single bond at the same time, that is, $T_1$ and $T_2$ in Formulae CY51-16 and CY51-17 may not both be a single bond, $T_3$ and $T_4$ in Formulae CY52-16 and CY52-17 may not be a single bond at the same time, that is, $T_3$ and $T_4$ in Formulae CY52-16 and CY52-17 may not both be a single bond, $R_{51a}$ to $R_{51g}$, $T_{11}$, $T_{12}$, $T_{21}$, and $T_{22}$ may each independently be the same as described in connection with $R_{51}$ in the present specification, but $R_{51a}$ to $R_{51e}$ may not each be hydrogen, for example, none of $R_{51a}$ to $R_{51e}$ may be hydrogen, $R_{52a}$ to $R_{52i}$, $T_{31}$, $T_{32}$, $T_{41}$, and $T_{42}$ may each independently be the same as described in connection with $R_{52}$ in the present specification, but $R_{52a}$ to $R_{52e}$ may not each be hydrogen, for example, none of $R_{52a}$ to $R_{52e}$ may be hydrogen, $R_{53a}$ to $R_{53g}$ may each independently be the same as described in connection with $R_{53}$ in the present specification, but $R_{53a}$ to $R_{53e}$ may not each be hydrogen, for example, none of $R_{53a}$ to $R_{53e}$ may be hydrogen, $Z_1$ to $Z_6$, $Z_8$ and $Z_9$ in Formulae CY52-18 and CY53-19 may each independently be C or N, and

* indicates a binding site to a neighboring atom.

For example, in Formulae CY51-1 to CY51-15 and CY52-1 to CY52-15, $R_{51a}$ to $R_{51e}$ and $R_{52a}$ to $R_{52e}$ may each independently be selected from:

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, and a group represented by Formula 91;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, and a group represented by Formula 91, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and $—C(Q_1)(Q_2)(Q_3)$ and $—Si(Q_1)(Q_2)(Q_3)$, $Q_1$ to $Q_3$ may each independently be selected from:

a phenyl group, a naphthyl group, a pyridinyl group, a pyrimidinyl group, a pyridazinyl group, a pyrazinyl group, and a triazinyl group; and a phenyl group, a naphthyl group, a pyridinyl group, a pyrimidinyl group, a pyridazinyl group, a pyrazinyl group, and a triazinyl group, each substituted with at least one selected from deuterium, a $C_1$-$C_{10}$ alkyl group, a phenyl group, a biphenyl group, a pyridinyl group, a pyrimidinyl group, a pyridazinyl group, a pyrazinyl group, and a triazinyl group, and in Formulae CY51-16 and CY51-17, i) $T_1$ may be O or S, and $T_2$ may be $Si(T_{21})(T_{22})$, or ii) $T_1$ may be $Si(T_{11})(T_{12})$, and $T_2$ may be O or S, and in Formulae CY52-16 and CY52-17, i) $T_3$ may be O or S, and $T_4$ may be $Si(T_{41})(T_{42})$, or ii) $T_3$ may be $Si(T_{31})(T_{32})$, and $T_4$ may be O or S. However, embodiments of the present disclosure are not limited thereto.

In one or more embodiments, the third compound may be represented by one of Formulae 3-1 to 3-5:

3-1

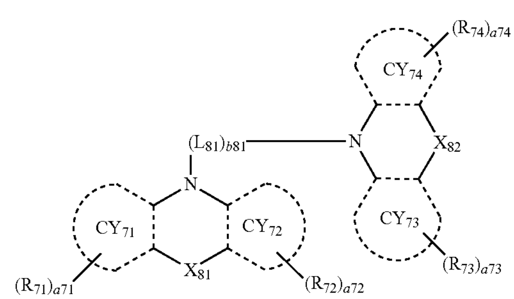

3-2

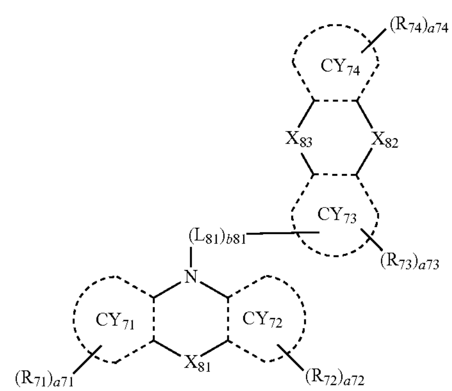

3-3

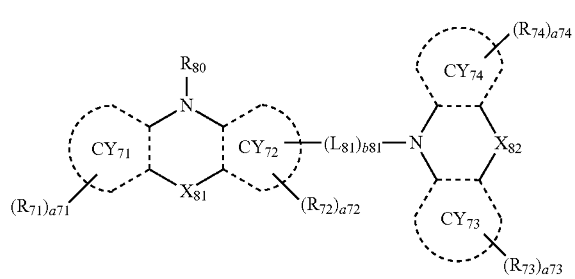

-continued 3-4

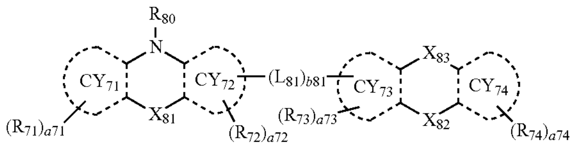

3-5

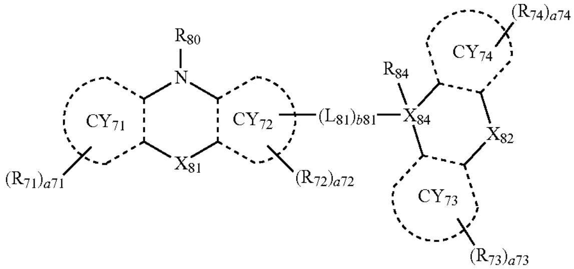

In Formulae 3-1 to 3-5, ring $CY_{71}$, ring $CY_{72}$, $X_{81}$, $R_{71}$, $R_{72}$, a71, and a72 may each be the same as respectively described above in the present specification, ring $CY_{73}$, ring $CY_{74}$, $R_{73}$, $R_{74}$, a73, and a74 may each be the same as described in connection with ring $CY_{71}$, ring $CY_{72}$, $R_{71}$, $R_{72}$, a71, and a72, respectively, in the present specification, $L_{81}$ may be selected from *—C($Q_4$)($Q_5$)—*', *—Si($Q_4$)($Q_5$)—', a substituted or unsubstituted $C_5$-$C_{30}$ carbocyclic group, and a substituted or unsubstituted $C_1$-$C_{30}$ heterocyclic group, wherein $Q_4$ and $Q_5$ may each independently be the same as described in connection with $Q_1$ in the present specification, b81 may be an integer from 0 to 5, wherein, when b81 is 0, *-$(L_{81})_{b81}$-*' may be a single bond, and when b81 is 2 or more, two or more $L_{81}$(s) may be identical to or different from each other, $X_{82}$ may be a single bond, O, S, N($R_{82}$), B($R_{82}$), C($R_{82a}$)($R_{82b}$), or Si($R_{82a}$)($R_{82b}$), $X_{83}$ may be a single bond, O, S, N($R_{83}$), B($R_{83}$), C($R_{83a}$)($R_{83b}$), or Si($R_{83a}$)($R_{83b}$), in Formulae 3-2 and 3-4, $X_{82}$ and $X_{83}$ may not be a single bond at the same time, that is, $X_{82}$ and $X_{83}$ may not both be a single bond, $X_{84}$ may be C or Si, $R_{80}$, $R_{82}$, $R_{83}$, $R_{82a}$, $R_{82b}$, $R_{83a}$, $R_{83b}$, and $R_{84}$ may each independently be the same as described in connection with $R_{81}$ in the present specification, and

* and *' each indicate a binding site to a neighboring atom.

For example, $L_{81}$ may be selected from:

*—C($Q_4$)($Q_5$)—*' and *—Si($Q_4$)($Q_5$)—*';

a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group; and a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(═O)($Q_{31}$), —S(═O)$_2$($Q_{31}$), and —P(═O)($Q_{31}$)($Q_{32}$), and $Q_4$, $Q_5$, and $Q_{31}$ to $Q_{33}$ may each independently be selected from hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, and a triazinyl group, but embodiments of the present disclosure are not limited thereto.

For example, in Formulae 3-1 and 3-2, a moiety represented by

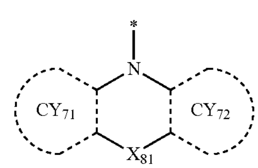

may be selected from groups represented by Formulae CY71-1(1) to CY71-1(8), in Formulae 3-1 and 3-3, a moiety represented by

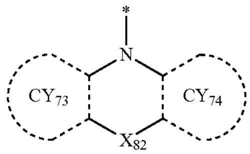

may be selected from groups represented by Formulae CY71-2(1) to CY71-2(8), in Formulae 3-2 and 3-4, a moiety represented by

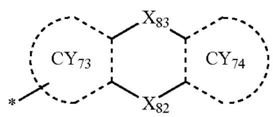

may be selected from groups represented by Formulae CY71-3(1) to CY71-3(32), in Formulae 3-3 to 3-5, a moiety represented by

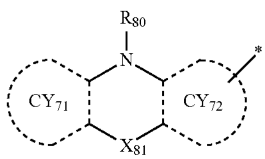

may be selected from groups represented by Formulae CY71-4(1) to CY71-4(32), and in Formula 3-5, a moiety represented by

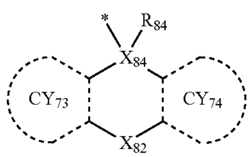

may be selected from groups represented by Formulae CY71-5(1) to CY71-5(8). However, embodiments of the present disclosure are not limited thereto:

CY71-1(1)

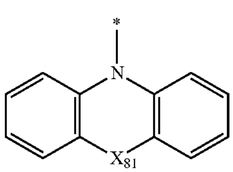

CY71-1(2)

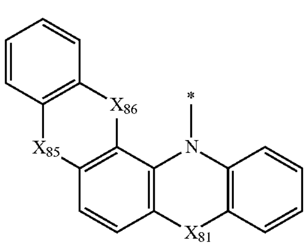

-continued

CY71-1(3)

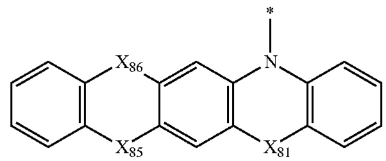

CY71-1(4)

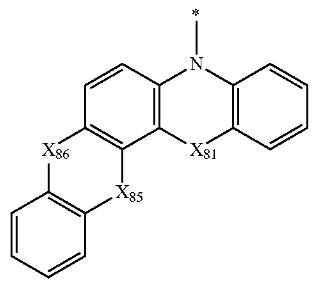

CY71-1(5)

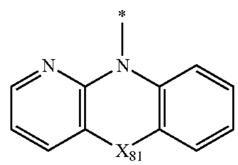

CY71-1(6)

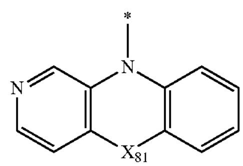

CY71-1(7)

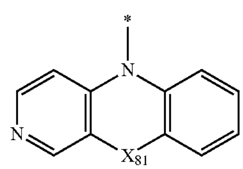

CY71-1(8)

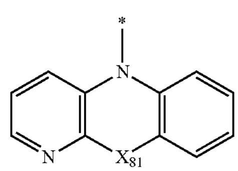

CY71-2(1)

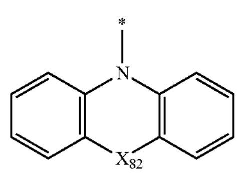

CY71-2(2)

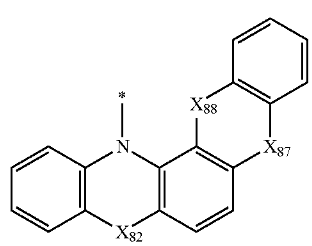

-continued
CY71-2(3)
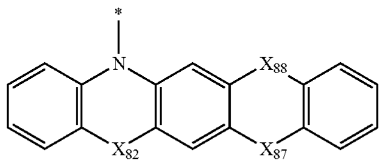
CY71-2(4)
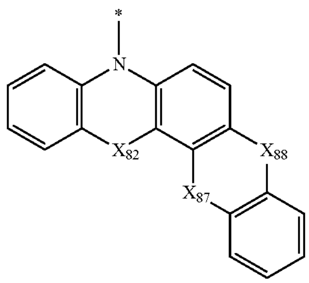
CY71-2(5)
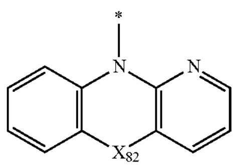
CY71-2(6)
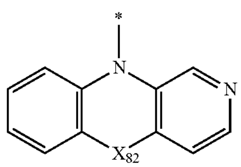
CY71-2(7)
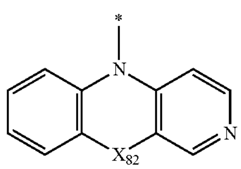
CY71-2(8)
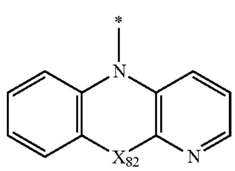
CY71-3(1)
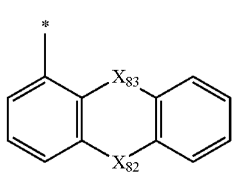
CY71-3(2)
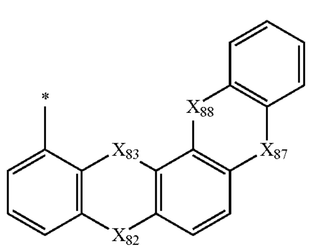
-continued
CY71-3(3)
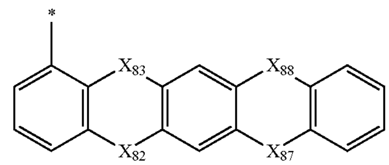
CY71-3(4)
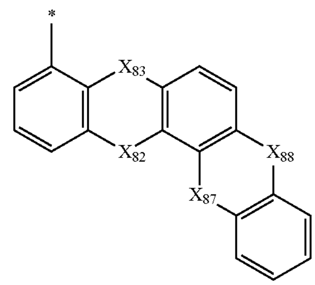
CY71-3(5)
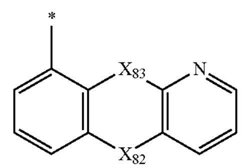
CY71-3(6)
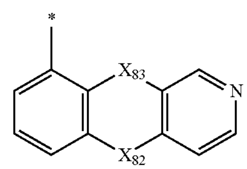
CY71-3(7)
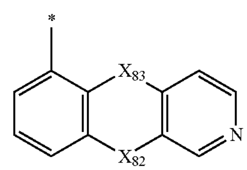
CY71-3(8)
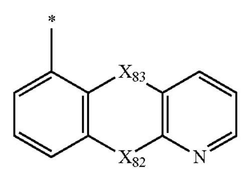
CY71-3(9)
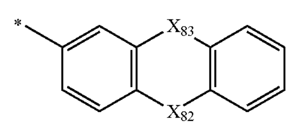
CY71-3(10)
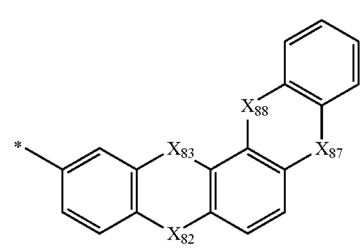

-continued
CY71-3(11)
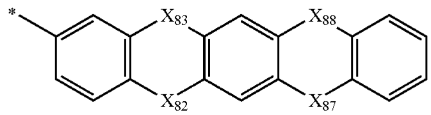
CY71-3(12)
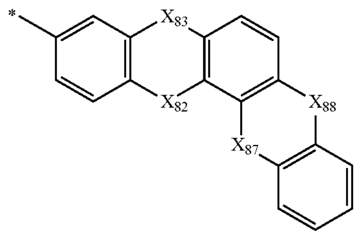
CY71-3(13)
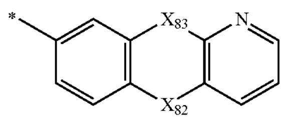
CY71-3(14)
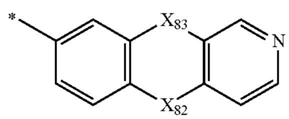
CY71-3(15)
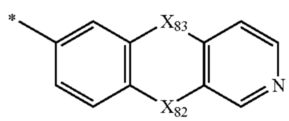
CY71-3(16)
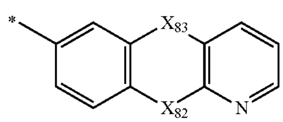
CY71-3(17)
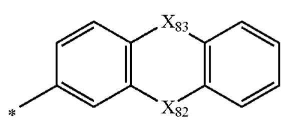
CY71-3(18)
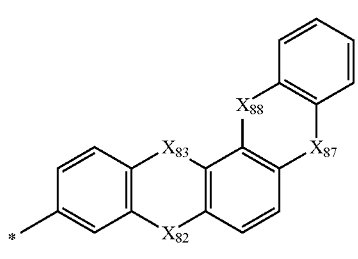
CY71-3(19)
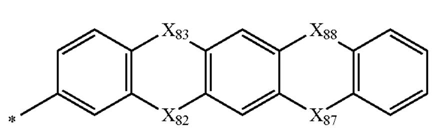
-continued
CY71-3(20)
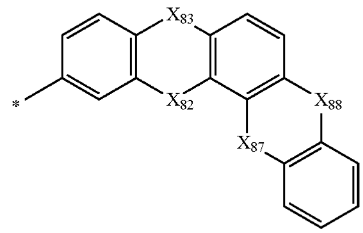
CY71-3(21)
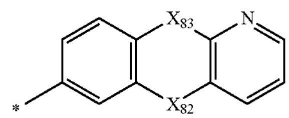
CY71-3(22)
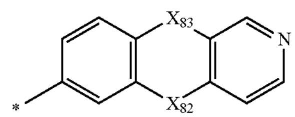
CY71-3(23)
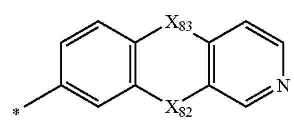
CY71-3(24)
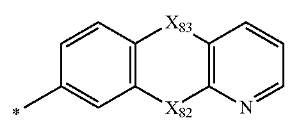
CY71-3(25)
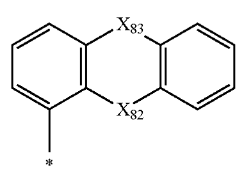
CY71-3(26)
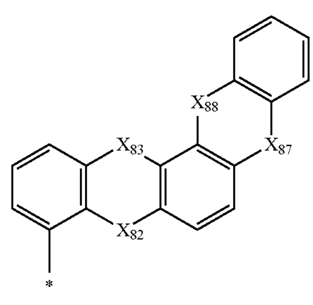
CY71-3(27)
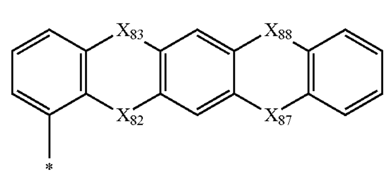

CY71-3(28)
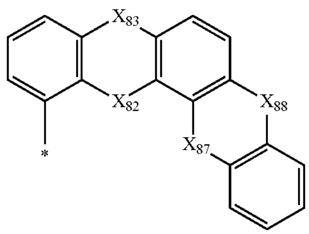
CY71-3(29)
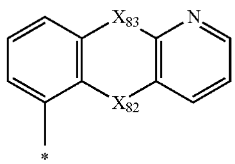
CY71-3(30)
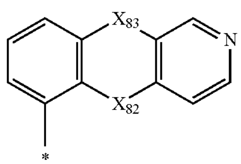
CY71-3(31)
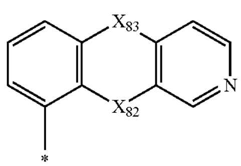
CY71-3(32)
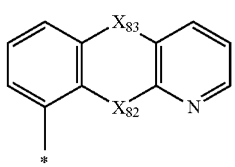
CY71-4(1)
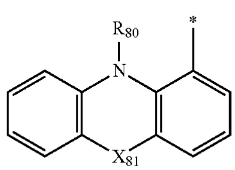
CY71-4(2)
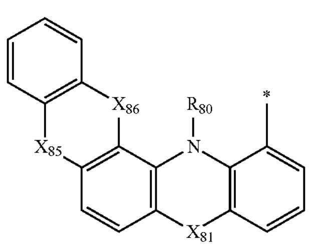
CY71-4(3)
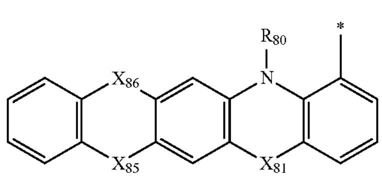
CY71-4(4)
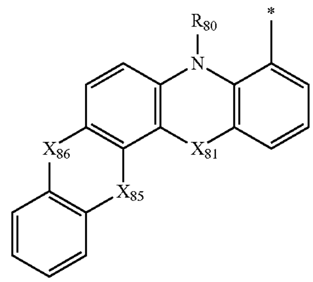
CY71-4(5)
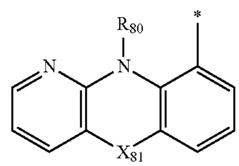
CY71-4(6)
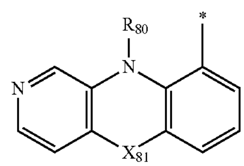
CY71-4(7)
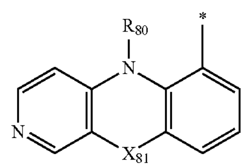
CY71-4(8)
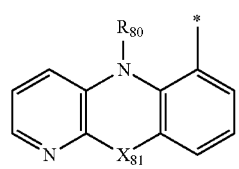
CY71-4(9)
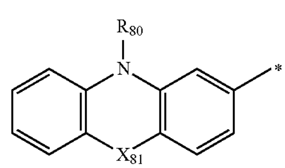
CY71-4(10)
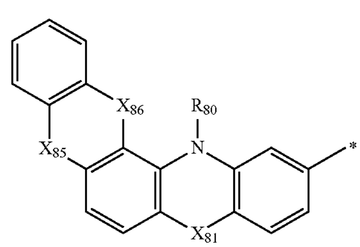
CY71-4(11)
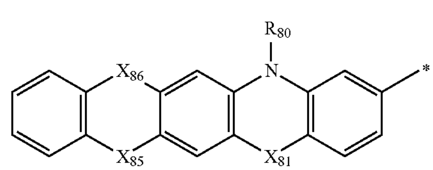

-continued
CY71-4(12)
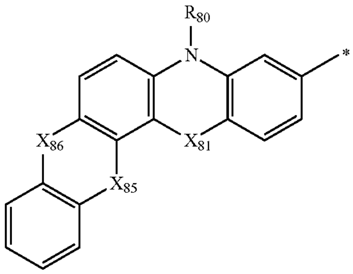
CY71-4(13)
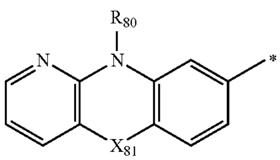
CY71-4(14)
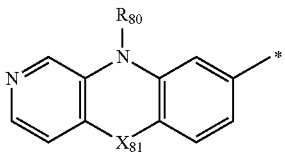
CY71-4(15)
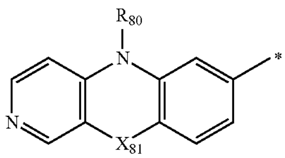
CY71-4(16)
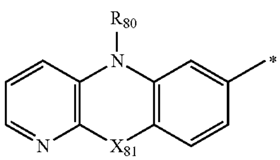
CY71-4(17)
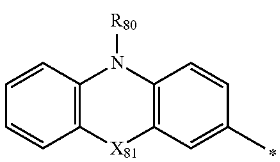
CY71-4(18)
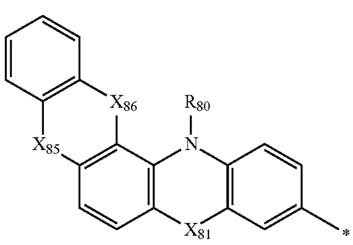
CY71-4(19)
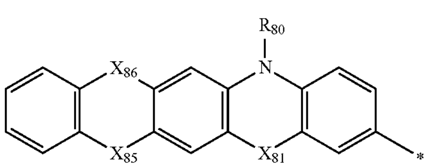
-continued
CY71-4(20)
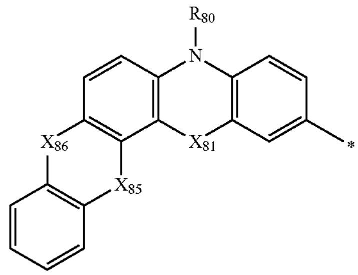
CY71-4(21)
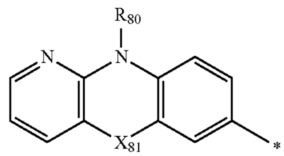
CY71-4(22)
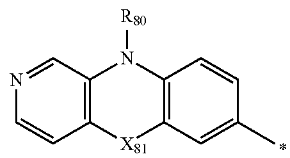
CY71-4(23)
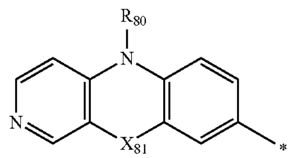
CY71-4(24)
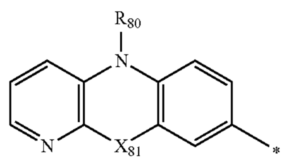
CY71-4(25)
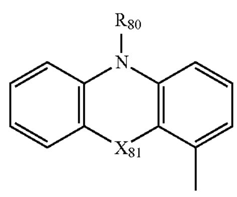
CY71-4(26)
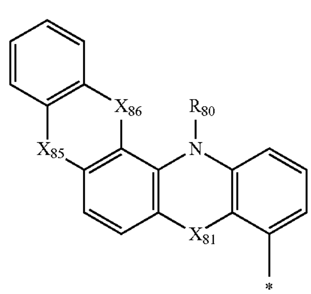

-continued
CY71-4(27)
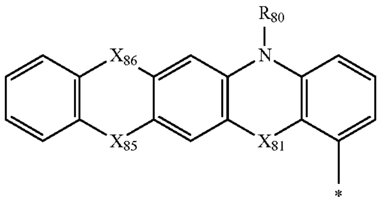
CY71-4(28)
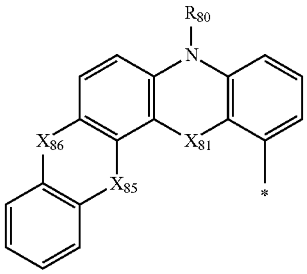
CY71-4(29)
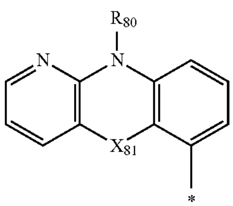
CY71-4(30)
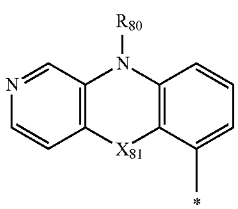
CY71-4(31)
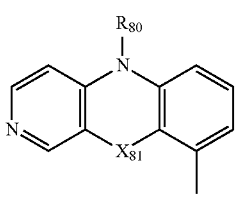
CY71-4(32)
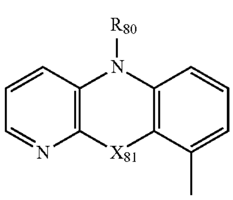
CY71-5(1)
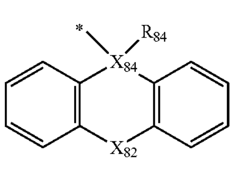
-continued
CY71-5(2)
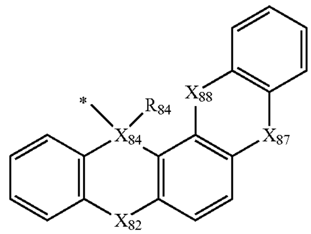
CY71-5(3)
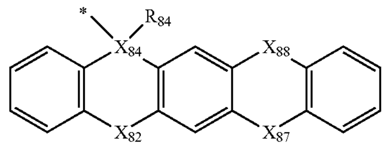
CY71-5(4)
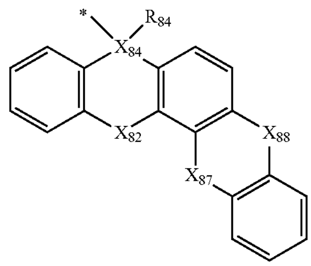
CY71-5(5)
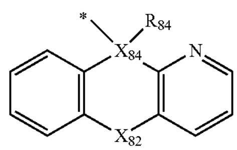
CY71-5(6)
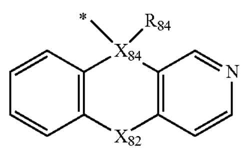
CY71-5(7)
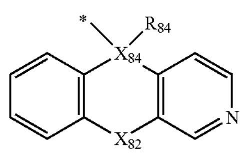
CY71-5(8)
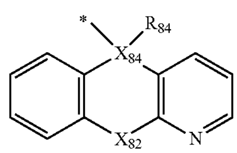
In Formulae CY71-1(1) to CY71-1(8), CY71-2(1) to CY71-2(8), CY71-3(1) to CY71-3(32), CY71-4(1) to CY71-4(32), and CY71-5(1) to CY71-5(8),
$X_{81}$ to $X_{84}$, $R_{80}$, and $R_{84}$ may each be the same as respectively described above in the present specification,
$X_{85}$ may be a single bond, O, S, $N(R_{85})$, $B(R_{85})$, $C(R_{85a})(R_{85b})$, or $Si(R_{85a})(R_{85b})$,
$X_{86}$ may be a single bond, O, S, $N(R_{86})$, $B(R_{86})$, $C(R_{86a})(R_{86b})$, or $Si(R_{86a})(R_{86b})$, in Formulae CY71-1(1) to CY71-1(8) and CY71-4(1) to CY71-4(32), $X_{85}$ and $X_{86}$ may not be a single bond at the same time, that is, $X_{85}$ and $X_{86}$ may not both be a single bond, $X_{87}$ may be a single bond, O, S, N($R_{87}$), B($R_{87}$), C($R_{87a}$)($R_{87b}$), or Si($R_{87a}$)($R_{87b}$), and $X_{88}$ may be a single bond, O, S, N($R_{88}$), B($R_{88}$), C($R_{88a}$)($R_{88b}$), or Si($R_{88a}$)($R_{88b}$), and in Formulae CY71-2(1) to CY71-2(8), CY71-3(1) to CY71-3(32), and CY71-5(1) to CY71-5(8), $X_{87}$ and $X_{88}$ may not be a single bond at the same time, that is, $X_{87}$ and $X_{88}$ may not both be a single bond, and $R_{85}$ to $R_{88}$, $R_{85a}$, $R_{85b}$, $R_{86a}$, $R_{86b}$, $R_{87a}$, $R_{87b}$, $R_{88a}$, and $R_{88b}$ may each independently be the same as described in connection with $R_{81}$ in the present specification.

In one embodiment, the second compound may be selected from Compounds ETH1 to ETH80:

ETH1

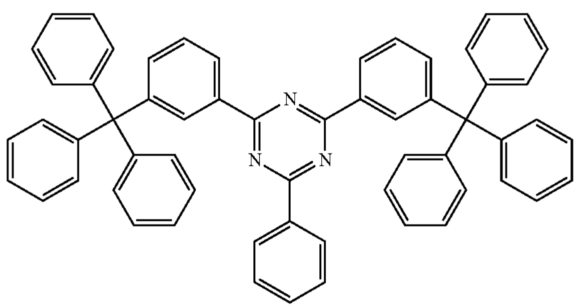

ETH2

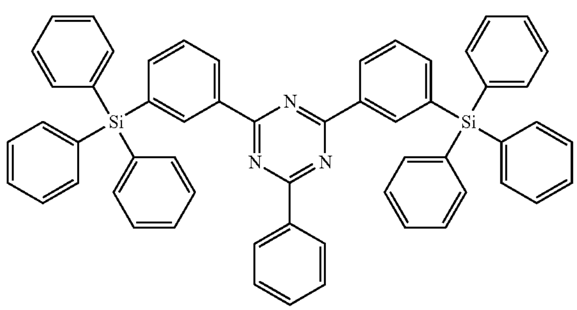

ETH3

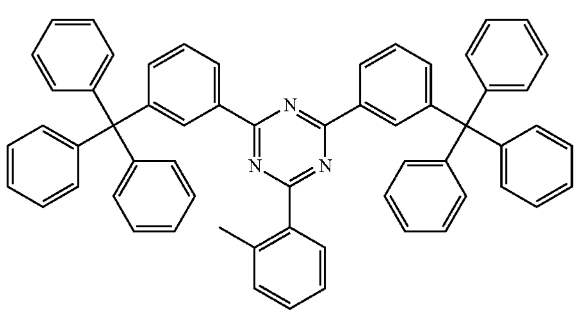

-continued

ETH4

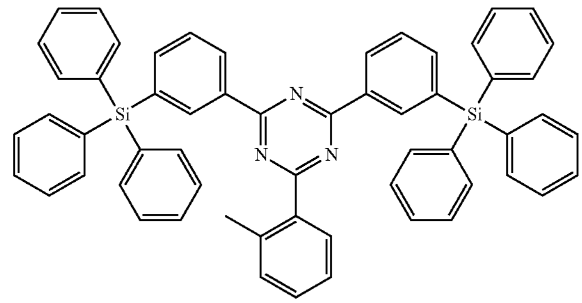

ETH5

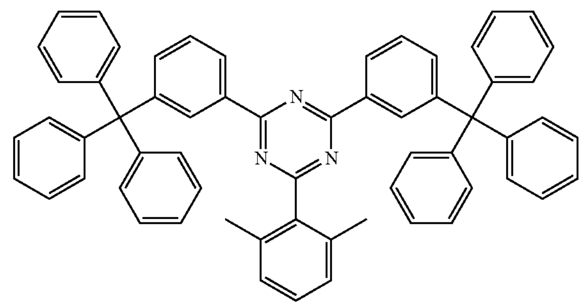

ETH6

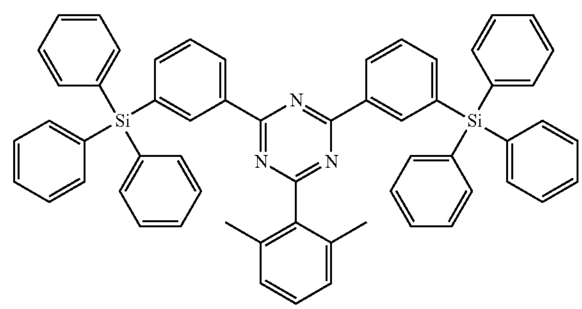

ETH7

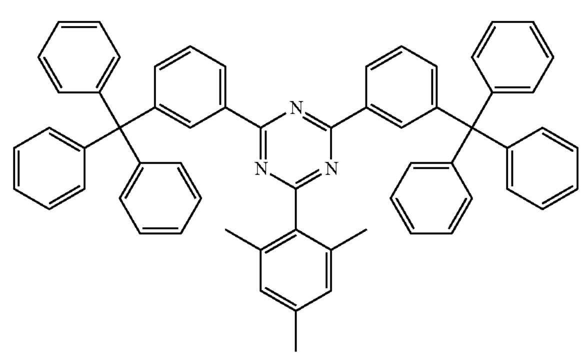

-continued
ETH8
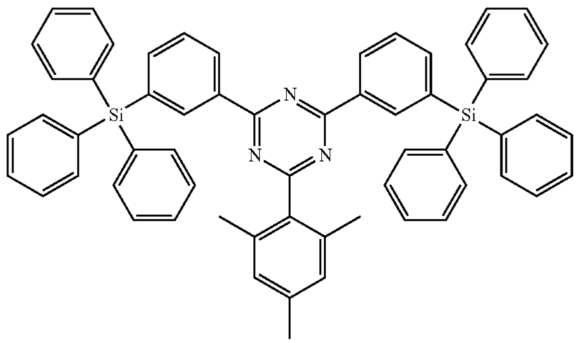
ETH9
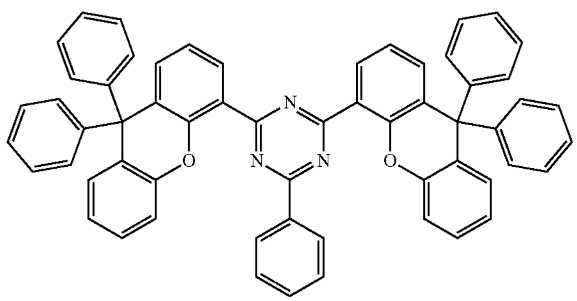
ETH10
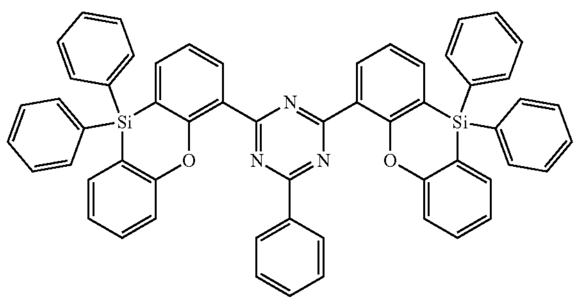
ETH11
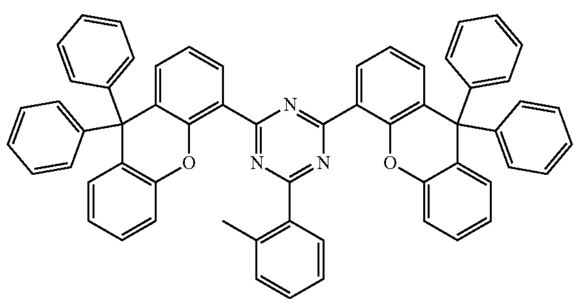
ETH12
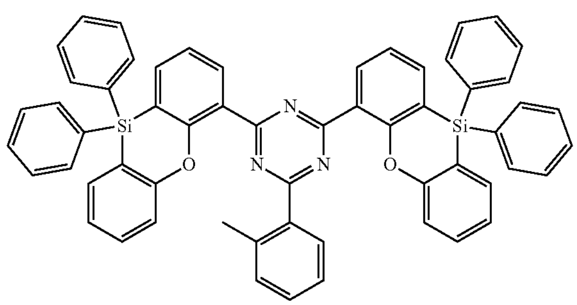
-continued
ETH13
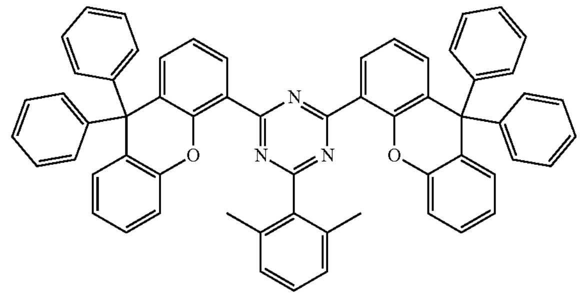
ETH14
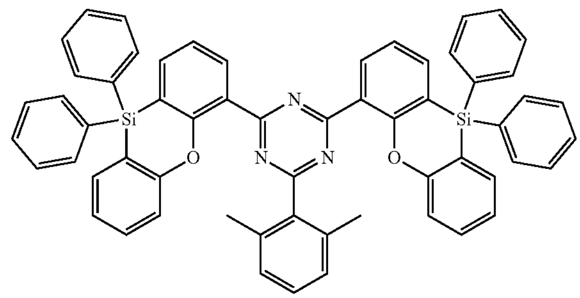
ETH15
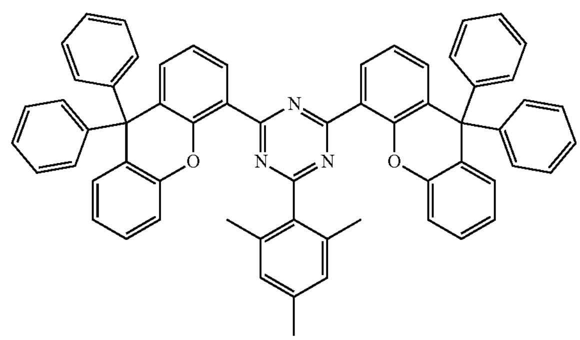
ETH16
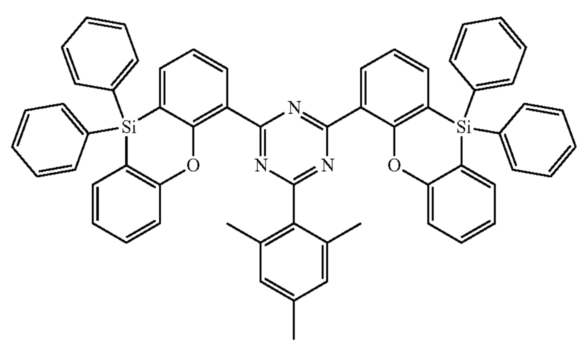

-continued
ETH17
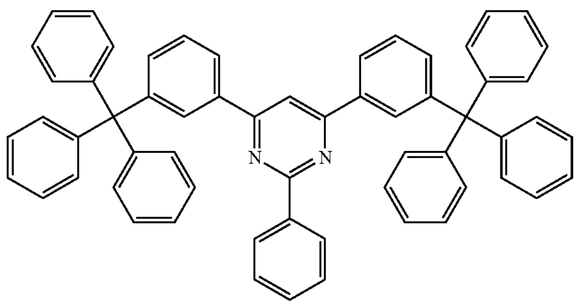
ETH18
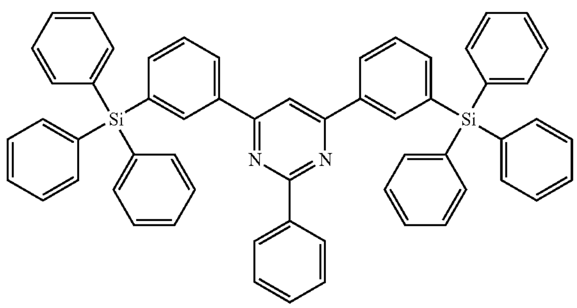
ETH19
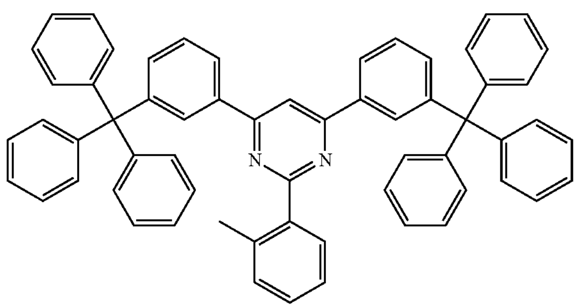
ETH20
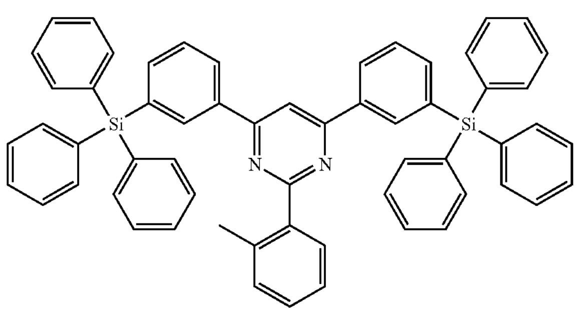
ETH21
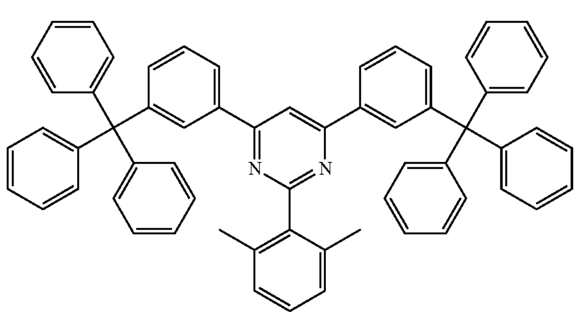
-continued
ETH22
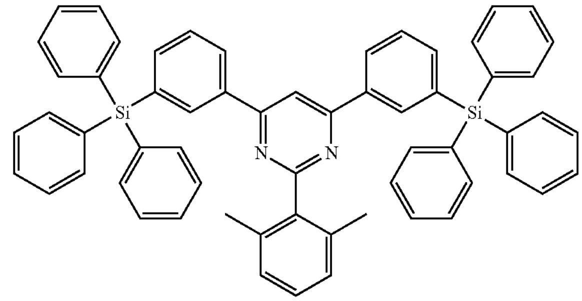
ETH23
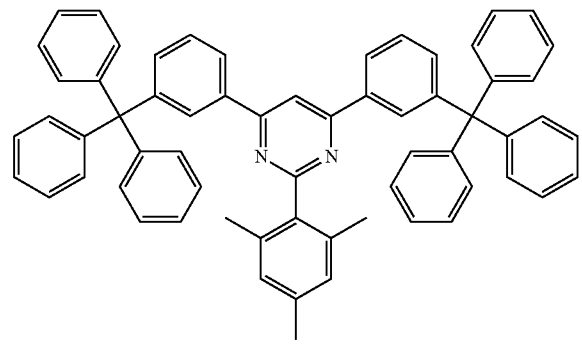
ETH24
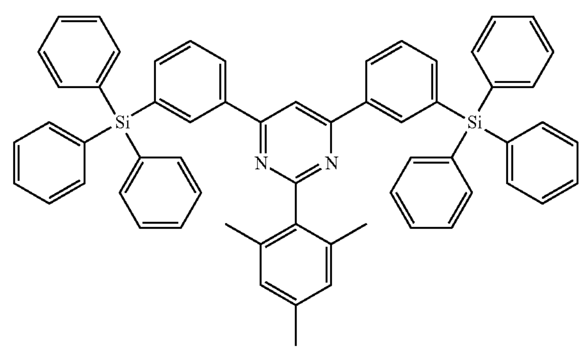
ETH25
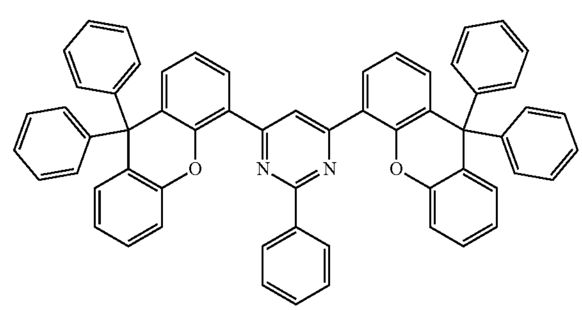

-continued
ETH26
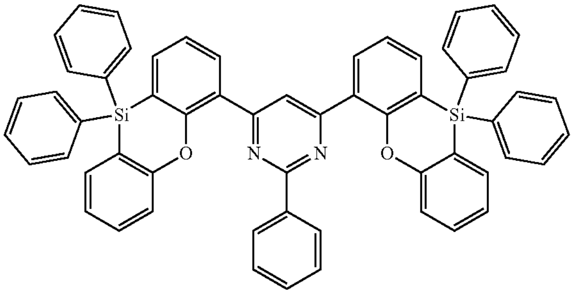
ETH27
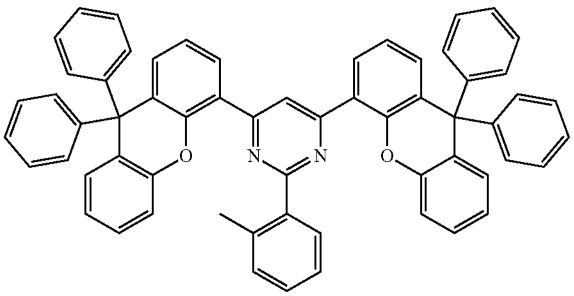
ETH28
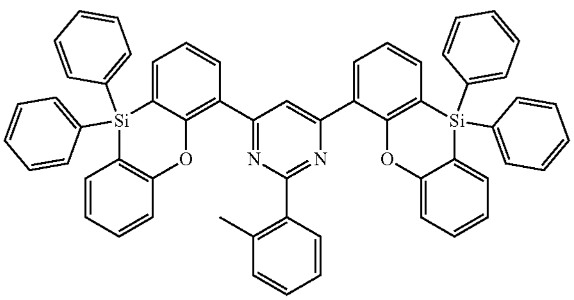
ETH29
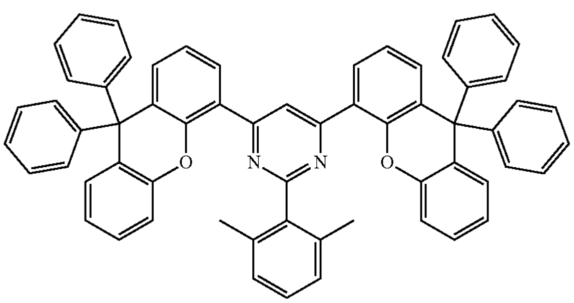
ETH30
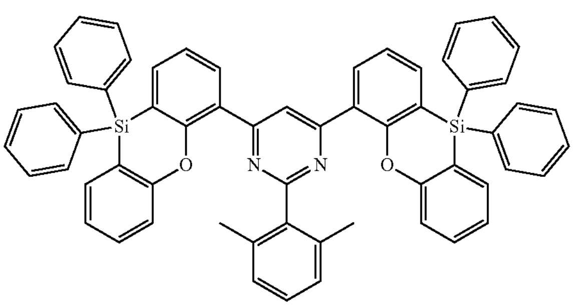
-continued
ETH31
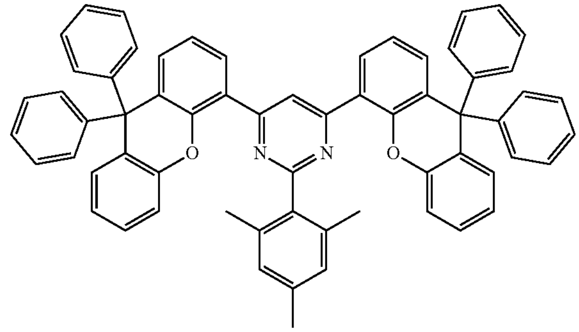
ETH32
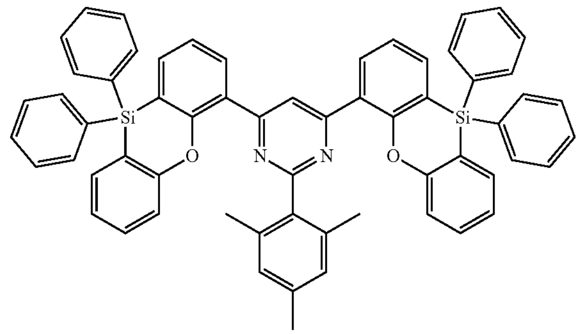
ETH33
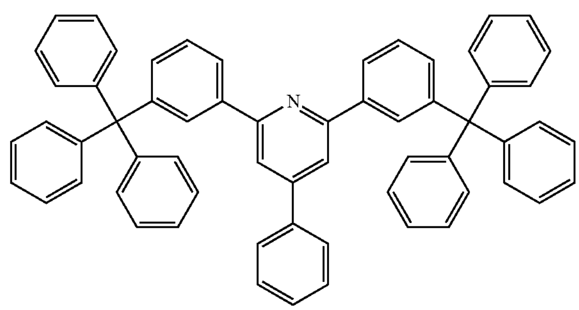
ETH34
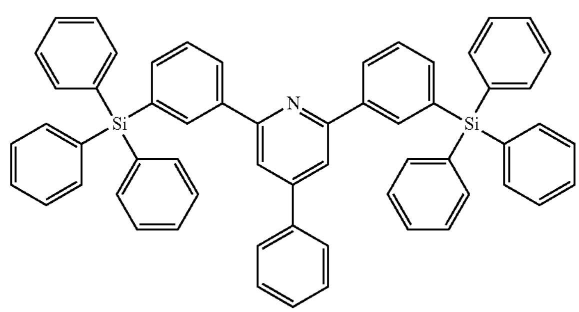

-continued
ETH35
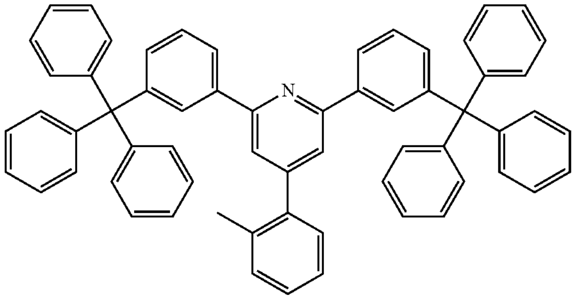
ETH36
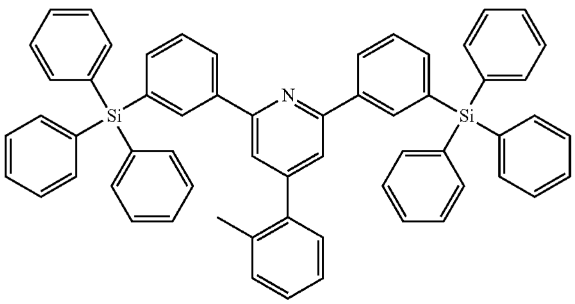
ETH37
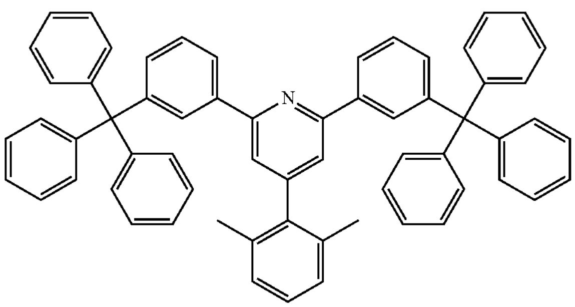
ETH38
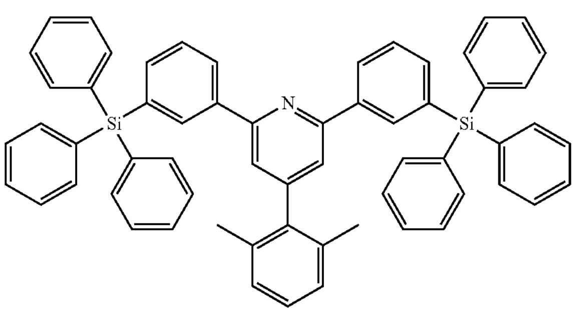
-continued
ETH39
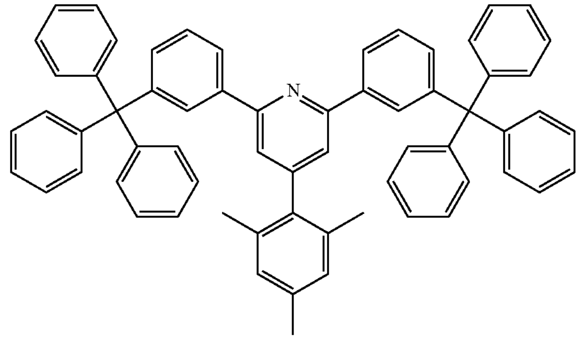
ETH40
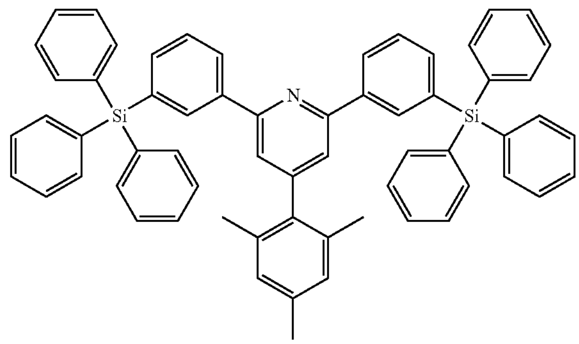
ETH41
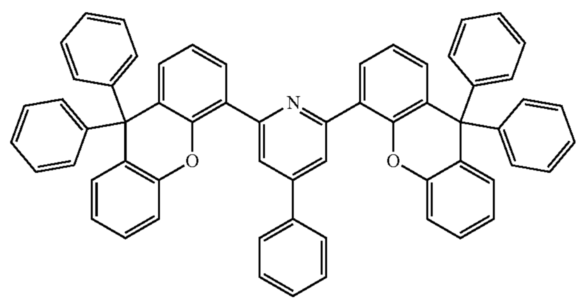
ETH42
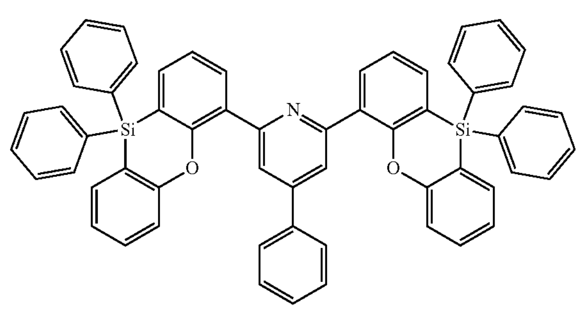

-continued
ETH43
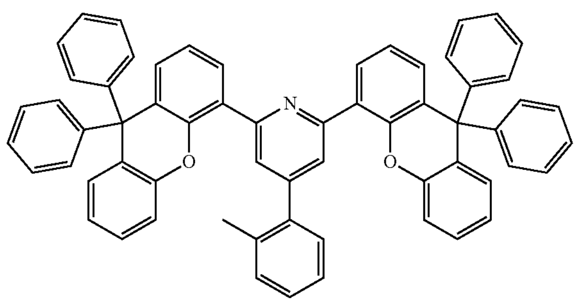
ETH44
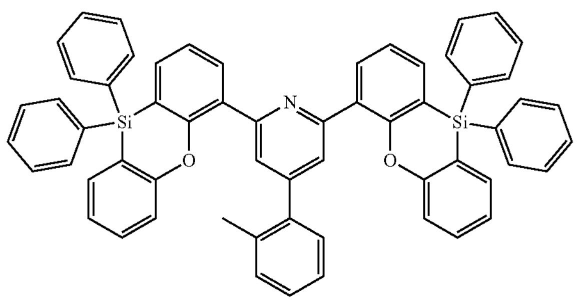
ETH45
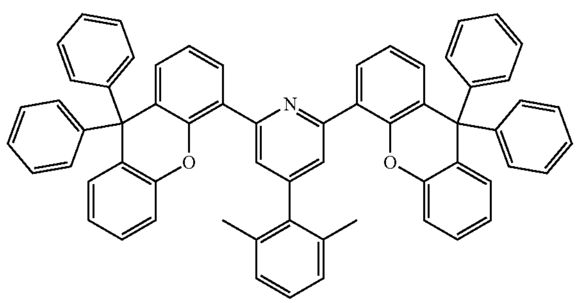
ETH46
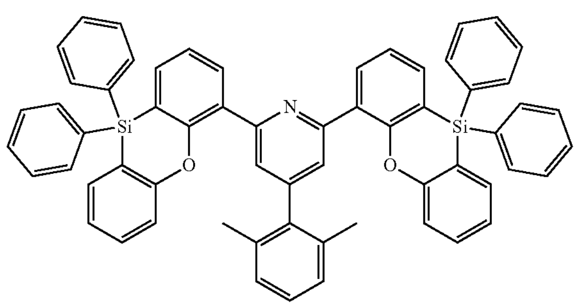
ETH47
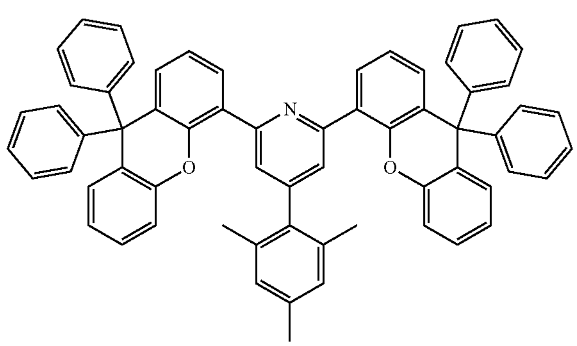
-continued
ETH48
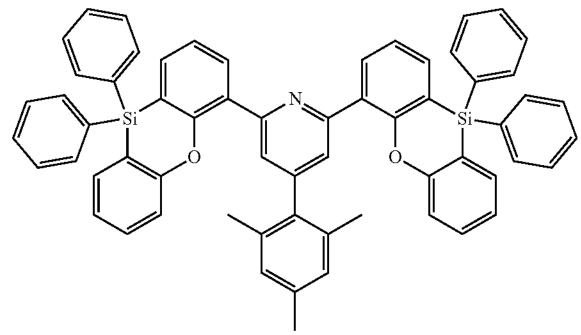
ETH49
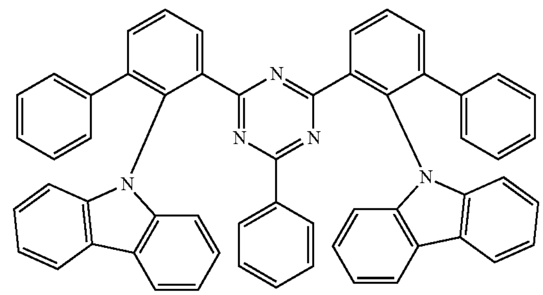
ETH50
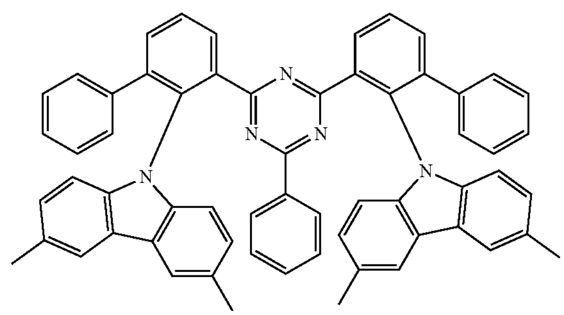
ETH51
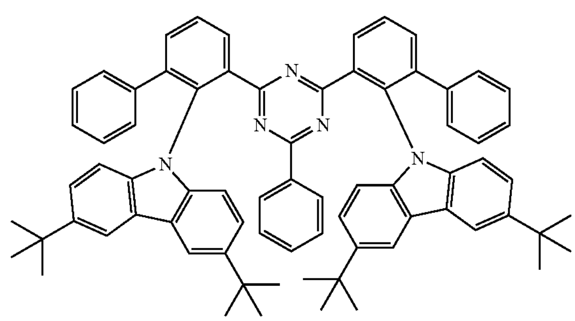
ETH52
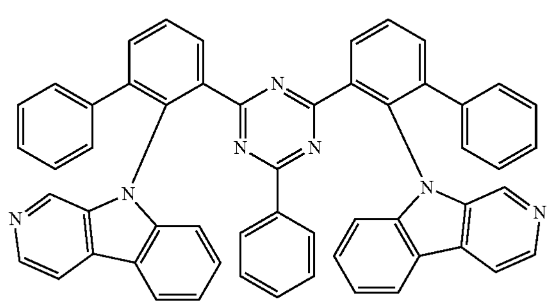

ETH53
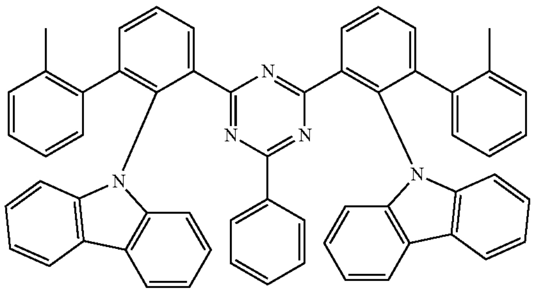
ETH54
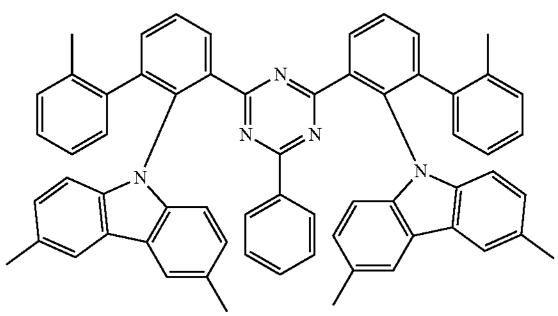
ETH55
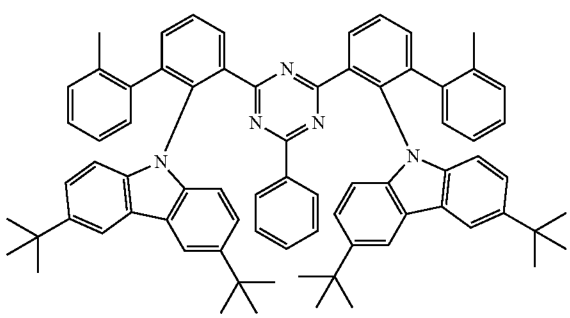
ETH56
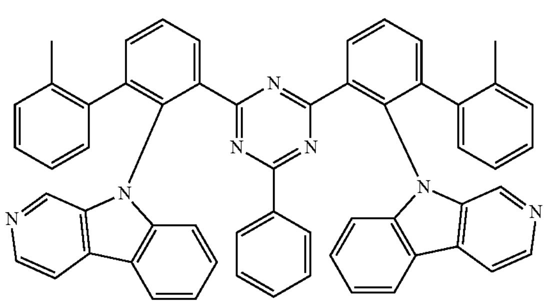
ETH57
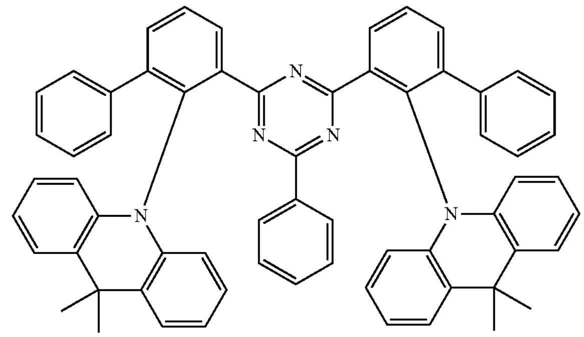
ETH58
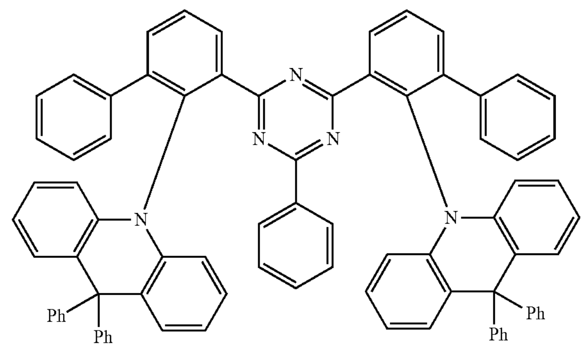
ETH59
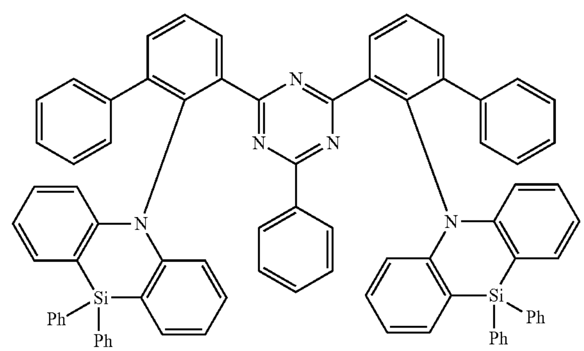
ETH60
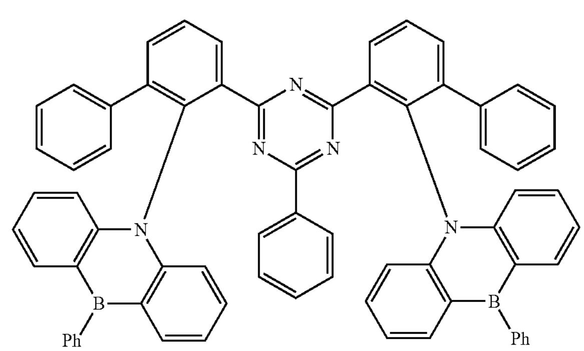

-continued
ETH61
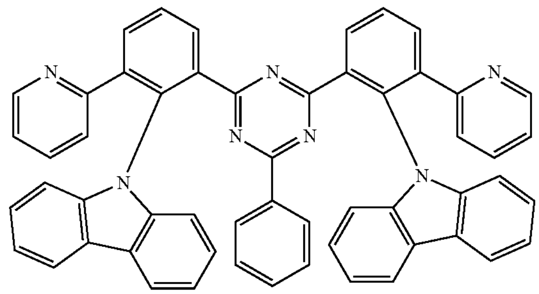
ETH62
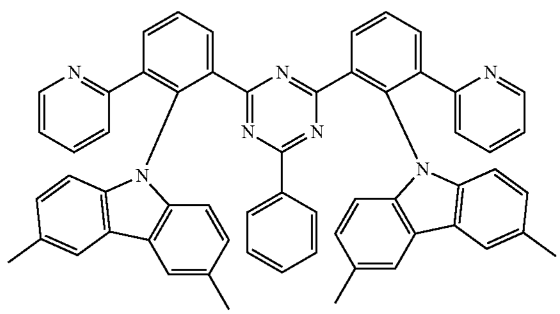
ETH63
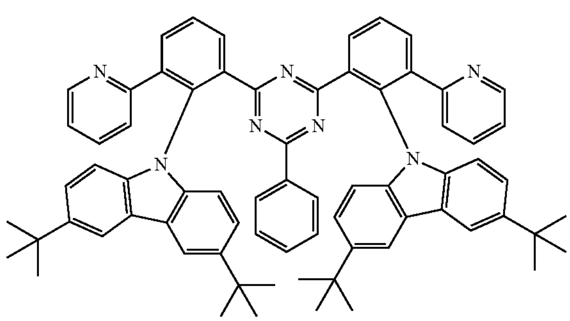
ETH64
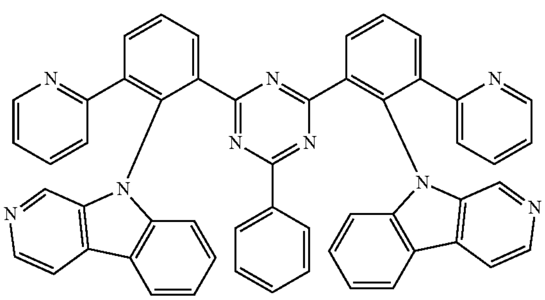
-continued
ETH65
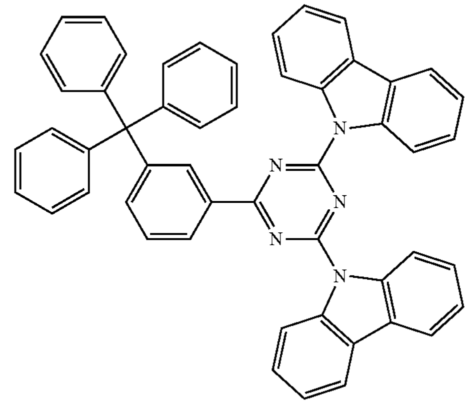
ETH66
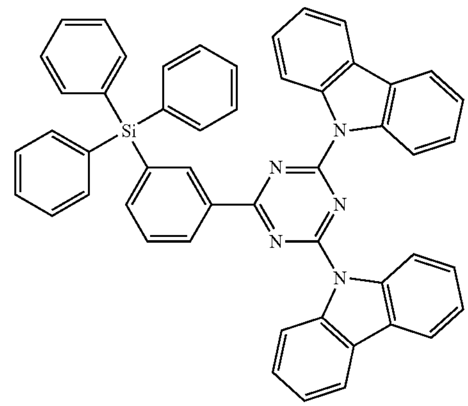
ETH67
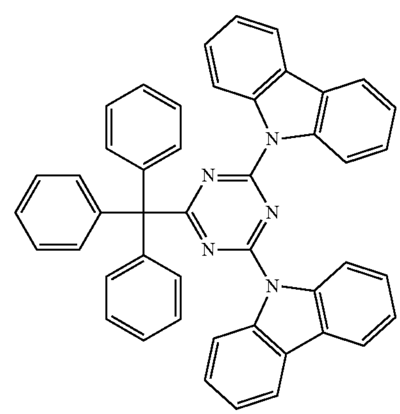
ETH68
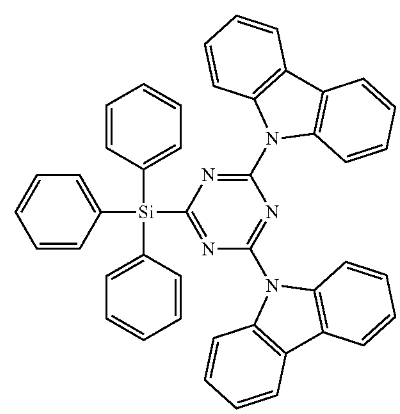

-continued
ETH69
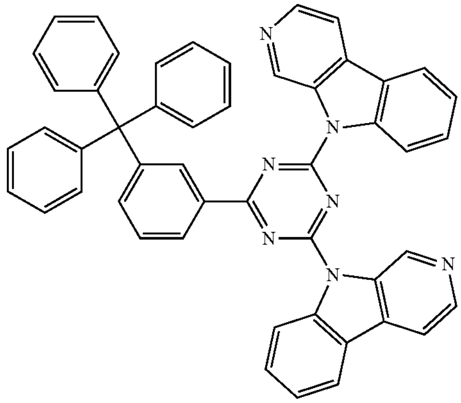
ETH70
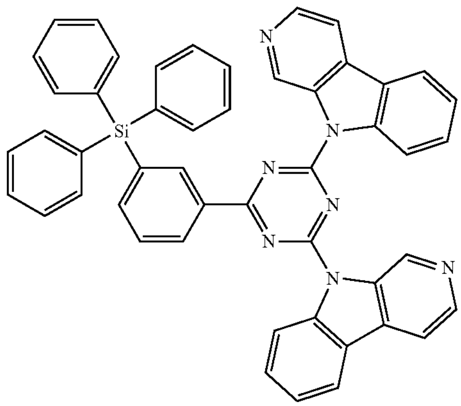
ETH71
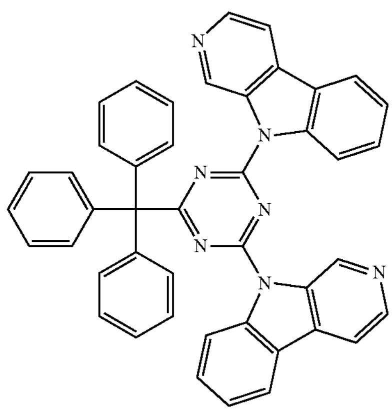
ETH72
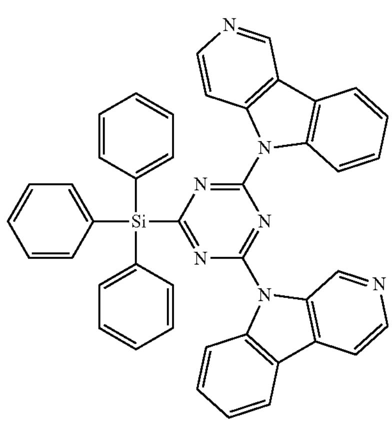
-continued
ETH73
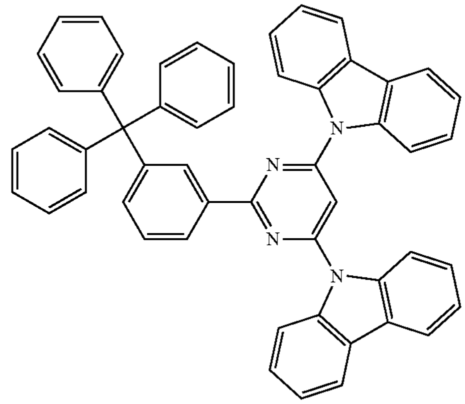
ETH74
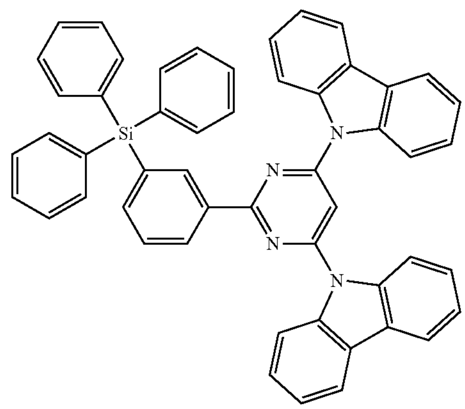
ETH75
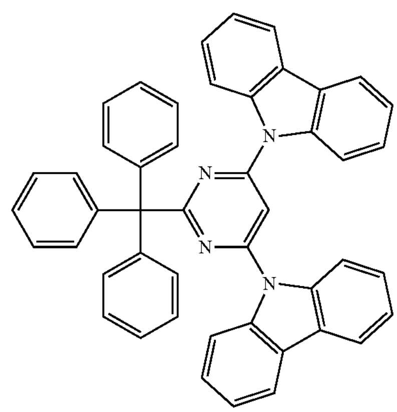
ETH76
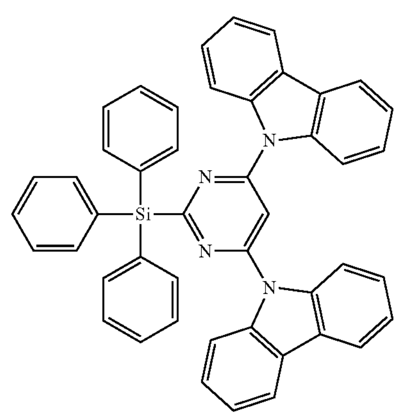

-continued
ETH77
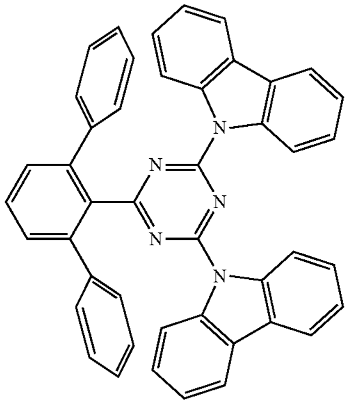
ETH78
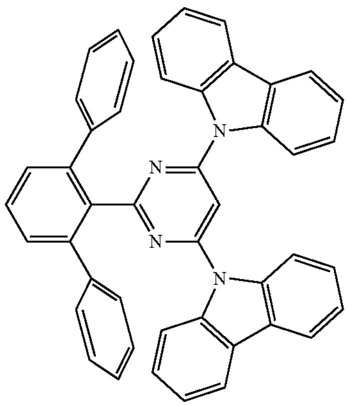
ETH79
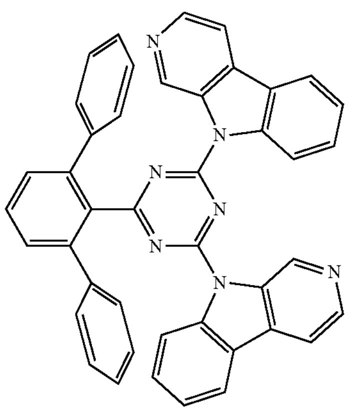
ETH80
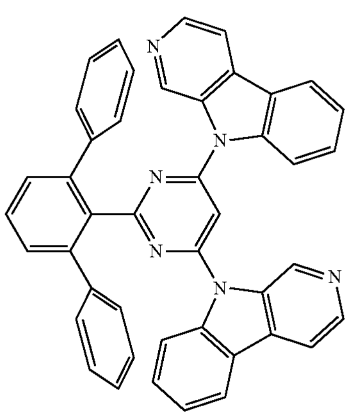
In one or more embodiments, the third compound may be selected from Compounds HTH1 to HTH28:
HTH1
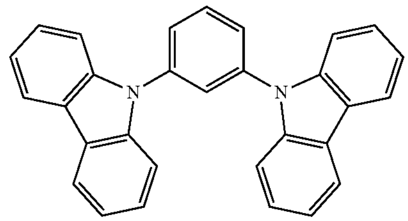
HTH2
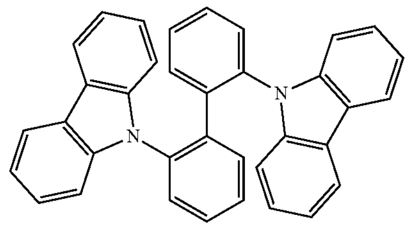
HTH3
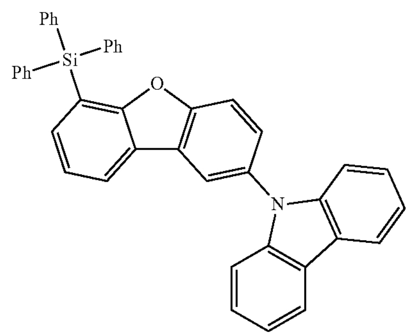
HTH4
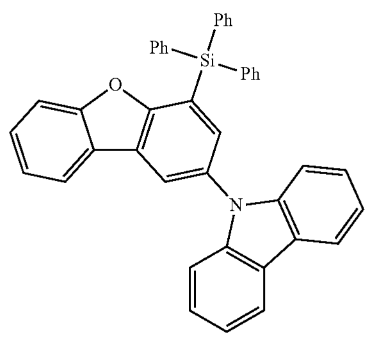
HTH5
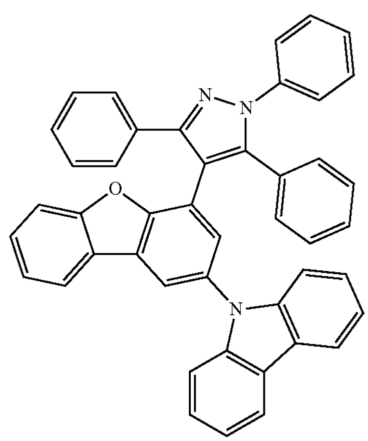

-continued
HTH6
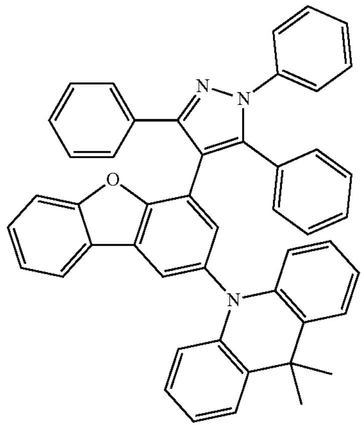
HTH7
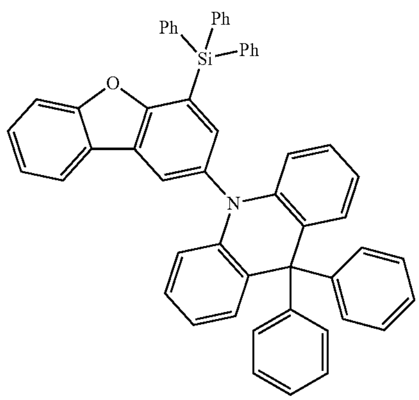
HTH8
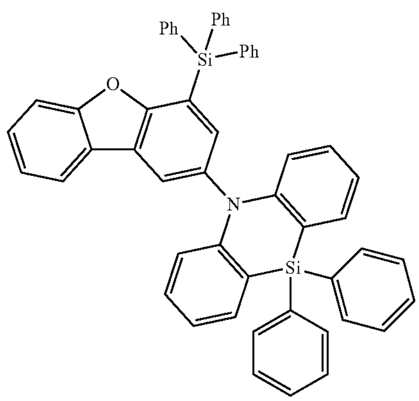
HTH9
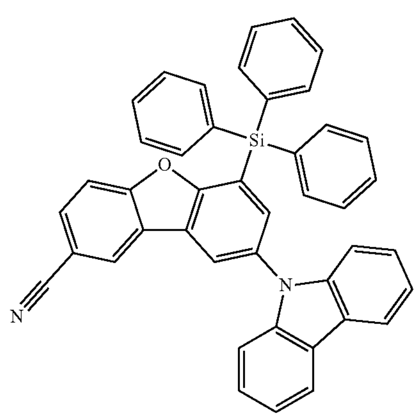
-continued
HTH10
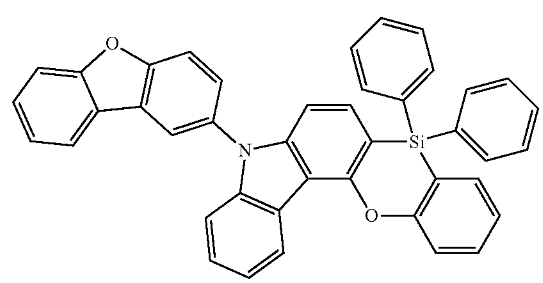
HTH11
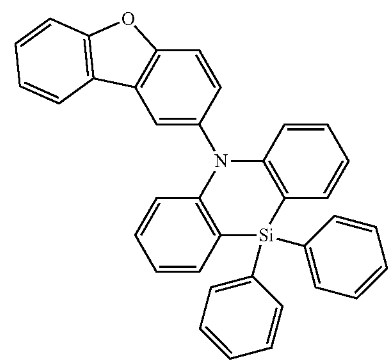
HTH12
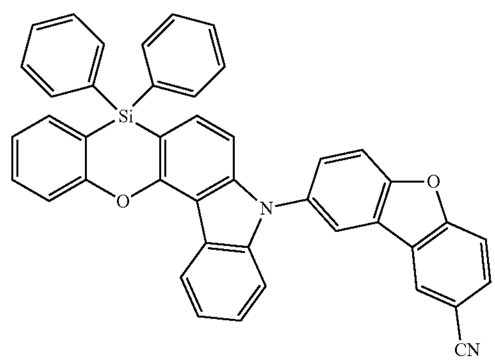
HTH13
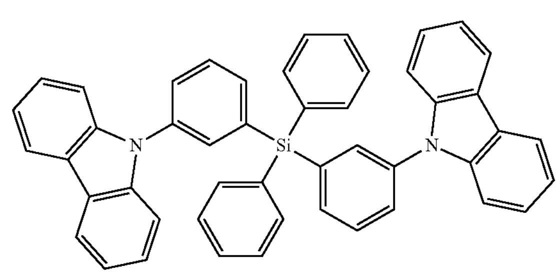

-continued
HTH14
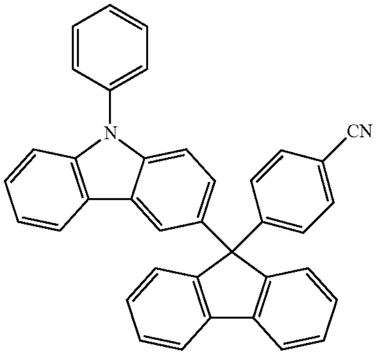
HTH15
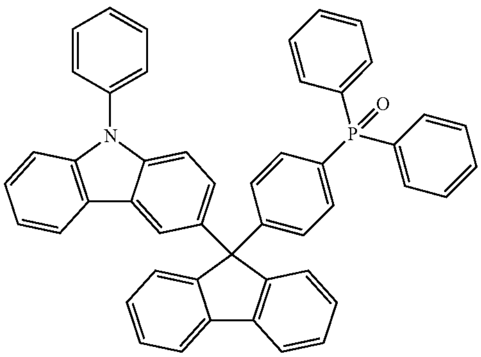
HTH16
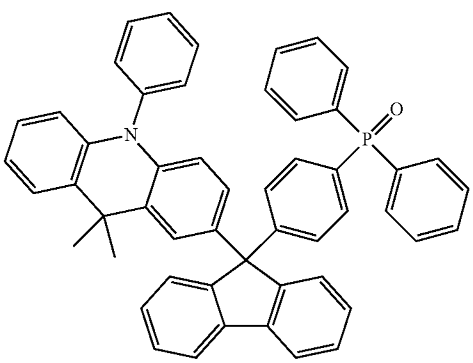
HTH17
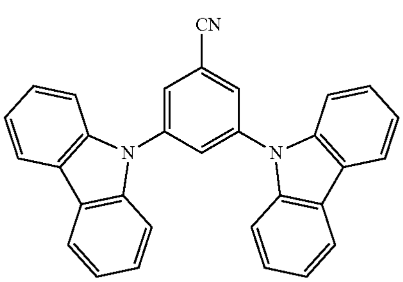
-continued
HTH18
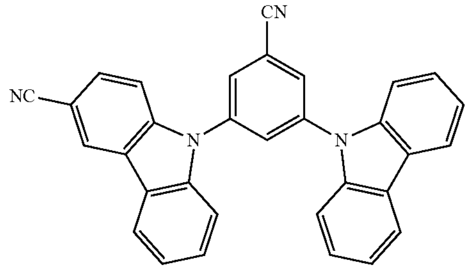
HTH19
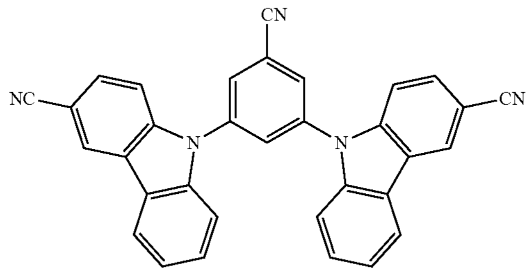
HTH20
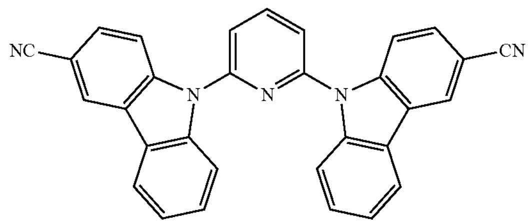
HTH21
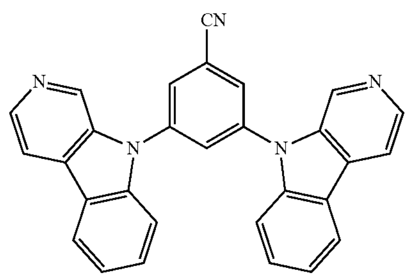
HTH22
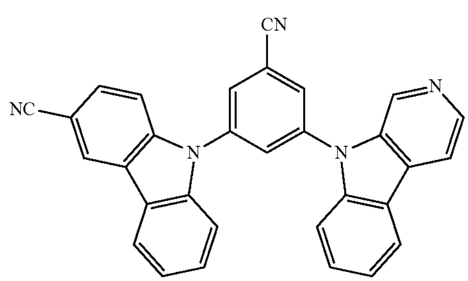

-continued

HTH23

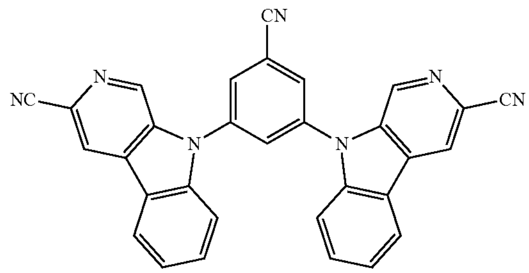

HTH24

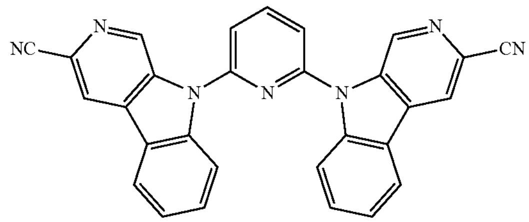

HTH25

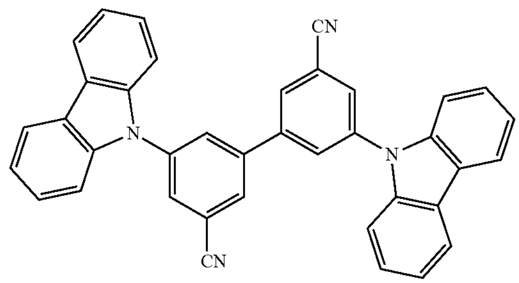

HTH26

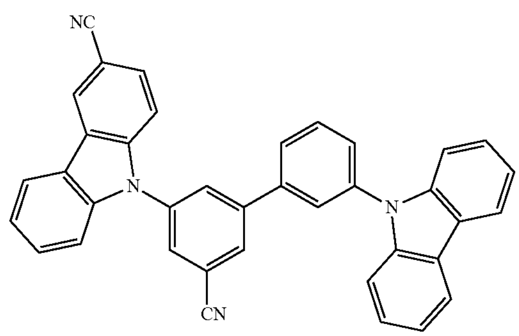

HTH27

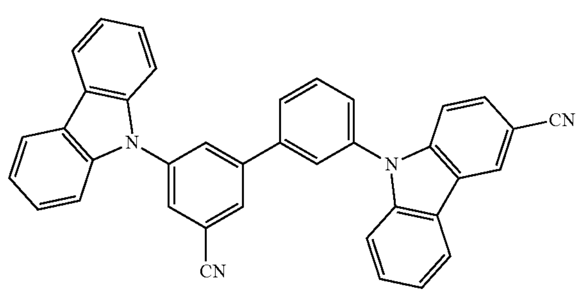

-continued

HTH28

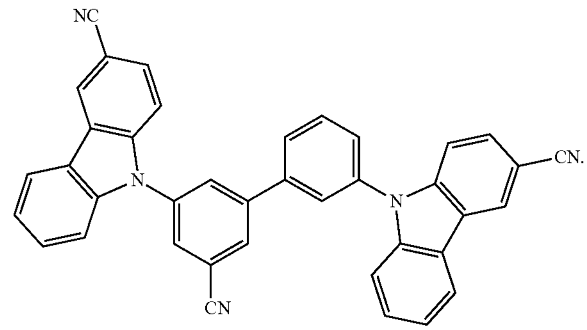

In one embodiment, the organic light-emitting device may satisfy at least one of Condition 1 to Condition 4:

LUMO energy level (eV) of the third compound>LUMO energy level (eV) of the organometallic compound; Condition 1

LUMO energy level (eV) of the organometallic compound>LUMO energy level (eV) of the second compound; Condition 2

HOMO energy level (eV) of the organometallic compound>HOMO energy level (eV) of the third compound; and Condition 3

HOMO energy level (eV) of the third compound>HOMO energy level (eV) of the second compound. Condition 4

The HOMO energy levels and the LUMO energy levels of each of the organometallic compound, the second compound, and the third compound are negative values, and may be measured according to a suitable (e.g., a known) method, for example, a method described in Evaluation Example 1 in the present specification.

In one or more embodiments, an absolute value of the difference between the LUMO energy level of the organometallic compound and the LUMO energy level of the second compound may be 0.1 eV or more and 1.0 eV or less, an absolute value of the difference between the LUMO energy level of the organometallic compound and the LUMO energy level of the third compound may be 0.1 eV or more and 1.0 eV or less, an absolute value of the difference between the HOMO energy level of the organometallic compound and the HOMO energy level of the second compound may be 1.25 eV or less (for example, 1.25 eV or less and 0.2 eV or more), an absolute value of the difference between the HOMO energy level of the organometallic compound and the HOMO energy level of the third compound may be 1.2 5 eV or less (for example, 1.25 eV or less and 0.2 eV or more), and an absolute value of the difference between the HOMO energy level of the organometallic compound and the HOMO energy level of the exciplex formed between the second compound and the third compound may be 1.25 eV or less.

When the relationships between LUMO energy level and HOMO energy level satisfy the conditions as described above, the balance between holes and electrons injected into the emission layer can be made.

The emission layer of the organic light-emitting device may include:

1) the organometallic compound represented by Formula 1 (heteronuclear complex);

2) the second compound represented by Formula 2 (wherein, in Formula 2, a bond between $L_{51}$ and ring $CY_{51}$, a bond between $L_{52}$ and ring $CY_{52}$, a bond between $L_{53}$ and ring $CY_{53}$, a bond between two or more $L_{51}$(s), a bond between two or more $L_{52}$(s), a bond between two or more $L_{53}$(s), a bond between $L_{51}$ and the carbon atom between $X_{54}$ and $X_{55}$ in Formula 2, a bond between $L_{52}$ and the carbon atom between $X_{54}$ and $X_{56}$ in Formula 2, and a bond between $L_{53}$ and the carbon atom between $X_{55}$ and $X_{56}$ in Formula 2 may each be a "carbon-carbon" single bond); and 3) the third compound represented by Formula 3, which is different from the compounds represented by Formulae 1 and 2, and accordingly, the exciplex formation between the organometallic compound and either the second compound or the third compound is effectively suppressed, thereby implementing the organic light-emitting device having high color purity and a long lifespan.

The decay time of delayed fluorescence in the time-resolved electroluminescence (TREL) spectrum of the organic light emitting device may be 50 ns or more, for example, 50 ns or more and 2.5 μs or less. In one embodiment, the decay time of delayed fluorescence in the TREL spectrum of the organic light-emitting device may be 50 ns or more and 2.4 μs or less, 50 ns or more and 2.3 μs or less, 50 ns or more and 2.2 μs or less, 50 ns or more and 2.1 μs or less, or 50 ns or more and 2 μs or less. When the decay time of delayed fluorescence of the organic light-emitting device is within these ranges, the time that the organometallic compound remains in an excited state is relatively reduced, so that the organic light-emitting device may have high luminescent efficiency and a long lifespan.

In one embodiment, the electroluminescence (EL) spectrum of the organic light-emitting device may have a first peak and a second peak, wherein a maximum emission wavelength of the second peak may be greater than that of the first peak, a difference between the maximum emission wavelength of the second peak and the maximum emission wavelength of the first peak may be 5 nm or more and 10 nm or less, and an intensity of the second peak may be smaller than that of the first peak.

When the difference between the maximum emission wavelength of the second peak and the maximum emission wavelength of the first peak is within the ranges above, the organic light-emitting device having excellent color purity (for example, a blue organic light-emitting device having excellent color purity) may be implemented (e.g., obtained).

The maximum emission wavelength of the first peak may be 390 nm or more and 500 nm or less (for example, 430 nm or more and 470 nm or less). In this regard, the organic light-emitting device may emit blue light (for example, dark blue light) having excellent color purity.

The first peak and the second peak may each be an emission peak of phosphorescence emitted by the organometallic compound.

The organometallic compound may have a heteronuclear structure in which two metals are coordinated, and accordingly, the exciplex formation between the organometallic compound and either the second compound or the third compound may be suppressed, thereby achieving high efficiency and high color purity of the organometallic compound.

The intensity of the second peak may be 20% to 90% of the intensity of the first peak. When the intensity of each of the second peak and the first peak is within the range above, the light emission by the second peak may be suppressed by the organometallic compound while the efficiency of phosphorescence emitted by the second compound or the third compound is not reduced, thereby implementing the organic light-emitting device having improved color purity.

The organometallic compound, the second compound, and the third compound may be the same as described above.

Another aspect of the present disclosure provides an electronic apparatus including the organic light-emitting device. The electronic apparatus may further include a thin-film transistor. For example, the electronic apparatus may further include a thin-film transistor including a source electrode and a drain electrode, wherein the first electrode of the organic light-emitting device is electrically connected to the source electrode or the drain electrode.

[Description of FIG. 1]

FIG. 1 is a schematic cross-sectional view of an organic light-emitting device 10 according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 will be described in connection with FIG. 1.

[First Electrode 110]

In FIG. 1, a substrate may be additionally located under the first electrode 110 or above the second electrode 190. The substrate may be a glass substrate or a plastic substrate, each having excellent mechanical strength, thermal stability, transparency, surface smoothness, ease of handling, and/or water resistance.

The first electrode 110 may be formed by, for example, depositing or sputtering a material for forming the first electrode on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, the material for forming the first electrode 110 may be selected from indium tin oxide (ITO), indium zinc oxide (IZO), tin oxide ($SnO_2$), zinc oxide (ZnO), and any combination thereof, but embodiments of the present disclosure are not limited thereto. In one or more embodiments, when the first electrode 110 is a semi-transmissive electrode or a reflective electrode, the material for forming the first electrode may be selected from magnesium (Mg), silver (Ag), aluminum (Al), aluminum-lithium (Al—Li), calcium (Ca), magnesium-indium (Mg—In), magnesium-silver (Mg—Ag), and any combination thereof, but embodiments of the present disclosure are not limited thereto.

The first electrode 110 may have a single-layered structure or a multi-layered structure including two or more layers. For example, the first electrode 110 may have a three-layered structure of ITO/Ag/ITO, but the structure of the first electrode 110 is not limited thereto.

[Organic layer 150]

The organic layer 150 is located on the first electrode 110. The organic layer 150 may include an emission layer.

The organic layer 150 may further include a hole transport region between the first electrode 110 and the emission layer and an electron transport region between the emission layer and the second electrode 190.

[Hole transport region in organic layer 150]

The hole transport region may have i) a single-layered structure including including (e.g., consisting of) a single material, ii) a single-layered structure including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 110 in the respective stated order, but the structure of the hole transport region is not limited thereto.

The hole transport region may include at least one selected from m-MTDATA, TDATA, 2-TNATA, NPB (NPD), p-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PAN I/CSA), polyaniline/poly(4-styrenesulfonate) (PANI/PSS), a compound represented by Formula 201, and a compound represented by Formula 202:

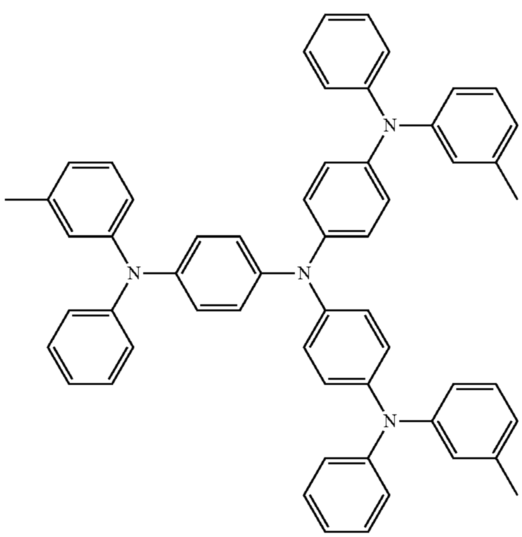

m-MTDATA

-continued

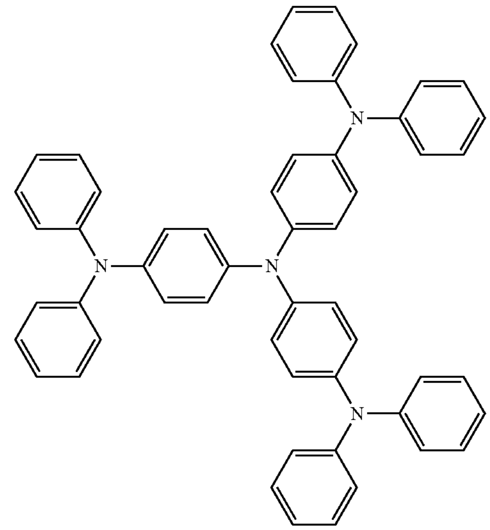

TDATA

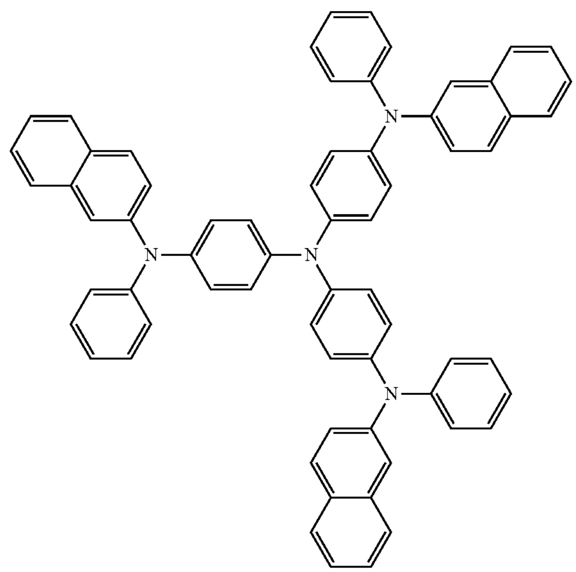

2-TNATA

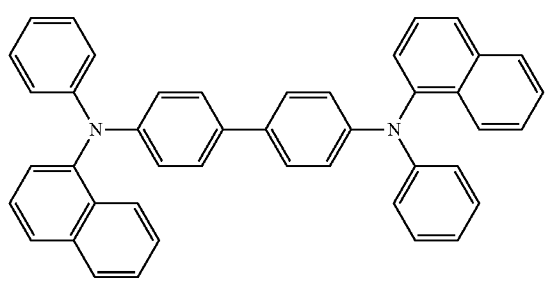

NPB

-continued

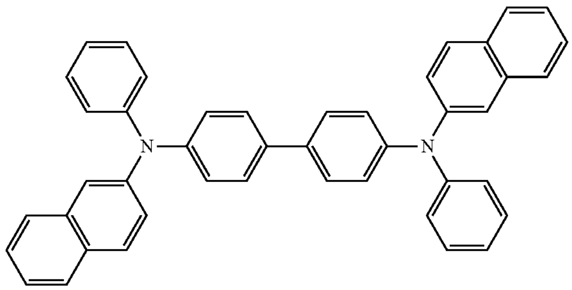

β-NPB

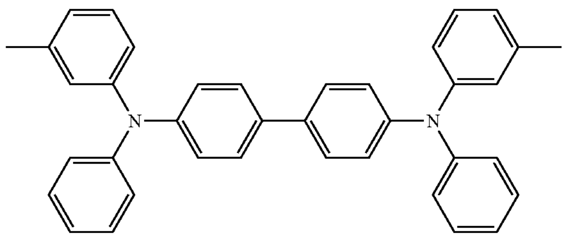

TPD

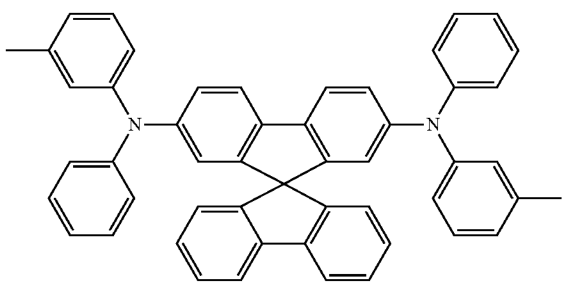

Spiro-TPD

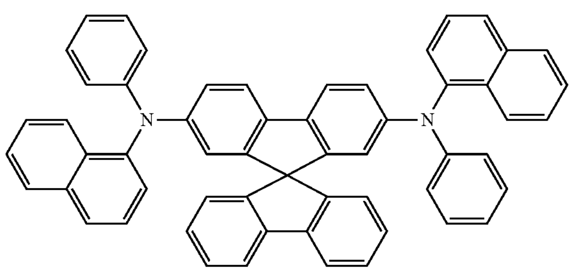

Spiro-NPB

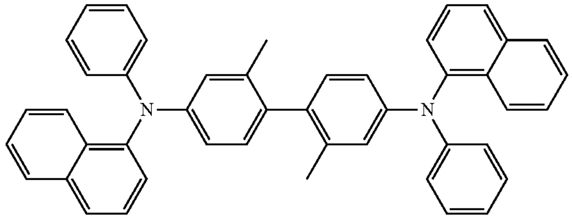

methylated NPB

-continued

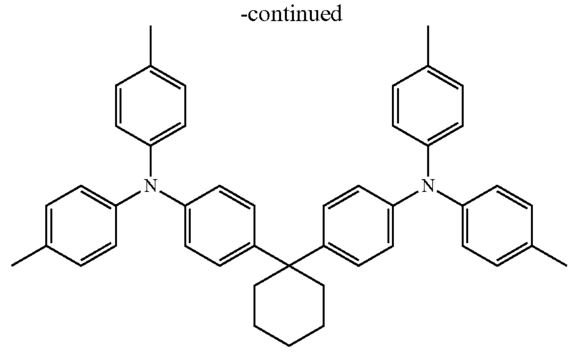

TAPC

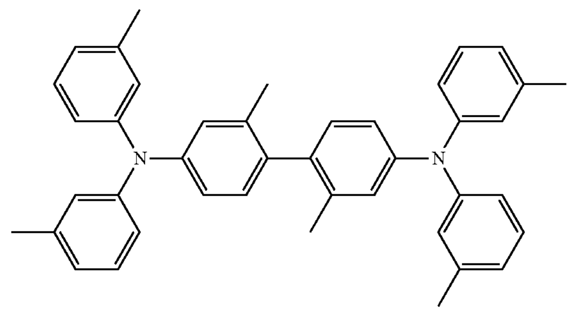

HMTPD

Formula 201

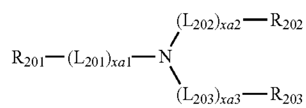

Formula 202

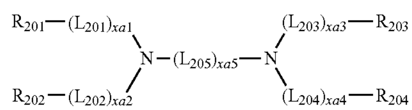

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an am idino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ may each independently be the same as described above in the present specification.

In one or more embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked to each other via a single bond, and/or ii) $R_{203}$ and $R_{204}$ may be linked to each other via a single bond.

In one or more embodiments, at least one of $R_{201}$ to $R_{204}$ in Formula 202 may be selected from:

a carbazolyl group; and a carbazolyl group substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201-1:

Fomula 201-1

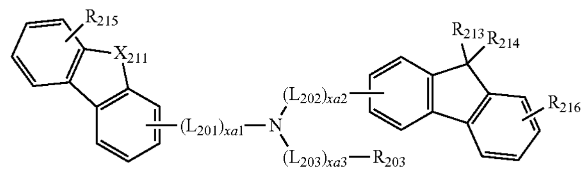

In one embodiment, the compound represented by Formula 201 may be represented by Formula 201-2, but embodiments of the present disclosure are not limited thereto:

Fomula 201-2

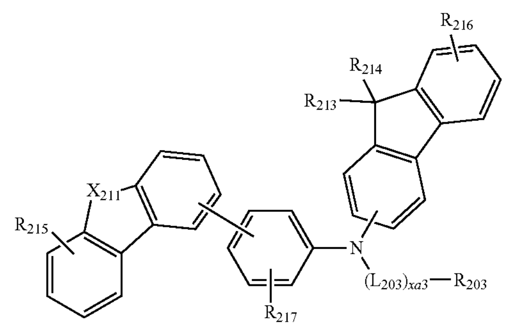

In one or more embodiments, the compound represented by Formula 201 may be represented by Formula 201-2(1), but embodiments of the present disclosure are not limited thereto:

Fomula 201-2(1)

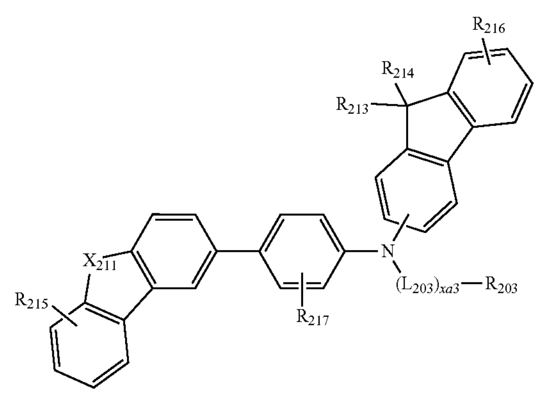

In one or more embodiments, the compound represented by Formula 201 may be represented by Formula 201A:

Formula 201A

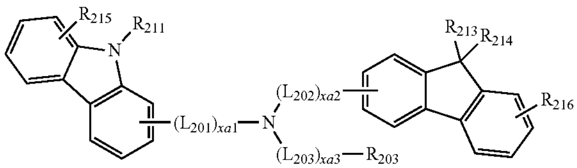

In one or more embodiments, the compound represented by Formula 201 may be represented by Formula 201A(1), but embodiments of the present disclosure are not limited thereto:

Formula 201A(1)

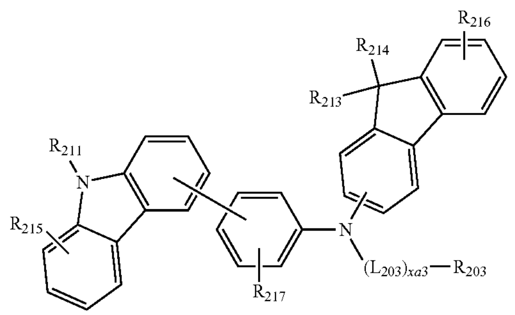

In one or more embodiments, the compound represented by Formula 201 may be represented by Formula 201A-1, but embodiments of the present disclosure are not limited thereto:

Fomula 201A-1

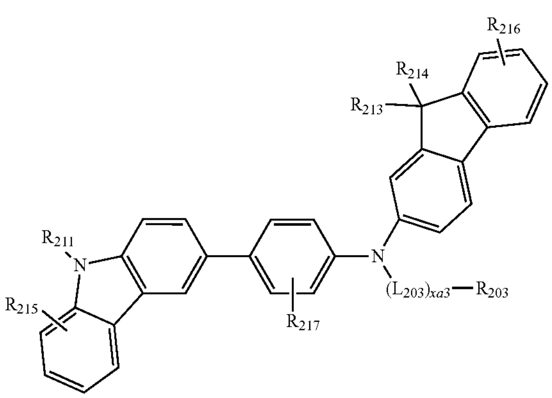

In one embodiment, the compound represented by Formula 202 may be represented by Formula 202-1:

Formula 202-1

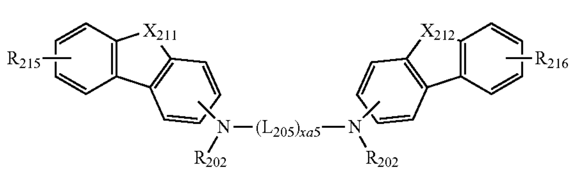

In one or more embodiments, the compound represented by Formula 202 may be represented by Formula 202-1(1):

Formula 202-1(1)

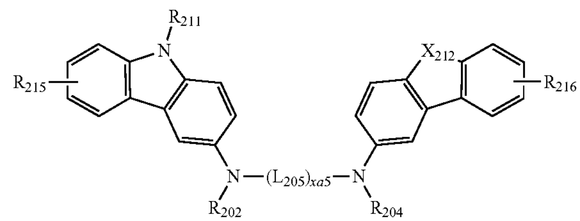

In one or more embodiments, the compound represented by Formula 202 may be represented by Formula 202A:

Fomula 202A

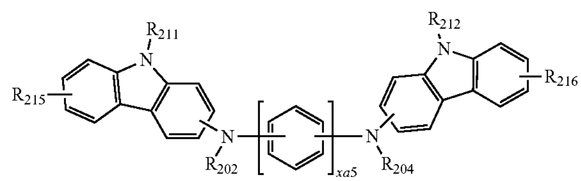

In one or more embodiments, the compound represented by Formula 202 may be represented by Formula 202A-1:

Formula 202A-1

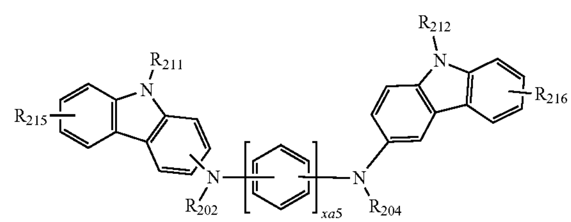

In Formulae 201-1, 201-2, 201-2(1), 201A, 201A(1), 201A-1, 202-1, 202-1(1), 202A, and 202A-1, $L_{201}$ to $L_{203}$, xa1 to xa3, xa5, and $R_{202}$ to $R_{204}$ may be the same as respectively described above in the present specification, $L_{205}$ may be selected from a phenylene group and a fluorenylene group, $X_{211}$ may be selected from O, S, and $N(R_{211})$, $X_{212}$ may be selected from O, S, and $N(R_{212})$, $R_{211}$ and $R_{212}$ may each independently be the same as described in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT48, but embodiments of the present disclosure are not limited thereto:

HT1

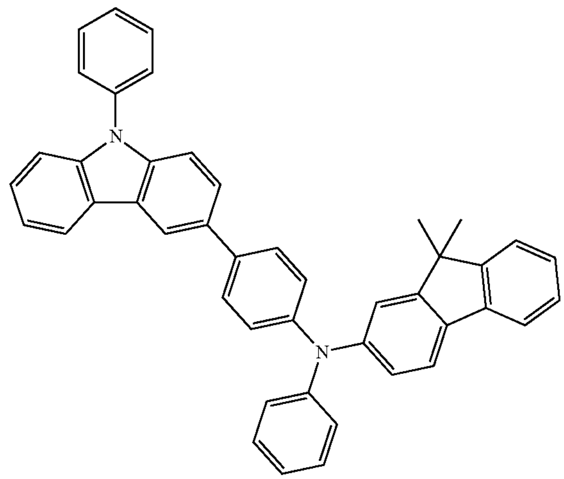

HT2

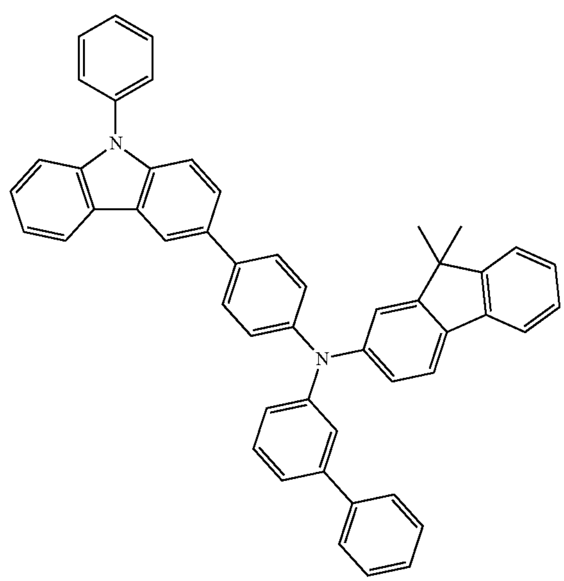

-continued
HT3
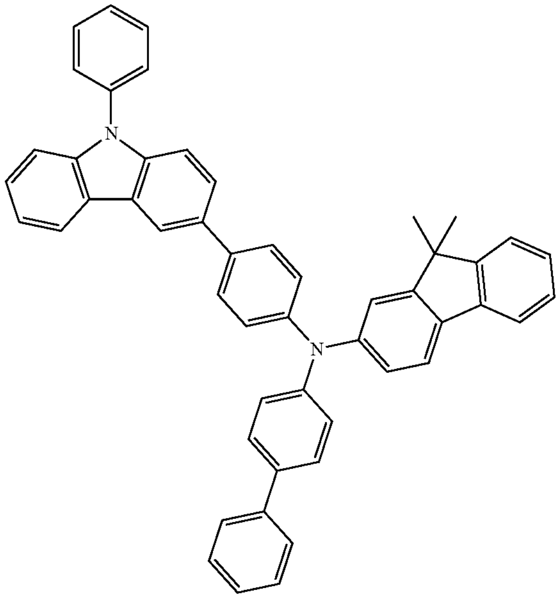
HT4
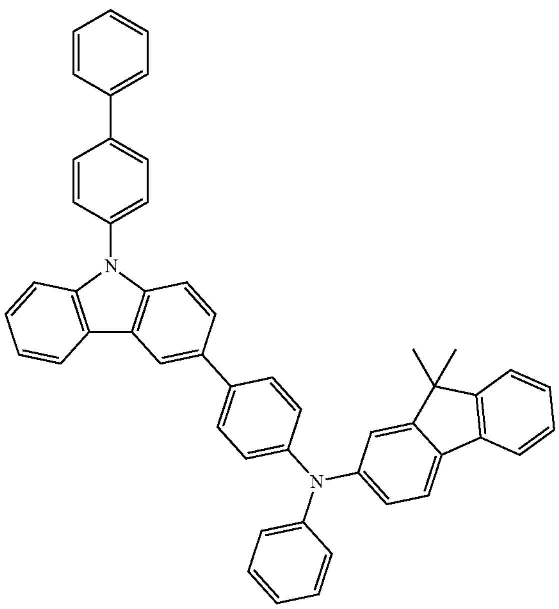
HT5
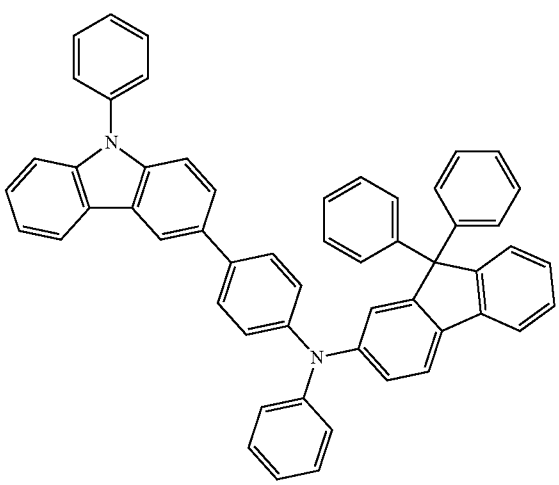

-continued
HT6
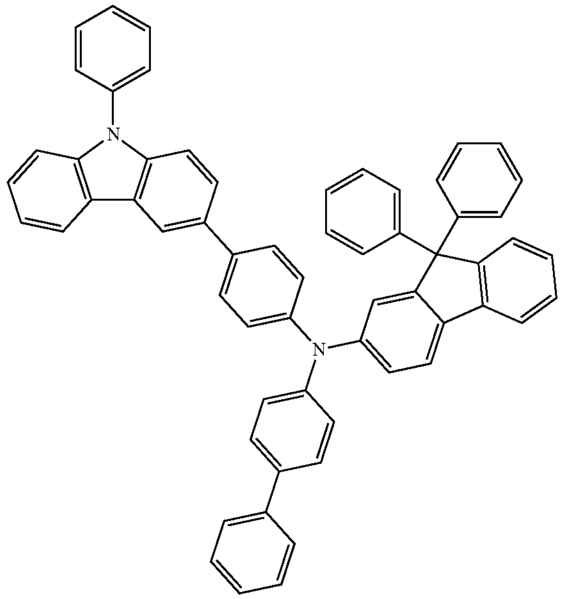
HT7
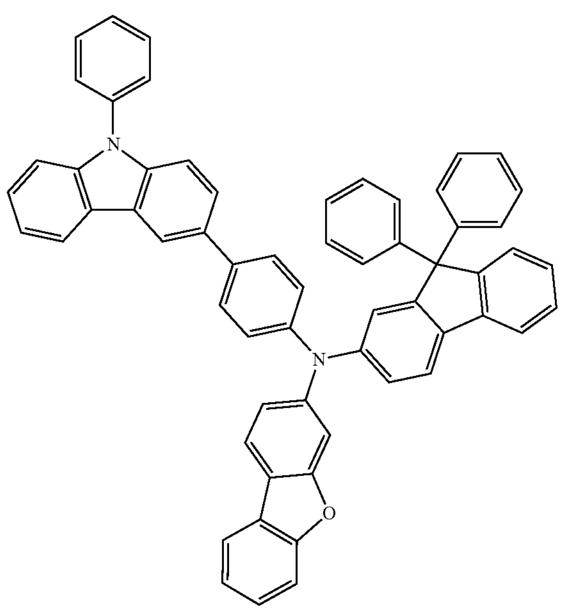

-continued
HT8
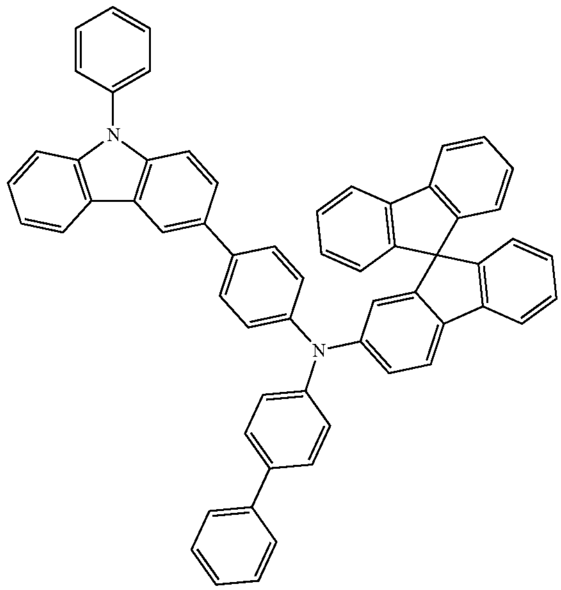
HT9
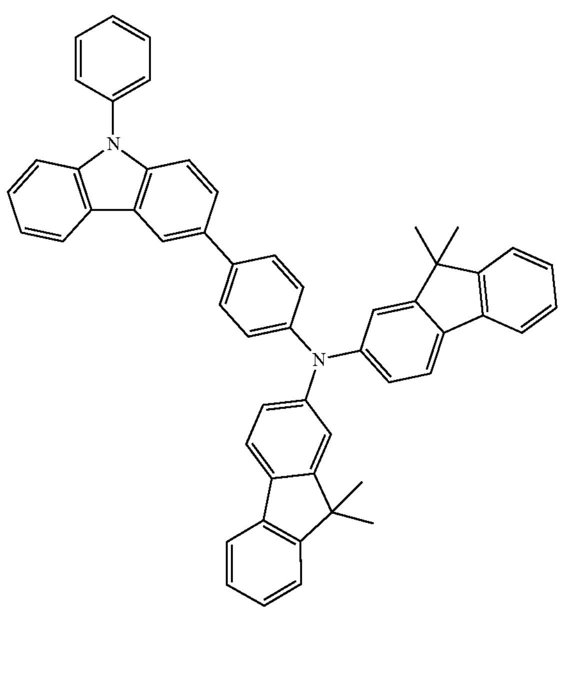

-continued
HT10
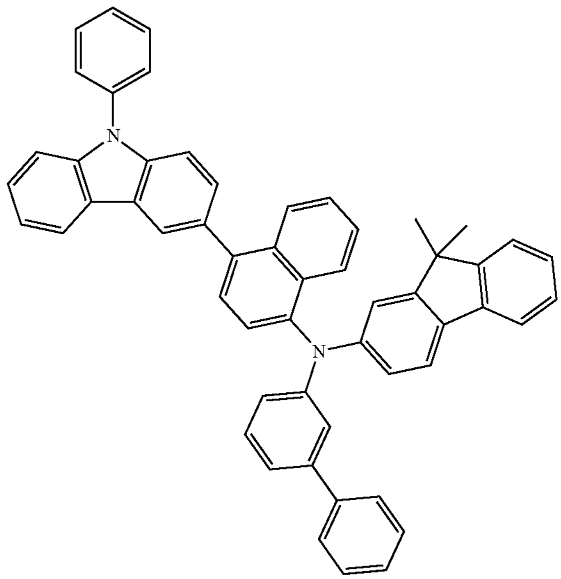
HT11
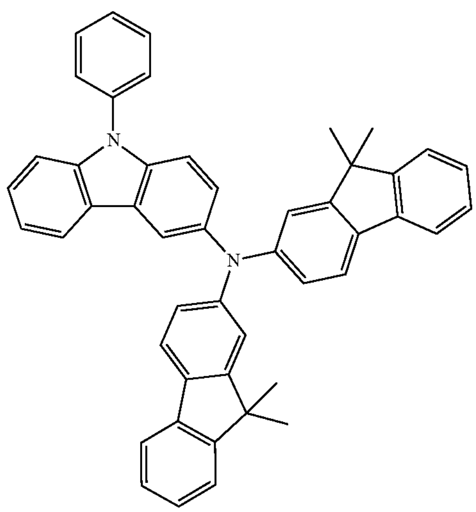
HT12
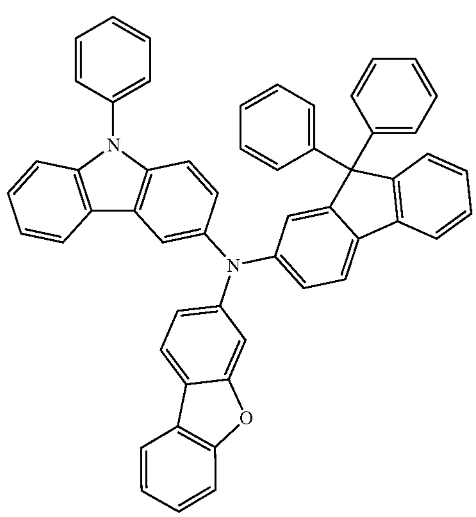

-continued
HT13
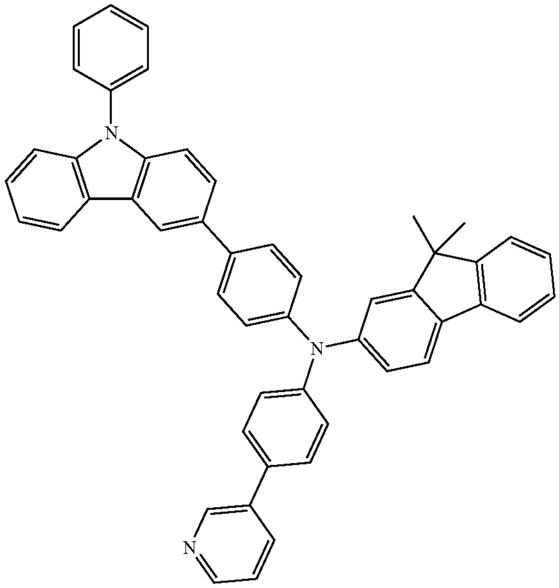
HT14
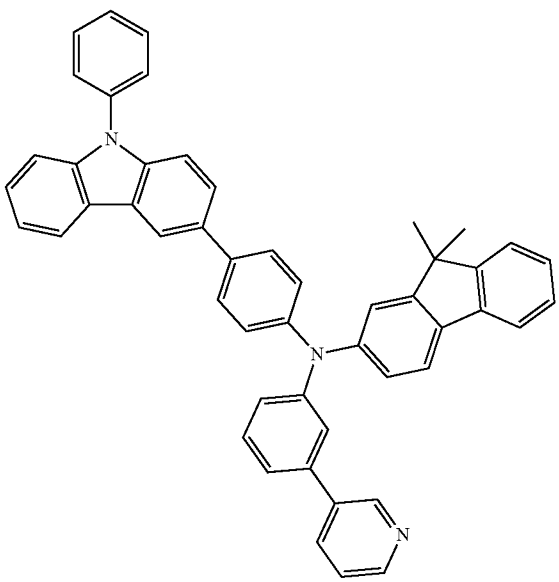
HT15
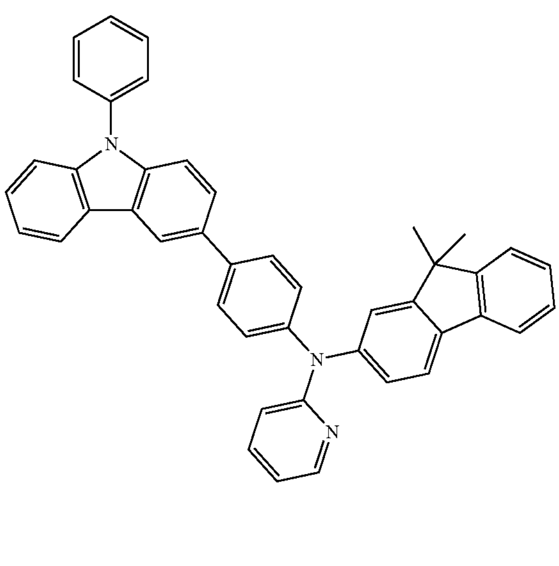

-continued
HT16
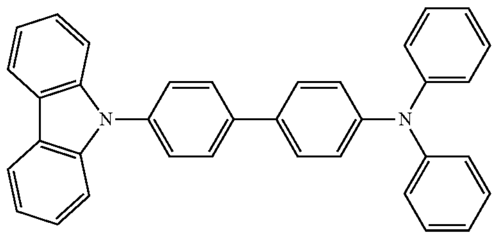
HT17
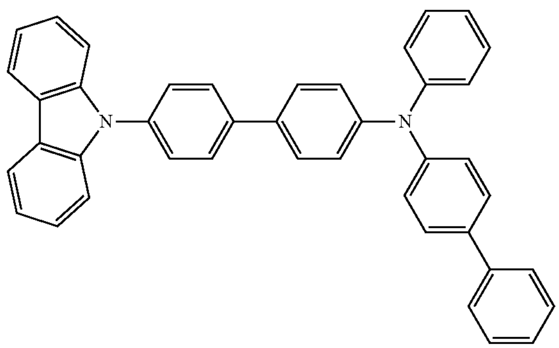
HT18
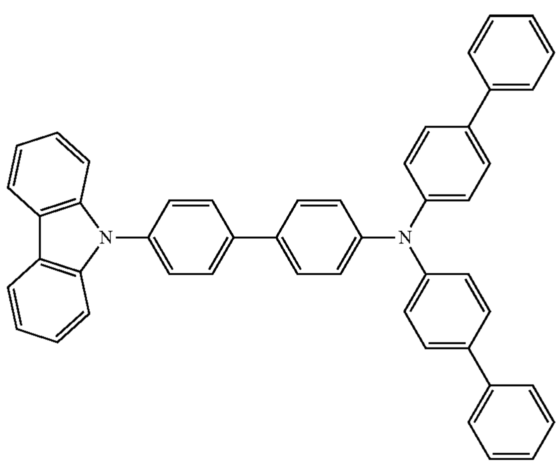
HT19
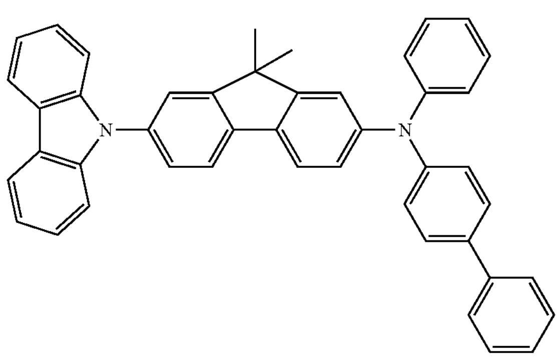

-continued
HT20
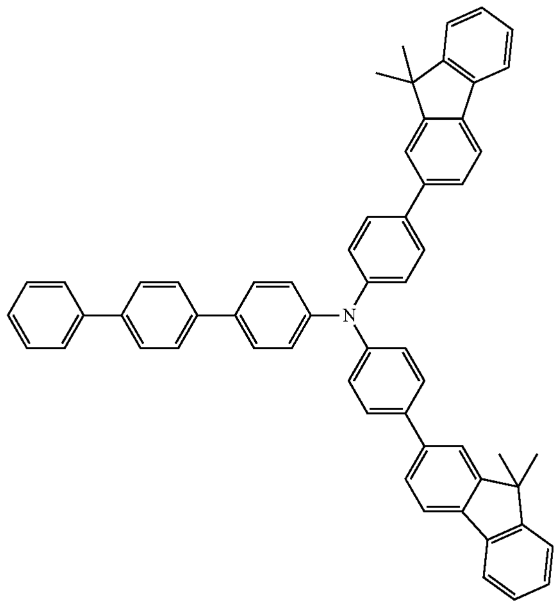
HT21
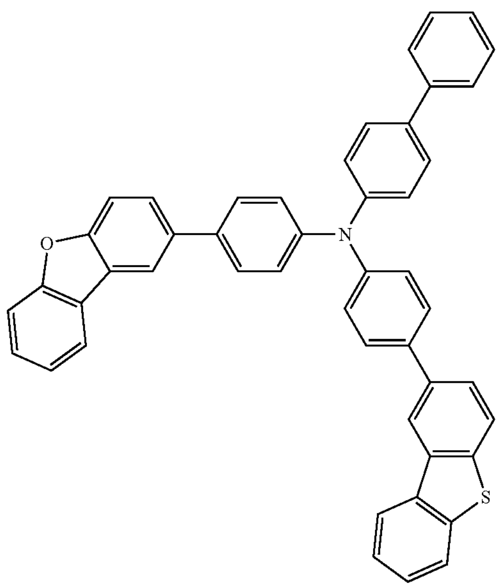
HT22
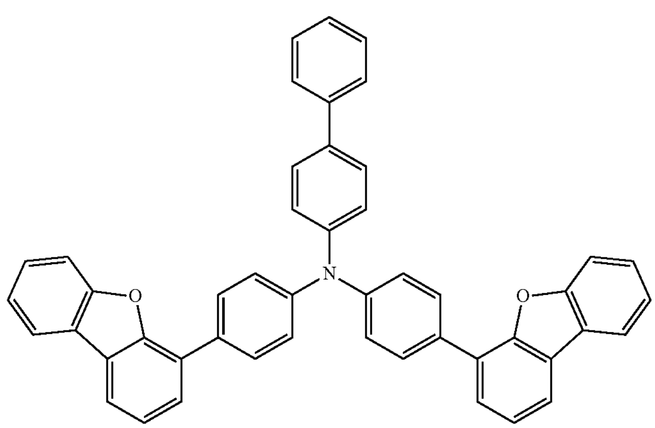

-continued
HT23
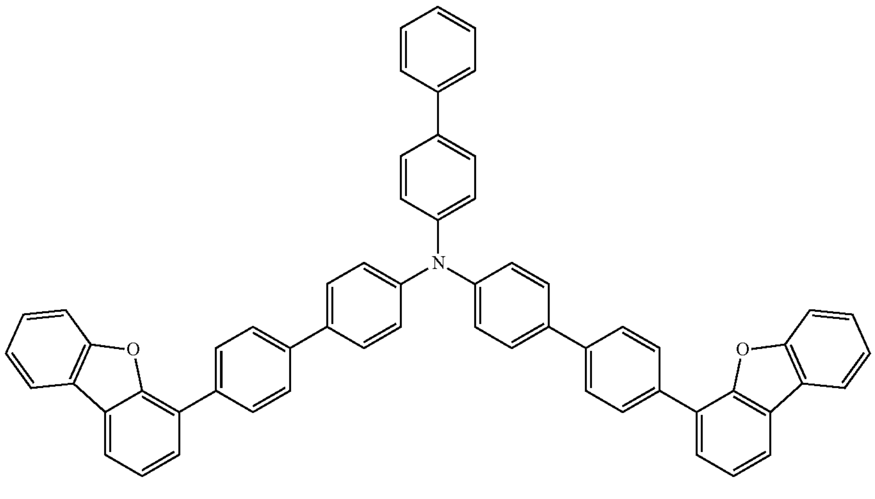
HT24
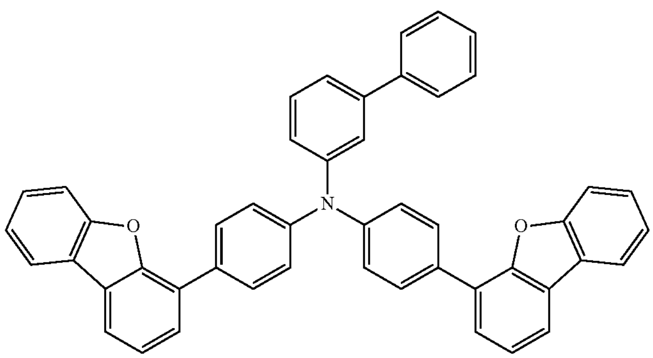
HT25
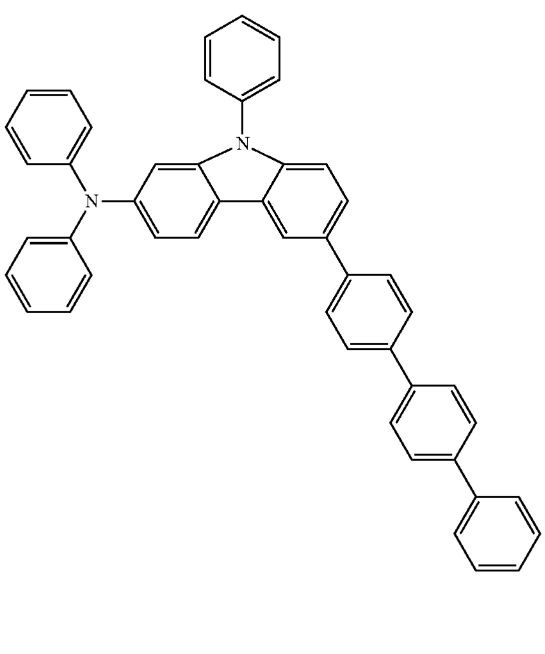

-continued
HT26
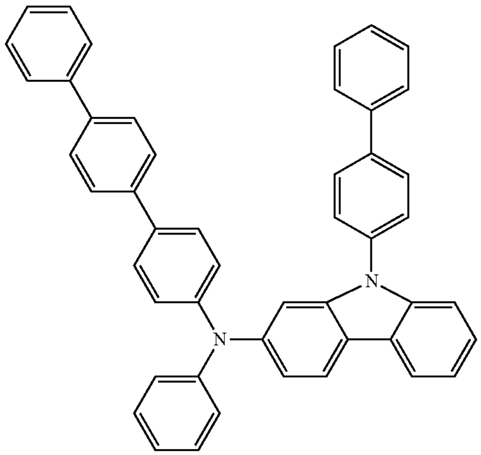
HT27
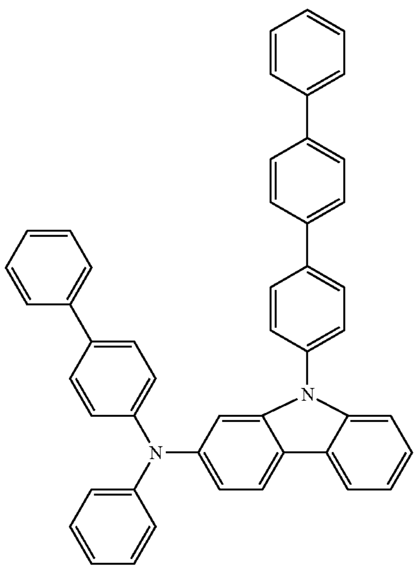
HT28
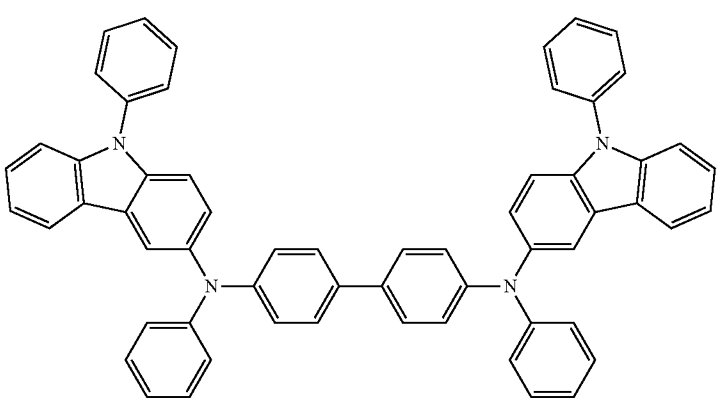

-continued
HT29
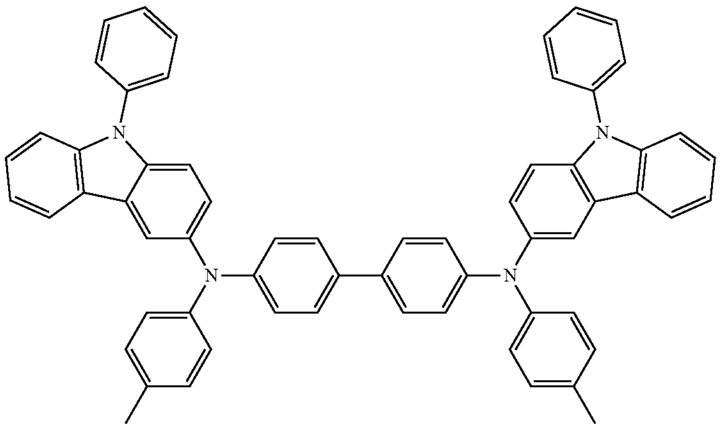
HT30
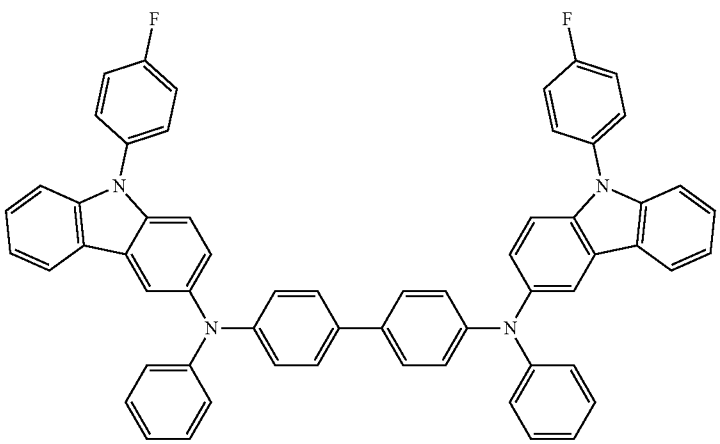
HT31
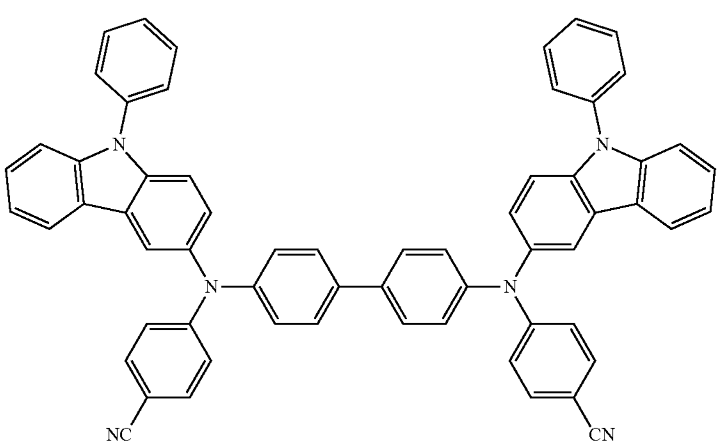

-continued
HT32
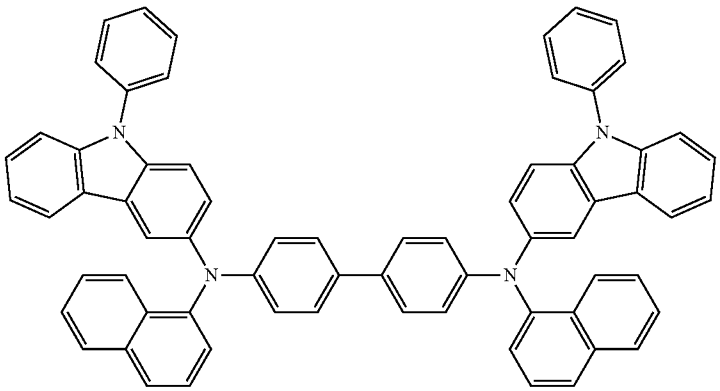
HT33
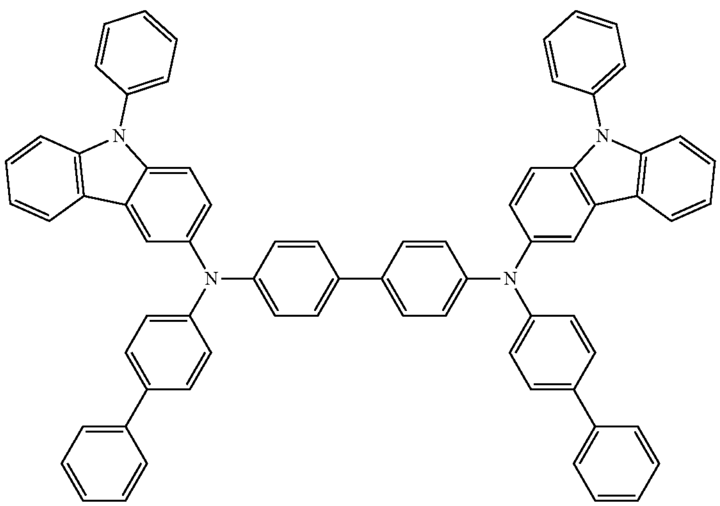
HT34
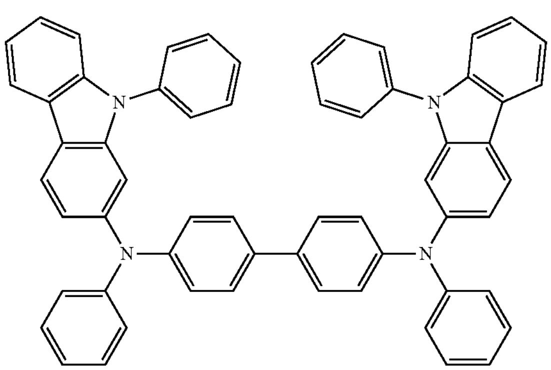

-continued
HT35
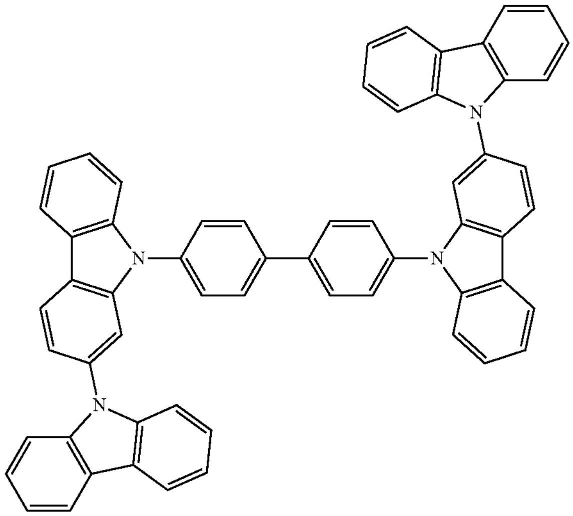
HT36
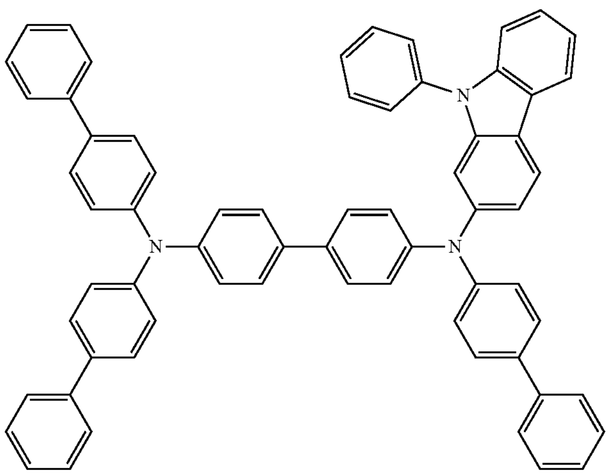
HT37
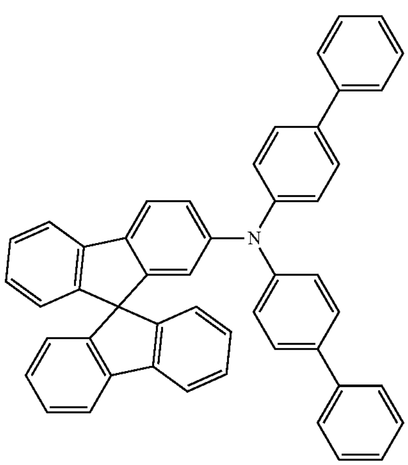

-continued
HT38
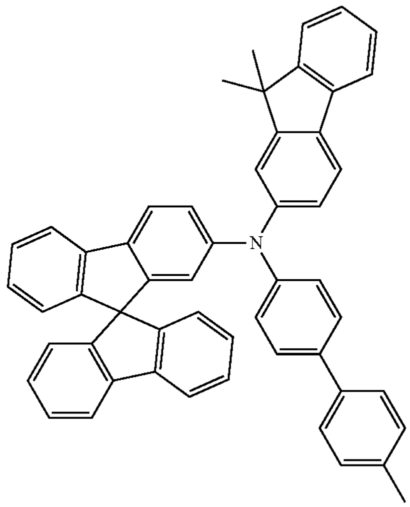
HT39
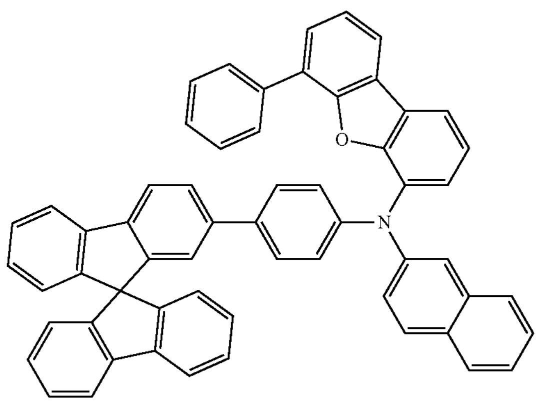
HT40
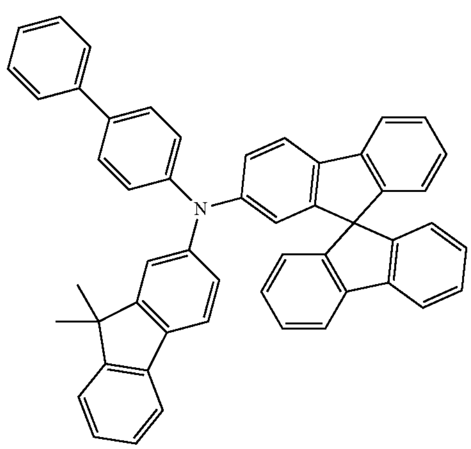

-continued
HT41
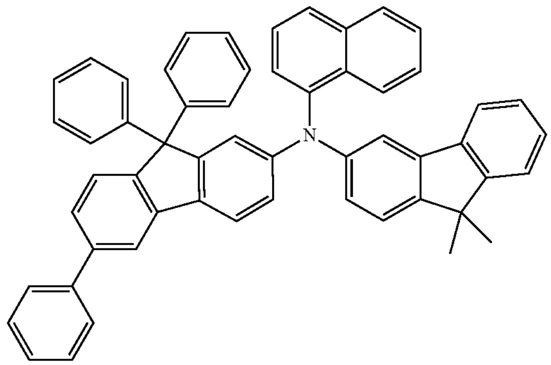
HT42
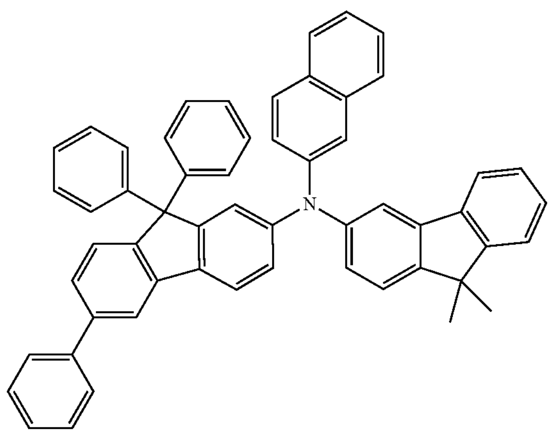
HT43
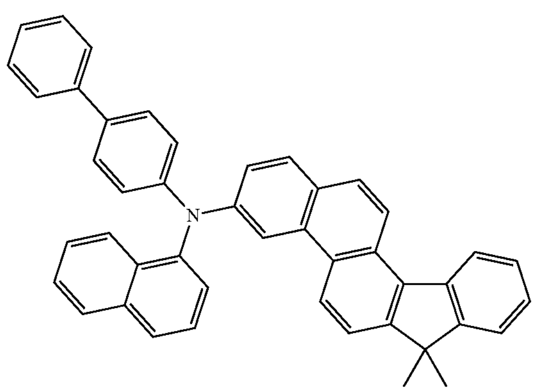

-continued
HT44
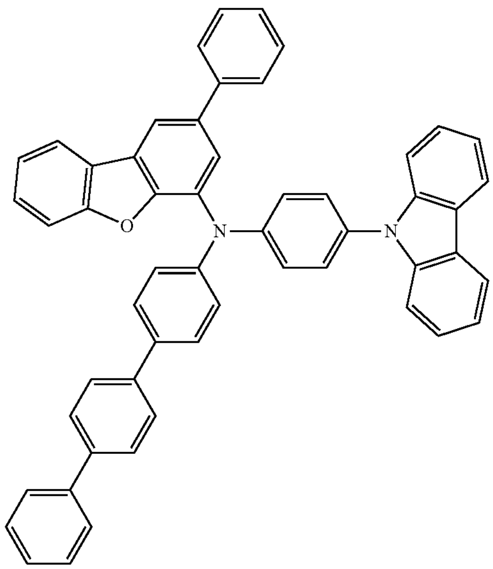
HT45
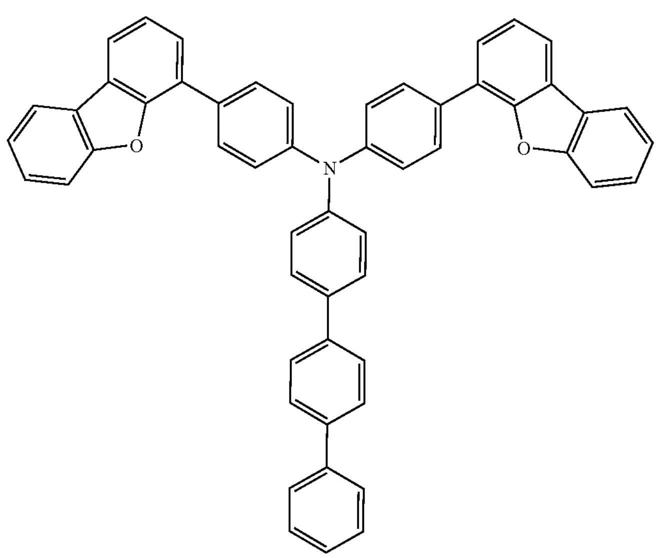

-continued
HT46
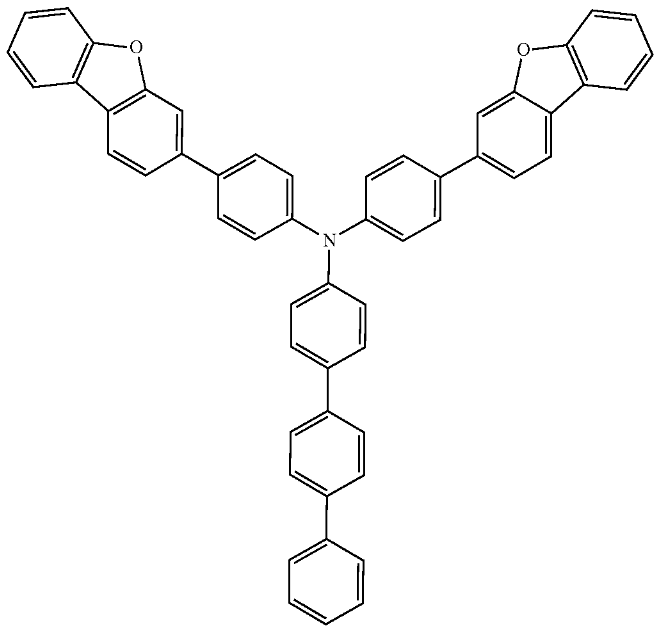
HT47
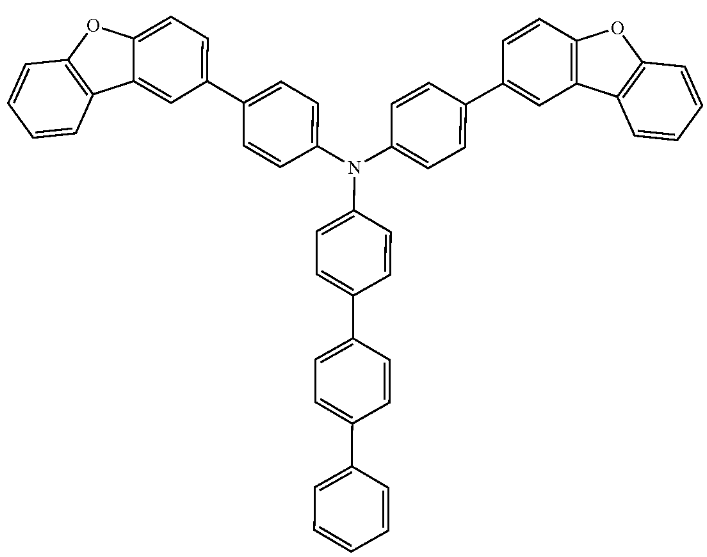

-continued

HT48

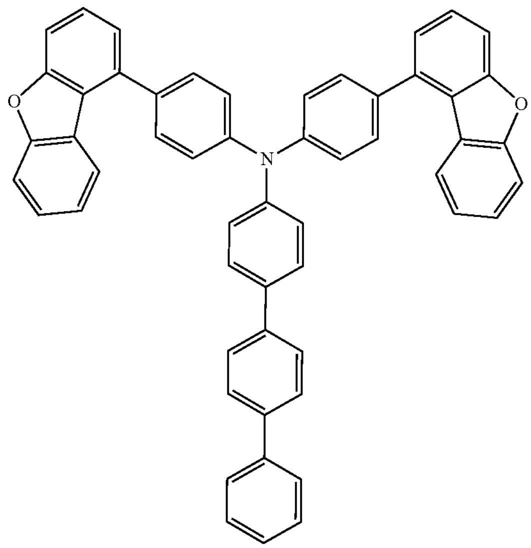

A thickness of the hole transport region may be about 100 Å to about 10,000 Å, for example, about 100 Å to about 1,000 Å. When the hole transport region includes at least one selected from a hole injection layer and a hole transport layer, a thickness of the hole injection layer may be about 100 Å to about 9,000 Å, for example, about 100 Å to about 1,000 Å, and a thickness of the hole transport layer may be about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the flow of electrons from an electron transport region. The emission auxiliary layer and the electron blocking layer may include the materials as described above.

[p-Dopant]

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one embodiment, a LUMO energy level of the p-dopant may be −3.5 eV or less.

The p-dopant may include at least one selected from a quinone derivative, a metal oxide, and a cyano group-containing compound, but embodiments of the present disclosure are not limited thereto.

In one embodiment, the p-dopant may include at least one selected from:

- a quinone derivative, such as tetracyanoquinodimethane (TCNQ) and/or 2,3,5,6-tetrafluoro-7,7,8,8-tetracyanoquinodimethane (F4-TCNQ);
- a metal oxide, such as tungsten oxide or molybdenum oxide;
- 1,4,5,8,9,12-hexaazatriphenylene-hexacarbonitrile (HAT-CN); and
- a compound represented by Formula 221, but embodiments of the present disclosure are not limited thereto:

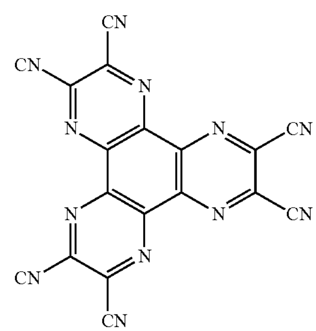

HAT-CN

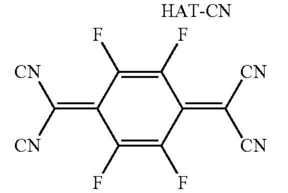

F4-TCNQ

Formula 221

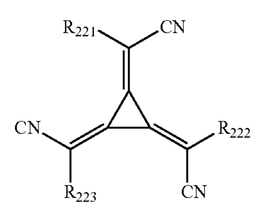

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

[Emission Layer in Organic Layer 150]

When the organic light-emitting device 10 is a full-color organic light-emitting device, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers may contact each other or may be separated from each other. In one or more embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include the organometallic compound represented by Formula 1. The host may include at least one of the second compound and the third compound. The third compound and the second compound may be the same as described above in the present specification.

An amount of a dopant in the emission layer may be, based on about 100 parts by weight of the host, about 0.01 parts by weight to about 15 parts by weight, but embodiments of the present disclosure are not limited thereto.

A thickness of the emission layer may be about 100 Å to about 1,000 Å, for example, about 200 Å to about 600 Å. When the thickness of the emission layer is within this range, excellent light-emission characteristics may be obtained without a substantial increase in driving voltage.

[Electron Transport Region in Organic Layer 150]

The electron transport region may have i) a single-layered structure including (e.g., consisting of) a single material, ii) a single-layered structure including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, embodiments of the structure of the electron transport region are not limited thereto.

The electron transport region may include the second compound as described above.

In one embodiment, the electron transport region may include a buffer layer, the buffer layer may be in direct contact with the emission layer, and the buffer layer may include the second compound as described above.

In one or more embodiments, the electron transport region may include a buffer layer, an electron transport layer, and an electron injection layer stacked in this stated order from the emission layer, and the buffer layer may include the second compound as described above.

In one or more embodiments, the electron transport region (for example, a hole blocking layer, an electron control layer, or an electron transport layer in the electron transport region) may include a metal-free compound containing at least one π electron-depleted nitrogen-containing ring.

The term "π electron-depleted nitrogen-containing ring" as used herein refers to a $C_1$-$C_{60}$ heterocyclic group having including at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-depleted (or π electron-deficient) nitrogen-containing ring include an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, an isobenzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and an azacarbazole ring, but are not limited thereto.

For example, the electron transport region may include a compound represented by Formula 601:

$$[Ar_{601}]_{xe11}-[(L_{601})_{xe1}-R_{601}]_{xe21} \quad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of $Ar_{601}$(s) in the number of xe11 and $R_{601}$(s) in the number of xe21 may include the π electron-depleted nitrogen-containing ring.

In one embodiment, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more $Ar_{601}$(s) may be linked to each other via a single bond.

In one or more embodiments, $Ar_{601}$ in Formula 601 may be an anthracene group.

In one or more embodiments, the compound represented by Formula 601 may be represented by Formula 601-1:

Fomula 601-1

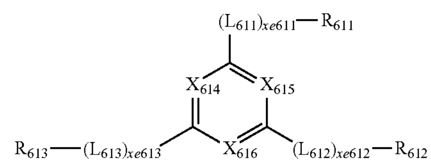

In Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$($Q_{601}$) and —P(=O)($Q_{601}$)($Q_{602}$), and $Q_{601}$ and $Q_{602}$ may be the same as respectively described above in the present specification.

The electron transport region may include at least one compound selected from Compounds ET1 to ET36, but embodiments of the present disclosure are not limited thereto:

ET1

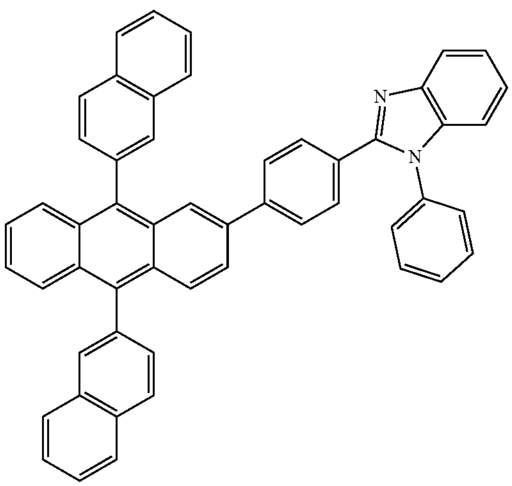

ET2

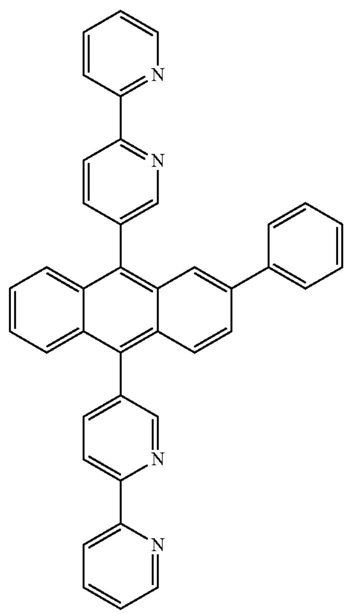

ET3

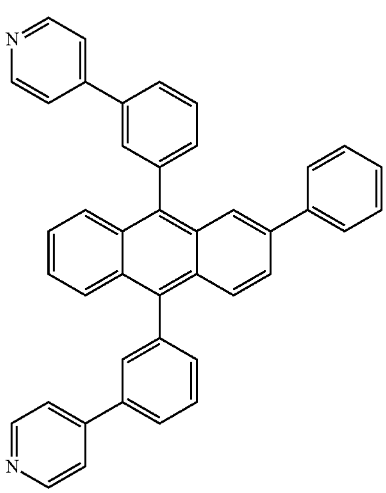

ET4

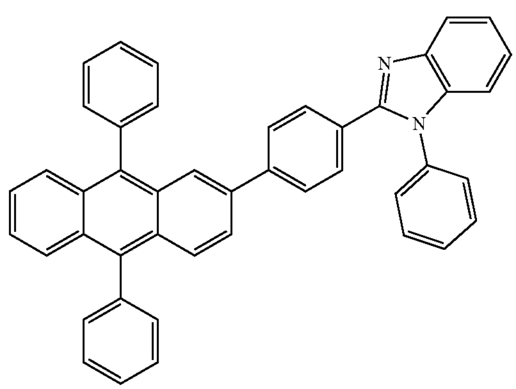

-continued
ET5
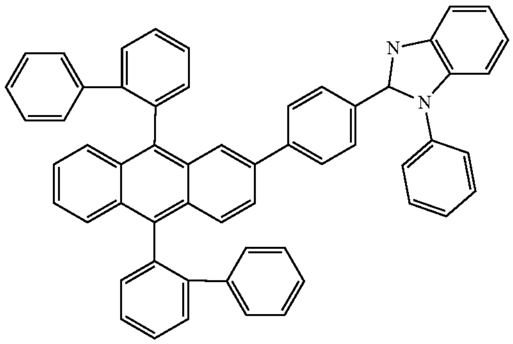
ET6
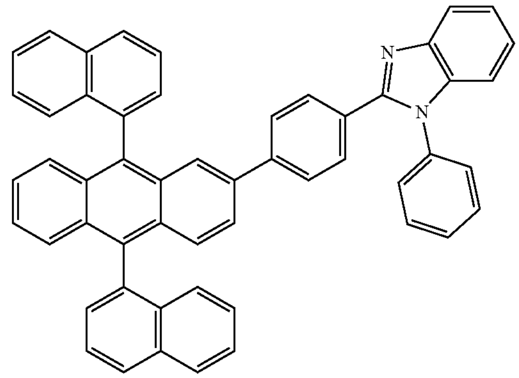
ET7
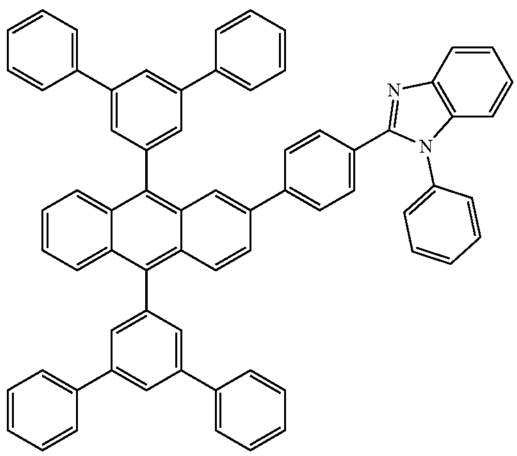
ET8
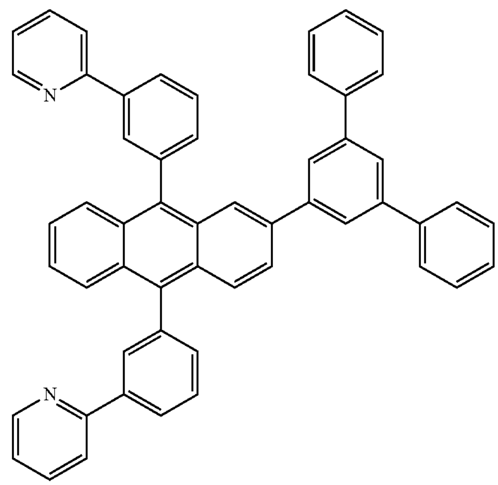
ET9
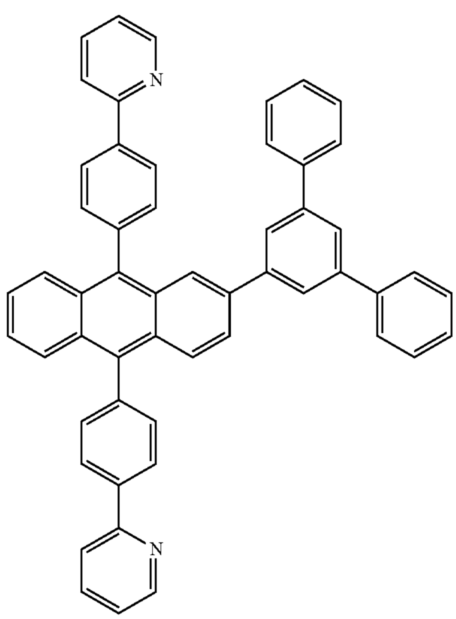
ET10
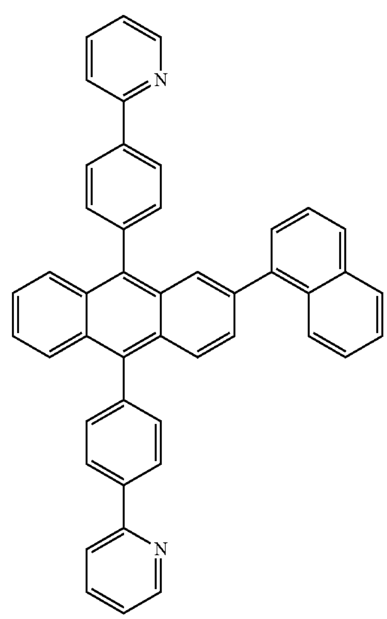

-continued
ET11
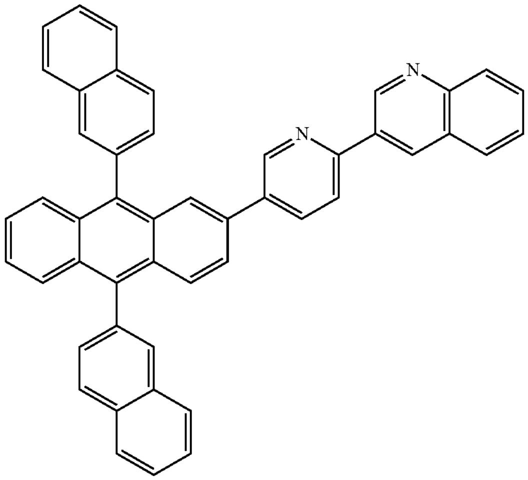
ET12
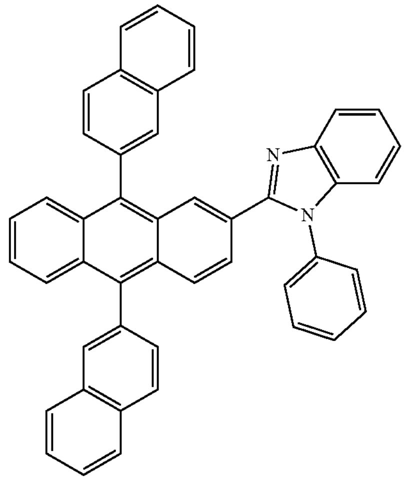
ET13
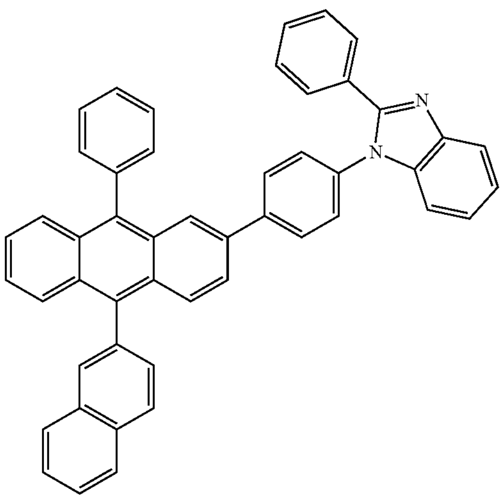
ET14
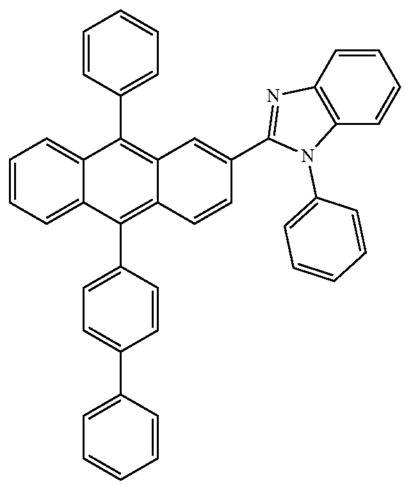
ET15
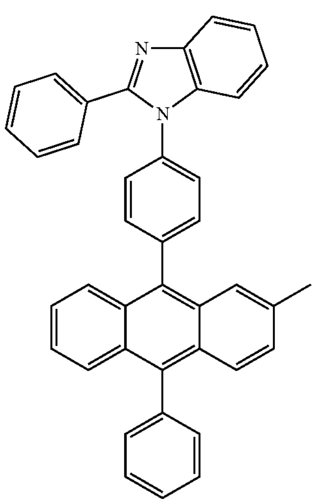
ET16
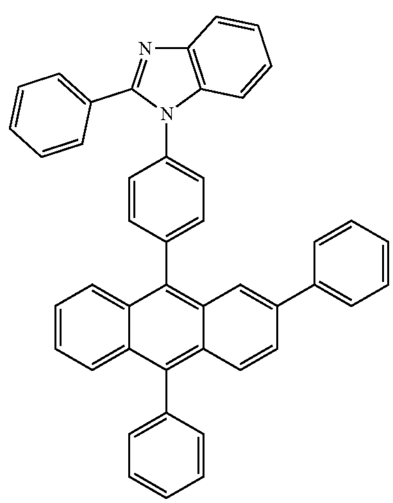

-continued
ET17
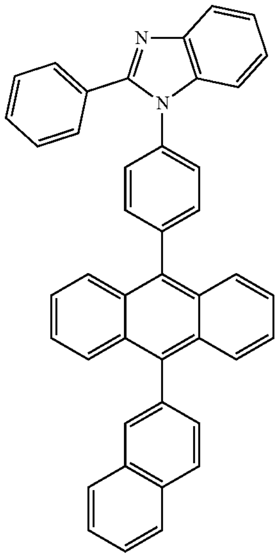
ET18
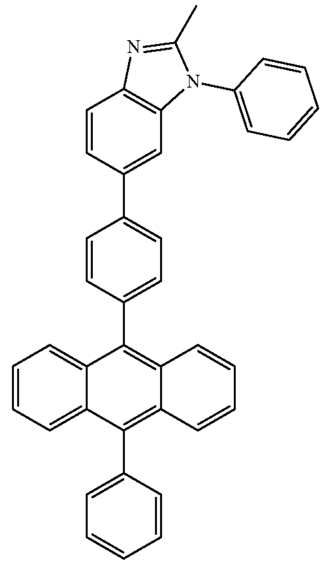
ET19
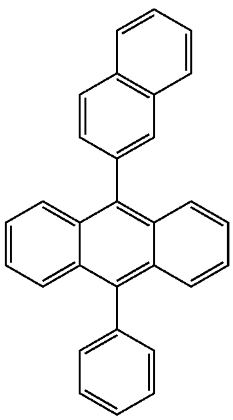
ET20
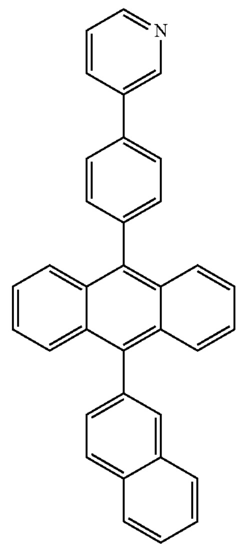
ET21
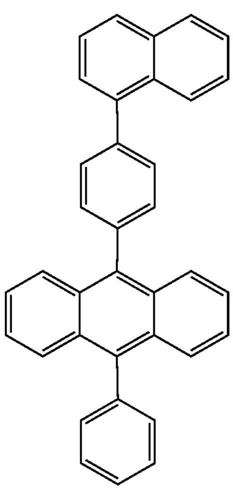
ET22
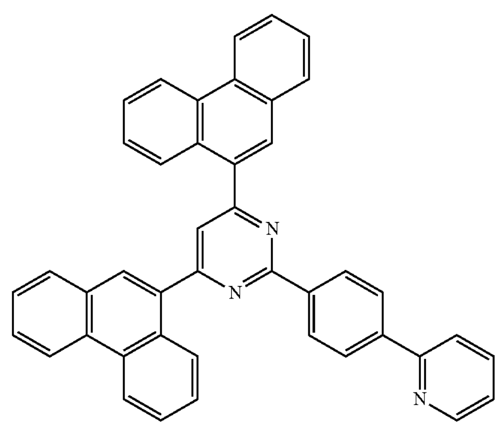

-continued
ET23
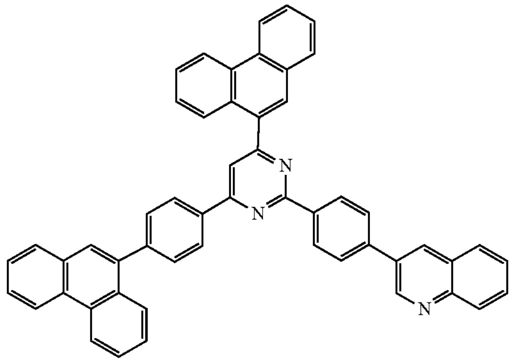
ET24
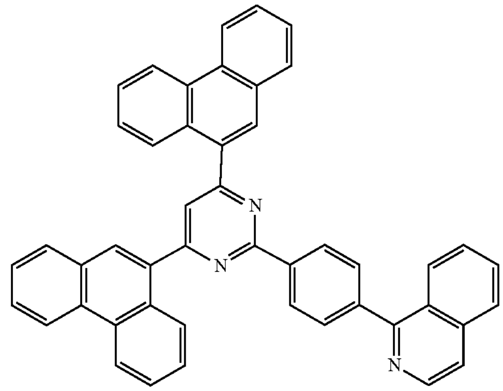
ET25
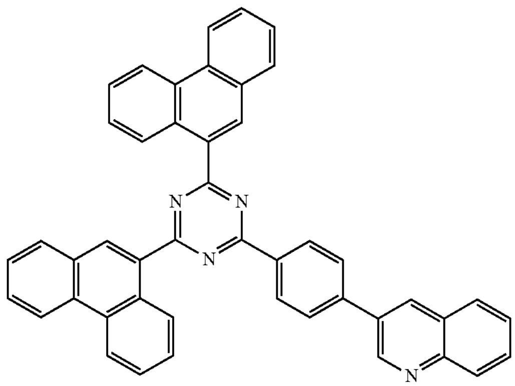
ET26
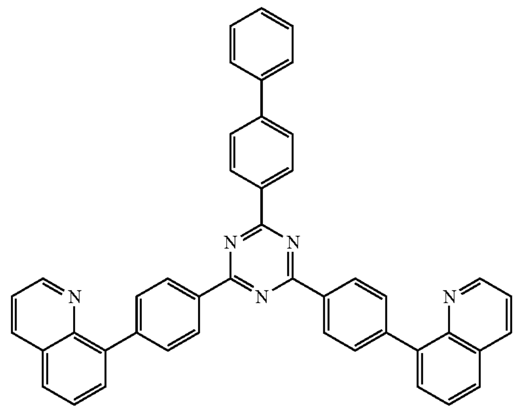
ET27
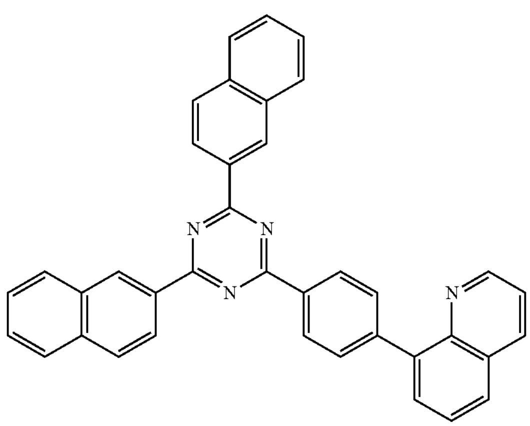
ET28
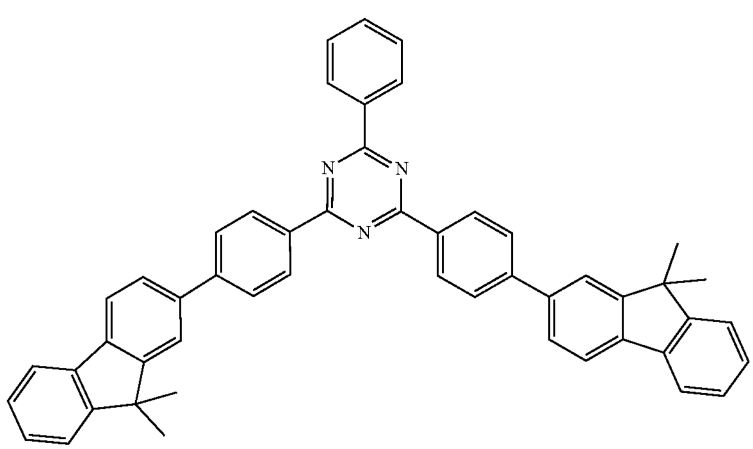

-continued
ET29
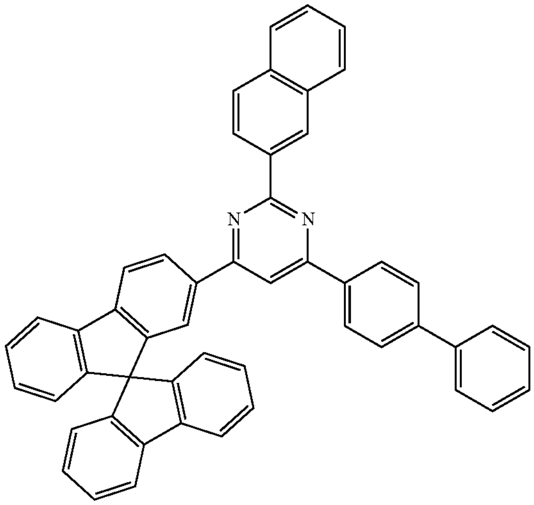
ET30
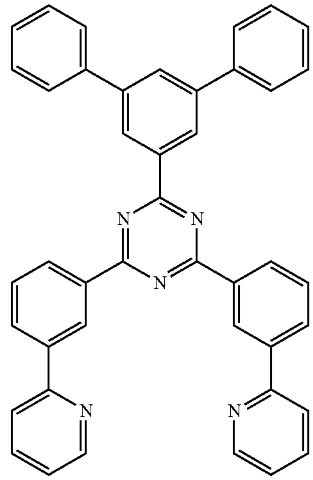
ET31
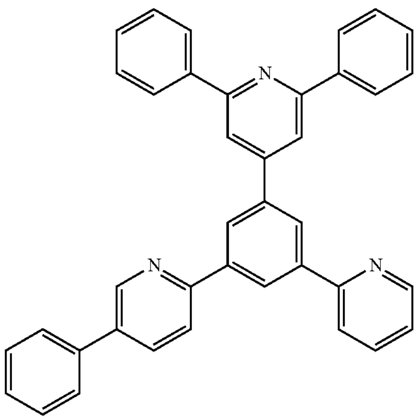
ET32
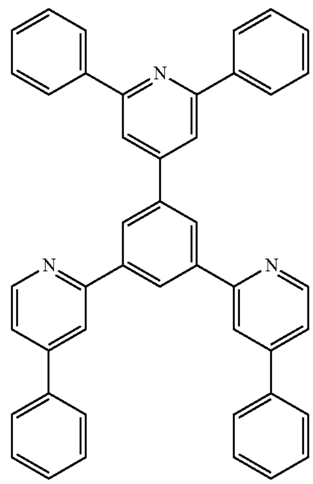
ET33
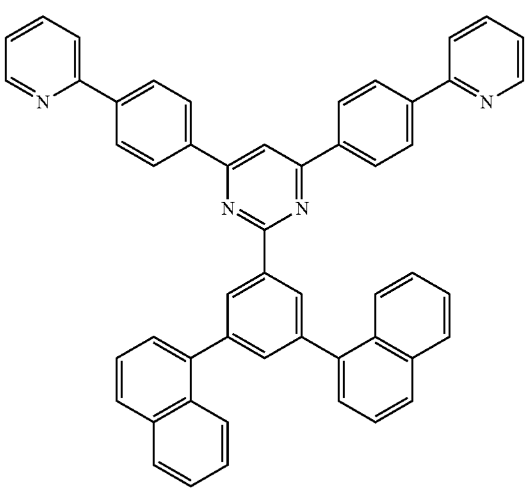
ET34
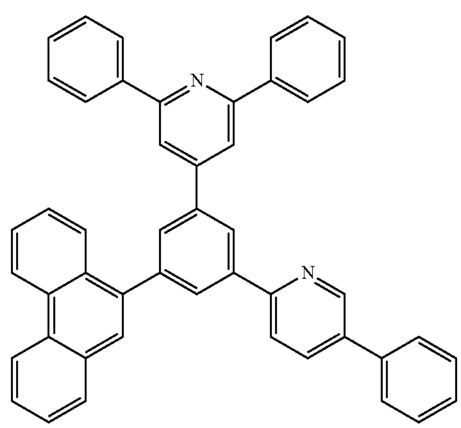

-continued

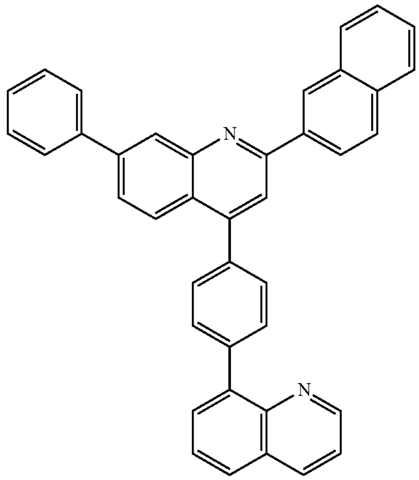

ET35

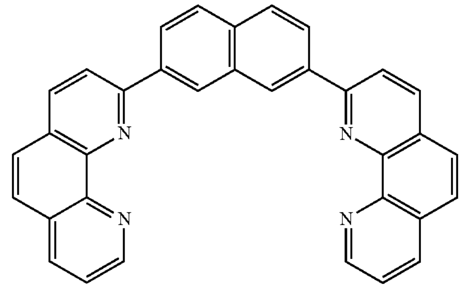

ET36

In one or more embodiments, the electron transport region may include at least one selected from 2,9-dimethyl-4,7-diphenyl-1,10-phenanthroline (BCP), 4,7-diphenyl-1,10-phenanthroline (Bphen), Alq3, BAlq, 3-(biphenyl-4-yl)-5-(4-tert-butylphenyl)-4-phenyl-4H-1,2,4-triazole (TAZ), and NTAZ:

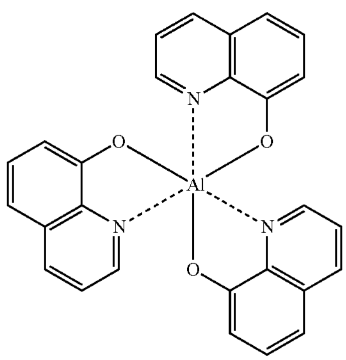

$Alq_3$

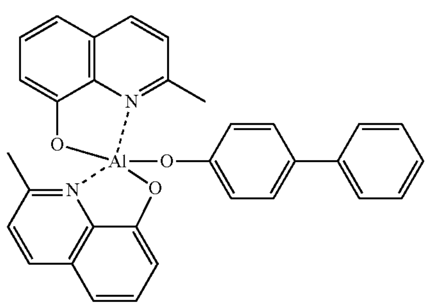

BAlq

-continued

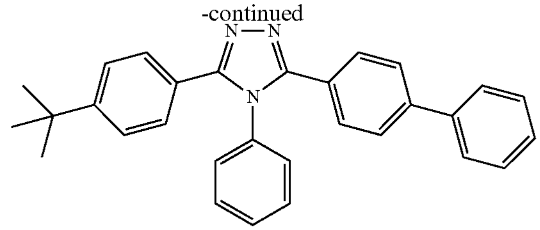

TAZ

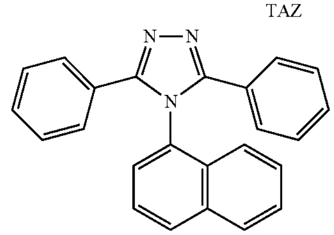

NTAZ

Thicknesses of the buffer layer, the hole blocking layer, and the electron control layer may each independently be about 20 Å to about 1,000 Å, for example, about 30 Å to about 300 Å. When the thicknesses of the buffer layer, the hole blocking layer, and the electron control layer are within these ranges, excellent hole blocking characteristics or excellent electron control characteristics may be obtained without a substantial increase in driving voltage.

A thickness of the electron transport layer may be about 100 Å to about 1,000 Å, for example, about 150 Å to about 500 Å. When the thickness of the electron transport layer is within the range described above, satisfactory electron transport characteristics may be obtained without a substantial increase in driving voltage.

The electron transport region (for example, the electron transport layer in the electron transport region) may further include, in addition to the materials described above, a metal-containing material.

The metal-containing material may include at least one selected from an alkali metal complex and an alkaline earth-metal complex. The alkali metal complex may include a metal ion selected from a lithium (Li) ion, a sodium (Na) ion, a potassium (K) ion, a rubidium (Rb) ion, and a cesium (Cs) ion, and the alkaline earth-metal complex may include a metal ion selected from a beryllium (Be) ion, a magnesium (Mg) ion, a calcium (Ca) ion, a strontium (Sr) ion, and a barium (Ba) ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) and/or ET-D2:

ET-D1

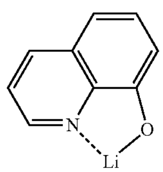

ET-D2

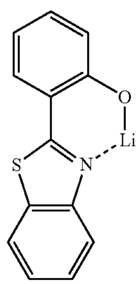

The electron transport region may include an electron injection layer that facilitates electron injection from the second electrode 190. The electron injection layer may directly contact the second electrode 190.

The electron injection layer may have i) a single-layered structure including including (e.g., consisting of) a single material, ii) a single-layered structure including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

In one embodiment, the electron injection layer may include Li, Na, K, Rb, Cs, Mg, Ca, Er, Tm, Yb, or any combination thereof, but embodiments of the present disclosure are not limited thereto.

The alkali metal may be selected from Li, Na, K, Rb, and Cs. In one embodiment, the alkali metal may be Li, Na, or Cs. In one or more embodiments, the alkali metal may be Li, or Cs, but embodiments of the present disclosure are not limited thereto.

The alkaline earth metal may be selected from Mg, Ca, Sr, and Ba.

The rare earth metal may be selected from scandium (Sc), yttrium (Y), cerium (Ce), terbium (Tb), ytterbium (Yb), and gadolinium (Gd).

The alkali metal compound, the alkaline earth-metal compound, and the rare earth metal compound may be selected from oxides and halides (for example, fluorides, chlorides, bromides, and/or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or KI. In one embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ ($0<x<1$), or $Ba_xCa_{1-x}O$ ($0<x<1$). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $Sc_2O_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with the metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy phenyloxadiazole, hydroxy phenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may include (e.g., consist of) an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, the alkali metal, the alkaline earth metal, the rare earth metal, the alkali metal compound, the alkaline earth-metal compound, the rare earth metal compound, the alkali metal complex, the alkaline earth-metal complex, the rare earth metal complex, or any combination thereof may be homogeneously or non-homogeneously dispersed in a matrix including the organic material.

A thickness of the electron injection layer may be about 1 Å to about 100 Å, for example, about 3 Å to about 90 Å. When the thickness of the electron injection layer is within the range described above, the electron injection layer may have satisfactory electron injection characteristics without a substantial increase in driving voltage.

In one embodiment, the electron transport region of the organic light-emitting device 10 may include the buffer layer, the electron transport layer, and the electron injection layer, and at least one layer selected from the electron transport layer and the electron injection layer may include the alkali metal, the alkaline earth metal, the rare earth metal, the alkali metal compound, the alkaline earth metal compound, the rare earth metal compound, the alkali metal complex, the alkaline earth metal complex, the rare earth metal complex, or any combination thereof.

[Second Electrode 190]

The second electrode 190 is located on the organic layer 150 having such a structure. The second electrode 190 may be a cathode, which is an electron injection electrode, and as a material for forming the second electrode, a metal, an alloy, an electrically conductive compound, and a mixture thereof, each having a low work function, may be utilized.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure or a multi-layered structure including two or more layers.

Figure 2:
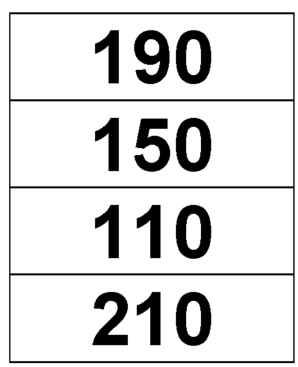
FIG. 2 is a schematic view of an organic light-emitting device according to another embodiment.
Figure 3:
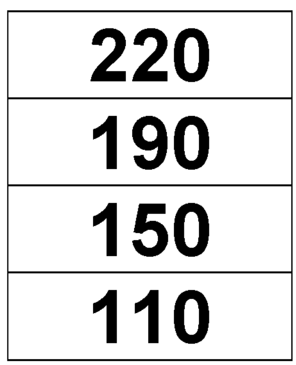
FIG. 3 is a schematic view of an organic light-emitting device according to another embodiment.
Figure 4:
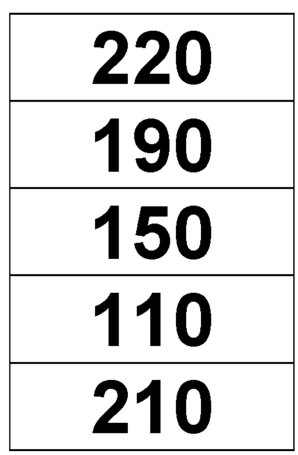
FIG. 4 is a schematic view of an organic light-emitting device according to another embodiment.

[Description of FIGS. 2 to 4]

An organic light-emitting device 20 of FIG. 2 includes a first capping layer 210, a first electrode 110, an organic layer 150, and a second electrode 190 which are sequentially stacked in this stated order, an organic light-emitting device 30 of FIG. 3 includes a first electrode 110, an organic layer 150, a second electrode 190, and a second capping layer 220 which are sequentially stacked in this stated order, and an organic light-emitting device 40 of FIG. 4 includes a first capping layer 210, a first electrode 110, an organic layer 150, a second electrode 190, and a second capping layer 220.

Regarding FIGS. 2 to 4, the first electrode 110, the organic layer 150, and the second electrode 190 may be understood by referring to the description presented in connection with FIG. 1.

In the organic layer 150 of each of the organic light-emitting devices 20 and 40, light generated in an emission layer may pass through the first electrode 110, which is a semi-transmissive electrode or a transmissive electrode, and the first capping layer 210 toward the outside, and in the organic layer 150 of each of the organic light-emitting devices 30 and 40, light generated in an emission layer may pass through the second electrode 190, which is a semi-transmissive electrode or a transmissive electrode, and the second capping layer 220 toward the outside.

The first capping layer 210 and the second capping layer 220 may increase external luminescent efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphyrine derivatives, phthalocyanine derivatives, naphthalocyanine derivatives, alkali metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I. In one embodiment, at least one of the first capping layer 210 and the second capping layer 220 may each independently include an amine-based compound.

In one embodiment, at least one selected from the first capping layer 210 and the second capping layer 220 may each independently include the compound represented by Formula 201 or the compound represented by Formula 202.

Hereinbefore, the organic light-emitting device according to an embodiment has been described in connection with FIGS. 1 to 4. However, embodiments of the present disclosure are not limited thereto.

Layers constituting the hole transport region, the emission layer, and layers constituting the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the vacuum deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a compound to be included in the layer to be formed and the structure of the layer to be formed.

When layers constituting the hole transport region, the emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a compound to be included in the layer to be formed and the structure of the layer to be formed.

General Definition of Substituents

The term "$C_1$-$C_{60}$ alkyl group" as used herein refers to a linear or branched aliphatic saturated hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and non-limiting examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, Si, P, and S as a ring-forming atom and 1 to 10 carbon atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one carbon-carbon double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, a fluorenyl group, and a chrysenyl group. When the $C_6$-$C_{60}$ aryl group and the $C_6$-$C_{60}$ arylene group each include two or more rings, the two or more rings may be fused to each other. The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a carbocyclic aromatic system that has at least one heteroatom selected from N, O, Si, P, and S as a ring-forming atom, in addition to 1 to 60 carbon atoms.

The term "$C_1$-$C_{60}$ heteroarylene group" as used herein refers to a divalent group having a carbocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, an isoquinolinyl group, a carbazolyl group, a dibenzofuranyl group and a dibenzothiofuranyl group. When the $C_1$-$C_{60}$ heteroaryl group and the $C_1$-$C_{60}$ heteroarylene group each include two or more rings, the two or more rings may be condensed with each other. The term "$C_2$-$C_{60}$ alkylheteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. A non-limiting example of the monovalent non-aromatic condensed polycyclic group is a fluorenyl group, and an adamantyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom selected from N, O, Si, P, and S, other than carbon atoms, as a ring-forming atom, and no aromaticity in its entire molecular structure. A non-limiting example of the monovalent non-aromatic condensed heteropolycyclic group is a carbazolyl group and an azaadamantyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a monocyclic or polycyclic group that includes only carbon atoms as a ring-forming atom and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_5$-$C_{60}$ carbocyclic group, except that as a ring-forming atom, at least one heteroatom selected from N, O, Si, P, and S is used in addition to carbon (the number of carbon atoms may be in a range of 1 to 60).

In the present specification, at least one substituent of the substituted $C_5$-$C_{60}$ carbocyclic group, the substituted $C_1$-$C_{60}$ heterocyclic group, the substituted $C_1$-$C_{20}$ alkylene group, the substituted $C_2$-$C_{20}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —Si($C_{211}$)($C_{212}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, and a monovalent non-aromatic condensed heteropolycyclic group, each substituted with at least one selected from deuterium, —F, —Br, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group that is substituted with at least one selected from deuterium, —F, a cyano group, a $C_1$-$C_{60}$ alkyl group, a phenyl group, and a biphenyl group and a $C_6$-$C_{60}$ aryl group that is substituted with at least one selected from deuterium, —F, a cyano group, a $C_1$-$C_{10}$ alkyl group, a phenyl group, and a biphenyl group.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, the term "OMe" as used herein refers to a methoxy group, the term "Ad" as used herein refers to an adamantyl group, and the term "i-Pr" as used herein refers to an isopropyl group.

The term "biphenyl group" as used herein refers to "a phenyl group substituted with a phenyl group". In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The wording "B was utilized instead of A" utilized in describing Synthesis Examples refers to that an identical molar equivalent of B was utilized in place of A.

EXAMPLES

Synthesis Example 1: Synthesis of Compound BD19

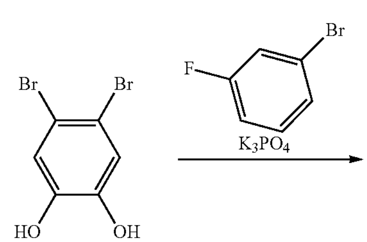

-continued

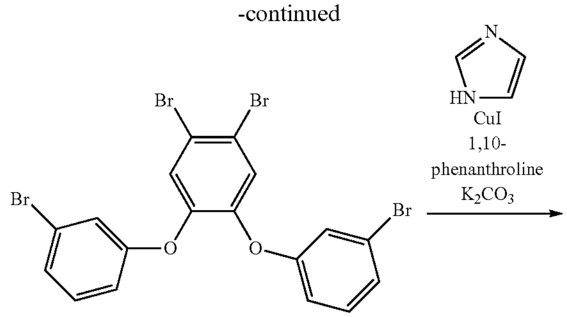

[19-A]

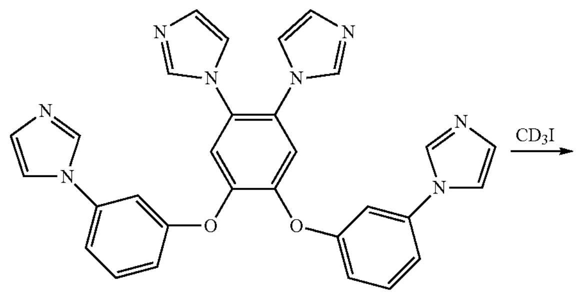

[19-B]

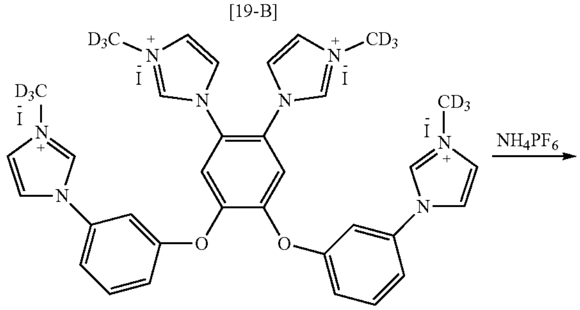

[19-C]

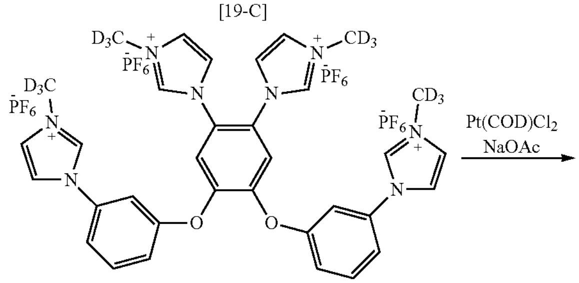

[19-D]

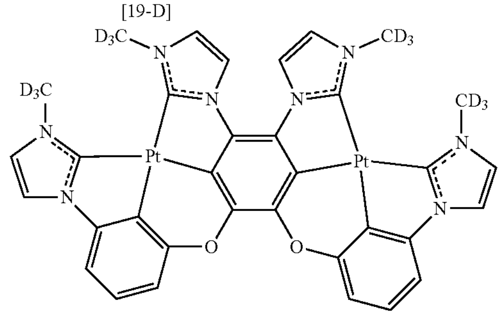

BD19

Synthesis of Intermediate [19-A]

4,5-dibromobenzene-1,2-diol (1.0 eq), 1-bromo-3-fluorobenzene (2.6 eq), and $K_3PO_4$ (4.0 eq) were added to a reaction container, and the mixed solution was suspended in DMF (0.25 M). The reaction mixture was heated, and stirred at a temperature of 160° C. for 24 hours. After the completion of the reaction, the resulting product was cooled to room temperature, and an extraction process was performed thereon utilizing distilled water and ethylacetate. An organic layer extracted therefrom was washed with a saturated aqueous NaCl solution, and dried utilizing $MgSO_4$. A residue obtained by removing the solvent therefrom was separated by column chromatography to obtain Intermediate [19-A] (yield of 64%).

Synthesis of Intermediate [19-B]

Intermediate [19-A] (1.0 eq), imidazole (5.2 eq), $K_2CO_3$ (8.0 eq), CuI (0.4 eq), and 1,10-phenanthroline (0.4 eq) were added to a reaction container, and the mixed solution was suspended in DMF (0.25 M). The reaction mixture was heated, and stirred at a temperature of 160° C. for 24 hours. After the completion of the reaction, the resulting product was cooled to room temperature, and an extraction process was performed thereon utilizing distilled water and ethylacetate. An organic layer extracted therefrom was washed with a saturated aqueous NaCl solution, and dried utilizing $MgSO_4$. A residue obtained by removing the solvent therefrom was separated by column chromatography to obtain Intermediate [19-B] (yield of 68%).

Synthesis of Intermediate [19-C]

Intermediate [19-B] (1.0 eq) and iodomethane-D3($CD_3I$) (40.0 eq) were added to a reaction container, and the mixed solution was suspended in toluene (0.1 M). The reaction mixture was heated, and stirred at the temperature of 110° C. for 24 hours. After the completion of the reaction, the resulting product was cooled to room temperature, and an extraction process was performed thereon utilizing distilled water and ethylacetate. An organic layer extracted therefrom was dried utilizing $MgSO_4$, and the solvent was removed therefrom to obtain Intermediate [19-C] (yield of 89%).

Synthesis of Intermediate [19-D]

Intermediate [19-C] (1.0 eq) was added to a reaction container, and suspended in a mixed solution containing methanol and distilled water at a volume ratio of 2:1. In a sufficiently dissolved state, ammonium hexafluorophosphate (4.4 eq) was slowly added to the reaction solution, and the resulting reaction solution was stirred at room temperature for 24 hours. After completion of the reaction, a resulting solid was filtered and washed with diethyl ether. The washed solid was dried to obtain Intermediate [19-D] (yield of 87%).

Synthesis of Compound BD19

Intermediate [19-D] (1.0 eq), dichloro(1,5-cyclooctadiene)platinum (2.2 eq), and sodium acetate (12.0 eq) were suspended in 1,4-dioxane (0.1 M). The reaction mixture was heated, and stirred at the temperature of 120° C. for 72 hours. After completion of the reaction, the reaction solution was cooled to room temperature, and an extraction process was performed thereon utilizing distilled water and dichloromethane. An organic layer extracted therefrom was washed with a saturated aqueous NaCl solution, and dried utilizing $MgSO_4$. A residue obtained by removing the solvent therefrom was separated by column chromatography to obtain Compound BD19 (yield of 35%).

Synthesis Example 2: Synthesis of Compound BD63

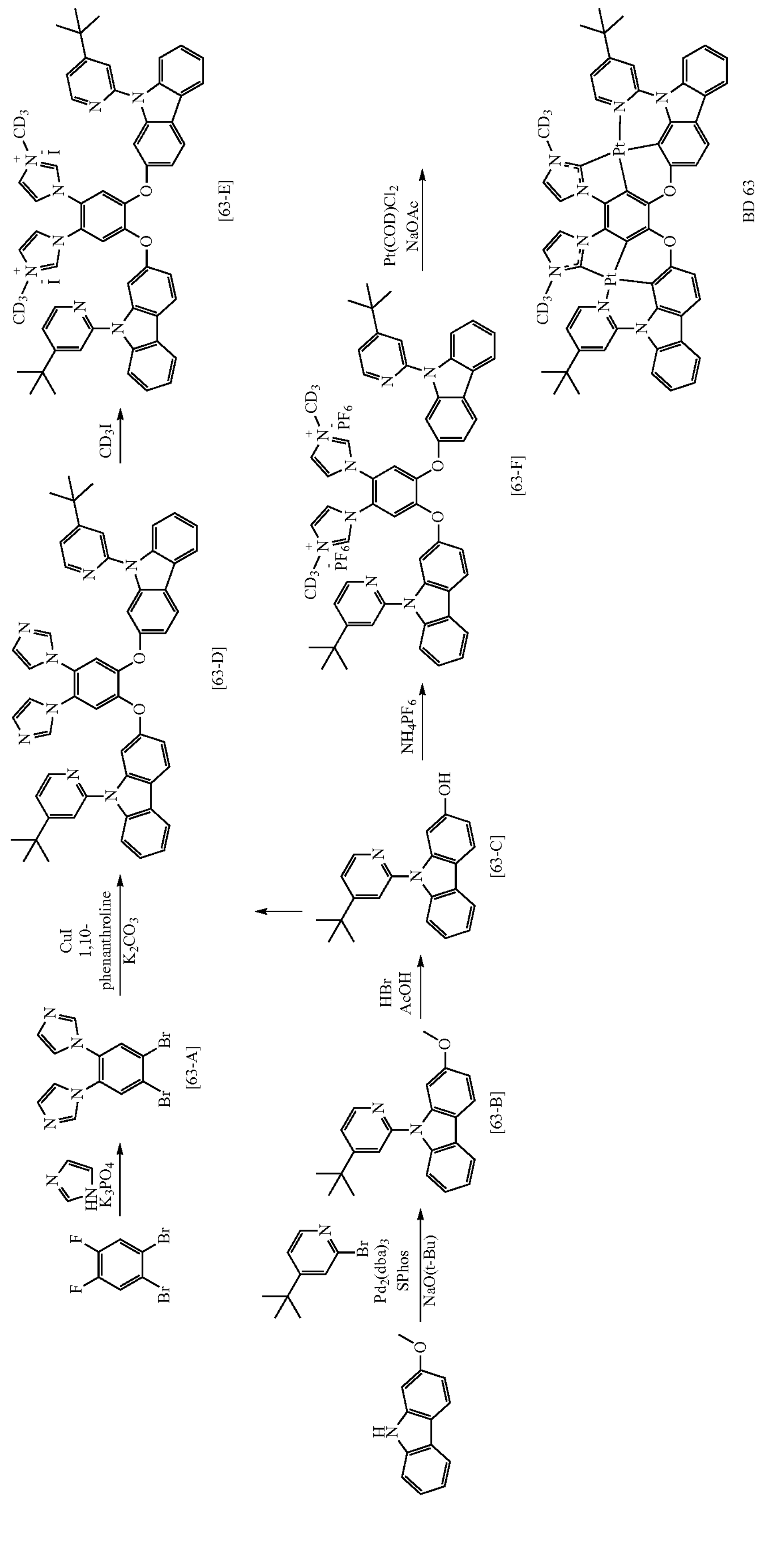
K$_3$PO$_4$
[63-A]
CuI
1,10-
phenanthroline
K$_2$CO$_3$
[63-D]
CD$_3$I
[63-E]
Pd$_2$(dba)$_3$
SPhos
NaO(t-Bu)
[63-B]
HBr
AcOH
[63-C]
NH$_4$PF$_6$
[63-F]
Pt(COD)Cl$_2$
NaOAc
BD 63

Synthesis of Intermediate [63-A]

1,2-dibromo-4,5-difluorobenzene (1.0 eq), imidazole (3.0 eq), and $K_3PO_4$ (4.0 eq) were added to a reaction container, and the mixed solution was suspended in DMF (0.25 M). The reaction mixture was heated, and stirred at a temperature of 160° C. for 24 hours. After the completion of the reaction, the resulting product was cooled to room temperature, and an extraction process was performed thereon utilizing distilled water and ethylacetate. An organic layer extracted therefrom was washed with a saturated aqueous NaCl solution, and dried utilizing $MgSO_4$. A residue obtained by removing the solvent therefrom was separated by column chromatography to obtain Intermediate [63-A] (yield of 70%).

Synthesis of Intermediate [63-B]

2-methoxycarbazole (1.0 eq), 2-bromo-4-(tert-butyl)pyridine (2.6 eq), $Pd_2(dba)_3$(0.02 eq), SPhos (0.04 eq), and sodium tert-butoxide (1.6 eq) were added to a reaction container, and the mixed solution was suspended in toluene (0.17 M). The reaction mixture was heated, and stirred at the temperature of 110° C. for 24 hours. After the completion of the reaction, the resulting product was cooled to room temperature, and an extraction process was performed thereon utilizing distilled water and ethylacetate. An organic layer extracted therefrom was washed with a saturated aqueous NaCl solution, and dried utilizing $MgSO_4$. A residue obtained by removing the solvent therefrom was separated by column chromatography to obtain Intermediate [63-B] (yield of 64%).

Synthesis of Intermediate [63-C]

Intermediate [63-B] (1.0 eq) was suspended in an excessive amount of a mixed solution containing HBr and AcOH at a volume ratio of 2:1. The reaction mixture was heated, and stirred at the temperature of 110° C. for 24 hours. After completion of the reaction, the reaction solution was cooled to room temperature, and an excessive amount of distilled water was added thereto. The resulting solution was then neutralized with an aqueous sodium hydroxide solution and ammonium chloride. A solid precipitated therefrom was filtered, and the filtrate was dissolved in acetone. The resulting product was dried utilizing $MgSO_4$, and the solvent was removed therefrom to obtain Intermediate [63-C] (yield of 90%).

Synthesis of Intermediate [63-D]

Intermediate [63-A] (1.0 eq), Intermediate [63-C] (2.6 eq), $K_2CO_3$ (4.0 eq), CuI (0.2 eq), and 1,10-phenanthroline (0.2 eq) were added to a reaction container, and the mixed solution was suspended in DMF (0.25 M). The reaction mixture was heated, and stirred at a temperature of 160° C. for 24 hours. After the completion of the reaction, the resulting product was cooled to room temperature, and an extraction process was performed thereon utilizing distilled water and ethylacetate. An organic layer extracted therefrom was washed with a saturated aqueous NaCl solution, and dried utilizing $MgSO_4$. A residue obtained by removing the solvent therefrom was separated by column chromatography to obtain Intermediate [63-D] (yield of 60%).

Synthesis of Intermediate [63-E]

Intermediate [63-D] (1.0 eq) and iodomethane-D3 ($CD_3I$) (20.0 eq) were added to a reaction container, and the mixed solution was suspended in toluene (0.1 M). The reaction mixture was heated, and stirred at the temperature of 110° C. for 24 hours. After the completion of the reaction, the resulting product was cooled to room temperature, and an extraction process was performed thereon utilizing distilled water and ethylacetate. An organic layer extracted therefrom was dried utilizing $MgSO_4$, and the solvent was removed therefrom to obtain Intermediate [63-E] (yield of 92%).

Synthesis of Intermediate [63-F]

Intermediate [63-E] (1.0 eq) was added to a reaction container, and suspended in a mixed solution containing methanol and distilled water at a volume ratio of 2:1. In a sufficiently dissolved state, ammonium hexafluorophosphate (2.2 eq) was slowly added to the reaction solution, and the resulting reaction solution was stirred at room temperature for 24 hours. After completion of the reaction, a resulting solid was filtered and washed with diethyl ether. The washed solid was dried to obtain Intermediate [63-F] (yield of 82%).

Synthesis of Compound BD63

Compound BD63 (yield of 37%) was obtained in the same manner as in the synthesis of Compound BD19, except that Intermediate [63-F] was utilized instead of Intermediate [19-D].

Synthesis Example 3: Synthesis of Compound BD69

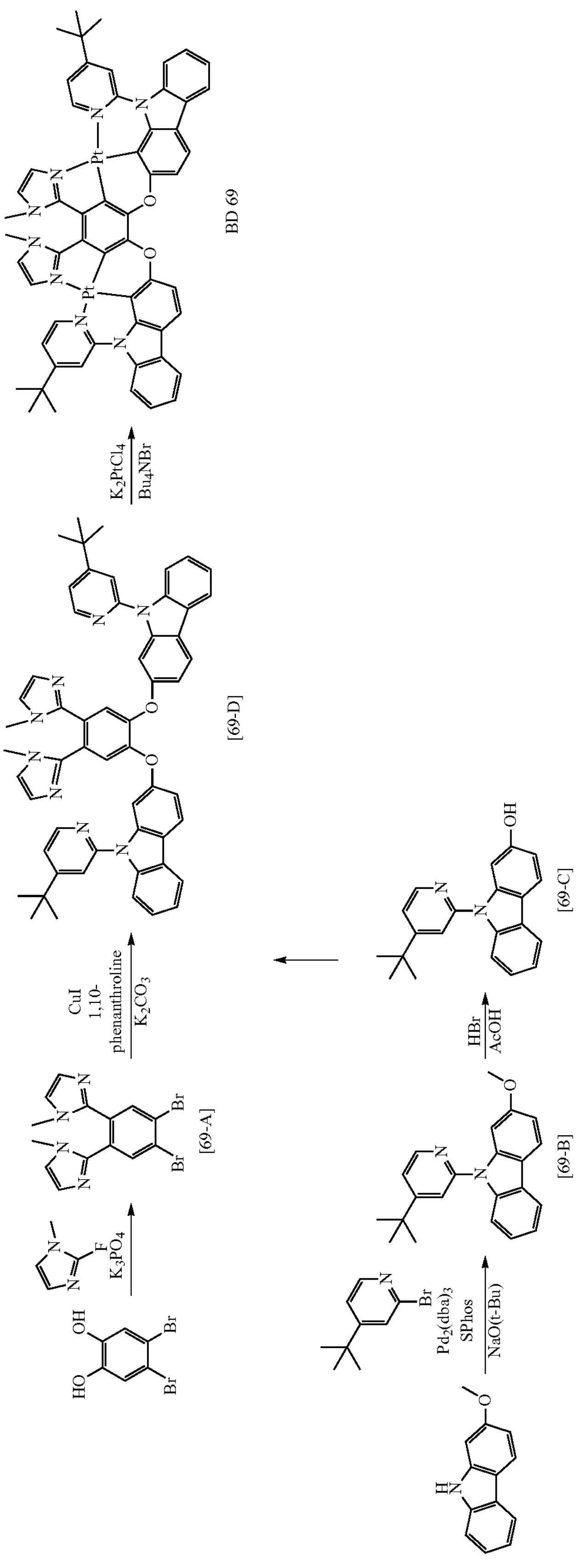
HO
OH
Br
Br
F
$K_3PO_4$
[69-A]
CuI
1,10-
phenanthroline
$K_2CO_3$
[69-D]
$K_2PtCl_4$
$Bu_4NBr$
BD 69
Pt
Pt
Br
$Pd_2(dba)_3$
SPhos
NaO(t-Bu)
[69-B]
HBr
AcOH
[69-C]
OH Synthesis of Intermediate [69-A]

Intermediate [69-A] (yield of 55%) was obtained in the same manner as in the synthesis of Intermediate [19-A], except that 2-fluoro-1-methylimidazole was utilized instead of imidazole.

Synthesis of Intermediate [69-B]

Intermediate [69-B] was synthesized in the same manner as in the synthesis of Intermediate [63-B].

Synthesis of Intermediate [69-C]

Intermediate [69-C] was synthesized in the same manner as in the synthesis of Intermediate [63-C].

Synthesis of Intermediate [69-D]

Intermediate [69-D] (yield of 62%) was obtained in the same manner as in the synthesis of Intermediate [63-D], except that Intermediate [69-A] was utilized instead of Intermediate [63-A].

Synthesis of Compound BD69

Intermediate [69-D] (1.0 eq), potassium tetrachloroplatinate (2.2 eq), and tetrabutylammonium bromide (0.2 eq) were suspended in AcOH (0.03 M). The reaction mixture was heated, and stirred at the temperature of 110° C. for 72 hours. After the completion of the reaction, the resulting product was cooled to room temperature, and an extraction process was performed thereon utilizing distilled water and dichloromethane. An organic layer extracted therefrom was washed with a saturated aqueous NaCl solution, and dried utilizing $MgSO_4$. A residue obtained by removing the solvent therefrom was separated by column chromatography to obtain Compound BD69 (yield of 29%).

Synthesis Example 4: Synthesis of Compound BD87

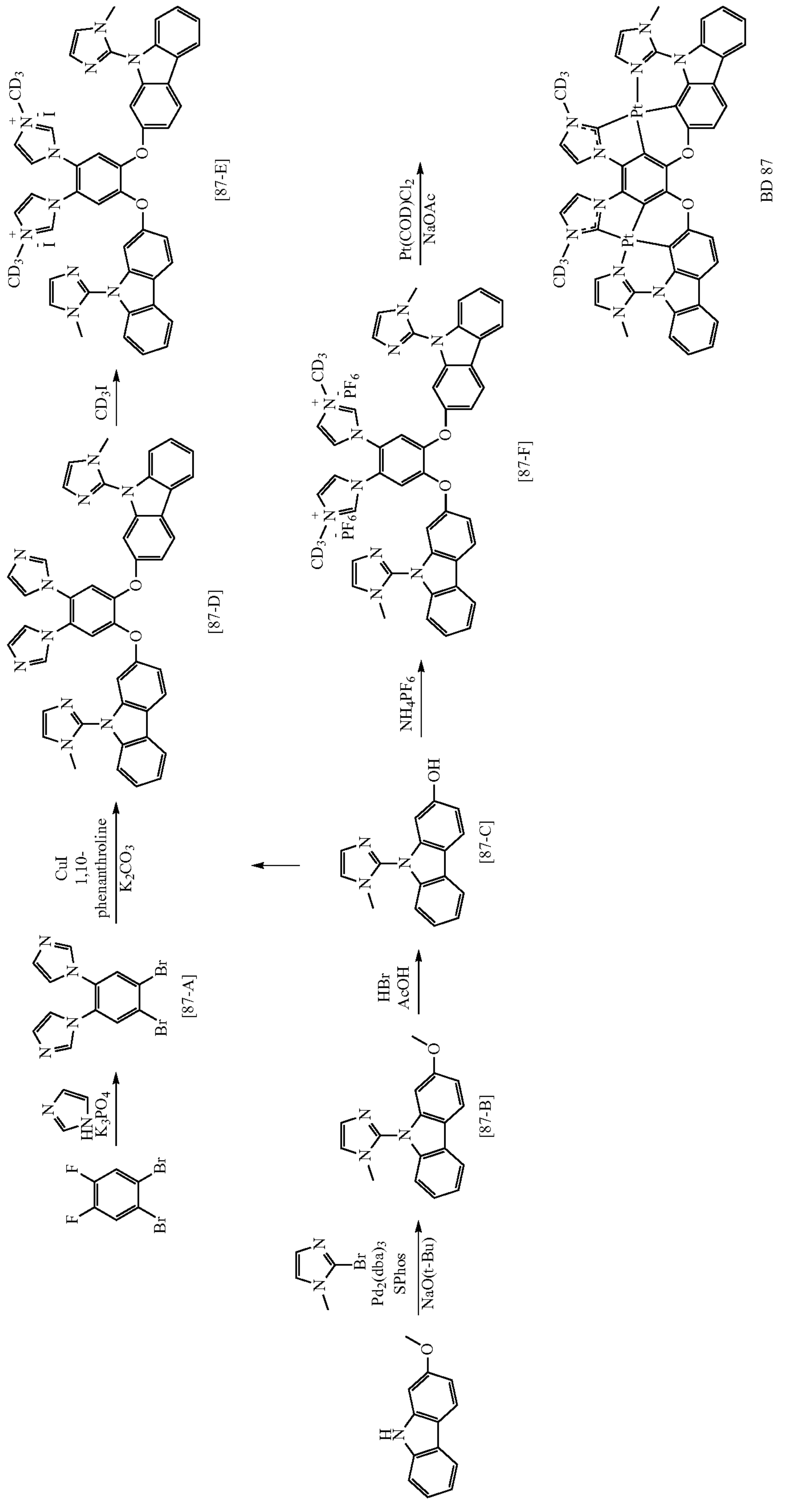
[87-A]
[87-B]
[87-C]
[87-D]
[87-E]
[87-F]
BD 87
$K_3PO_4$
CuI
1,10-
phenanthroline
$K_2CO_3$
$CD_3I$
$Pd_2(dba)_3$
SPhos
NaO(t-Bu)
HBr
AcOH
$NH_4PF_6$
$Pt(COD)Cl_2$
NaOAc Synthesis of Intermediate [87-A]

Intermediate [87-A] was synthesized in the same manner as in the synthesis of Intermediate [63-A].

Synthesis of Intermediate [87-B]

Intermediate [87-B] (yield of 60%) was obtained in the same manner as in the synthesis of Intermediate [63-B], except that 2-bromo-1-methyl-1H-imidazole was utilized instead of instead of 2-bromo-4-(tert-butyl)pyridine.

Synthesis of Intermediate [87-C]

Intermediate [87-C] (yield of 87%) was obtained in the same manner as in the synthesis of Intermediate [63-C], except that Intermediate [87-B] was utilized instead of Intermediate [63-B].

Synthesis of Intermediate [87-D]

Intermediate [87-D] (yield of 65%) was obtained in the same manner as in the synthesis of Intermediate [63-D], except that Intermediate [87-C] was utilized instead of Intermediate [63-C].

Synthesis of Intermediate [87-E]

Intermediate [87-E] (yield of 87%) was obtained in the same manner as in the synthesis of Intermediate [63-E], except that Intermediate [87-D] was utilized instead of Intermediate [63-D].

Synthesis of Intermediate [87-F]

Intermediate [87-F] (yield of 85%) was obtained in the same manner as in the synthesis of Intermediate [63-F], except that Intermediate [87-E] was utilized instead of Intermediate [63-E].

Synthesis of Compound BD87

Compound BD87 (yield of 31%) was obtained in the same manner as in the synthesis of Compound BD19, except that Intermediate [87-F] was utilized instead of Intermediate [19-D].

The synthesized compounds were identified by $^{1}$H NMR and MS/FAB, and results are shown in Table 1 below.

TABLE 1

| Compound | | MS/FAB | |
|---|---|---|---|
| No. | 1H NMR (CDCl3, 400 MHz) | found | calc. |
| BD19 | 7.00(d, 2H), 7.27(m, 4H), 7.31(t, 2H), 7.33(d, 2H), 7.44(m, 4H) | 981.01 | 980.22 |
| BD63 | 1.32(s, 18H), 7.16(m, 4H), 7.27(d, 2H), 7.35(t, 2H), 7.40(m, 4H), 7.44(d, 2H), 7.95(d, 2H), 8.10(d, 2H), 8.55(d, 2H), 8.75(d, 2H) | 1258.47 | 1258.34 |
| BD69 | 1.33(s, 18H), 3.72(s, 6H), 7.11(d, 2H), 7.13(d, 2H), 7.17(m, 4H), 7.35(t, 2H), 7.41(m, 4H), 7.94(d, 2H), 8.08(d, 2H), 8.56(d, 2H), 8.74(d, 2H) | 1253.10 | 1252.30 |

TABLE 1-continued

| Compound | | MS/FAB | |
|---|---|---|---|
| No. | 1H NMR (CDCl3, 400 MHz) | found | calc. |
| BD87 | 3.73(s, 6H), 7.11(d, 2H), 7.13(d, 2H), 7.16(m, 4H), 7.27(d, 2H), 7.35(t, 2H), 7.44(d, 2H), 7.94(d, 2H), 8.09(d, 2H), 8.55(d, 2H) | 1152.81 | 1152.24 |

Evaluation Example 1

The HOMO energy level and LUMO energy level of each of Compounds BD19, BD63, BD69, BD87, ETH2, and HTH2 were evaluated according to a method described in Table 2, and the results are shown in Table 3.

TABLE 2

| | |
|---|---|
| HOMO energy level evaluation method | Cyclic voltammetry (CV) (electrolyte: 0.1M $Bu_4NPF_6$/solvent: dimethylforamide (DMF)/electrode: 3-electrode system (working electrode: GC, reference electrode: Ag/AgCl, auxiliary electrode: Pt)) was utilized to obtain a voltage (V)-current (A) graph for each compound. Then, a HOMO energy level of each compound was calculated from an oxidation onset of the graph. |
| LUMO energy level evaluation method | Cyclic voltammetry (CV) (electrolyte: 0.1M $Bu_4NPF_6$/solvent: dimethylforamide (DMF)/electrode: 3-electrode system (working electrode: GC, reference electrode: Ag/AgCl, auxiliary electrode: Pt)) was utilized to obtain a voltage (V)-current (A) graph for each compound. Then, a LUMO energy level of each compound was calculated from a reduction onset of the graph. |

TABLE 3

| Compound No. | HOMO (eV) | LUMO (eV) |
|---|---|---|
| BD19 | −4.55 | −0.91 |
| BD63 | −4.49 | −1.37 |
| BD69 | −5.05 | −1.47 |
| BD87 | −4.41 | −0.83 |
| ETH2 | −6.44 | −1.78 |
| HTH2 | −5.67 | −1.34 |

Referring to Table 3, it was confirmed that Compounds BD19, BD63, BD69, BD87 ETH2, and HTH2 each have HOMO and LUMO energy levels suitable for the manufacture of an organic light-emitting device.

Example 1

An organic light-emitting device including an emission layer that includes an organometallic complex according to an embodiment was manufactured by the following method.

As an anode, an ITO/Ag/ITO substrate was cut to a size of 50 mm×50 mm×0.7 mm, sonicated with acetone, isopropyl alcohol, and pure water each for 5 minutes, and then cleaned by exposure to ultraviolet rays and ozone for 30 minutes. Then, the ITO substrate was provided to a vacuum deposition apparatus.

Compound 2-TNATA was vacuum-deposited on the ITO substrate to form a hole injection layer having a thickness of 60 nm, and then, NPB was vacuum-deposited on the hole injection layer to form a hole transport layer having a thickness of 30 nm.

Compound BD19 (dopant, 10 wt %) was co-deposited with a mixed host including Compounds ETH2 and HTH2 at a weight ratio of 5:5 on the hole transport layer to form an emission layer having a thickness of 30 nm. Subsequently, Compound ETH2 was vacuum-deposited on the emission layer to form a hole blocking layer having a thickness of 5 nm. Then, Alq3 was deposited on the hole blocking layer to form an electron transport layer having a thickness of 30 nm, alkali metal halide LiF was deposited on the electron transport layer to form an electron injection layer having a thickness of 1 nm, and Al was vacuum-deposited to a thickness of 300 nm to form a LiF/Al electrode, thereby completing the manufacture of an organic light-emitting device.

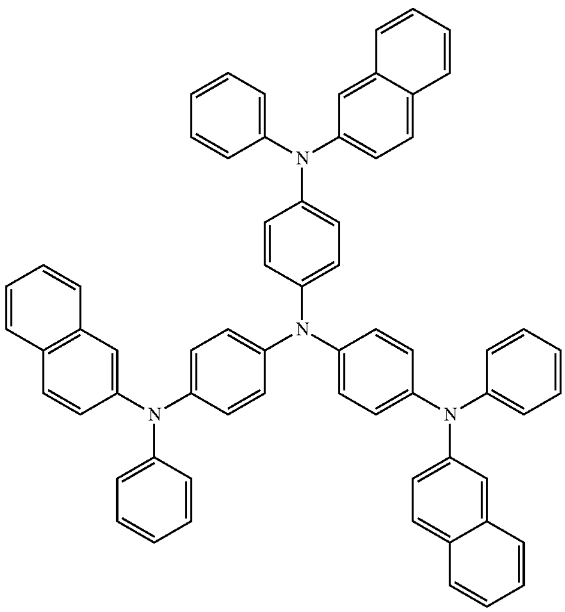

2-TNATA

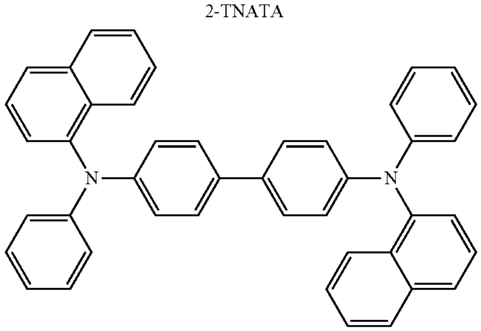

NPB

-continued

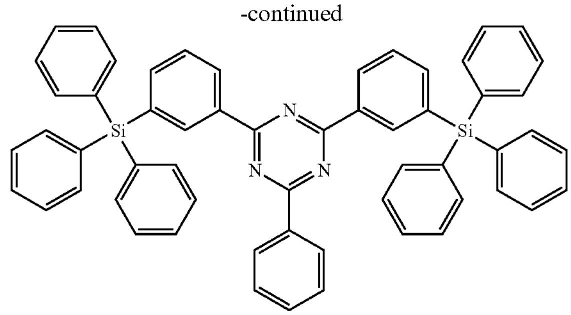

ETH2

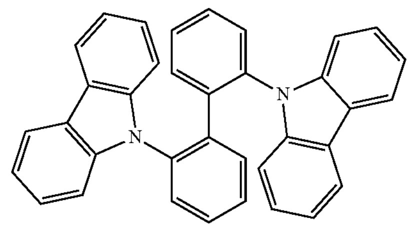

HTH2

Example 2 to 4 and Comparative Example 1 to 5

An organic light-emitting device was manufactured in the same manner as in Example 1, except that, in forming an emission layer, corresponding compounds shown in Table 4 were utilized.

Evaluation Example 2

Regarding the organic light-emitting devices of Examples 1 to 4 and Comparative Examples 1 to 5, the driving voltage (V) at 1,000 cd/m$^2$, current density (mA/cm$^2$), and luminescence efficiency (cd/A) were each measured by utilizing Keithley MU 236 and luminance meter PR650. In addition, the decay time of delayed fluorescence was evaluated based on the time-resolved spectra of the organic light-emitting devices measured by utilizing the Tektronix TDS 460 Four Channel Digitizing Oscilloscope while applying a voltage pulse by utilizing the AVTECCH AV-1011-B pulse generator (wherein a pulse width was between 100 ns and 1 ms), and the results are shown in Table 4.

TABLE 4

| | Organo metallic compound | Second compound | Third compound | Driving voltage (V) | Current density (mA/cm$^2$) | Luminance (cd/m$^2$) | Efficiency (cd/A) | Emission wavelength (nm) | Lifespan LT95 (h) |
|---|---|---|---|---|---|---|---|---|---|
| Example 1 | BD19 | ETH2 | HTH2 | 5.81 | 50 | 4297 | 8.59 | 495 | 79.9 |
| Example 2 | BD63 | ETH2 | HTH2 | 5.78 | 50 | 4205 | 8.41 | 510 | 82.7 |
| Example 3 | BD69 | ETH2 | HTH2 | 5.62 | 50 | 4308 | 8.62 | 531 | 87.6 |
| Example 4 | BD87 | ETH2 | HTH2 | 5.45 | 50 | 4410 | 8.82 | 496 | 89.1 |
| Comparative Example 1 | BD19 | ETH2 | — | 5.82 | 50 | 4091 | 8.13 | 496 | 70.4 |

TABLE 4-continued

| | Organo metallic compound | Second compound | Third compound | Driving voltage (V) | Current density ($mA/cm^2$) | Luminance ($cd/m^2$) | Efficiency (cd/A) | Emission wavelength (nm) | Lifespan LT95 (h) |
|---|---|---|---|---|---|---|---|---|---|
| Comparative Example 2 | BD19 | — | HTH2 | 5.83 | 50 | 3980 | 8.16 | 498 | 68.1 |
| Comparative Example 3 | Compound A | ETH2 | HTH2 | 7.14 | 50 | 3310 | 7.42 | 473 | 10.3 |
| Comparative Example 4 | Compound B | ETH2 | HTH2 | 6.89 | 50 | 2845 | 7.69 | 606 | 7.9 |
| Comparative Example 5 | Compound C | ETH2 | HTH2 | 5.50 | 50 | 3548 | 7.91 | 475 | 4.8 |

BD19

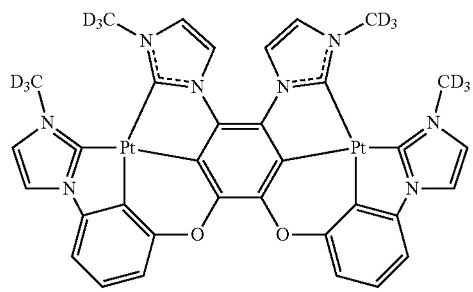

BD 63

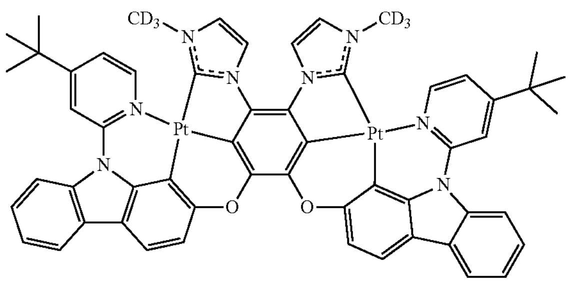

BD 69

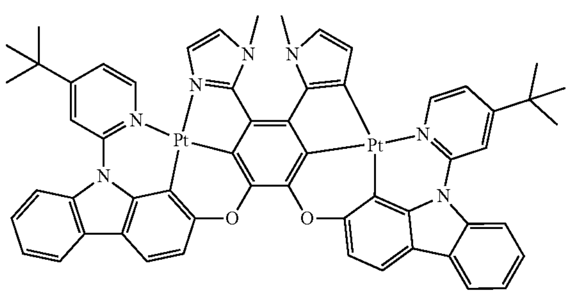

BD 87

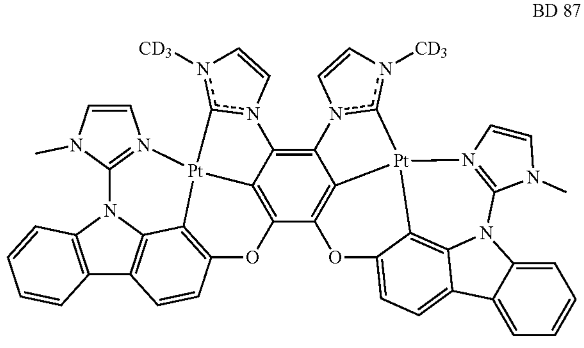

-continued

A

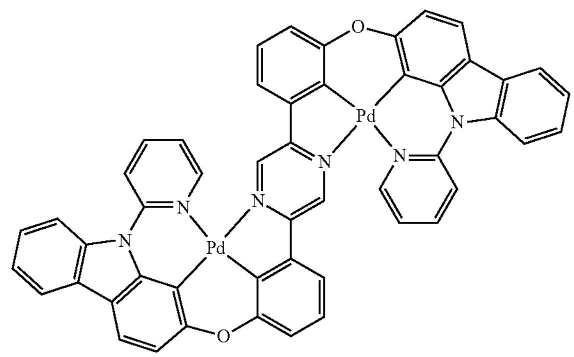

B

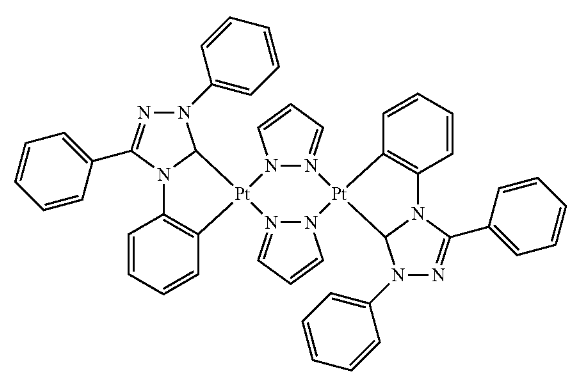

C

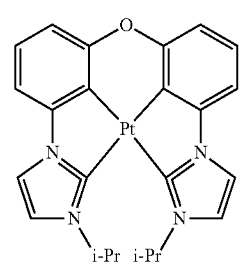

Referring to Table 4, it was confirmed that the organic light-emitting devices of Examples 1 to 4 emitted blue light, and showed high efficiency, long lifespan, and low driving voltage compared to those of the organic light-emitting devices of Comparative Examples 1 to 5.

According to the one or more embodiments, an organic light-emitting device should have high luminescence efficiency, high color purity, and/or a long lifespan.

The use of "may" when describing embodiments of the present invention refers to "one or more embodiments of the present invention." Also, the term "exemplary" is intended to refer to an example or illustration. It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a), and 35 U.S.C. § 132(a).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An organic light-emitting device comprising:

a first electrode;

a second electrode;

an organic layer between the first electrode and the second electrode and comprising an emission layer; and an organometallic compound represented by Formula 1:

Formula 1

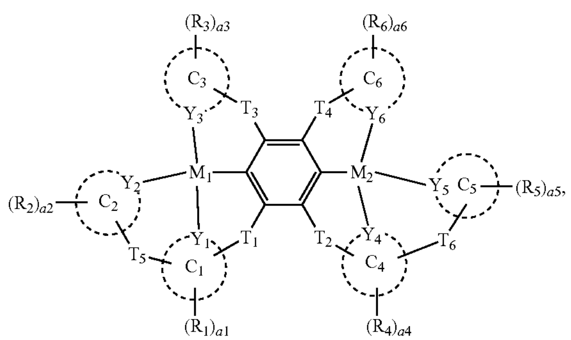

wherein, in Formula 1, $M_1$ and $M_2$ are each independently selected from platinum (Pt), palladium (Pd), iridium (Ir), copper (Cu), cadmium (Cd), nickel (Ni), zinc (Zn), manganese (Mn), and gold (Au), ring $C_1$ to ring $C_6$ are each independently selected from a $C_5$-$C_{30}$ carbocyclic group and a $C_1$-$C_{30}$ heterocyclic group, $Y_1$ is a constituent atom of ring $C_1$, and is C or N, $Y_2$ is a constituent atom of ring $C_2$, and is C or N, $Y_3$ is a constituent atom of ring $C_3$, and is C or N, $Y_4$ is a constituent atom of ring $C_4$, and is C or N, $Y_5$ is a constituent atom of ring $C_5$, and is C or N, $Y_6$ is a constituent atom of ring $C_6$, and is C or N, one selected from a bond between $Y_1$ and $M_1$, a bond between $Y_2$ and $M_1$, and a bond between $Y_3$ and $M_1$ is a covalent bond, and a remainder thereof are each a coordinate bond, one selected from a bond between $Y_4$ and $M_2$, a bond between $Y_5$ and $M_2$, and a bond between $Y_6$ and $M_2$ is a covalent bond, and a remainder thereof are each a coordinate bond, $T_1$ to $T_6$ are each independently selected from a single bond, *—O—*', *—S—*', *—Se—*', *—N($R_7$)—*, *—B($R_7$)—*', *—P($R_7$)—*', *—P(═O)($R_7$)—*, *—S(═O)—*, *—S(═O)$_2$—*, *—S(═O)($R_7$)($R_8$)—*', *—C(═O)—*', *—C($R_7$)($R_8$)—*', *—Si($R_7$)($R_8$)—*', and *—Ge($R_7$)($R_8$)—*', $R_1$ to $R_8$ are each independently selected from hydrogen, deuterium (D), —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(═O)($Q_1$)($Q_2$), adjacent groups from among $R_1$ to $R_8$ are optionally linked to each other to form a substituted or unsubstituted $C_5$-$C_{30}$ carbocyclic group or a substituted or unsubstituted $C_1$-$C_{30}$ heterocyclic group, a1 to a6 are each independently an integer from 0 to 10,

* and *' each indicate a binding site to a neighboring atom, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_7$-$C_{60}$ alkylaryl group, the substituted $C_6$-$C_{60}$ aryloxy group, the substituted $C_6$-$C_{60}$ arylthio group, the substituted $C_2$-$C_{60}$ heteroaryl group, the substituted $C_2$-$C_{60}$ alkylheteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is selected from:

deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-Coo arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$ ($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-Coo aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$ ($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$ ($Q_{31}$), and —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_1$-$C_{60}$ heteroaryl group, a monovalent non-aromatic condensed polycyclic group, a monovalent non-aromatic condensed heteropolycyclic group, a biphenyl group, and a terphenyl group.

2. The organic light-emitting device of claim 1, wherein the emission layer comprises the organometallic compound.

3. The organic light-emitting device of claim 2, wherein the emission layer further comprises a second compound and a third compound, and the second compound and the third compound are different from each other.

4. The organic light-emitting device of claim 3, wherein the organometallic compound, the second compound, and the third compound satisfy Condition 1 to Condition 4:

Lowest unoccupied molecular orbital (LUMO) energy level (eV) of the third compound>LUMO energy level (eV) of the organometallic compound; Condition 1

LUMO energy level (eV) of the organometallic compound>LUMO energy level (eV) of the second compound; Condition 2

Highest occupied molecular orbital (HOMO) energy level (eV) of the organometallic compound>HOMO energy level (eV) of the third compound; and Condition 3

HOMO energy level (eV) of the third compound>HOMO energy level (eV) of the second compound. Condition 4

5. The organic light-emitting device of claim 3, wherein the second compound is represented by Formula 2; and the third compound comprises a group represented by Formula 3:

Formula 2

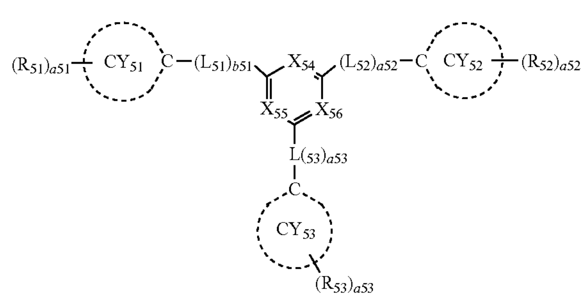

Formula 3

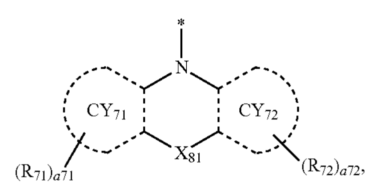

wherein, in Formulae 2 and 3, ring $CY_{51}$ to ring $CY_{53}$, ring $CY_{71}$, and ring $CY_{72}$ are each independently selected from a $C_5$-$C_{30}$ carbocyclic group and a $C_1$-$C_{30}$ heterocyclic group, $L_{51}$ to $L_{53}$ are each independently selected from a substituted or unsubstituted $C_5$-$C_{30}$ carbocyclic group and a substituted or unsubstituted $C_1$-$C_{30}$ heterocyclic group, a bond between $L_{51}$ and ring $CY_{51}$, a bond between $L_{52}$ and ring $CY_{52}$, a bond between $L_{53}$ and ring $CY_{53}$, a bond between two or more $L_{51}$ (s), a bond between two or more $L_{52}$ (s), a bond between two or more $L_{53}$ (s), a bond between $L_{51}$ and a carbon atom between $X_{54}$ and $X_{55}$ in Formula 2, a bond between $L_{52}$ and a carbon atom between $X_{54}$ and $X_{56}$ in Formula 2, and a bond between $L_{53}$ and a carbon atom between $X_{55}$ and $X_{56}$ in Formula 2 are each independently a carbon-carbon single bond, $b_{51}$ to $b_{53}$ are each independently an integer from 0 to 5, wherein, when $b_{51}$ is 0, *-$(L_{51})_{b51}$-** is a single bond, when b52 is 0, *-$(L_{52})_{b52}$-*' is a single bond, and when b53 is 0, *-$(L_{53})_{b53}$-** is a single bond, $X_{54}$ is N or $C(R_{54})$, $X_{55}$ is N or $C(R_{55})$, $X_{56}$ is N or $C(R_{56})$, and at least one selected from $X_{54}$ to $X_{56}$ is N, $X_{81}$ is a single bond, O, S, $N(R_{81})$, $B(R_{81})$, $C(R_{81a})(R_{81b})$, or $Si(R_{81a})(R_{81b})$, $R_{51}$ to $R_{56}$, $R_{71}$, $R_{72}$, $R_{81}$, $R_{81a}$, and $R_{81b}$ are each independently selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —C(═O)($Q_1$), —S(═O)$_2$ ($Q_1$), and —P(═O)($Q_1$)($Q_2$), a51 to a53, a71, and a72 are each independently an integer from 0 to 10, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-Coo alkylaryl group, a $C_6$-Coo aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —C(═O)($Q_{11}$), —S(═O)$_2$ ($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-Coo aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —C(═O)($Q_{21}$), —S(═O)$_2$ ($Q_{21}$), and —P(═O)($Q_{21}$)($Q_{22}$); and —$Si(Q_{31})(Q_{32})(Q_{33})$, —$N(Q_{31})(Q_{32})$, —$B(Q_{31})(Q_{32})$, —C(═O)($Q_{31}$), —S(═O)$_2$ ($Q_{31}$), and —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

6. The organic light-emitting device of claim 5, wherein, in Formulae 2 and 3, ring $CY_{51}$ to ring $CY_{53}$, ring $CY_{71}$, and ring $CY_{72}$ are each independently selected from i) a first ring, ii) a second ring, iii) a condensed ring in which two or more first rings are condensed with each other, iv) a condensed ring in which two or more second rings are condensed with each other, and v) a condensed ring in which one or more first rings and one or more second rings are condensed with each other, the first ring is selected from a cyclopentane group, a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the second ring is selected from an adamantane group, a norbornane group, a norbornene group, a cyclohexane group, a cyclohexene group, a benzene group, a pyridine group, a pyrimidine group, a pyrazine group, a pyridazine group, a triazine group, an oxasiline group, a thiasiline group, a dihydroazasiline group, a dihydrodisiline group, a dihydrosiline group, a dioxine group, an oxathiine group, an oxazine group, a pyran group, a dithiine group, a thiazine group, a thiopyran group, a cyclohexadiene group, a dihydropyridine group, and a dihydropyrazine group.

7. The organic light-emitting device of claim 5, wherein, in Formulae 2 and 3, $R_{51}$ to $R_{56}$, $R_{71}$, $R_{72}$, $R_{81}$, $R_{81a}$, and $R_{81b}$ are each independently selected from:

hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, and an indolocarbazolyl group;

a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, an indolocarbazolyl group, and a group represented by Formula 91, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a $C_1$-$C_{60}$ alkyl group, a $C_1$-$C_{60}$ alkoxy group, a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, an indolocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$; and $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, and $Q_1$ to $Q_3$ and $Q_{31}$ to $Q_{33}$ are each independently selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group that is substituted with at least one selected from deuterium, —F, a cyano group, a $C_1$-$C_{60}$ alkyl group, a phenyl group, and a biphenyl group, a $C_6$-$C_{60}$ aryl group that is substituted with at least one selected from deuterium, —F, a cyano group, a $C_1$-$C_{10}$ alkyl group, a phenyl group, and a biphenyl group and a $C_1$-$C_{60}$ heteroaryl group that is substituted with at least one selected from deuterium, —F, a cyano group, a $C_1$-$C_{10}$ alkyl group, a phenyl group, and a biphenyl group:

Formula 91

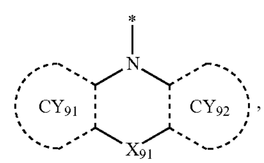

wherein, in Formula 91, ring $CY_{91}$ and ring $CY_{92}$ are each independently selected from a $C_5$-$C_{30}$ carbocyclic group and a $C_1$-$C_{30}$ heterocyclic group, $X_{91}$ is a single bond, O, S, $N(R_{91})$, $B(R_{91})$, $C(R_{91a})(R_{91b})$, or $Si(R_{91a})(R_{91b})$, $R_{91}$, $R_{91a}$, and $R_{91b}$ are each the same as described in connection with $R_{81}$, $R_{81a}$, and $R_{81b}$, respectively in connection with Formula 3, and

* indicates a binding site to a neighboring atom.

8. The organic light-emitting device of claim 5, wherein the third compound is represented by one of Formulae 3-1 to 3-5:

3-1

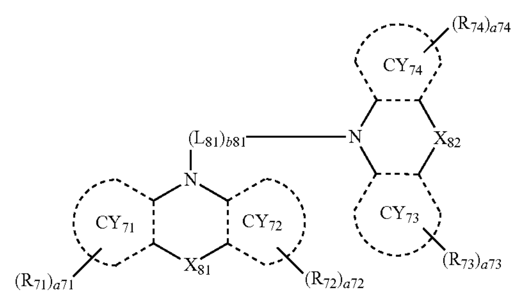

-continued 3-2

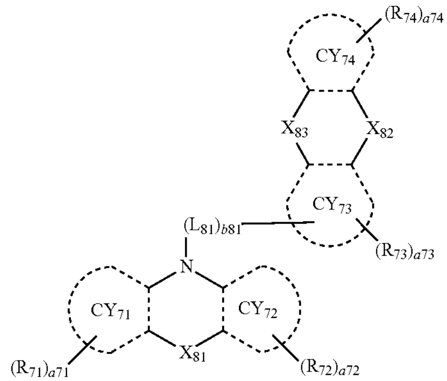

3-3

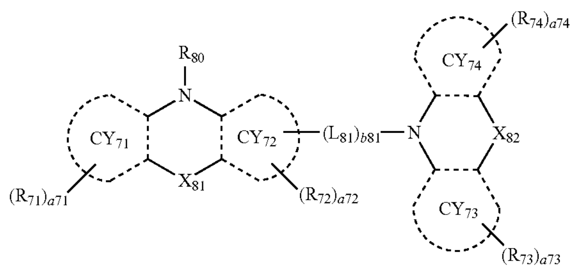

3-4

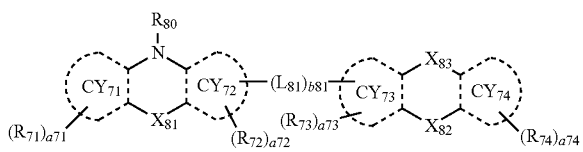

3-5

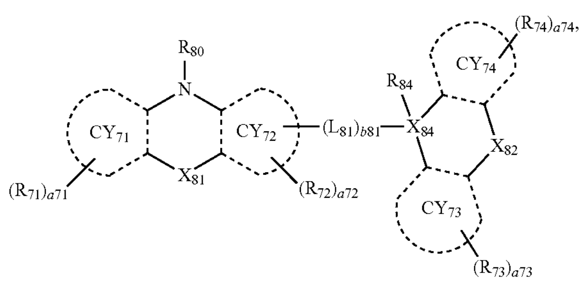

and wherein, in Formulae 3-1 to 3-5, ring $CY_{71}$, ring $CY_{72}$, $X_{81}$, $R_{71}$, $R_{72}$, a71, and a72 are each the same as respectively described in connection with Formula 3, ring $CY_{73}$, ring $CY_{74}$, $R_{73}$, $R_{74}$, a73, and a74 are each the same as described in connection with ring $CY_{71}$, ring $CY_{72}$, $R_{71}$, $R_{72}$, a71, and a72, respectively, in Formula 3, $L_{81}$ is selected from *—$C(Q_4)(Q_5)$-*', *—$Si(Q_4)(Q_5)$-*', a substituted or unsubstituted $C_5$-$C_{30}$ carbocyclic group, and a substituted or unsubstituted $C_1$-$C_{30}$ heterocyclic group, wherein $Q_4$ and $Q_5$ are each independently the same as described in connection with $Q_1$ in Formula 3, $b_{81}$ is an integer from 0 to 5, wherein, when $b_{81}$ is 0, *-$(L_{81})_{b81}$-*' is a single bond, and when $b_{81}$ is 2 or more, two or more $L_{81}$ (s) are identical to or different from each other, $X_{82}$ is a single bond, O, S, $N(R_{82})$, $B(R_{82})$, $C(R_{82a})(R_{82b})$, or $Si(R_{82a})(R_{82b})$, $X_{83}$ is a single bond, O, S, $N(R_{83})$, $B(R_{83})$, $C(R_{83a})(R_{83b})$, or $Si(R_{83a})(R_{83b})$, in Formulae 3-2 and 3-4, $X_{82}$ and $X_{83}$ are not both a single bond at the same time, $X_{84}$ is C or Si, $R_{80}$, $R_{82}$, $R_{83}$, $R_{82a}$, $R_{82b}$, $R_{83a}$, $R_{83b}$, and $R_{84}$ are each independently the same as described in connection with $R_{81}$ in Formula 3, and

* and *' each indicate a binding site to a neighboring atom.

9. The organic light-emitting device of claim 5, wherein the second compound is selected from Compounds ETH1 to ETH80, and the third compound is selected from Compounds HTH1 to HTH28:

ETH1

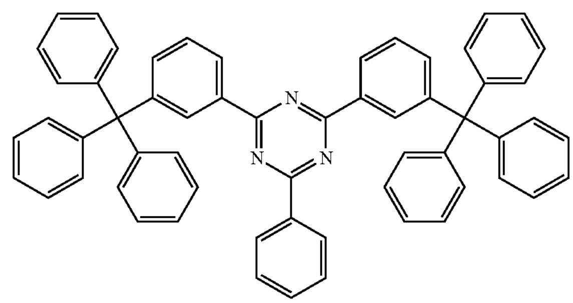

ETH2

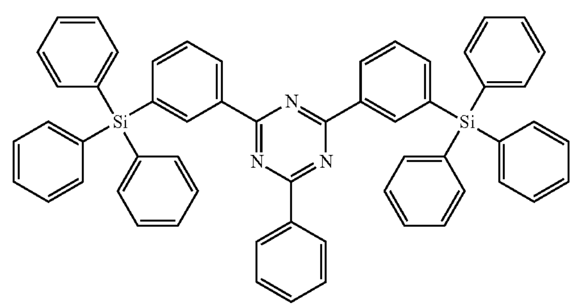

ETH3

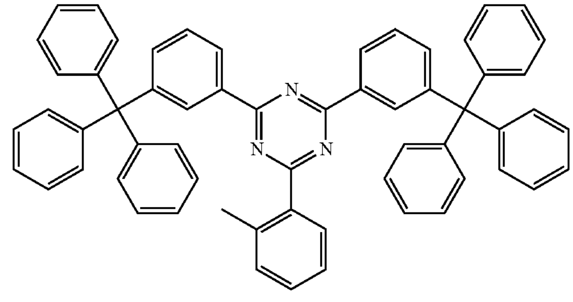

ETH4
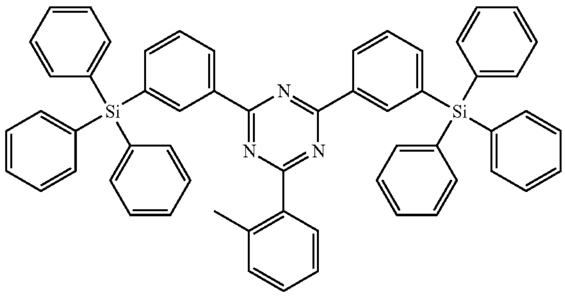
ETH5
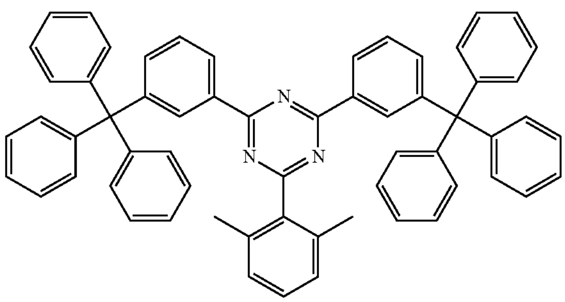
ETH6
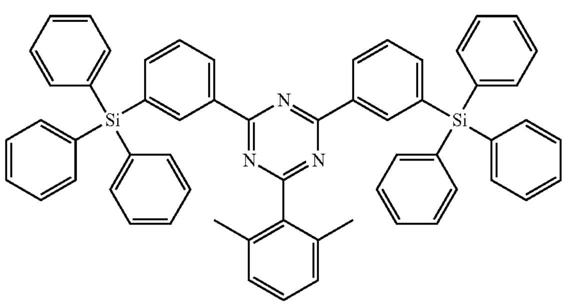
ETH7
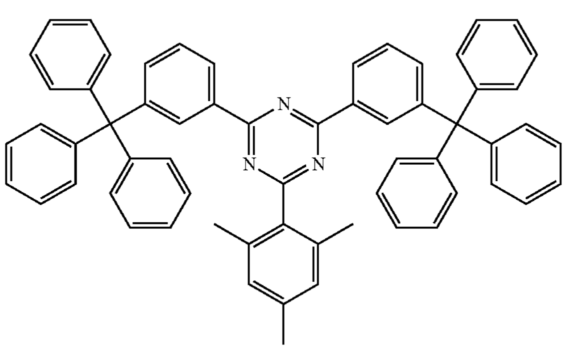
ETH8
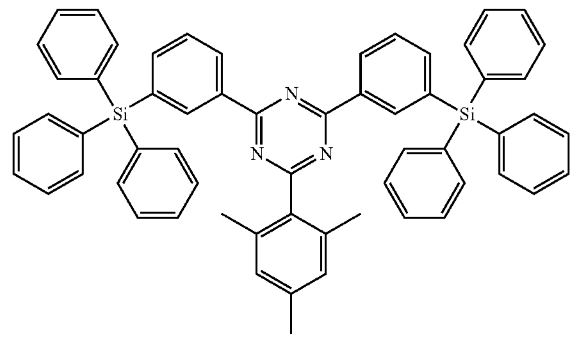
ETH9
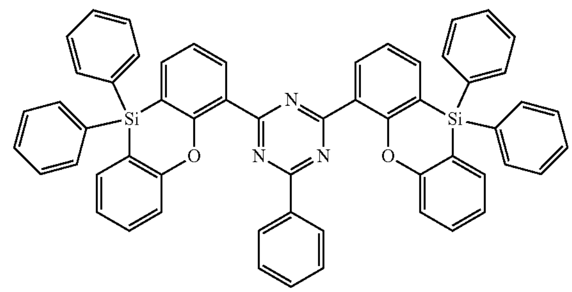
ETH10
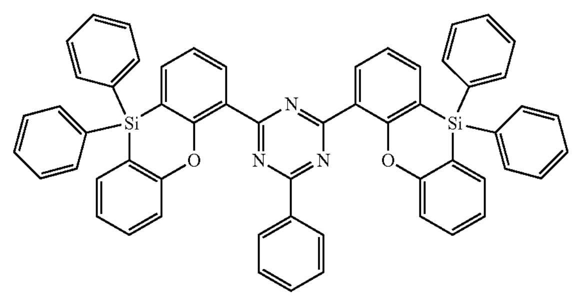
ETH11
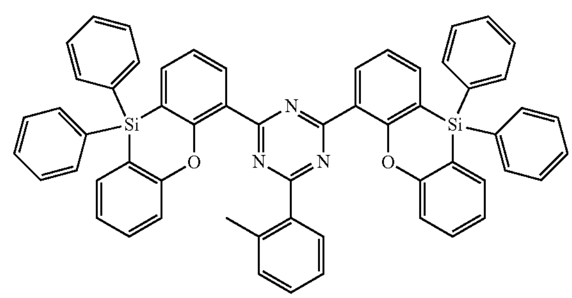
ETH12
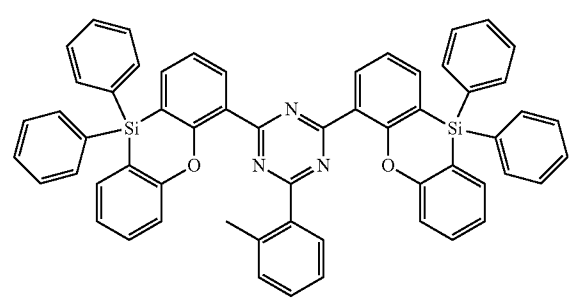

-continued
ETH13
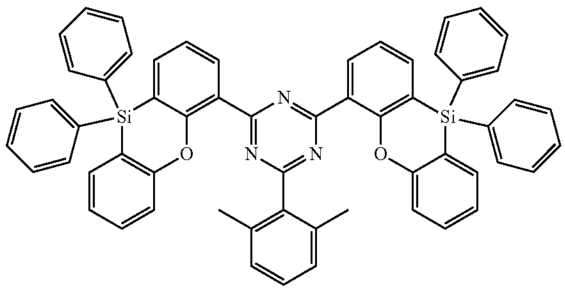
ETH14
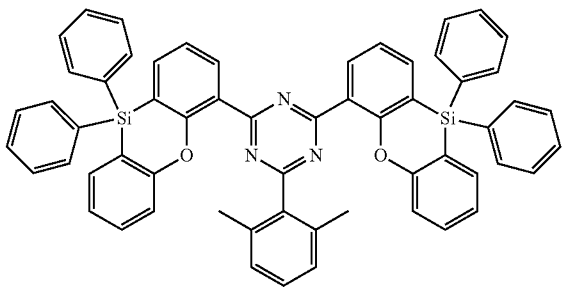
ETH15
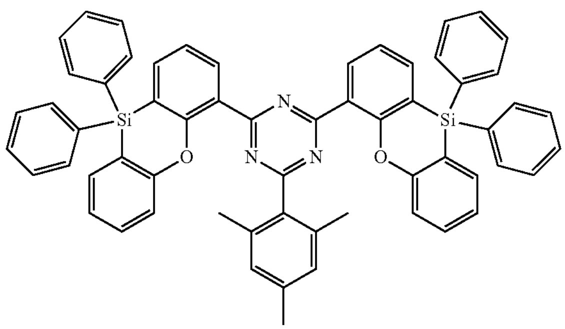
ETH16
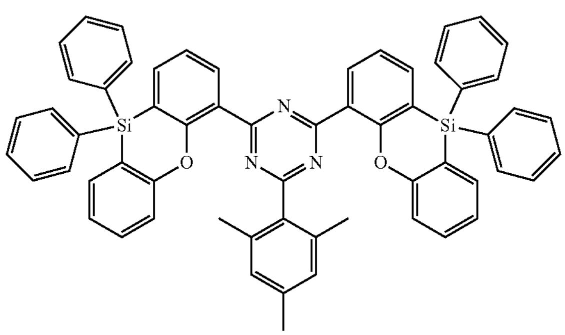
ETH17
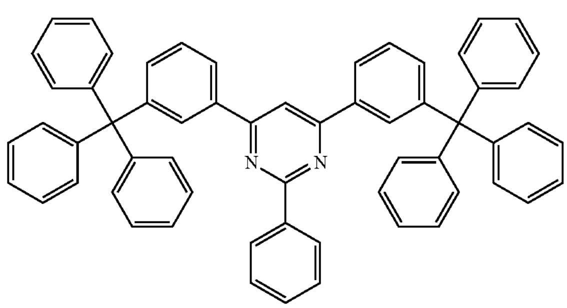
-continued
ETH18
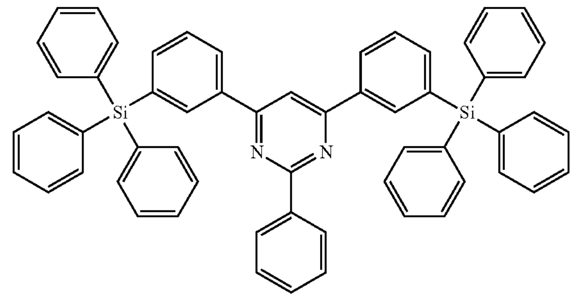
ETH19
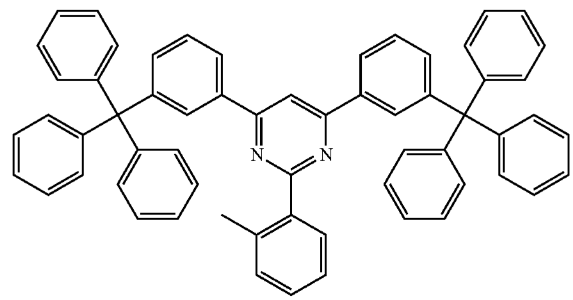
ETH20
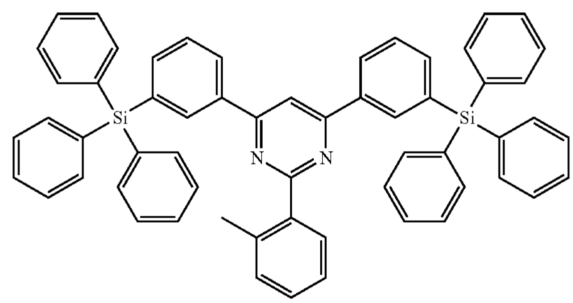
ETH21
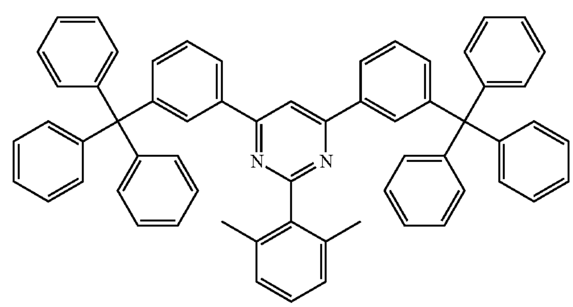
ETH22
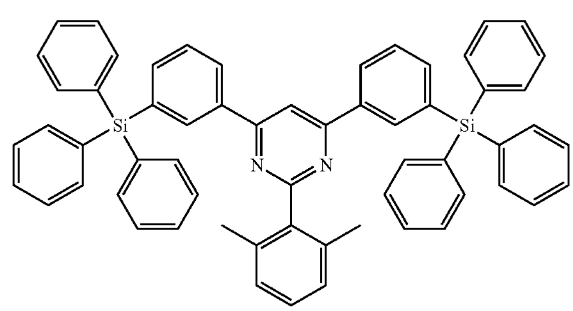

-continued
ETH23
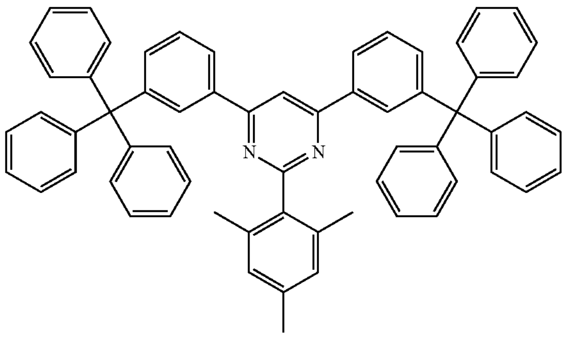
ET24
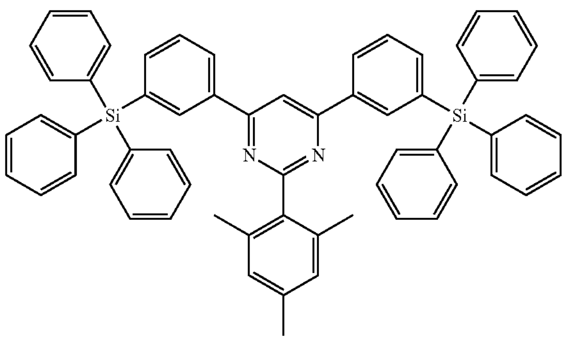
ETH25
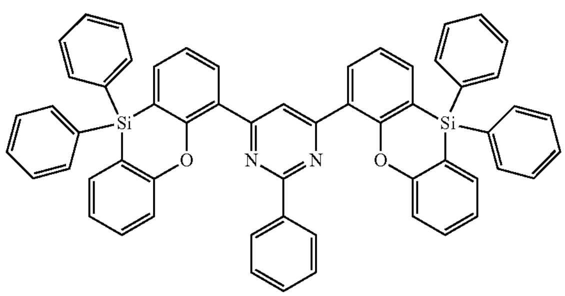
ETH26
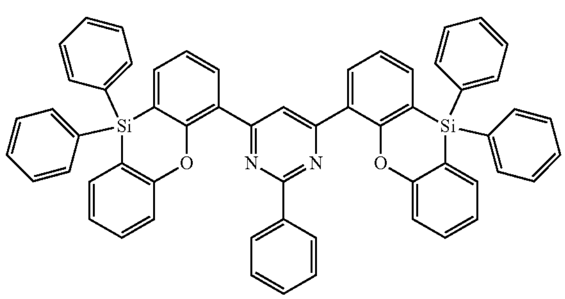
ETH27
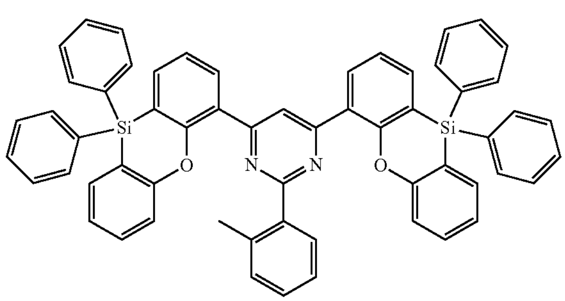
-continued
ETH28
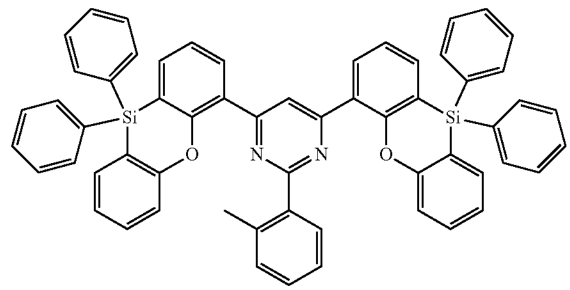
ETH29
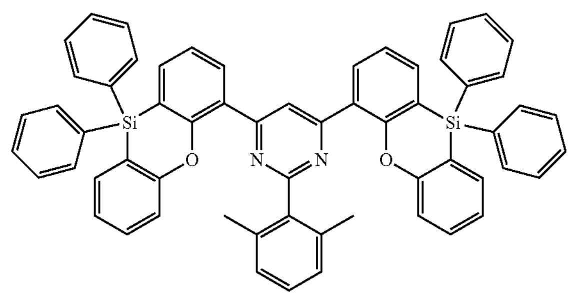
ETH30
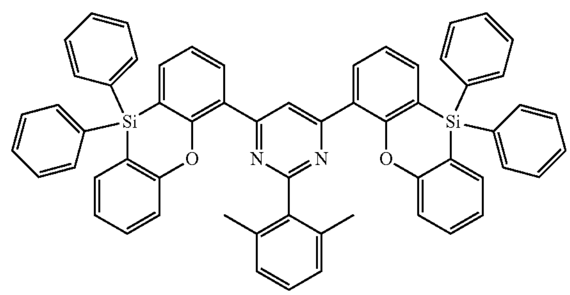
ETH31
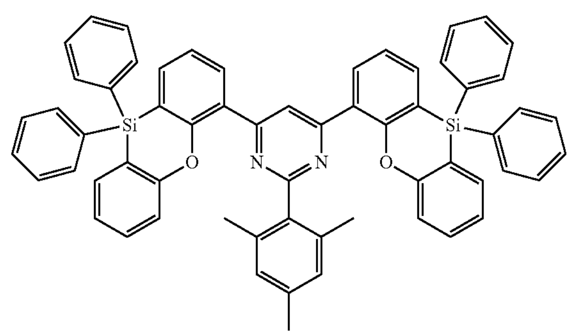
ETH32
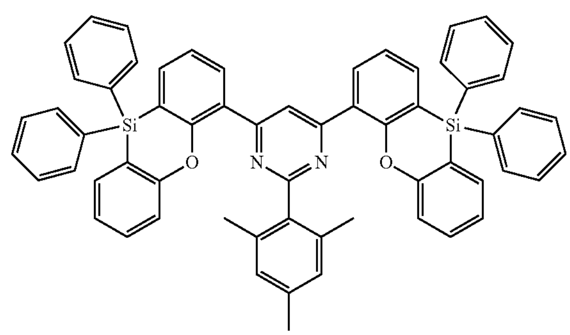

-continued
ETH33
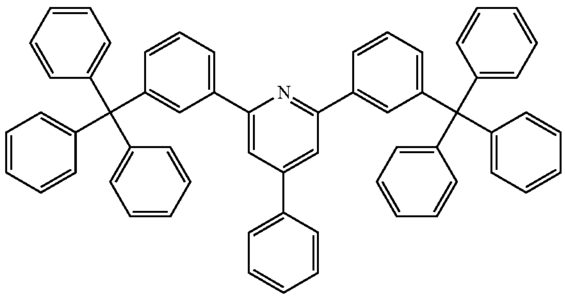
ETH34
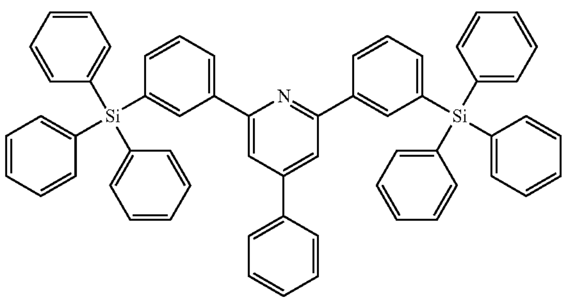
ETH35
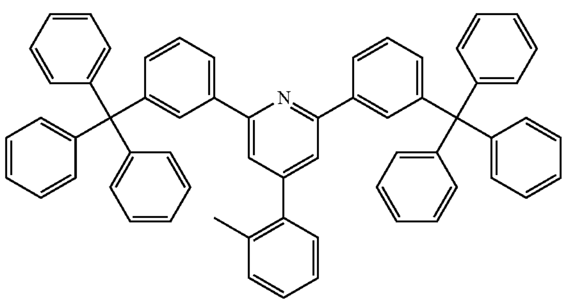
ETH36
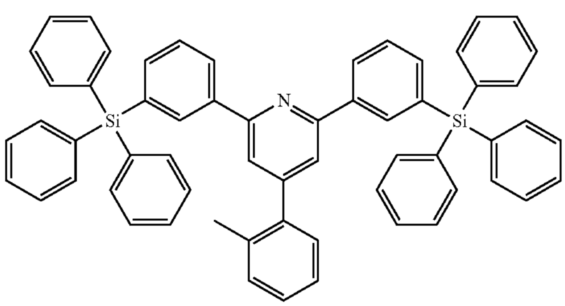
ETH37
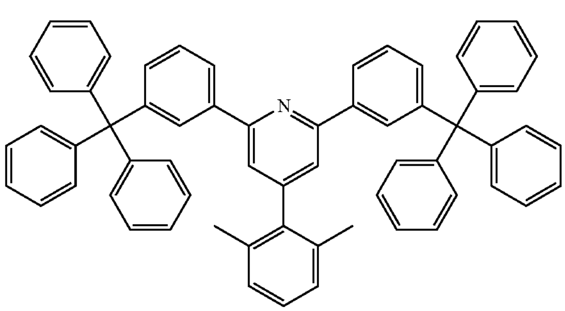
-continued
ETH38
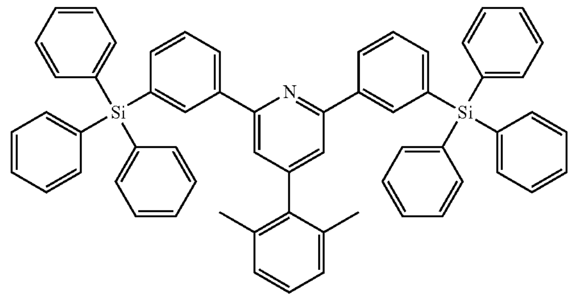
ETH39
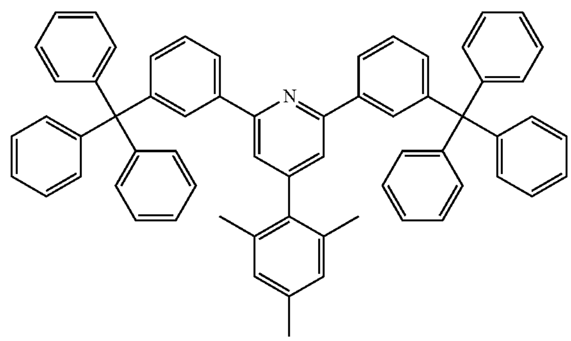
ETH40
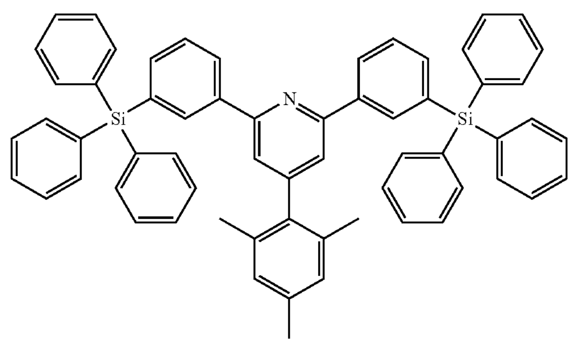
ETH41
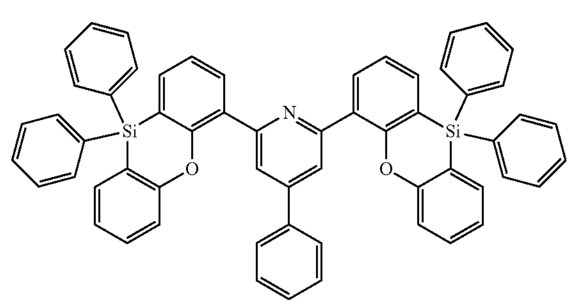

ETH42
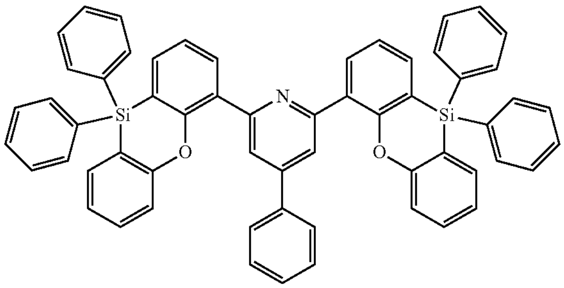
ETH43
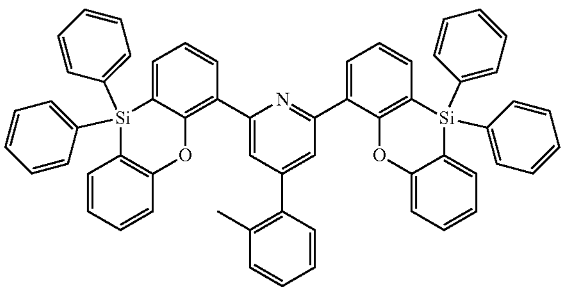
ETH44
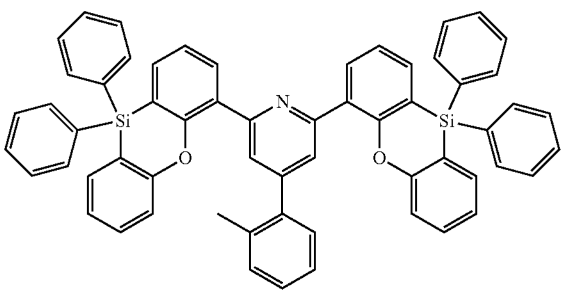
ETH45
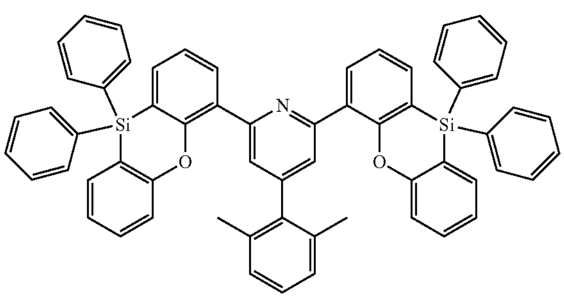
ETH46
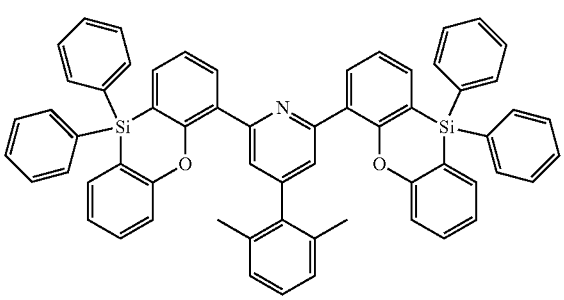
ETH47
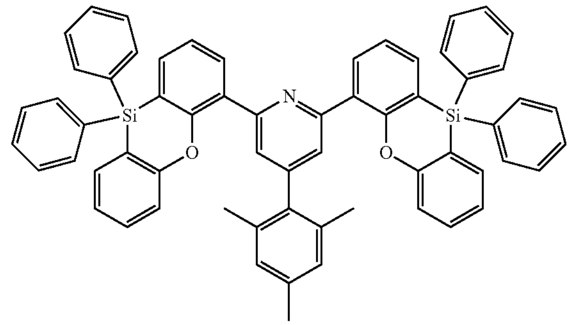
ETH48
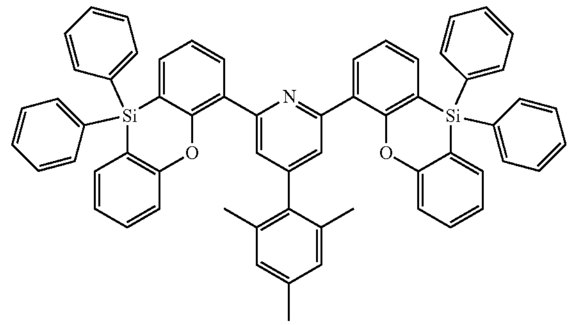
ETH49
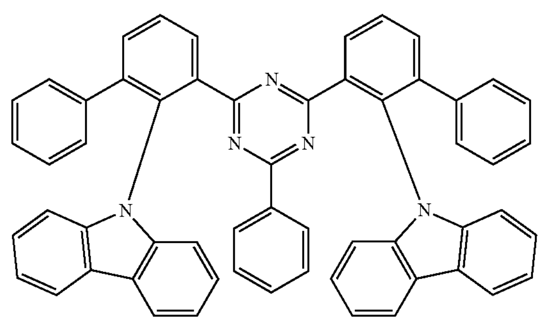
ETH50
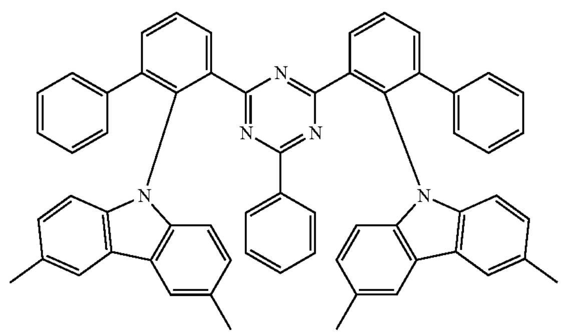

-continued
ETH51
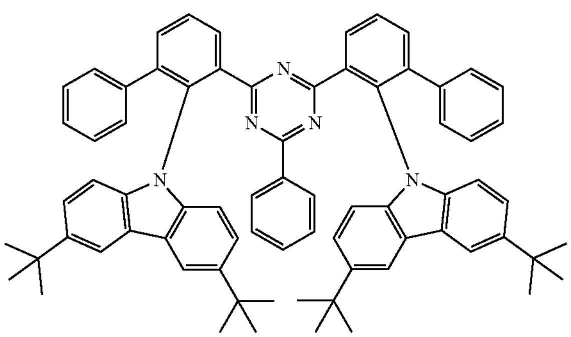
ETH52
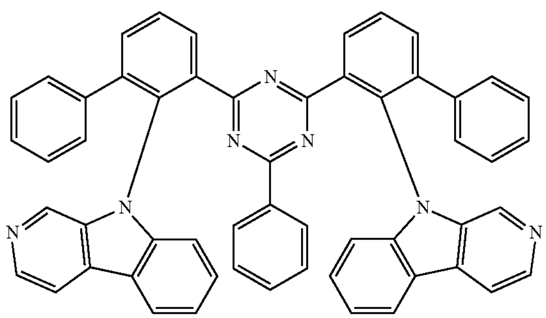
ETH53
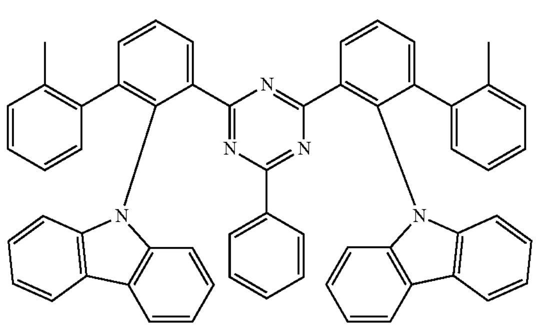
ETH54
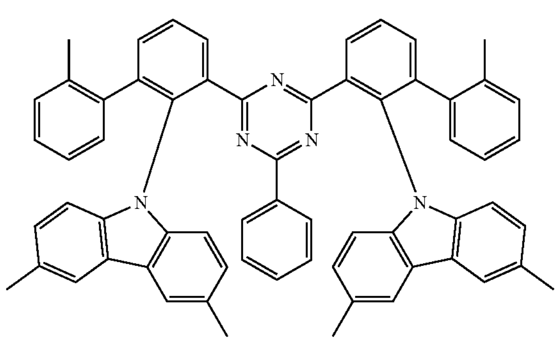
-continued
ETH55
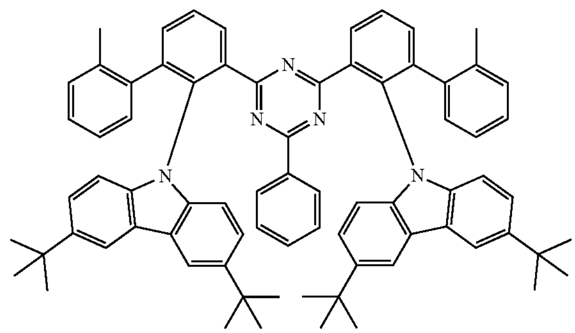
ETH56
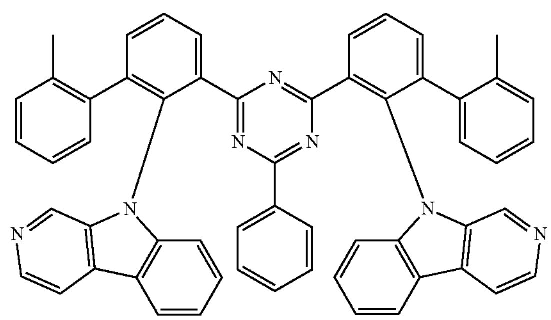
ETH57
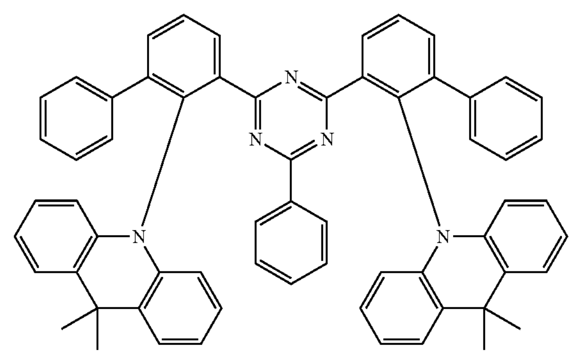
ETH58
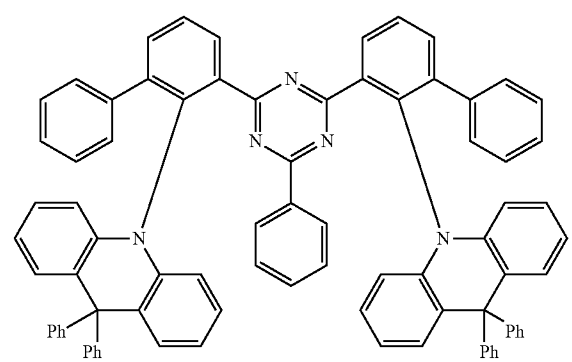

-continued
ETH59
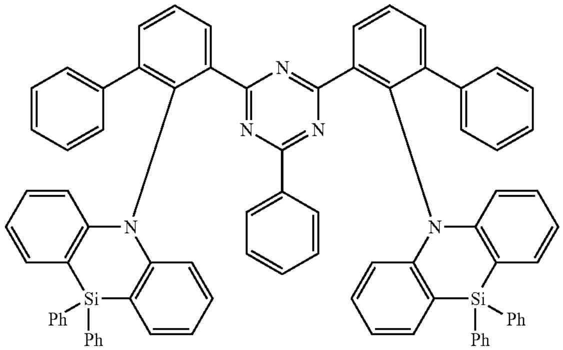
ETH60
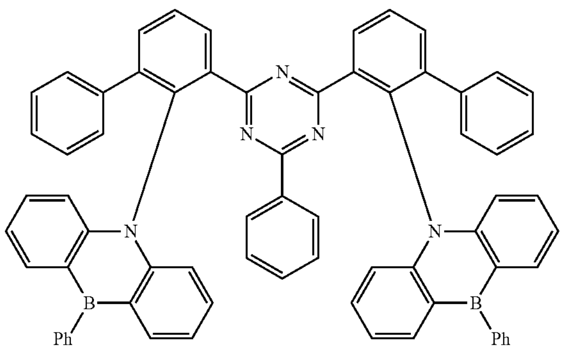
ETH61
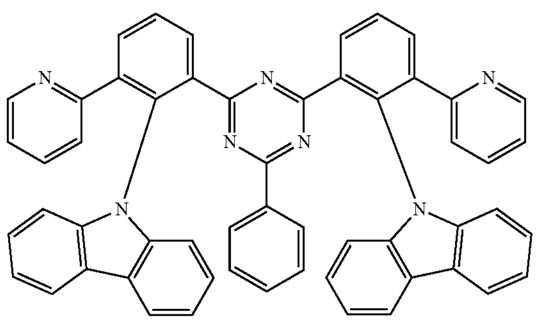
ETH62
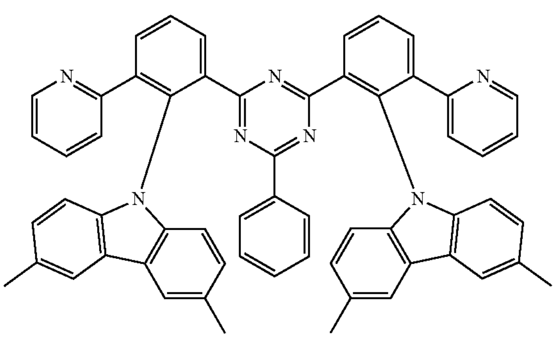
-continued
ETH63
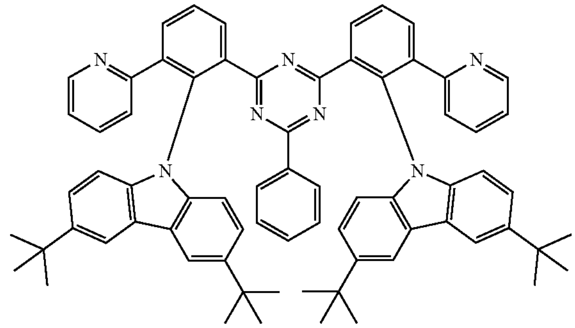
ETH64
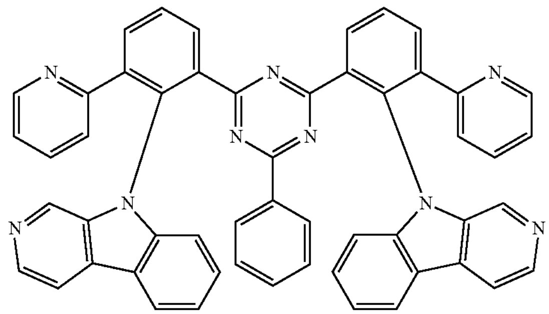
ETH65
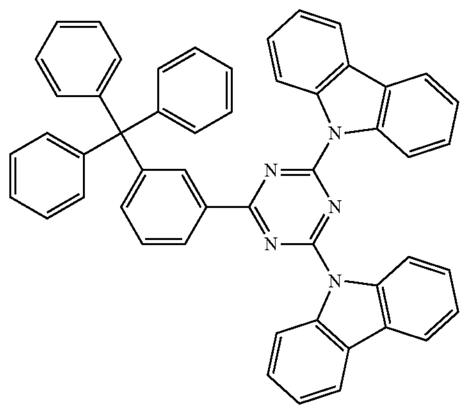
ETH66
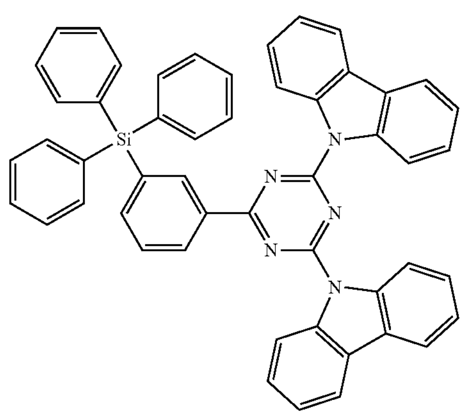

ETH67
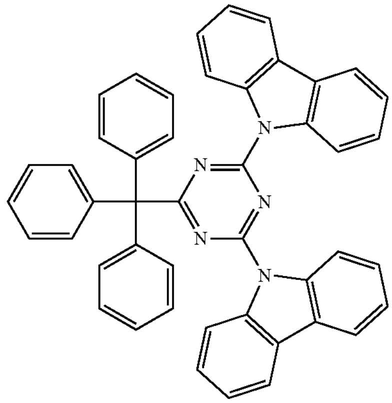
ETH68
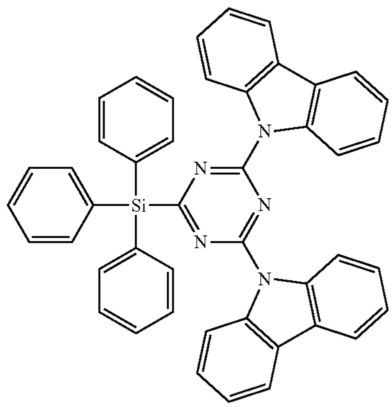
ETH69
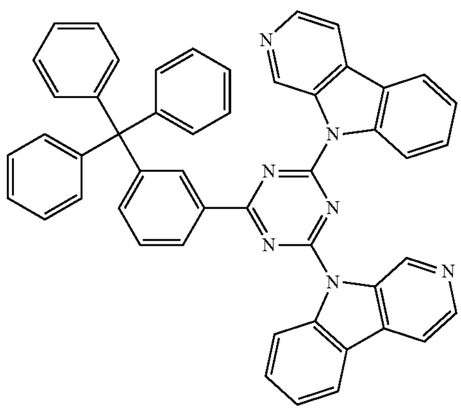
ETH70
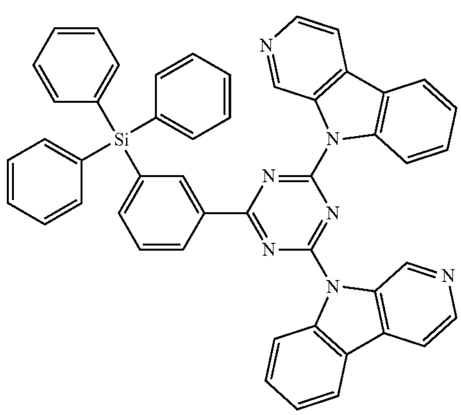
ETH71
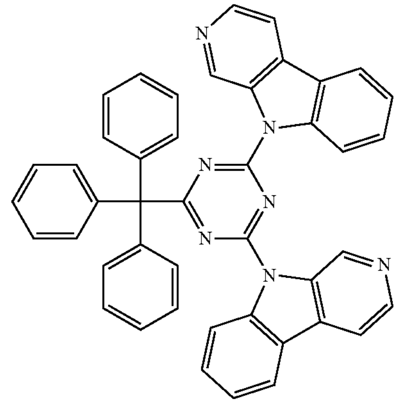
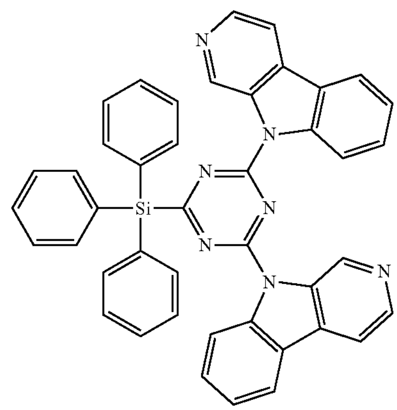
ETH73
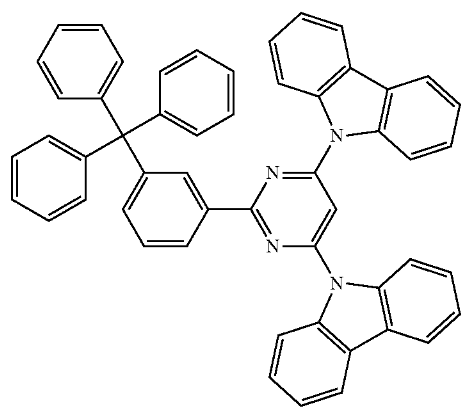
ETH74
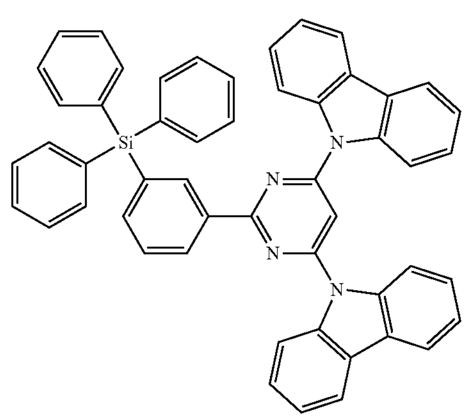

-continued
ETH75
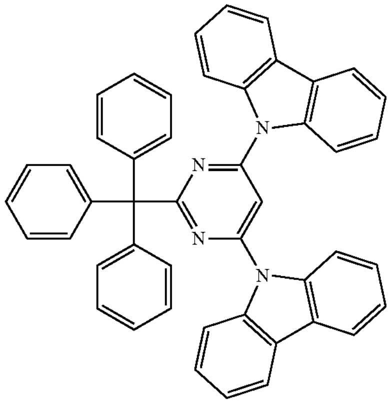
ETH76
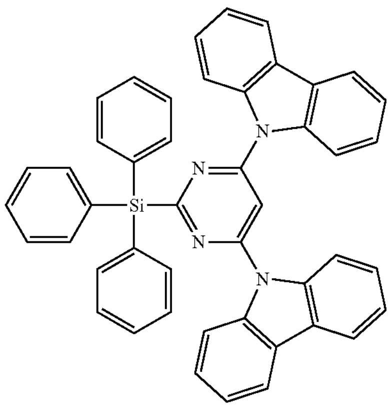
ETH77
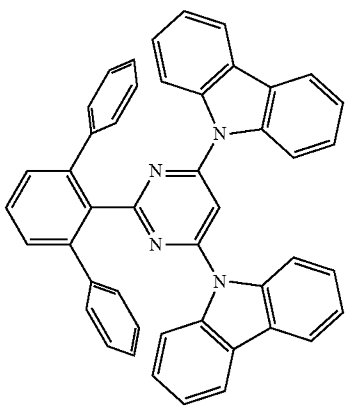
ETH78
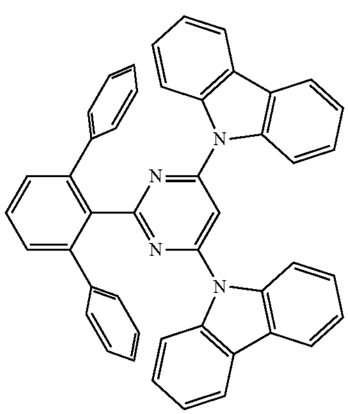
-continued
ETH79
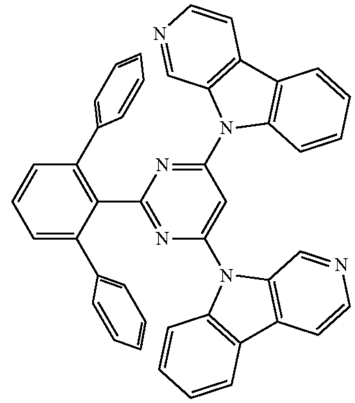
ETH80
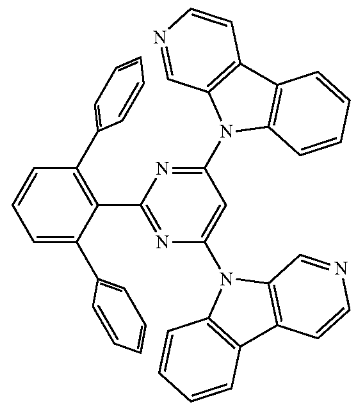
HTH1
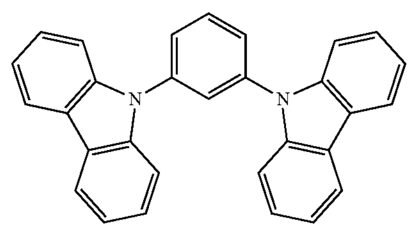
HTH2
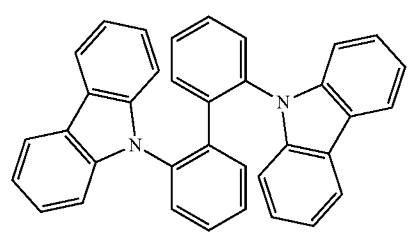
HTH3
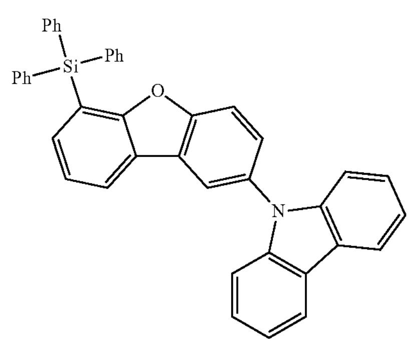

-continued
HTH4
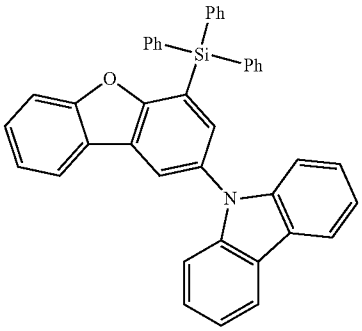
HTH5
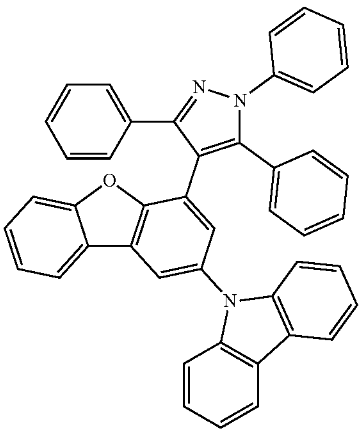
HTH6
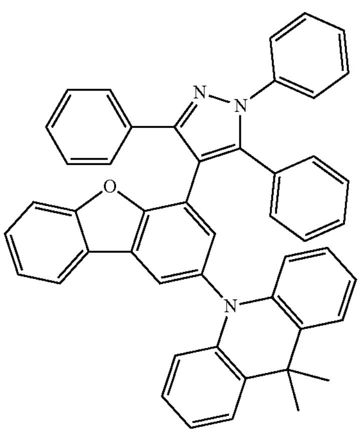
HTH7
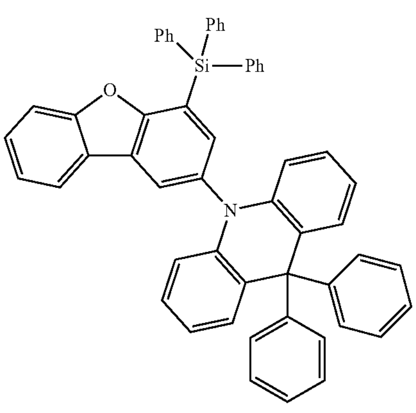
-continued
HTH8
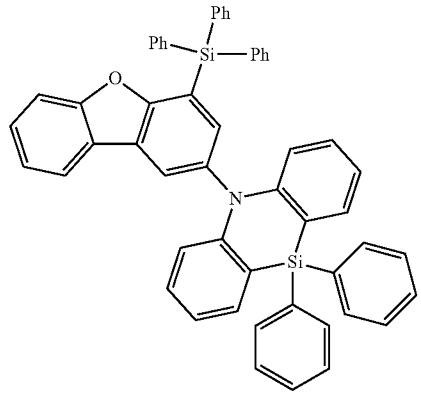
HTH9
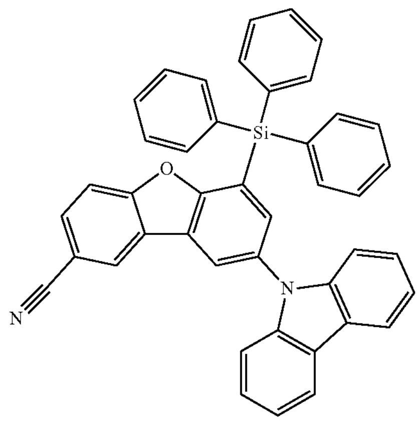
HTH10
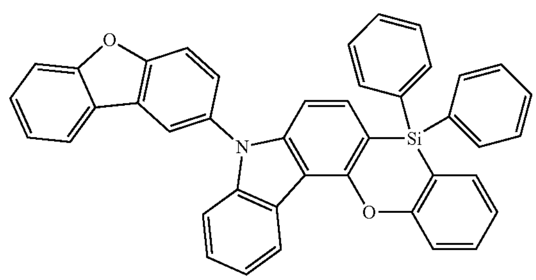
HTH11
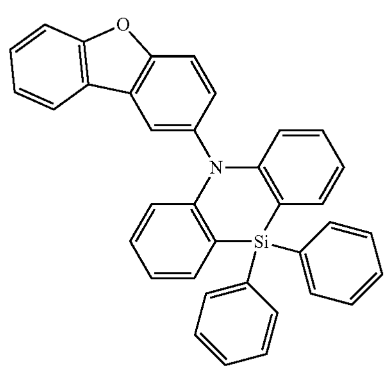

-continued
HTH12
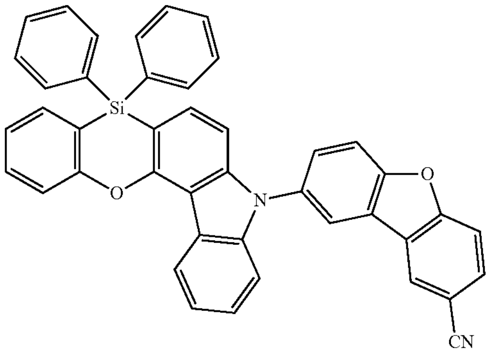
HTH13
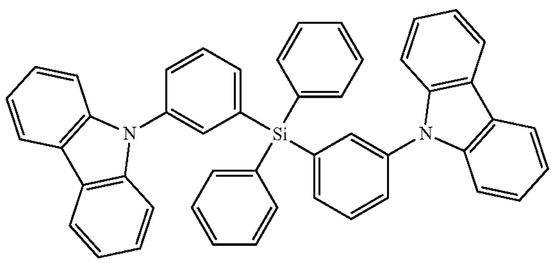
HTH14
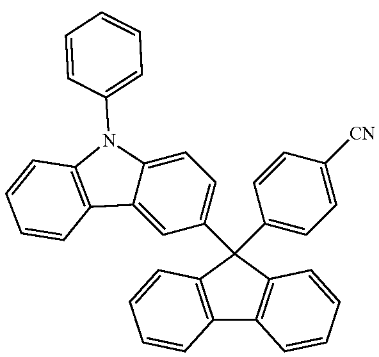
HTH15
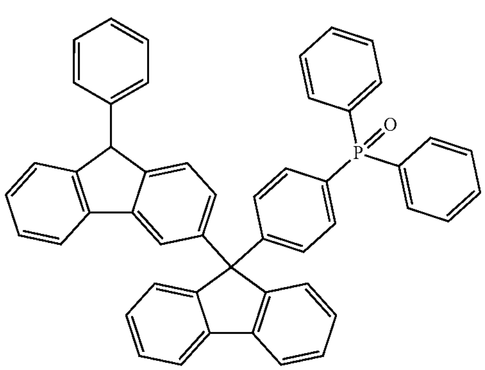
-continued
HTH16
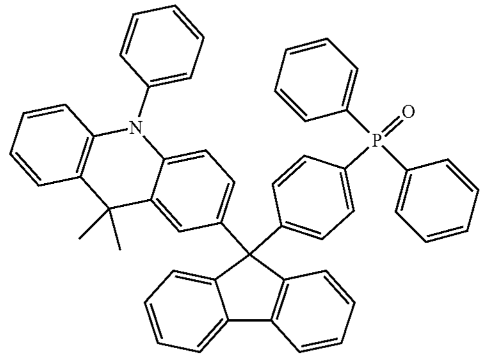
HTH17
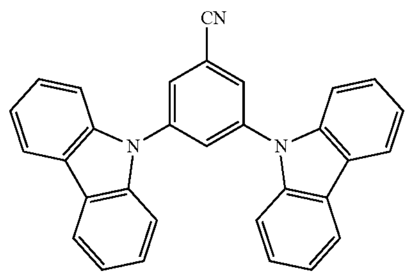
HTH18
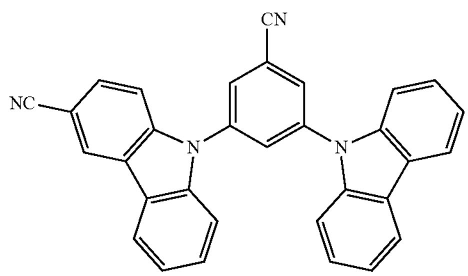
HTH19
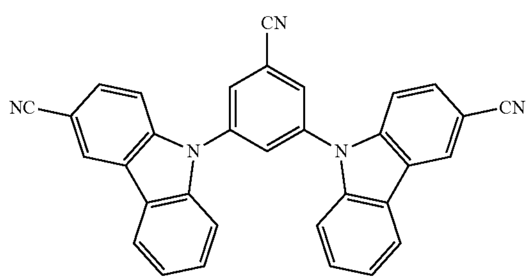
HTH20
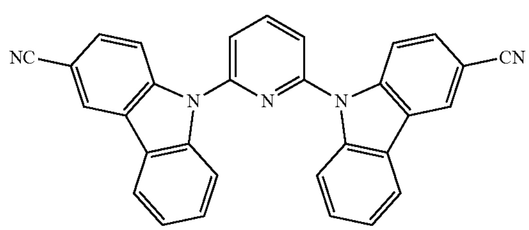

-continued
HTH21
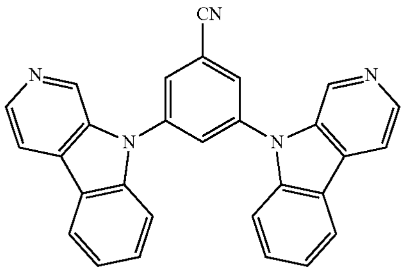
HTH22
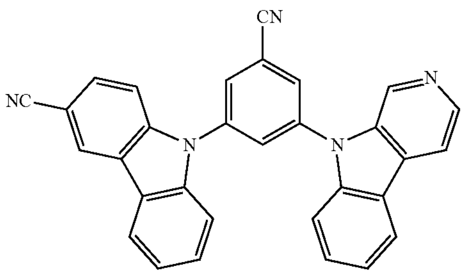
HTH23
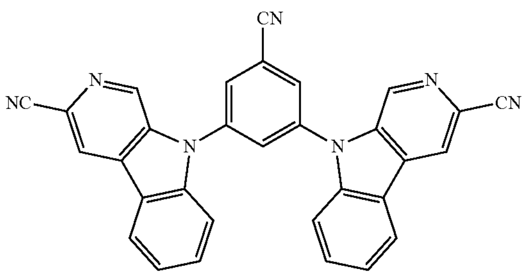
HTH24
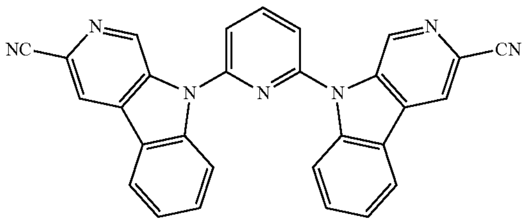
HTH25
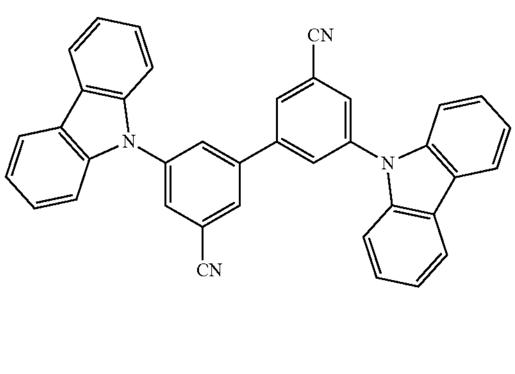
-continued
HTH26
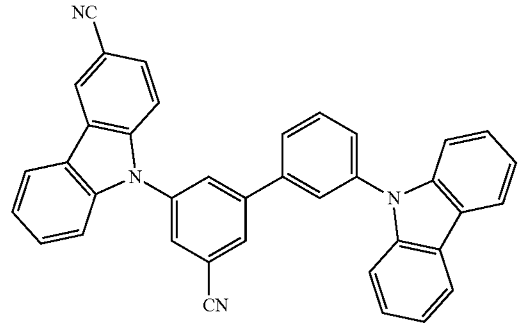
HTH27
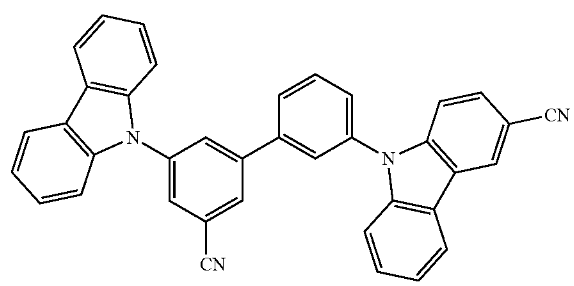
HTH28
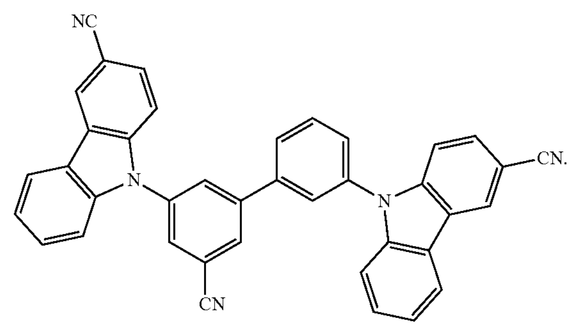
10. An organometallic compound represented by Formula 1:
Formula 1
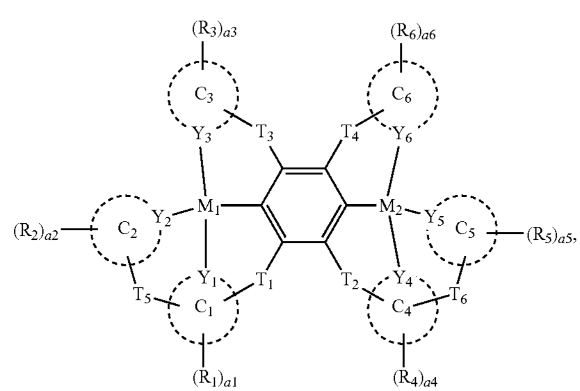

wherein, in Formula 1, $M_1$ and $M_2$ are each independently selected from platinum (Pt), palladium (Pd), iridium (Ir), copper (Cu), cadmium (Cd), nickel (Ni), zinc (Zn), manganese (Mn), and gold (Au), ring $C_1$ to ring $C_6$ are each independently selected from a $C_5$-$C_{30}$ carbocyclic group and a $C_1$-$C_{30}$ heterocyclic group, $Y_1$ is a constituent atom of ring $C_1$, and is C or N, $Y_2$ is a constituent atom of ring $C_2$, and is C or N, $Y_3$ is a constituent atom of ring $C_3$, and is C or N, $Y_4$ is a constituent atom of ring $C_4$, and is C or N, $Y_5$ is a constituent atom of ring $C_5$, and is C or N, $Y_6$ is a constituent atom of ring $C_6$, and is C or N, one selected from a bond between $Y_1$ and $M_1$, a bond between $Y_2$ and $M_1$, and a bond between $Y_3$ and $M_1$ is a covalent bond, and a remainder thereof are each a coordinate bond, one selected from a bond between $Y_4$ and $M_2$, a bond between $Y_5$ and $M_2$, and a bond between $Y_6$ and $M_2$ is a covalent bond, and a remainder thereof are each a coordinate bond, $T_1$ to $T_6$ are each independently selected from a single bond, *—O—*', *—S—*', *—Se—*', *—N($R_7$)—*, *—B($R_7$)—*', *—P($R_7$)—*, *—P(═O)($R_7$)—*, *—S(═O)—*, *—S(═O)$_2$—*, *—S(═O)($R_7$)($R_8$)—*', *—C(═O)—*', *—C($R_7$)($R_8$)—*', *—Si($R_7$)($R_8$)—*', and *—Ge($R_7$)($R_8$)—*', $R_1$ to $R_8$ are each independently selected from hydrogen, deuterium (D), —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$ ($Q_1$), and —P(═O)($Q_1$)($Q_2$), adjacent groups from among $R_1$ to $R_8$ are optionally linked to each other to form a substituted or unsubstituted $C_5$-$C_{30}$ carbocyclic group or a substituted or unsubstituted $C_1$-$C_{30}$ heterocyclic group, a1 to a6 are each independently an integer from 0 to 10,

* and *' each indicate a binding site to a neighboring atom, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_2$-$C_{60}$ heteroaryl group, the substituted $C_2$-$C_{60}$ alkylheteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is selected from:

deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-Coo alkoxy group, each substituted with at least one selected from deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$ ($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-Coo aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-Coo aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$ ($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$ ($Q_{31}$), and —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, —$CH_2D$, —$CHD_2$, —$CD_3$, —$CH_2F$, —$CHF_2$, —$CF_3$, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_1$-$C_{60}$ heteroaryl group, a monovalent non-aromatic condensed polycyclic group, a monovalent non-aromatic condensed heteropolycyclic group, a biphenyl group, and a terphenyl group.

11. The organometallic compound of claim 10, wherein $M_1$ and $M_2$ are identical to each other.

12. The organometallic compound of claim 10, wherein ring $C_1$ to ring $C_6$ are each independently selected from i) a first ring, ii) a second ring, iii) a condensed ring in which two or more first rings are condensed with each other, iv) a condensed ring in which two or more second rings are condensed with each other, and v) a condensed ring in which one or more first rings and one or more second rings are condensed with each other, the first ring is selected from a cyclopentane group, a cyclopentene group, a cyclopentadiene group, a furan group, a thiophene group, a pyrrole group, a borole group, a phosphol group, a silole group, a germole group, a selenophene group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the second ring is selected from a cyclohexane group, a cyclohexene group, a cyclohexadiene group, an adamantane group, a norbornane group, a norbornene group, a benzene group, a pyridine group, a dihydropyridine group, a tetrahydropyridine group, a pyrimidine group, a dihydropyrimidine group, a tetrahydropyrimidine group, a pyrazine group, a dihydropyrazine group, a tetrahydropyrazine group, a pyridazine group, a dihydropyridazine group, a tetrahydropyridazine group, a triazine group, an oxasiline group, a thiasiline group, a dihydroazasiline group, a dihydrodisiline group, a dihydrosiline group, a dioxine group, an oxathiine group, an oxazine group, a pyran group, a dithiine group, a thiazine group, and a thiopyran group.

13. The organometallic compound of claim 10, wherein a moiety represented by

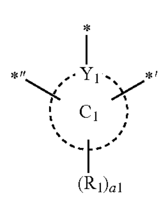

is a group represented by one selected from Formulae 1a to 1d, a moiety represented by

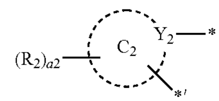

is a group represented by one selected from Formulae 2a to 2h, a moiety represented by

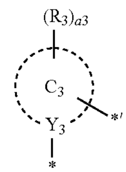

is a group represented by one selected from Formulae 3a to 3d, a moiety represented by

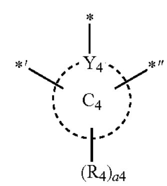

is a group represented by one selected from Formulae 4a to 4d, a moiety represented by

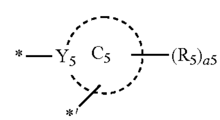

is a group represented by one selected from Formulae 5a to 5h, and a moiety represented by

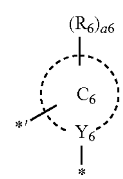

is a group represented by one selected from Formulae 6a to 6d:

1a

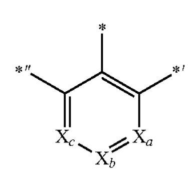

-continued
1b
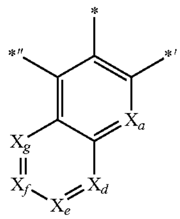
1c
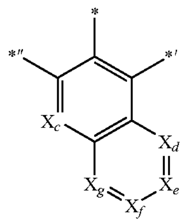
1d
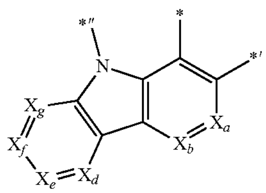
2a
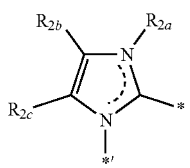
2b
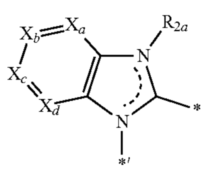
2c
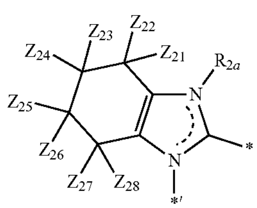
2d
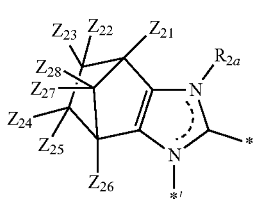
2e
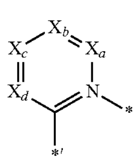
-continued
2f
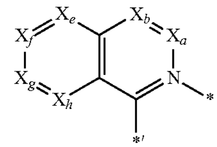
2g
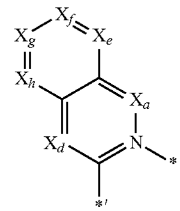
2h
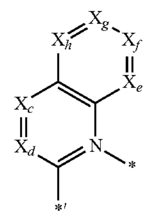
3a
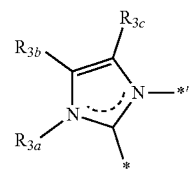
3b
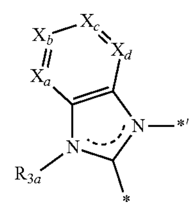
3c
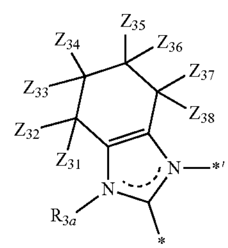
3d
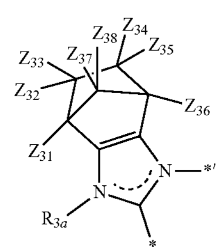
4a
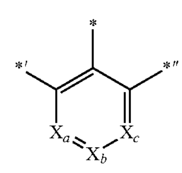

-continued
4b
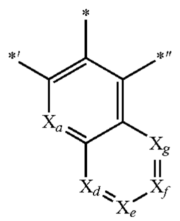
4c
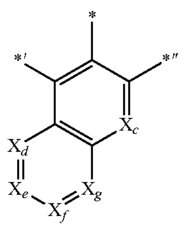
4d
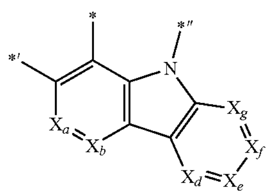
5a
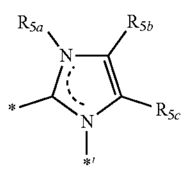
5b
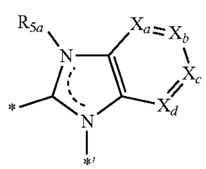
5c
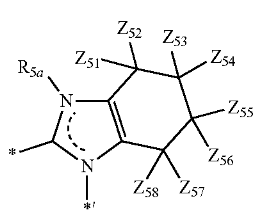
5d
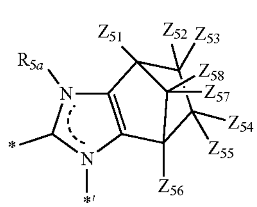
5e
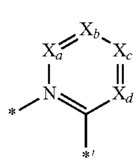
-continued
5f
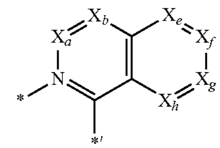
5g
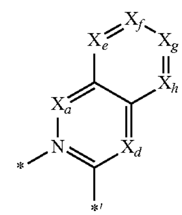
5h
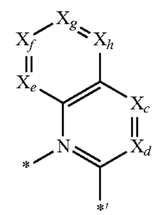
6a
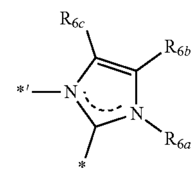
6b
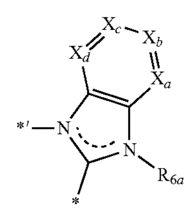
6c
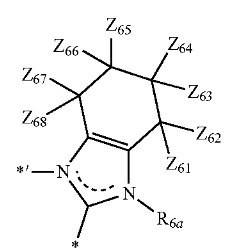
6d
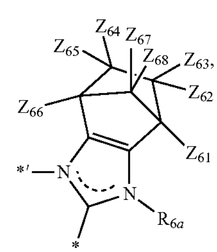
and
wherein, in Formulae 1a to 1d,
$X_a$ is N or $C(Z_{1a})$, $X_b$ is N or $C(Z_{1b})$, $X_c$ is N or $C(Z_{1c})$, $X_d$ is N or $C(Z_{1d})$, $X_e$ is N or $C(Z_{1e})$, $X_f$ is N or $C(Z_{1f})$, and $X_g$ is N or $C(Z_{1g})$, $Z_{1a}$ to $Z_{1g}$ are each independently the same as described in connection with $R_1$ in Formula 1, in Formulae 2a to 2h, $X_a$ is N or C($Z_{2a}$), $X_b$ is N or C($Z_{2b}$), $X_c$ is N or C($Z_{2c}$), $X_a$ is N or C($Z_{2d}$), $X_c$ is N or C($Z_{2e}$), $X_f$ is N or C($Z_{2f}$), $X_g$ is N or C($Z_{2g}$), and $X_h$ is N or C($Z_{2h}$), $R_{2a}$ to $R_{2c}$, $Z_{21}$ to $Z_{28}$, and $Z_{2a}$ to $Z_{2h}$ are each independently the same as described in connection with $R_2$ in Formula 1, in Formulae 3a to 3d, $X_a$ is N or C($Z_{3a}$), $X_b$ is N or C($Z_{3b}$), $X_c$ is N or C($Z_{3c}$), and $X_d$ is N or C($Z_{3d}$), $R_{3a}$ to $R_{3c}$, $Z_{31}$ to $Z_{38}$, and $Z_3$a to $Z_3$d are each independently the same as described in connection with $R_3$ in Formula 1, in Formulae 4a to 4d, $X_a$ is N or C($Z_{4a}$), $X_b$ is N or C($Z_{4b}$), $X_c$ is N or C($Z_{4c}$), $X_d$ is N or C($Z_{4d}$), $X_e$ is N or C($Z_{4e}$), $X_f$ is N or C($Z_{4f}$), and $X_g$ is N or C($Z_{4g}$), $Z_{4a}$ to $Z_{4g}$ are each independently the same as described in connection with $R_4$ in Formula 1, in Formulae 5a to 5h, $X_a$ is N or C($Z_{5a}$), $X_b$ is N or C($Z_{5b}$), $X_c$ is N or C($Z_{5c}$), $X_d$ is N or C($Z_{5d}$), $X_e$ is N or C($Z_{5e}$), $X_f$ is N or C($Z_{5f}$), $X_g$ is N or C($Z_{5g}$), and $X_h$ is N or C($Z_{5h}$), $R_{5a}$ to $R_{5c}$, $Z_{51}$ to $Z_{58}$, and $Z_{5a}$ to $Z_{5h}$ are each independently the same as described in connection with $R_5$ in Formula 1, and in Formulae 6a to 6d, $X_a$ is N or C($Z_{6a}$), $X_b$ is N or C($Z_{6b}$), $X_c$ is N or C($Z_{6c}$), and $X_d$ is N or C($Z_{6d}$), and $R_{6a}$ to $R_{6c}$, $Z_{61}$ to $Z_{68}$, and $Z_{6a}$ to $Z_{6d}$ are each independently the same as described in connection with $R_6$ in Formula 1.

14. The organometallic compound of claim 10, wherein $T_1$ and $T_2$ are each independently selected from *—O—*', *—S—*', and *—Se—*', $T_3$ and $T_4$ are each a single bond, and $T_5$ and $T_6$ are each independently selected from a single bond and *—N($R_7$)—*'.

15. The organometallic compound of claim 10, wherein $R_1$ to $R_8$ are each independently selected from:

hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, and a $C_1$-$C_{60}$ alkoxy group;

a $C_1$-$C_{60}$ alkyl group and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, and an indolocarbazolyl group;

a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, and an indolocarbazolyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a $C_1$-$C_{60}$ alkyl group, a $C_1$-$C_{60}$ alkoxy group, a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, an indolocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$; and $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$, and $Q_1$ to $Q_3$ and $Q_{31}$ to $Q_{33}$ are each independently selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group that is substituted with at least one selected from deuterium, —F, a cyano group, a $C_1$-$C_{60}$ alkyl group, a phenyl group, and a biphenyl group, a $C_6$-$C_{60}$ aryl group that is substituted with at least one selected from deuterium, —F, a cyano group, a $C_1$-$C_{10}$ alkyl group, a phenyl group, and a biphenyl group, and a $C_1$-$C_{60}$ heteroaryl group that is substituted with at least one selected from deuterium, —F, a cyano group, a $C_1$-$C_{10}$ alkyl group, a phenyl group, and a biphenyl group.

16. The organometallic compound of claim 10, wherein the organometallic compound is represented by Formula 1-1:

Formula 1-1

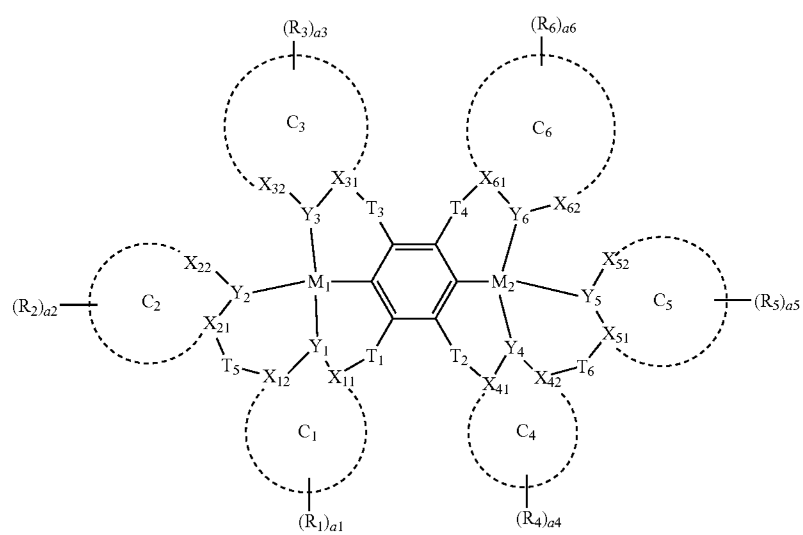

wherein, in Formula 1-1, $M_1$, $M_2$, ring $C_1$ to ring $C_6$, $R_1$ to $R_6$, a1 to a6, $T_1$ to $T_6$, and $Y_1$ to $Y_6$ are each the same as respectively described in Formula 1, $X_{11}$, $X_{12}$, $X_{21}$, $X_{22}$, $X_{31}$, $X_{32}$, $X_{41}$, $X_{42}$, $X_{51}$, $X_{52}$, $X_{61}$, and $X_{62}$ are each independently C or N, when $X_{21}$ is N, $X_{22}$ is N, and $Y_2$ is C, when $X_{31}$ is N, $X_{32}$ is N, and $Y_3$ is C, when $X_{51}$ is N, $X_{52}$ is N, and $Y_5$ is C, and when $X_{61}$ is N, $X_{62}$ is N, and $Y_6$ is C.

17. The organometallic compound of claim 10, wherein the organometallic compound is represented by Formula 1-2:

Formula 1-2

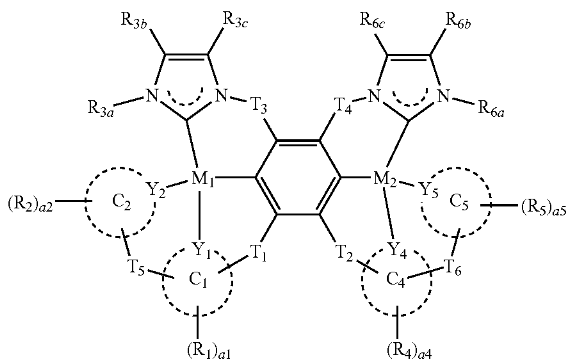

wherein, in Formula 1-2, $M_1$, $M_2$, $C_1$, $C_2$, $C_4$, $C_5$, $R_1$, $R_2$, $R_4$, $R_5$, a1, a2, a4, a5, $T_1$ to $T_6$, $Y_1$, $Y_2$, $Y_4$, and $Y_5$ are each the same as respectively described in connection with Formula 1, $R_{3a}$ to $R_{3c}$ are each independently the same as described in connection with $R_3$ in Formula 1, and $R_{6a}$ to $R_{6c}$ are each independently the same as described in connection with $R_6$ in Formula 1.

18. The organometallic compound of claim 10, wherein the organometallic compound is represented by Formula 1-3 or 1-4:

Formula 1-3

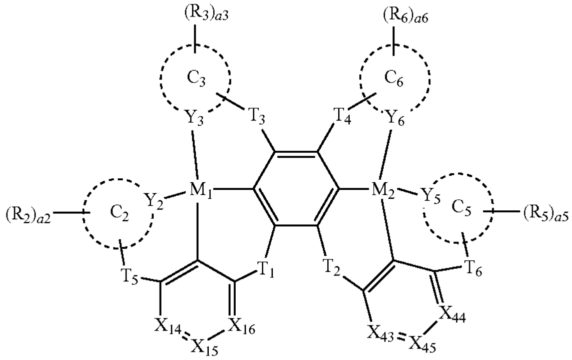

-continued

Formula 1-4

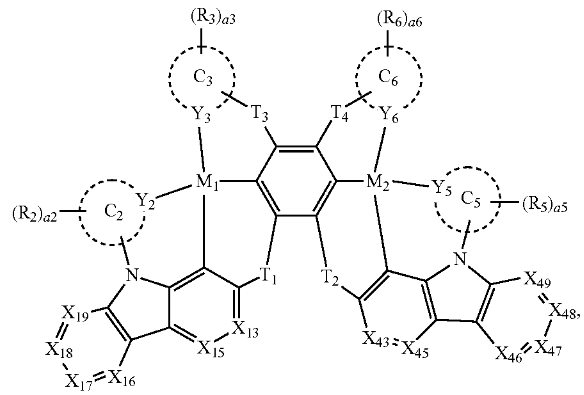

and wherein, in Formulae 1-3 and 1-4, $M_1$, $M_2$, $C_2$, $C_3$, $C_5$, $C_6$, $Y_2$, $Y_3$, $Y_5$, $Y_6$, $R_2$, $R_3$, $R_5$, $R_6$, a2, a3, a5, a6, and $T_1$ to $T_6$ are each the same as respectively described in connection with Formula 1, $X_{13}$ is N or $C(R_{13})$, $X_{14}$ is N or $C(R_{14})$, $X_{15}$ is N or $C(R_{15})$, $X_{16}$ is N or $C(R_{16})$, $X_{17}$ is N or $C(R_{17})$, $X_{18}$ is N or $C(R_{18})$, and $X_{19}$ is N or $C(R_{19})$, $X_{43}$ is N or $C(R_{43})$, $X_{44}$ is N or $C(R_{44})$, $X_{45}$ is N or $C(R_{45})$, $X_{46}$ is N or $C(R_{46})$, $X_{47}$ is N or $C(R_{47})$, $X_{48}$ is N or $C(R_{48})$, and $X_{49}$ is N or $C(R_{49})$, $R_{13}$ to $R_{19}$ are each independently the same as described in connection with $R_1$ in Formula 1, and $R_{43}$ to $R_{49}$ are each independently the same as described in connection with $R_4$ in Formula 1.

19. The organometallic compound of claim 10, wherein the organometallic compound is represented by one of Formulae 1-5 to 1-7:

Formula 1-5

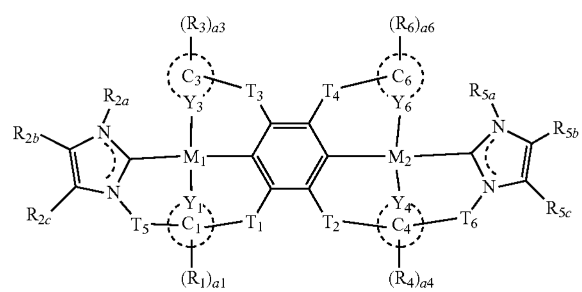

Formula 1-6

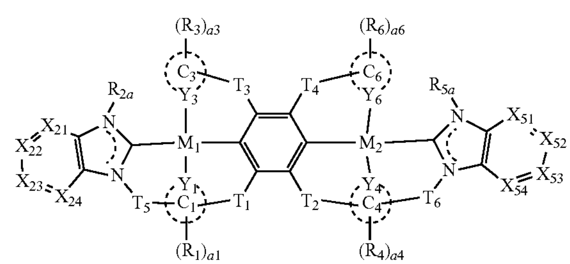

-continued

Formula 1-7

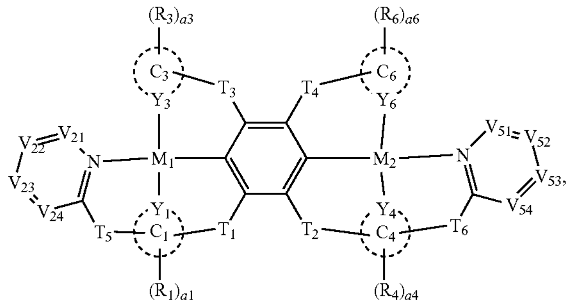

and wherein, in Formulae 1-5 to 1-7, $M_1$, $M_2$, $C_1$, $C_3$, $C_4$, $C_6$, $R_1$, $R_3$, $R_4$, $R_6$, a1, a3, a4, a6, $T_1$ to $T_6$, $Y_1$, $Y_3$, $Y_4$, and $Y_6$ are each the same as respectively described in connection with Formula 1, $X_{21}$ is N or $C(R_{21})$, $X_{22}$ is N or $C(R_{22})$, $X_{23}$ is N or $C(R_{23})$, and $X_{24}$ is N or $C(R_{24})$, $X_{51}$ is N or $C(R_{51})$, $X_{52}$ is N or $C(R_{52})$, $X_{53}$ is N or $C(R_{53})$, and $X_{54}$ is N or $C(R_{54})$, $V_{21}$ is N or $C(RV_{21})$, $V_{22}$ is N or $C(RV_{22})$, $V_{23}$ is N or $C(RV_{23})$, and $V_{24}$ is N or $C(RV_{24})$, $V_{51}$ is N or $C(RV_{51})$, $V_{52}$ is N or $C(RV_{52})$, $V_{53}$ is N or $C(RV_{53})$, and $V_{54}$ is N or $C(RV_{54})$, $R_{2a}$ to $R_{2c}$, $R_{21}$ to $R_{24}$, and $RV_{21}$ to $RV_{24}$ are each independently the same as described in connection with $R_2$ in Formula 1, and $R_{5a}$ to $R_{5c}$, $R_{51}$ to $R_{54}$, and $RV_{51}$ to $RV_{54}$ are each independently the same as described in connection with $R_5$ in Formula 1.

20. The organometallic compound of claim 10, wherein the organometallic compound is selected from Compounds BD 1 to BD 93:

BD 1

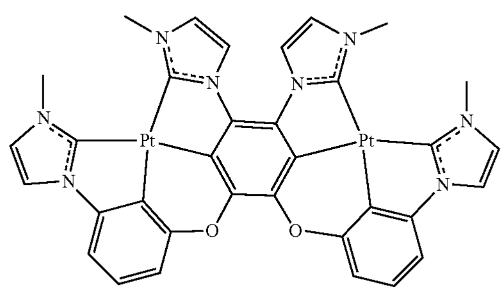

BD 2

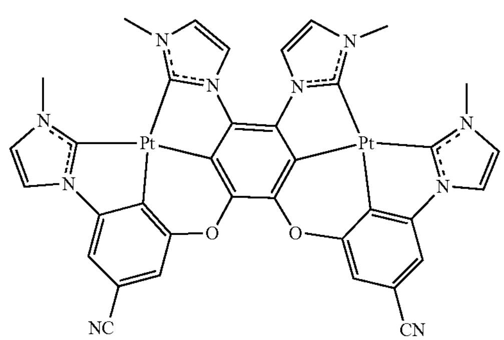

-continued

BD 3

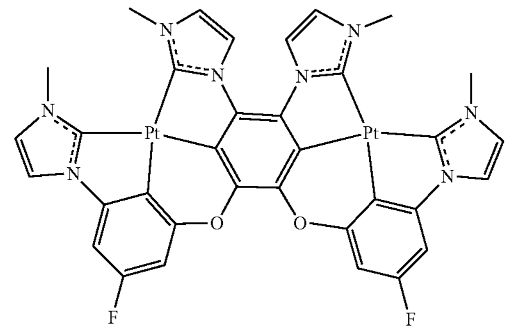

BD 4

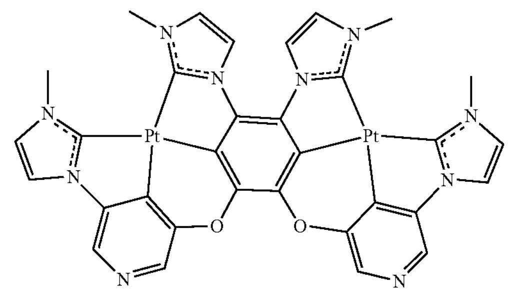

BD 5

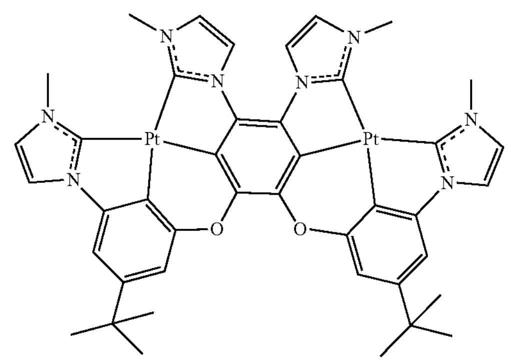

BD 6

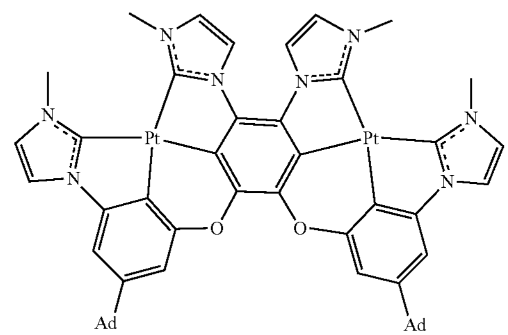

-continued
BD 7
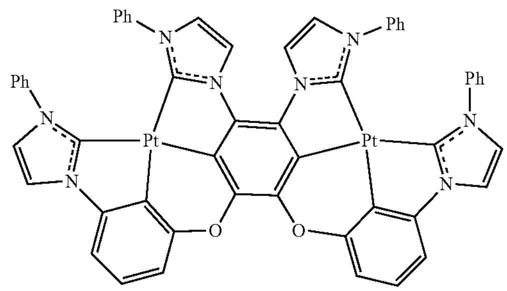
BD 8
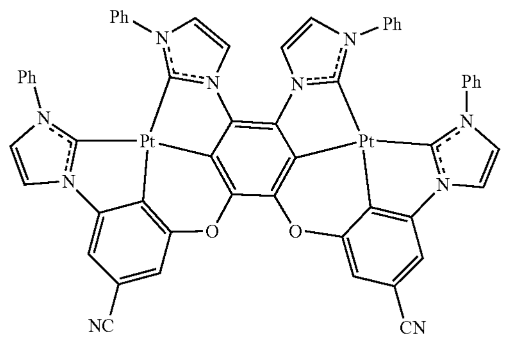
BD 9
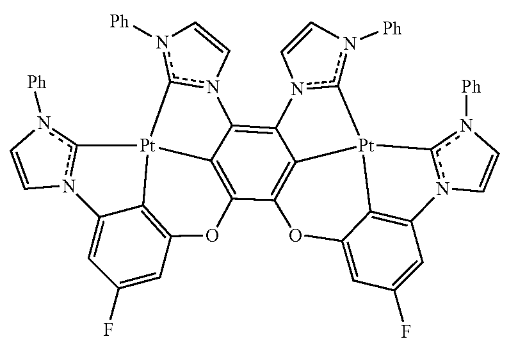
BD 10
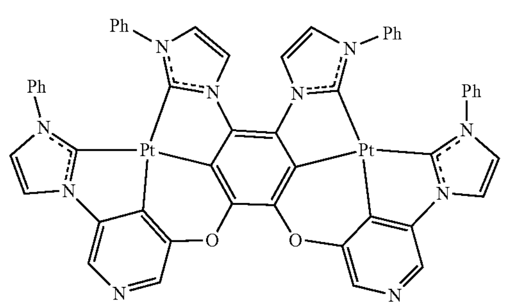
-continued
BD 11
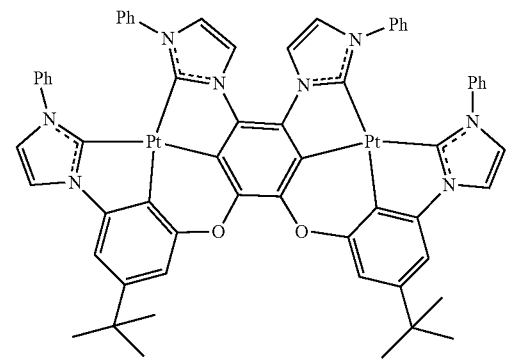
BD 12
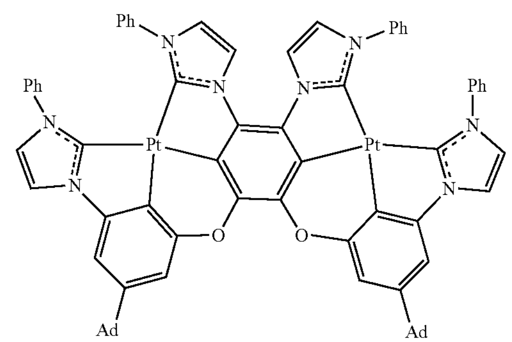
BD 13
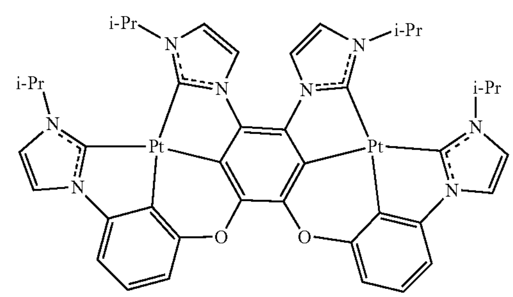
BD 14
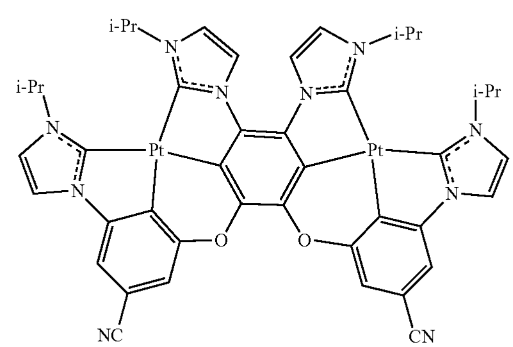

-continued
BD 15
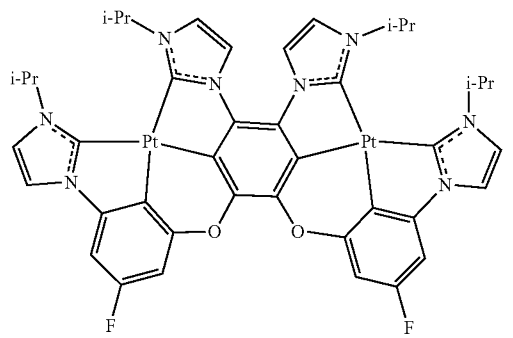
BD 16
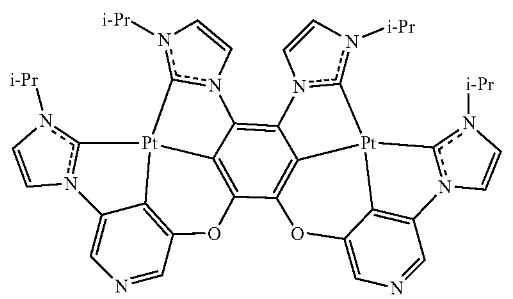
BD 17
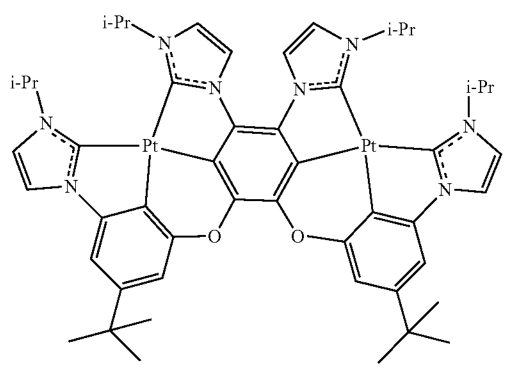
BD 18
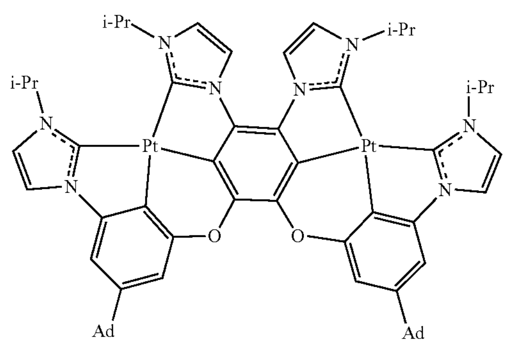
-continued
BD 19
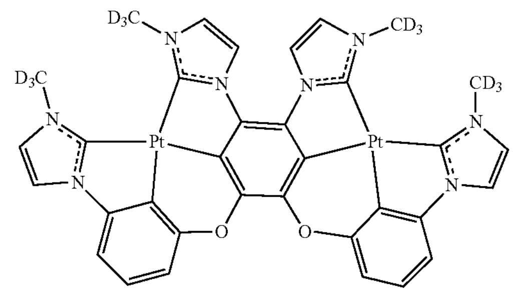
BD 20
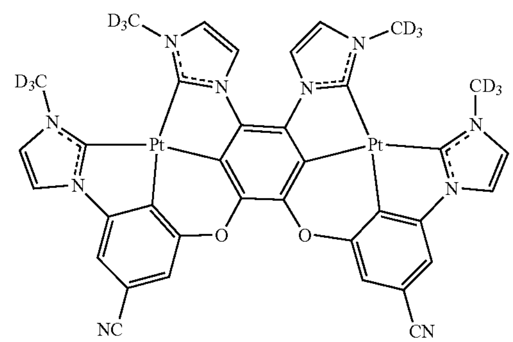
BD 21
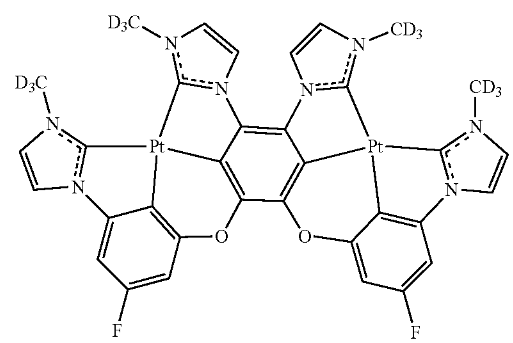
BD 22
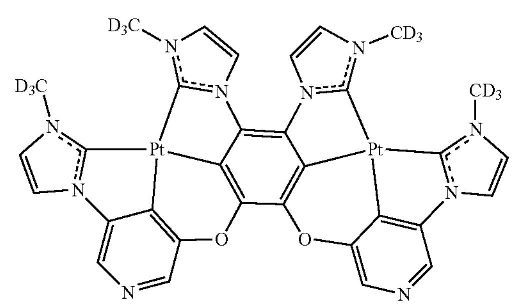

-continued
BD 23
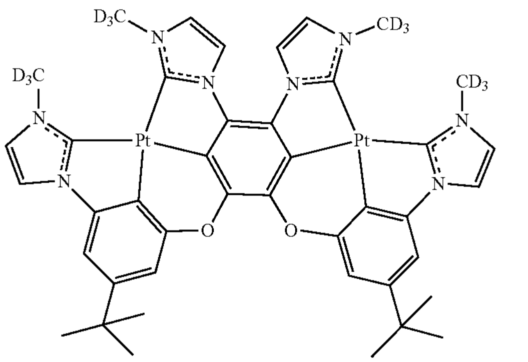
BD 24
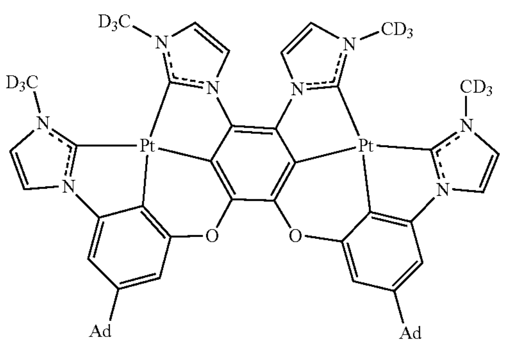
BD 25
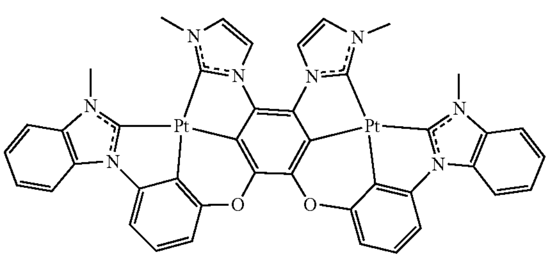
BD 26
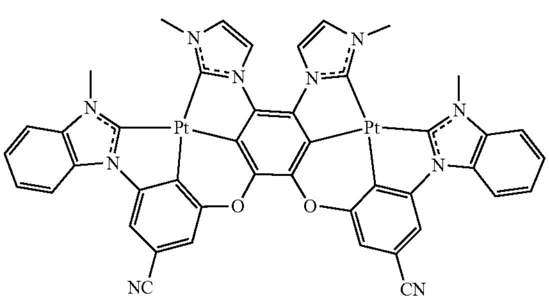
BD 27
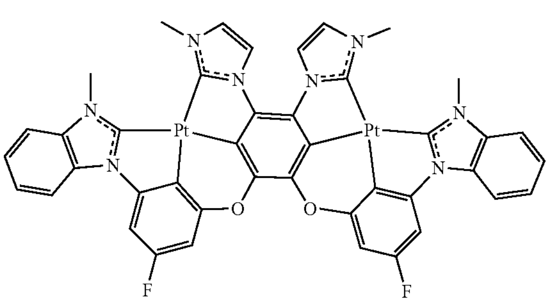
-continued
BD 28
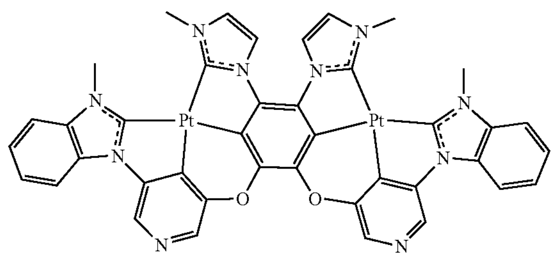
BD 29
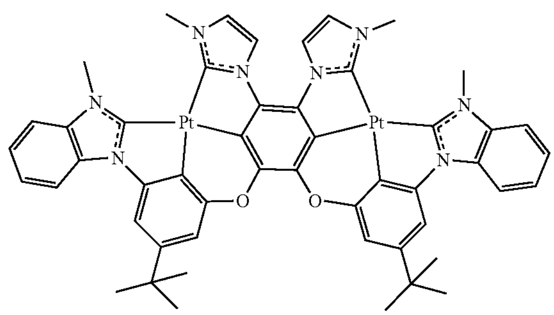
BD 30
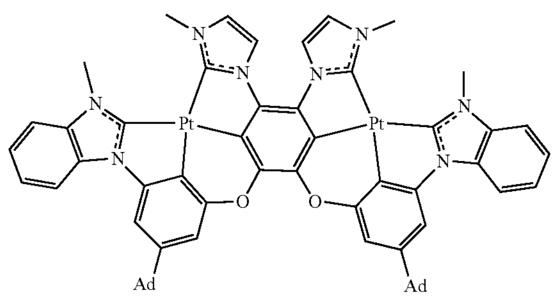
BD 31
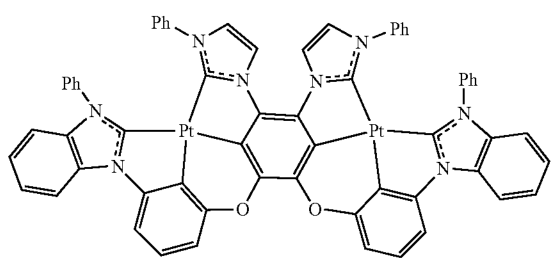
BD 32
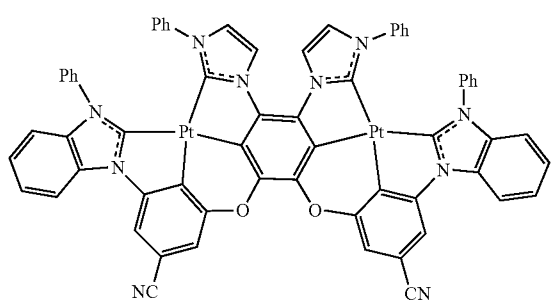

-continued
BD 33
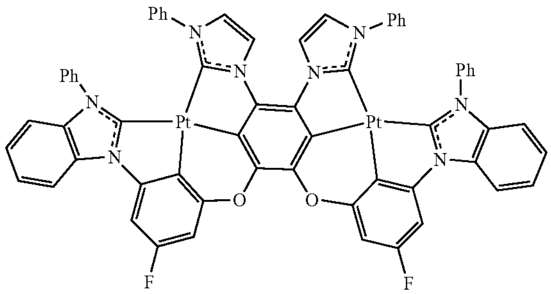
BD 34
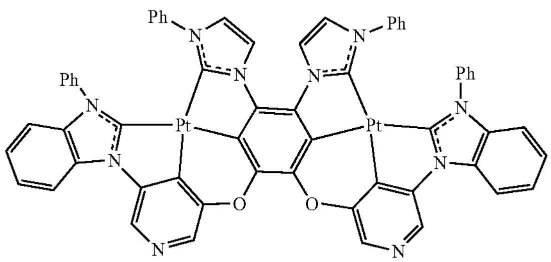
BD 35
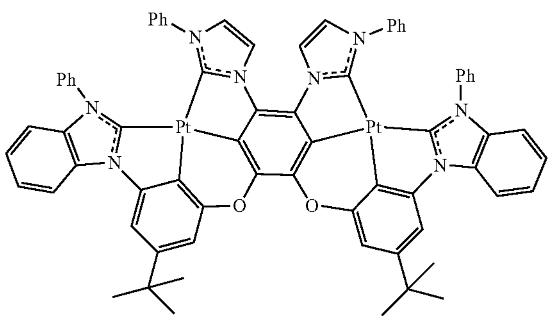
BD 36
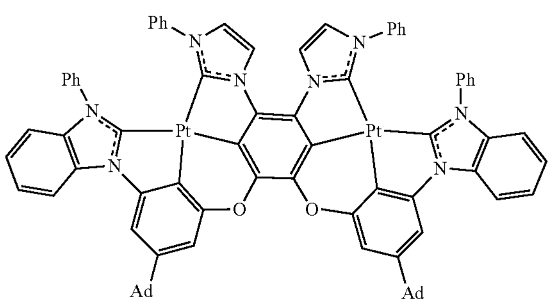
BD-37
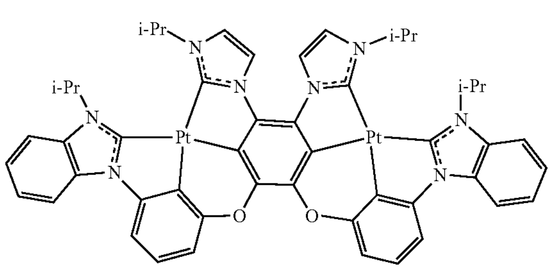
-continued
BD 38
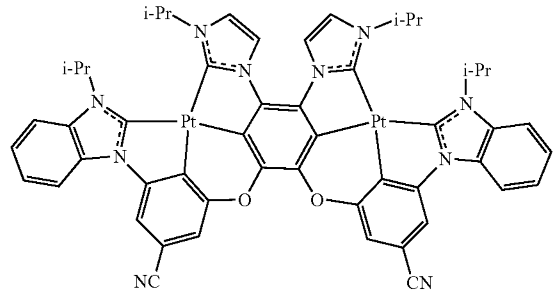
BD 39
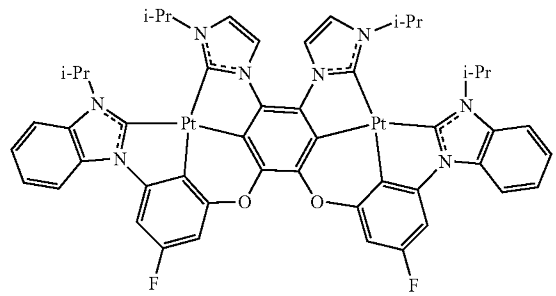
BD 40
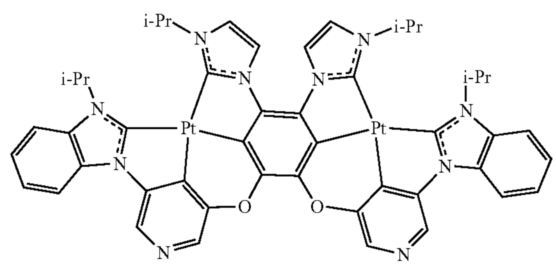
BD 41
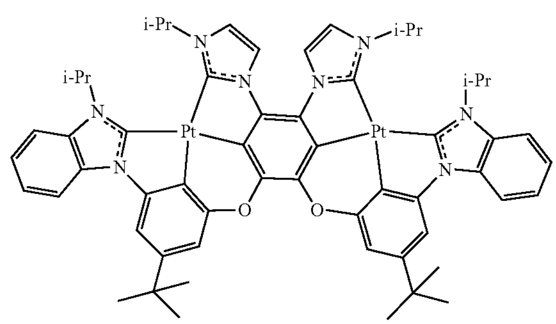
BD 42
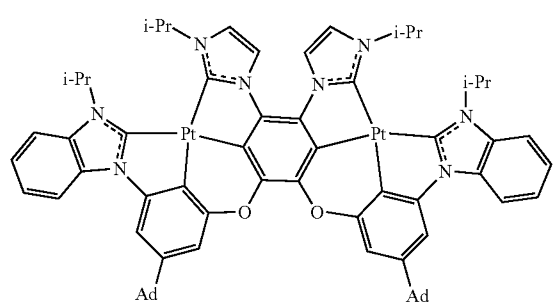

-continued
BD 43
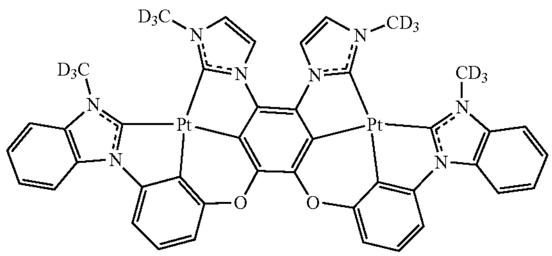
BD 44
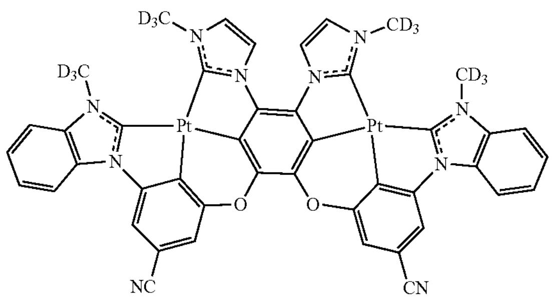
BD 45
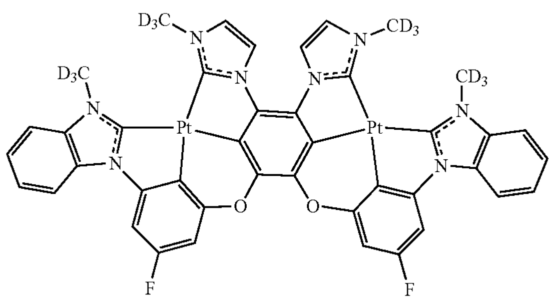
BD 46
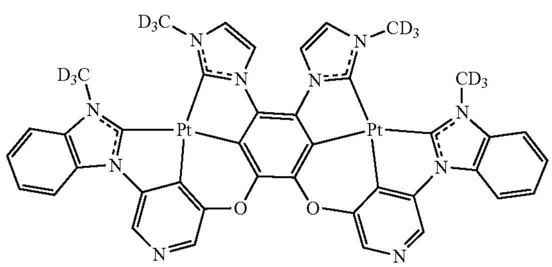
BD 47
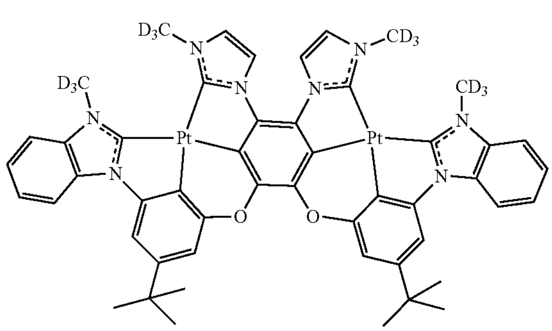
-continued
BD 48
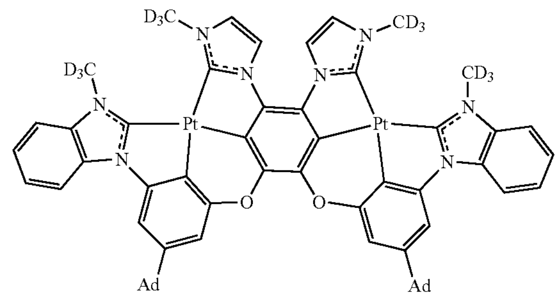
BD 49
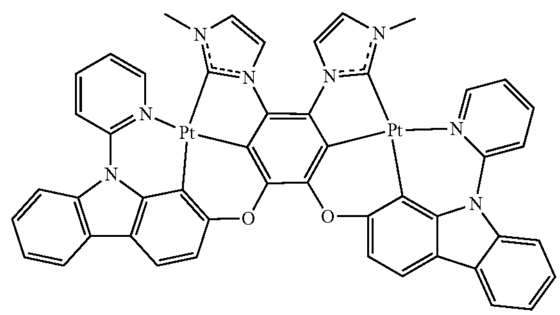
BD 50
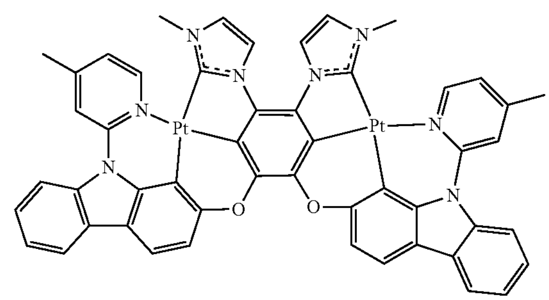
BD 51
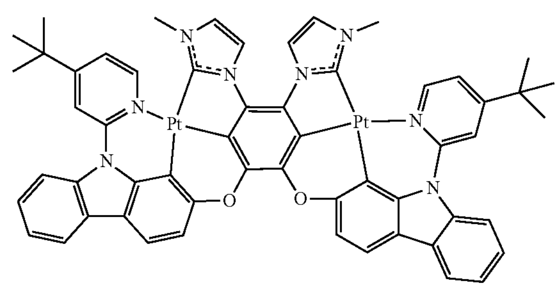
BD 52
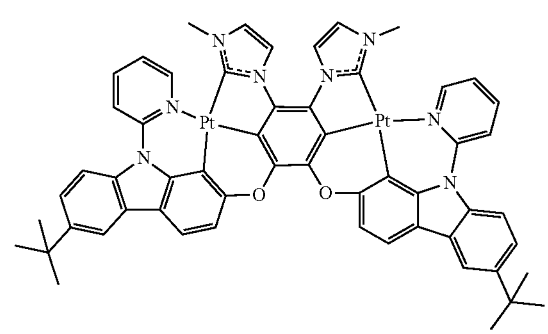

-continued
BD 53
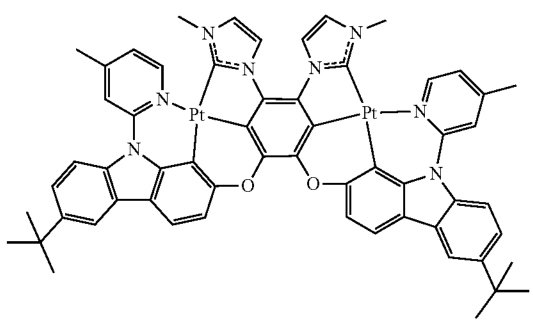
BD 54
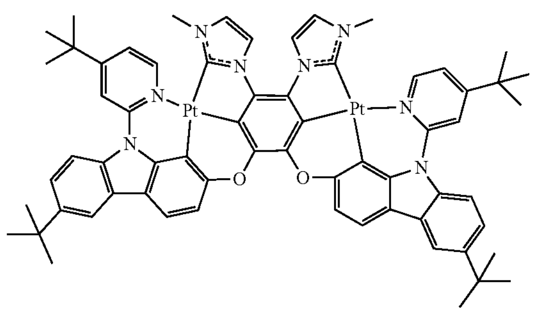
BD 55
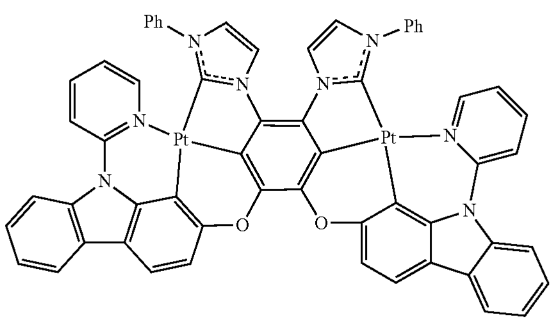
BD 56
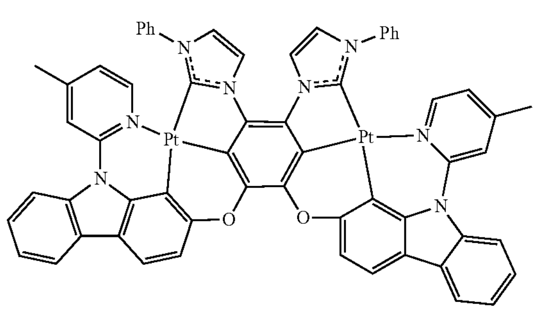
BD 57
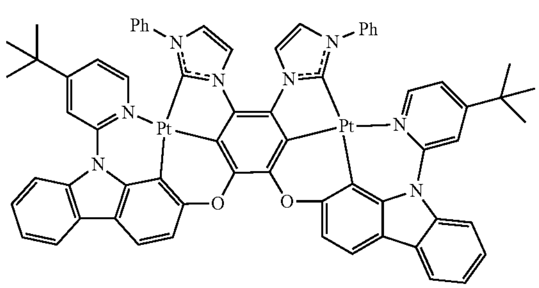
-continued
BD 58
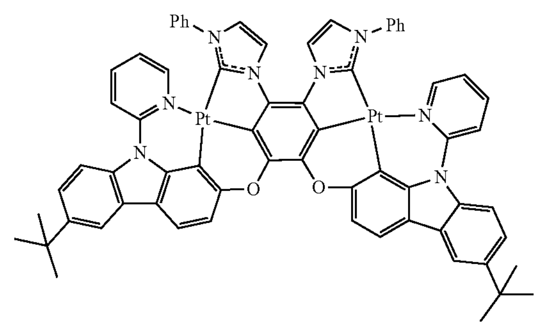
BD 59
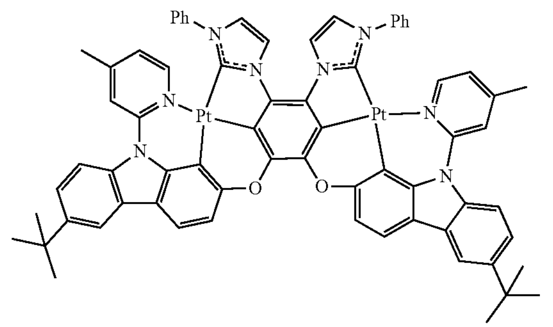
BD 60
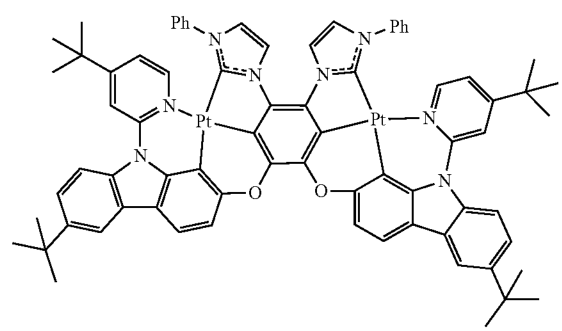
BD 61
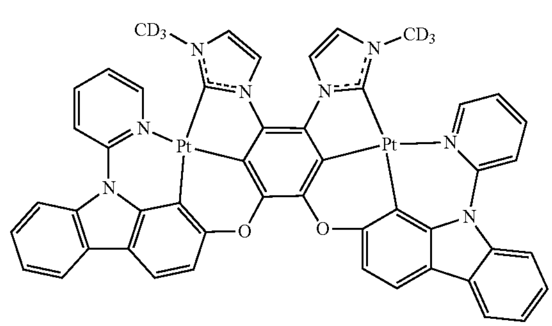

-continued
BD 62
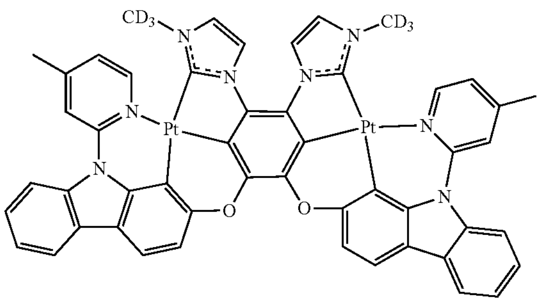
BD 63
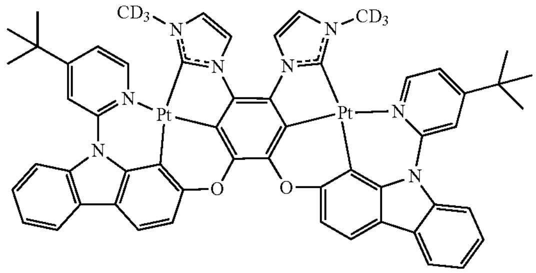
BD 64
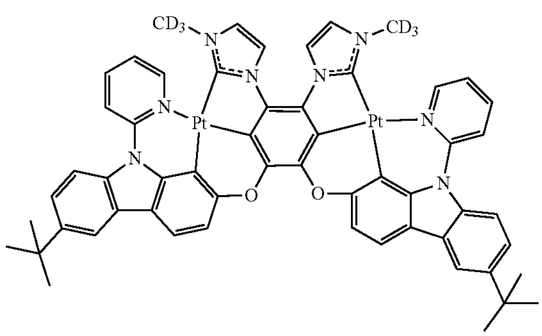
BD 65
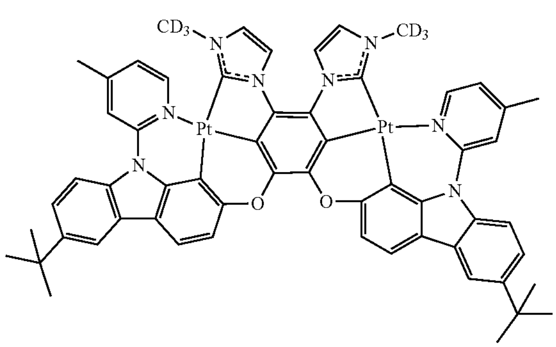
-continued
BD 66
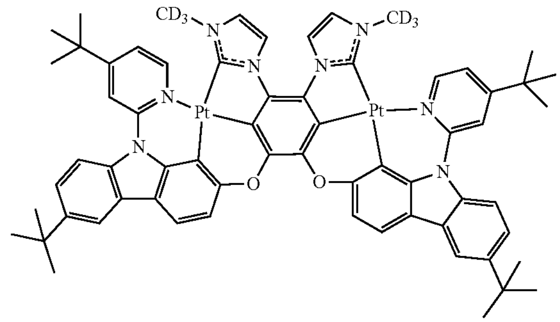
BD 67
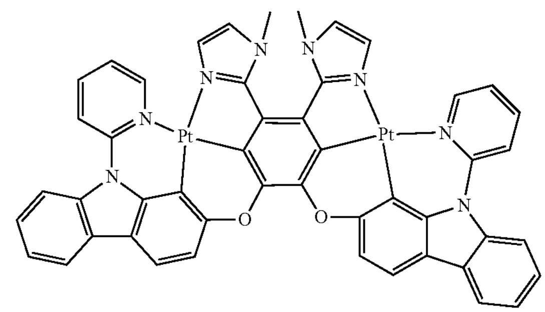
BD 68
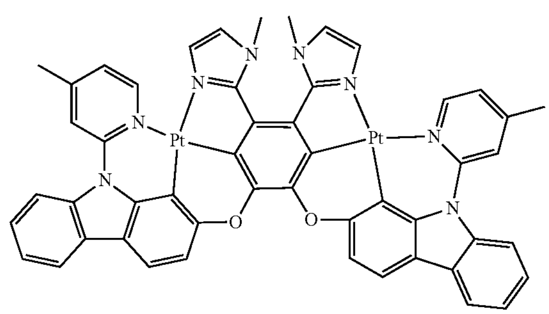
BD 69
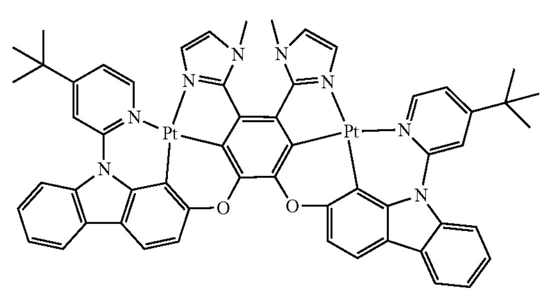

-continued
BD 70
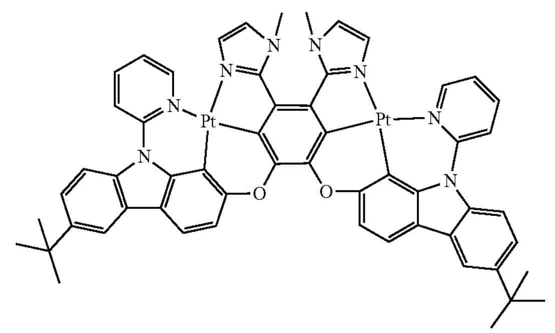
BD 71
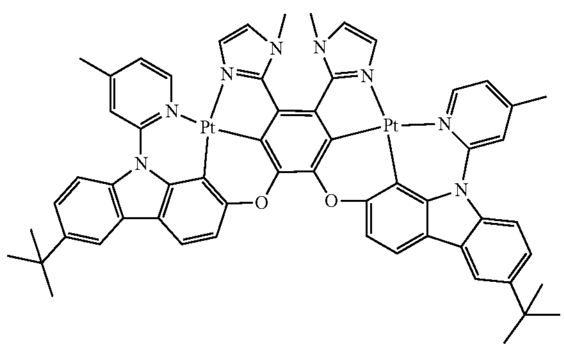
BD 72
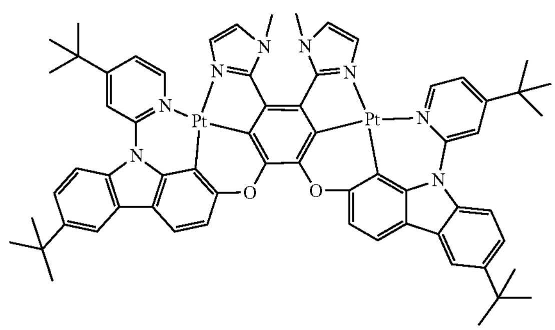
BD 73
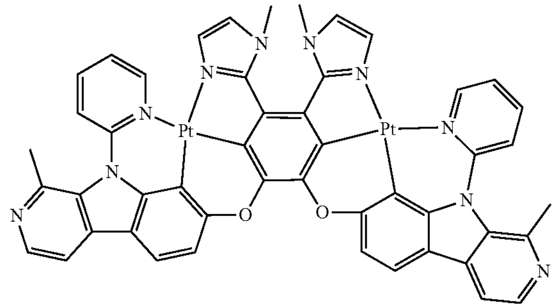
-continued
BD 74
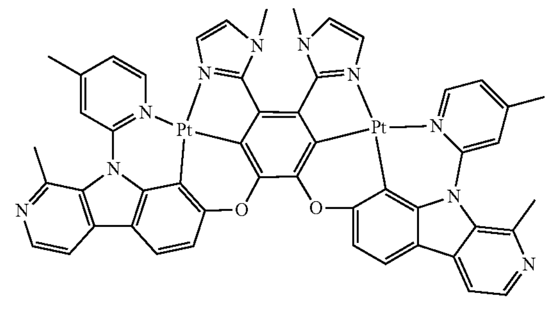
BD 75
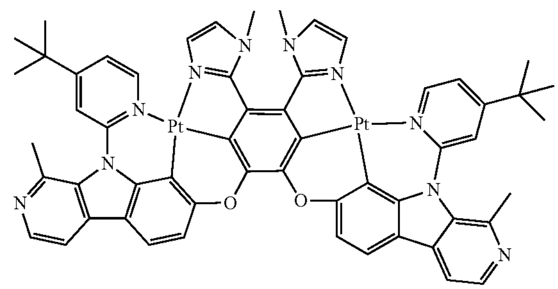
BD 76
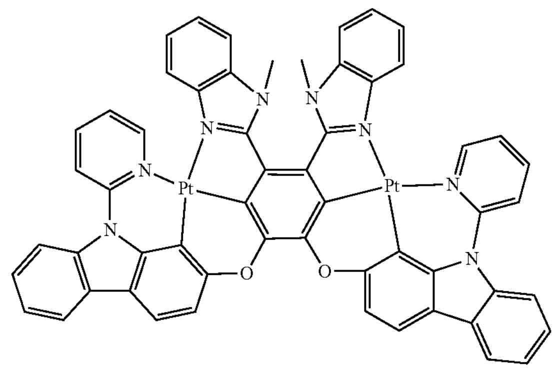
BD 77
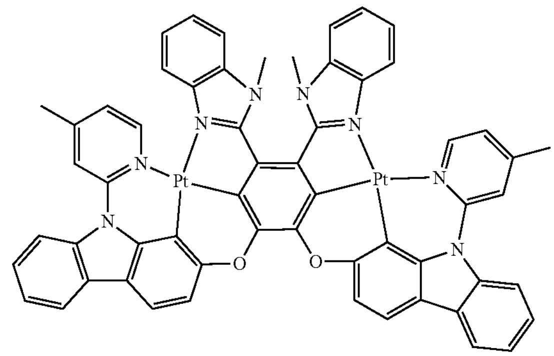

-continued
BD 78
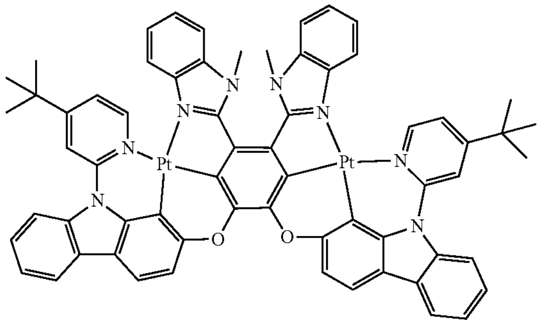
BD 79
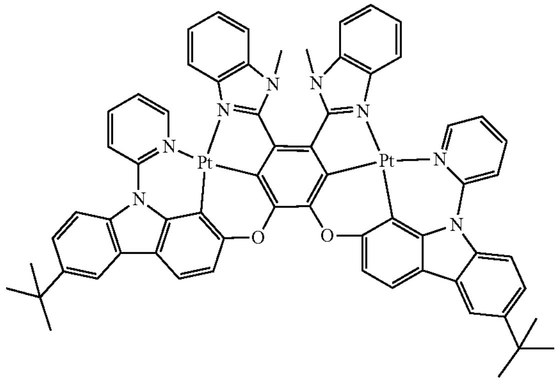
BD 80
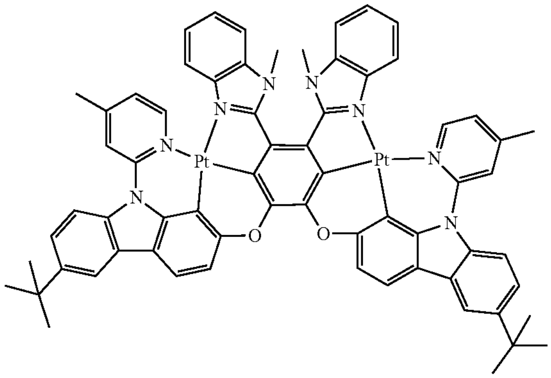
BD 81
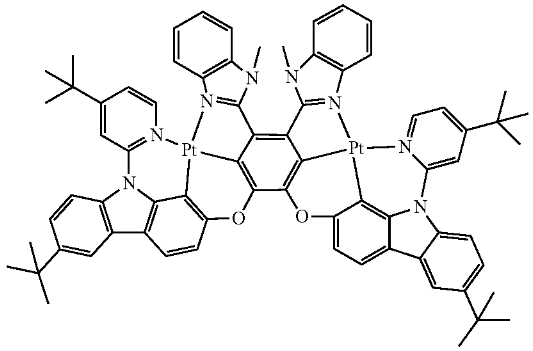
-continued
BD 82
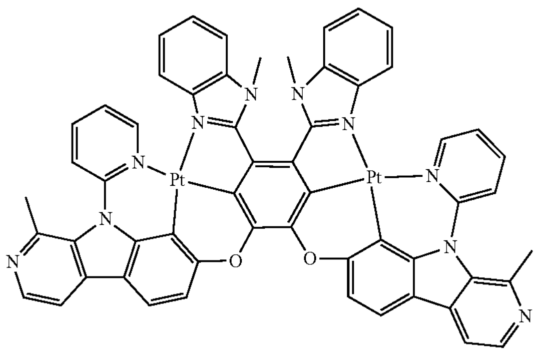
BD 83
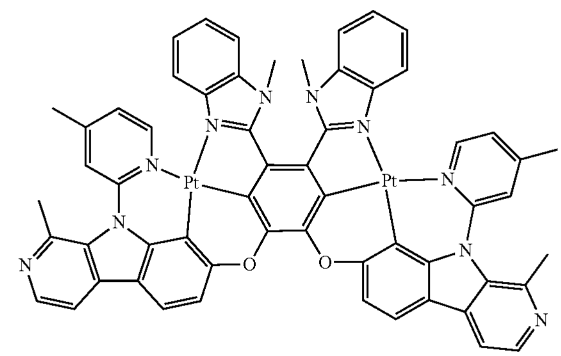
BD 84
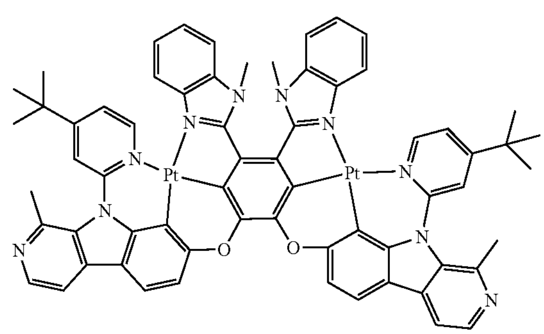
BD 85
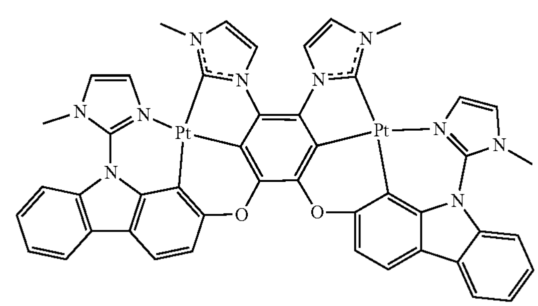

-continued
BD 86
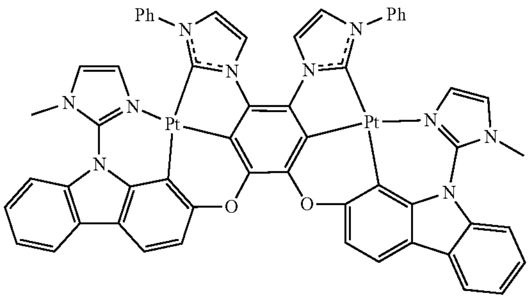
BD 87
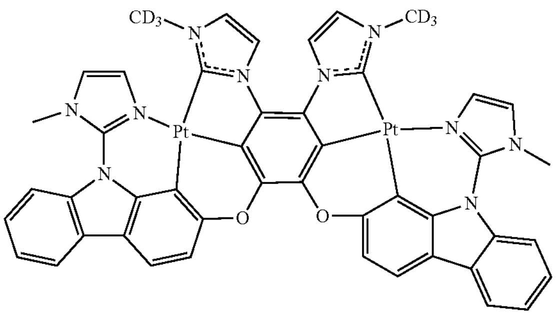
BD 88
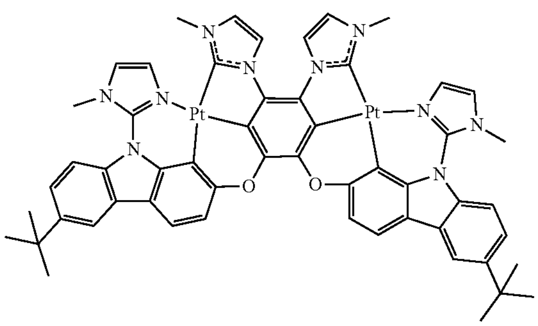
BD 89
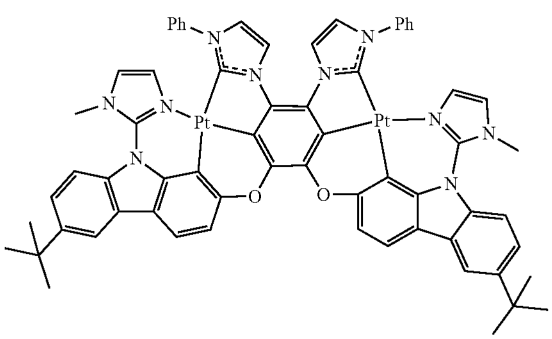
-continued
BD 90
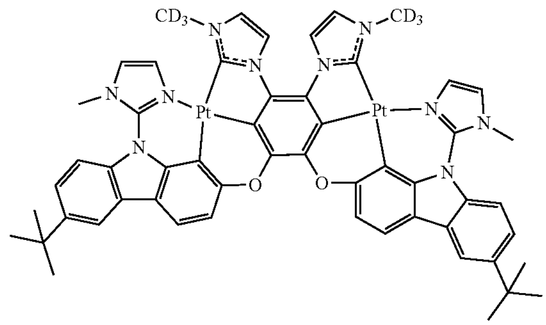
BD 91
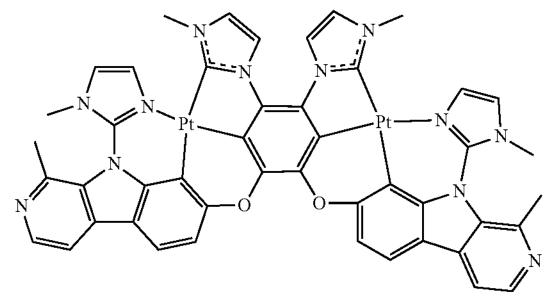
BD 92
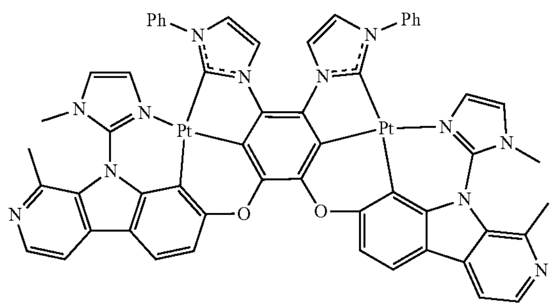
BD93
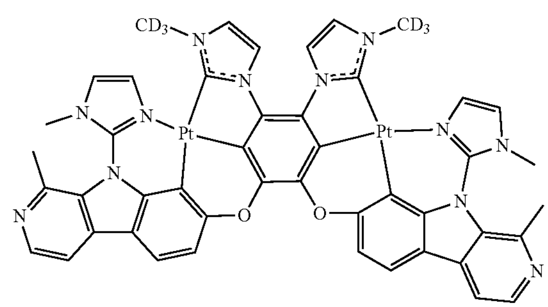
* * * * *